United States Patent
Yamanaka et al.

(10) Patent No.: US 6,492,190 B2
(45) Date of Patent: Dec. 10, 2002

(54) METHOD OF PRODUCING ELECTROOPTICAL DEVICE AND METHOD OF PRODUCING DRIVING SUBSTRATE FOR DRIVING ELECTROOPTICAL DEVICE

(75) Inventors: Hideo Yamanaka, Kanagawa (JP); Hisayoshi Yamoto, Kanagawa (JP); Yuuichi Sato, Kanagawa (JP); Hajime Yagi, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/798,832

(22) Filed: Mar. 2, 2001

(65) Prior Publication Data

US 2002/0006681 A1 Jan. 17, 2002

(51) Int. Cl.$^7$ .......................... H01L 21/00; H01L 21/84
(52) U.S. Cl. .......................... 438/30; 438/157; 438/154; 438/158; 438/163
(58) Field of Search ................ 438/151–166, 438/30

(56) References Cited

U.S. PATENT DOCUMENTS 5,506,165 A * 4/1996 Sato ........................... 438/154
5,926,699 A * 7/1999 Hayashi et al. ............. 438/151
6,406,946 B1 * 6/2002 Takizawa et al. ............. 257/59

* cited by examiner

Primary Examiner—Richard Booth
(74) Attorney, Agent, or Firm—Sonnenschein, Nath & Rosenthal

(57) ABSTRACT

A single-crystal silicon layer is formed by graphoepitaxy from a low-melting-point metal layer which contains dissolved polycrystalline or amorphous silicon, or from a melt of a silicon-containing low-melting-point metal, using step differences formed on a substrate as a seed for the epitaxial growth. This single-crystal silicon layer is used as dual-gate MOSTFTS, or bottom-gate MOSTFTS, of an electrooptical device such as an LCD integrating a display section and a peripheral-driving-circuit section. This process enables production of a uniform single-crystal silicon thin-film having high electron/hole mobility at a relatively low temperature. The display section includes LDD-nMOSTFTs or pMOSTFTs having high switching characteristics and a low leakage current. The peripheral-driving-circuit section includes cMOSTFTs, nMOSTFTs, pMOSTFTs, or a combination thereof, having high driving ability.

41 Claims, 81 Drawing Sheets

| No. | PERIPHERAL DRIVING CIRCUIT SECTION | DISPLAY SECTION |
|---|---|---|
| 1 | DUAL-GATE TYPE | TOP-GATE TYPE |
| 2 | DUAL-GATE TYPE | BOTTOM-GATE TYPE |
| 3 | DUAL-GATE TYPE | DUAL-GATE TYPE |
| 4 | TOP-GATE TYPE + DUAL-GATE TYPE | TOP-GATE TYPE |
| 5 | TOP-GATE TYPE + DUAL-GATE TYPE | BOTTOM-GATE TYPE |
| 6 | TOP-GATE TYPE + DUAL-GATE TYPE | DUAL-GATE TYPE |
| 7 | BOTTOM-GATE TYPE + DUAL-GATE TYPE | TOP-GATE TYPE |
| 8 | BOTTOM-GATE TYPE + DUAL-GATE TYPE | BOTTOM-GATE TYPE |
| 9 | BOTTOM-GATE TYPE + DUAL-GATE TYPE | DUAL-GATE TYPE |
| 10 | TOP-GATE TYPE + BOTTOM-GATE TYPE + DUAL-GATE TYPE | TOP-GATE TYPE |
| 11 | TOP-GATE TYPE + BOTTOM-GATE TYPE + DUAL-GATE TYPE | BOTTOM-GATE TYPE |
| 12 | TOP-GATE TYPE + BOTTOM-GATE TYPE + DUAL-GATE TYPE | DUAL-GATE TYPE |

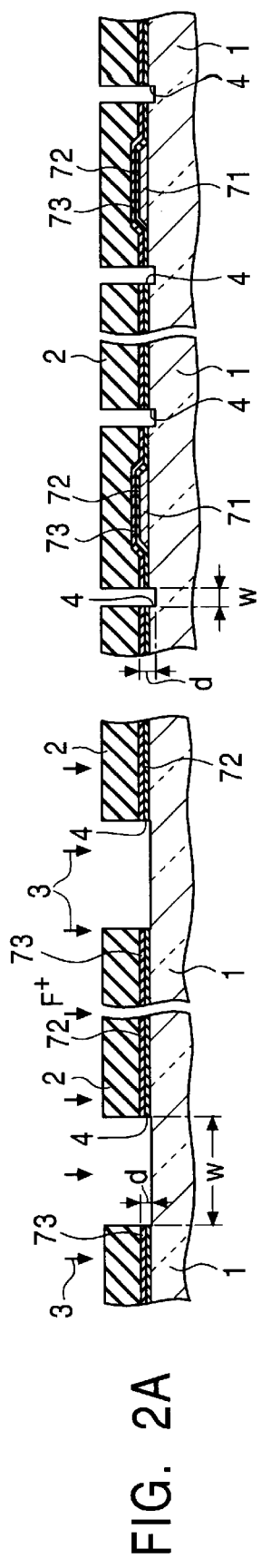
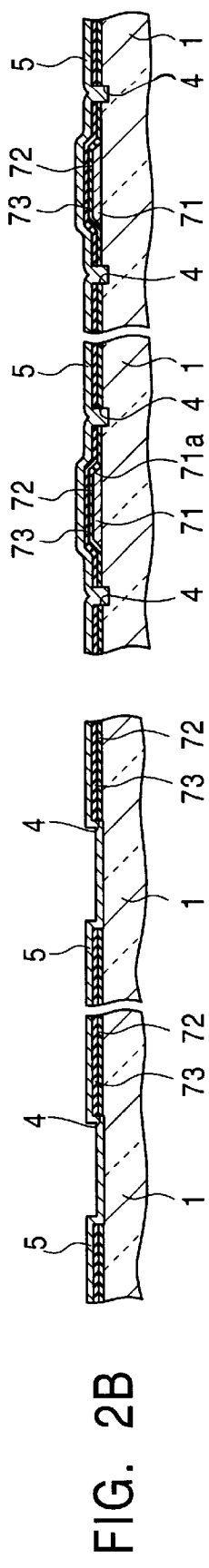
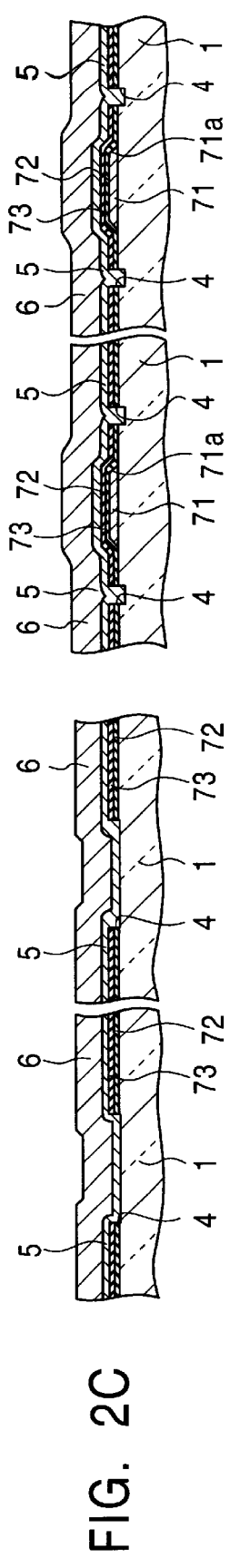
FIG. 2A
FIG. 2B
FIG. 2C

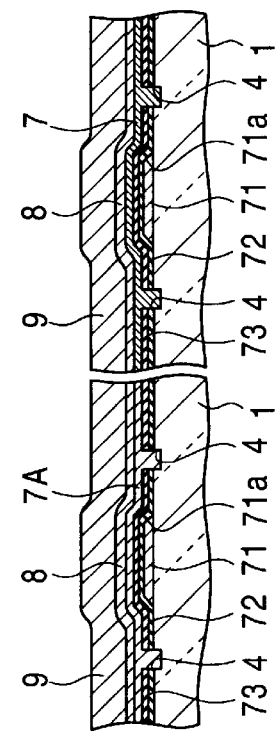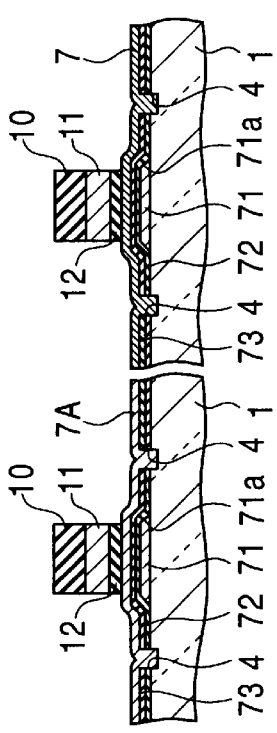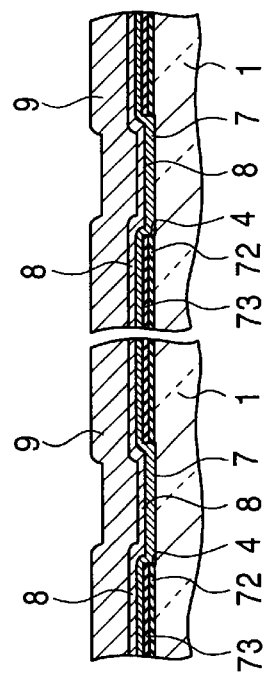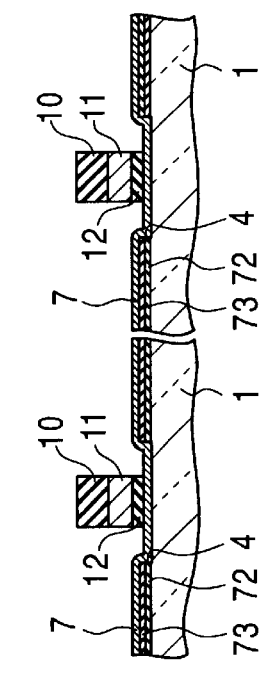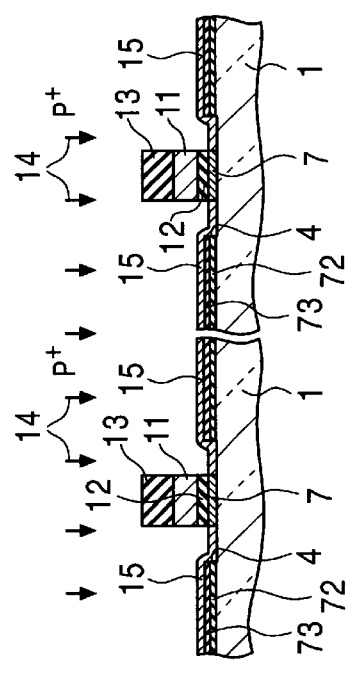
FIG. 4A
FIG. 4B
FIG. 4C

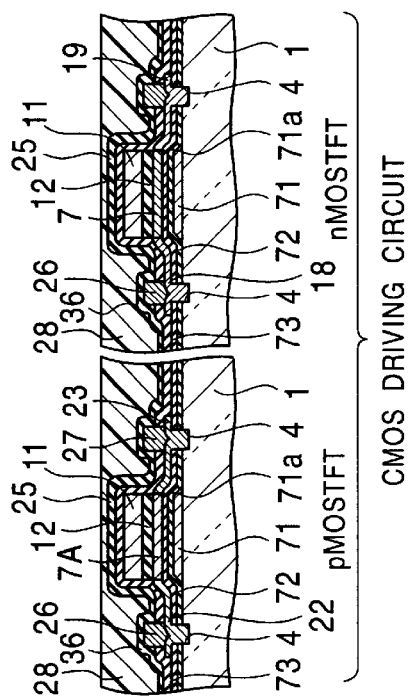
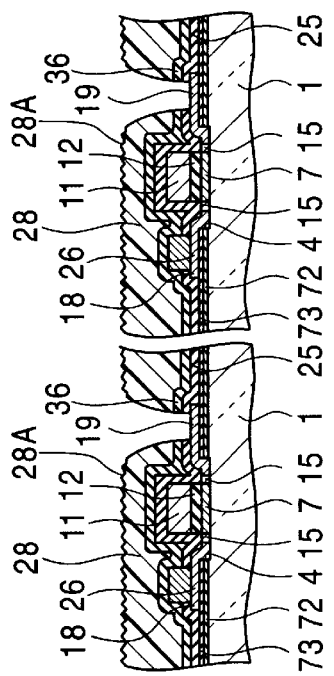
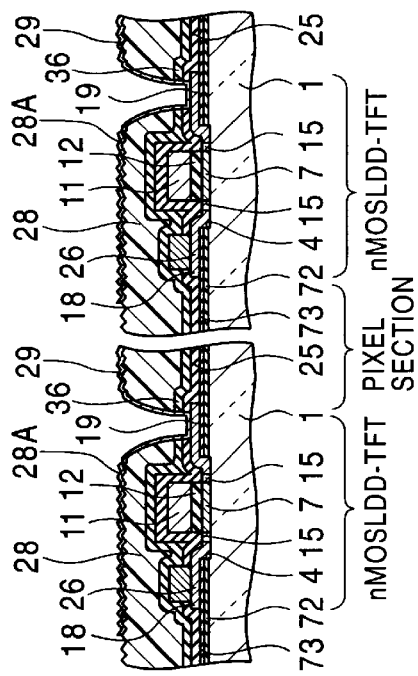
FIG. 7A
FIG. 7B
FIG. 7C

FIG. 14

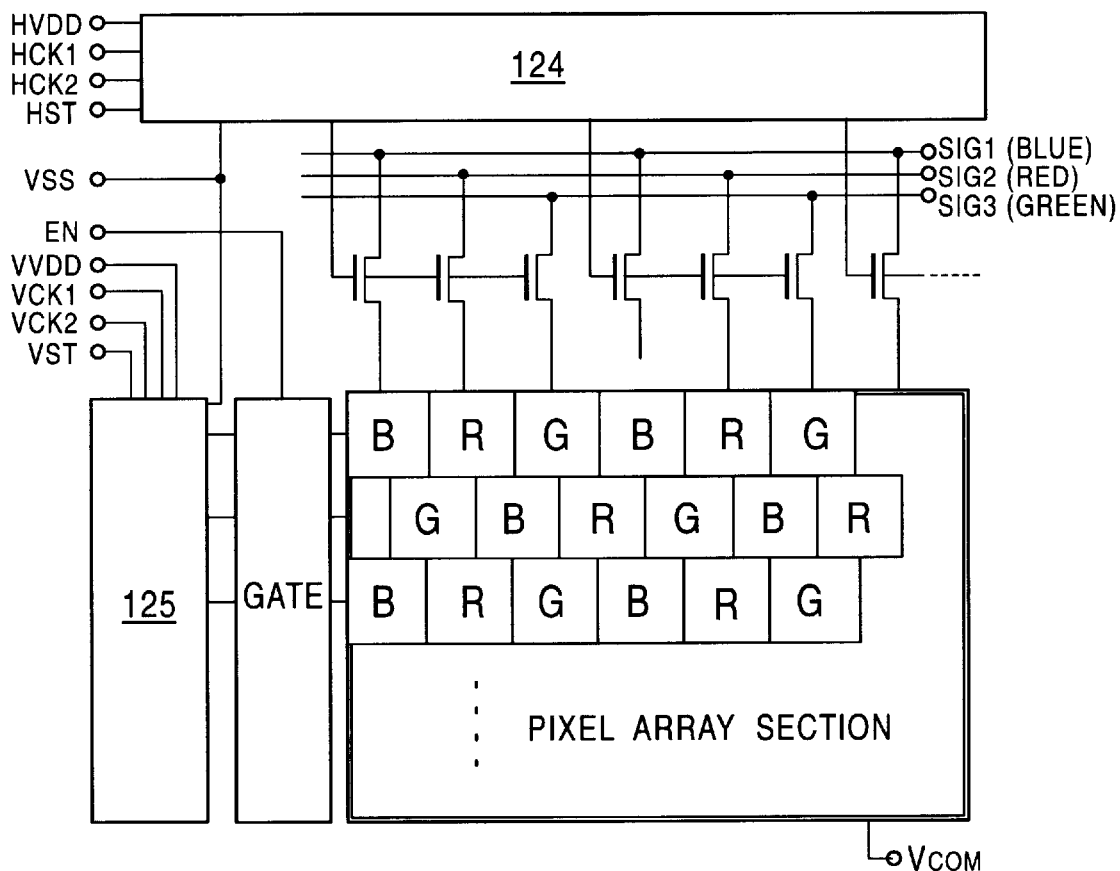

VCOM : COMMON-ELECTRODE VOLTAGE
HVDD : INPUT TERMINAL FOR H-DRIVER
VVDD : INPUT TERMINAL FOR V-DRIVER
HCK1 : CLOCK INPUT TERMINAL FOR DRIVING H-SHIFT REGISTER
HCK2 : CLOCK INPUT TERMINAL FOR DRIVING H-SHIFT REGISTER
VCK1 : CLOCK INPUT TERMINAL FOR DRIVING V-SHIFT REGISTER
VCK2 : CLOCK INPUT TERMINAL FOR DRIVING V-SHIFT REGISTER
HST  : START PULSE INPUT TERMINAL FOR DRIVING H-SHIFT REGISTER
VST  : START PULSE INPUT TERMINAL FOR DRIVING V-SHIFT REGISTER
VSS  : GND TERMINAL FOR H-, V-DRIVERS
SIG1 : VIDEO-SIGNAL INPUT-TERMINAL VOLTAGE (BLUE)
SIG2 : VIDEO-SIGNAL INPUT-TERMINAL VOLTAGE (RED)
S1G3 : VIDEO-SIGNAL INPUT-TERMINAL VOLTAGE (GREEN)

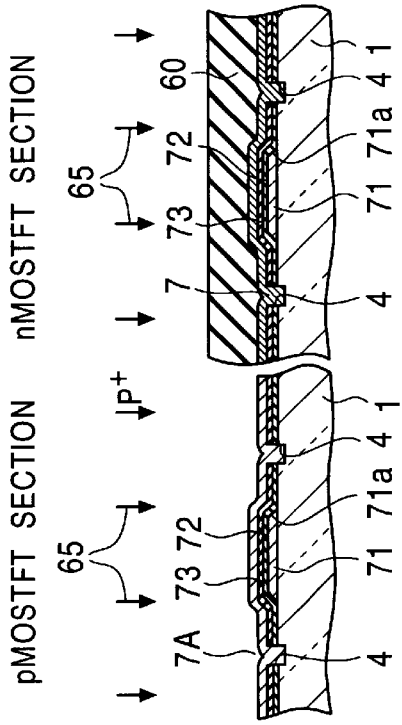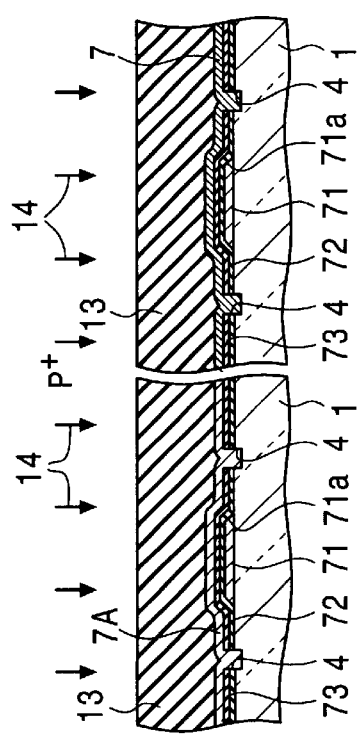
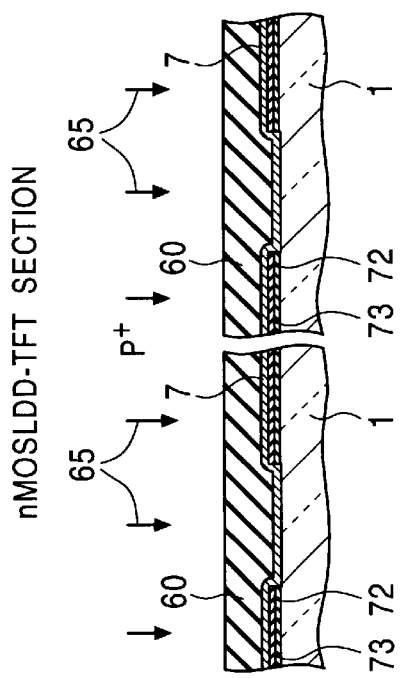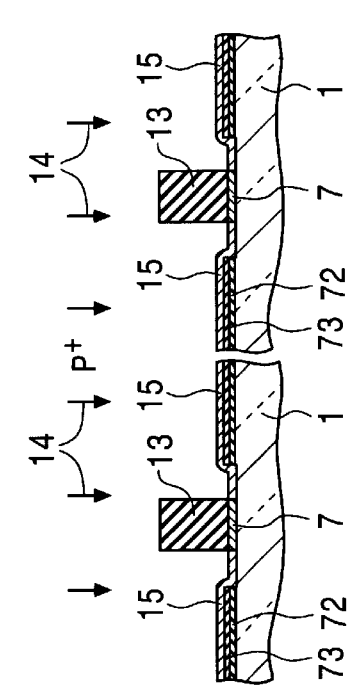
FIG. 29A　　FIG. 29B

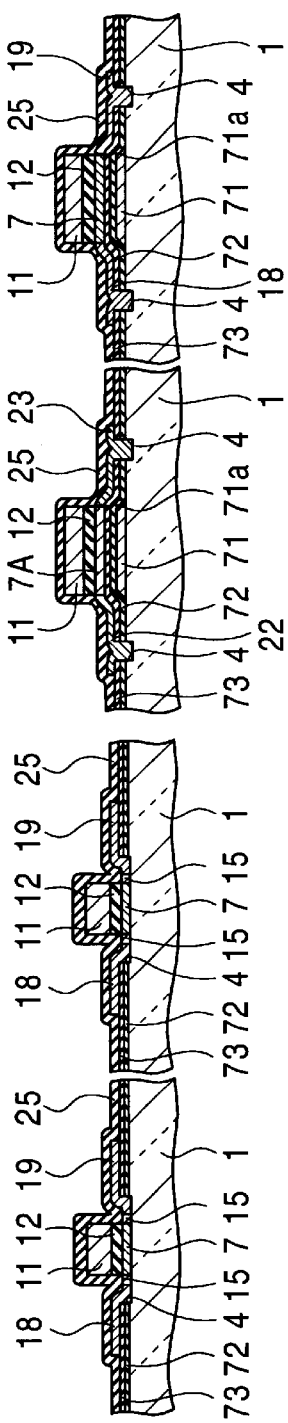
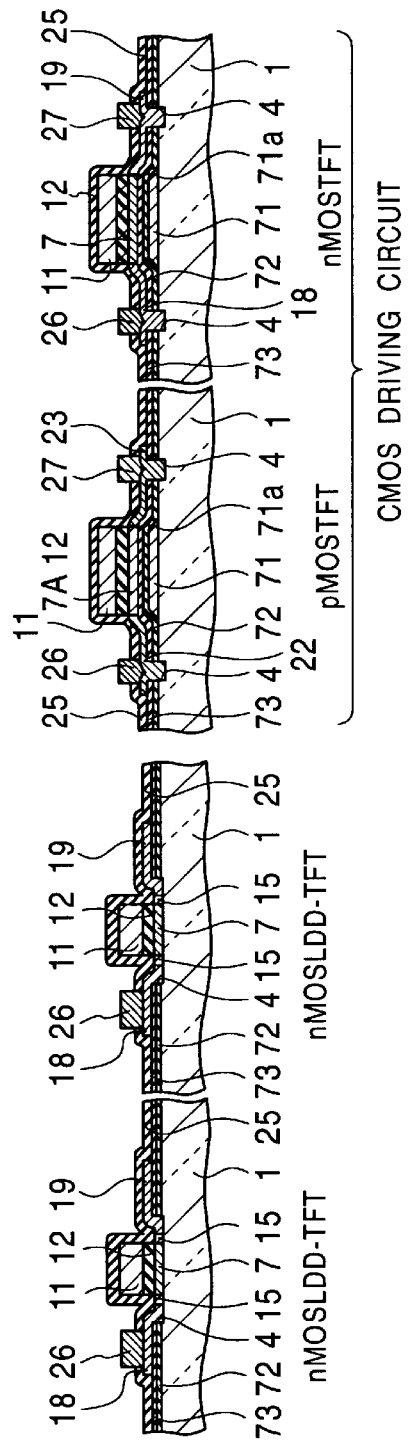
FIG. 31A
FIG. 31B

FIG. 44

| No. | PERIPHERAL DRIVING CIRCUIT SECTION | DISPLAY SECTION |
|---|---|---|
| 1 | DUAL-GATE TYPE | TOP-GATE TYPE |
| 2 | DUAL-GATE TYPE | BOTTOM-GATE TYPE |
| 3 | DUAL-GATE TYPE | DUAL-GATE TYPE |
| 4 | TOP-GATE TYPE + DUAL-GATE TYPE | TOP-GATE TYPE |
| 5 | TOP-GATE TYPE + DUAL-GATE TYPE | BOTTOM-GATE TYPE |
| 6 | TOP-GATE TYPE + DUAL-GATE TYPE | DUAL-GATE TYPE |
| 7 | BOTTOM-GATE TYPE + DUAL-GATE TYPE | TOP-GATE TYPE |
| 8 | BOTTOM-GATE TYPE + DUAL-GATE TYPE | BOTTOM-GATE TYPE |
| 9 | BOTTOM-GATE TYPE + DUAL-GATE TYPE | DUAL-GATE TYPE |
| 10 | TOP-GATE TYPE + BOTTOM-GATE TYPE + DUAL-GATE TYPE | TOP-GATE TYPE |
| 11 | TOP-GATE TYPE + BOTTOM-GATE TYPE + DUAL-GATE TYPE | BOTTOM-GATE TYPE |
| 12 | TOP-GATE TYPE + BOTTOM-GATE TYPE + DUAL-GATE TYPE | DUAL-GATE TYPE |

FIG. 45

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 1 | DUAL GATE | p | TOP GATE | p |
| 2 | DUAL GATE | p | TOP GATE | n |
| 3 | DUAL GATE | n | TOP GATE | n |
| 4 | DUAL GATE | n | TOP GATE | p |
| 5 | DUAL GATE | c | TOP GATE | p |
| 6 | DUAL GATE | c | TOP GATE | n |
| 7 | DUAL GATE | c | TOP GATE | c |
| 8 | DUAL GATE | p | TOP GATE | c |
| 9 | DUAL GATE | n | TOP GATE | c |
| 10 | DUAL GATE | p | BOTTOM GATE | p |
| 11 | DUAL GATE | p | BOTTOM GATE | n |
| 12 | DUAL GATE | n | BOTTOM GATE | n |
| 13 | DUAL GATE | n | BOTTOM GATE | p |
| 14 | DUAL GATE | c | BOTTOM GATE | p |
| 15 | DUAL GATE | c | BOTTOM GATE | n |
| 16 | DUAL GATE | c | BOTTOM GATE | c |
| 17 | DUAL GATE | p | BOTTOM GATE | c |
| 18 | DUAL GATE | n | BOTTOM GATE | c |
| 19 | DUAL GATE | p | DUAL GATE | p |
| 20 | DUAL GATE | p | DUAL GATE | n |
| 21 | DUAL GATE | n | DUAL GATE | n |
| 22 | DUAL GATE | n | DUAL GATE | p |
| 23 | DUAL GATE | c | DUAL GATE | p |
| 24 | DUAL GATE | c | DUAL GATE | n |
| 25 | DUAL GATE | c | DUAL GATE | c |
| 26 | DUAL GATE | p | DUAL GATE | c |
| 27 | DUAL GATE | n | DUAL GATE | c | p : p-CHANNEL TYPE n : n-CHANNEL TYPE c : COMPLEMENTARY TYPE OF COMBINATION OF p-CHANNEL TYPE AND n-CHANNEL TYPE

FIG. 46

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 28 | DUAL GATE | c + n | TOP GATE | p |
| 29 | DUAL GATE | c + n | TOP GATE | n |
| 30 | DUAL GATE | c + n | TOP GATE | c |
| 31 | DUAL GATE | c + p | TOP GATE | p |
| 32 | DUAL GATE | c + p | TOP GATE | n |
| 33 | DUAL GATE | c + p | TOP GATE | c |
| 34 | DUAL GATE | c + n + p | TOP GATE | p |
| 35 | DUAL GATE | c + n + p | TOP GATE | n |
| 36 | DUAL GATE | c + n + p | TOP GATE | c |
| 37 | DUAL GATE | c + n | BOTTOM GATE | p |
| 38 | DUAL GATE | c + n | BOTTOM GATE | n |
| 39 | DUAL GATE | c + n | BOTTOM GATE | c |
| 40 | DUAL GATE | c + p | BOTTOM GATE | p |
| 41 | DUAL GATE | c + p | BOTTOM GATE | n |
| 42 | DUAL GATE | c + p | BOTTOM GATE | c |
| 43 | DUAL GATE | c + n + p | BOTTOM GATE | p |
| 44 | DUAL GATE | c + n + p | BOTTOM GATE | n |
| 45 | DUAL GATE | c + n + p | BOTTOM GATE | c |
| 46 | DUAL GATE | c + n | DUAL GATE | p |
| 47 | DUAL GATE | c + n | DUAL GATE | n |
| 48 | DUAL GATE | c + n | DUAL GATE | c |
| 49 | DUAL GATE | c + p | DUAL GATE | p |
| 50 | DUAL GATE | c + p | DUAL GATE | n |
| 51 | DUAL GATE | c + p | DUAL GATE | c |
| 52 | DUAL GATE | c + n + p | DUAL GATE | p |
| 53 | DUAL GATE | c + n + p | DUAL GATE | n |
| 54 | DUAL GATE | c + n + p | DUAL GATE | c |

FIG. 47

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 55 | DUAL GATE | p | TOP GATE | p |
| 56 | DUAL GATE | p | TOP GATE | n |
| 57 | DUAL GATE | n | TOP GATE | n |
| 58 | DUAL GATE | n | TOP GATE | p |
| 59 | DUAL GATE | c | TOP GATE | p |
| 60 | DUAL GATE | c | TOP GATE | n |
| 61 | DUAL GATE | c | TOP GATE | c |
| 62 | DUAL GATE | p | TOP GATE | c |
| 63 | DUAL GATE | n | TOP GATE | c |
| 64 | DUAL GATE | p | BOTTOM GATE | p |
| 65 | DUAL GATE | p | BOTTOM GATE | n |
| 66 | DUAL GATE | n | BOTTOM GATE | n |
| 67 | DUAL GATE | n | BOTTOM GATE | p |
| 68 | DUAL GATE | c | BOTTOM GATE | p |
| 69 | DUAL GATE | c | BOTTOM GATE | n |
| 70 | DUAL GATE | c | BOTTOM GATE | c |
| 71 | DUAL GATE | p | BOTTOM GATE | c |
| 72 | DUAL GATE | n | BOTTOM GATE | c |
| 73 | DUAL GATE | p | DUAL GATE | p |
| 74 | DUAL GATE | p | DUAL GATE | n |
| 75 | DUAL GATE | n | DUAL GATE | n |
| 76 | DUAL GATE | n | DUAL GATE | p |
| 77 | DUAL GATE | c | DUAL GATE | p |
| 78 | DUAL GATE | c | DUAL GATE | n |
| 79 | DUAL GATE | c | DUAL GATE | c |
| 80 | DUAL GATE | p | DUAL GATE | c |
| 81 | DUAL GATE | n | DUAL GATE | c |

FIG. 48

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 82 | DUAL GATE | c + n | TOP GATE | p |
| 83 | DUAL GATE | c + n | TOP GATE | n |
| 84 | DUAL GATE | c + n | TOP GATE | c |
| 85 | DUAL GATE | c + p | TOP GATE | p |
| 86 | DUAL GATE | c + p | TOP GATE | n |
| 87 | DUAL GATE | c + p | TOP GATE | c |
| 88 | DUAL GATE | c + n + p | TOP GATE | p |
| 89 | DUAL GATE | c + n + p | TOP GATE | n |
| 90 | DUAL GATE | c + n + p | TOP GATE | c |
| 91 | DUAL GATE | c + n | BOTTOM GATE | p |
| 92 | DUAL GATE | c + n | BOTTOM GATE | n |
| 93 | DUAL GATE | c + n | BOTTOM GATE | c |
| 94 | DUAL GATE | c + p | BOTTOM GATE | p |
| 95 | DUAL GATE | c + p | BOTTOM GATE | n |
| 96 | DUAL GATE | c + p | BOTTOM GATE | c |
| 97 | DUAL GATE | c + n + p | BOTTOM GATE | p |
| 98 | DUAL GATE | c + n + p | BOTTOM GATE | n |
| 99 | DUAL GATE | c + n + p | BOTTOM GATE | c |
| 100 | DUAL GATE | c + n | DUAL GATE | p |
| 101 | DUAL GATE | c + n | DUAL GATE | n |
| 102 | DUAL GATE | c + n | DUAL GATE | c |
| 103 | DUAL GATE | c + p | DUAL GATE | p |
| 104 | DUAL GATE | c + p | DUAL GATE | n |
| 105 | DUAL GATE | c + p | DUAL GATE | c |
| 106 | DUAL GATE | c + n + p | DUAL GATE | p |
| 107 | DUAL GATE | c + n + p | DUAL GATE | n |
| 108 | DUAL GATE | c + n + p | DUAL GATE | c |

FIG. 49

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 109 | DUAL GATE | p | TOP GATE | p |
| 110 | DUAL GATE | p | TOP GATE | n |
| 111 | DUAL GATE | n | TOP GATE | n |
| 112 | DUAL GATE | n | TOP GATE | p |
| 113 | DUAL GATE | c | TOP GATE | p |
| 114 | DUAL GATE | c | TOP GATE | n |
| 115 | DUAL GATE | c | TOP GATE | c |
| 116 | DUAL GATE | p | TOP GATE | c |
| 117 | DUAL GATE | n | TOP GATE | c |
| 118 | DUAL GATE | p | BOTTOM GATE | p |
| 119 | DUAL GATE | p | BOTTOM GATE | n |
| 120 | DUAL GATE | n | BOTTOM GATE | n |
| 121 | DUAL GATE | n | BOTTOM GATE | p |
| 122 | DUAL GATE | c | BOTTOM GATE | p |
| 123 | DUAL GATE | c | BOTTOM GATE | n |
| 124 | DUAL GATE | c | BOTTOM GATE | c |
| 125 | DUAL GATE | p | BOTTOM GATE | c |
| 126 | DUAL GATE | n | BOTTOM GATE | c |
| 127 | DUAL GATE | p | DUAL GATE | p |
| 128 | DUAL GATE | p | DUAL GATE | n |
| 129 | DUAL GATE | n | DUAL GATE | n |
| 130 | DUAL GATE | n | DUAL GATE | p |
| 131 | DUAL GATE | c | DUAL GATE | p |
| 132 | DUAL GATE | c | DUAL GATE | n |
| 133 | DUAL GATE | c | DUAL GATE | c |
| 134 | DUAL GATE | p | DUAL GATE | c |
| 135 | DUAL GATE | n | DUAL GATE | c |

FIG. 50

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 136 | DUAL GATE | c + n | TOP GATE | p |
| 137 | DUAL GATE | c + n | TOP GATE | n |
| 138 | DUAL GATE | c + n | TOP GATE | c |
| 139 | DUAL GATE | c + p | TOP GATE | p |
| 140 | DUAL GATE | c + p | TOP GATE | n |
| 141 | DUAL GATE | c + p | TOP GATE | c |
| 142 | DUAL GATE | c + n + p | TOP GATE | p |
| 143 | DUAL GATE | c + n + p | TOP GATE | n |
| 144 | DUAL GATE | c + n + p | TOP GATE | c |
| 145 | DUAL GATE | c + n | BOTTOM GATE | p |
| 146 | DUAL GATE | c + n | BOTTOM GATE | n |
| 147 | DUAL GATE | c + n | BOTTOM GATE | c |
| 148 | DUAL GATE | c + p | BOTTOM GATE | p |
| 149 | DUAL GATE | c + p | BOTTOM GATE | n |
| 150 | DUAL GATE | c + p | BOTTOM GATE | c |
| 151 | DUAL GATE | c + n + p | BOTTOM GATE | p |
| 152 | DUAL GATE | c + n + p | BOTTOM GATE | n |
| 153 | DUAL GATE | c + n + p | BOTTOM GATE | c |
| 154 | DUAL GATE | c + n | DUAL GATE | p |
| 155 | DUAL GATE | c + n | DUAL GATE | n |
| 156 | DUAL GATE | c + n | DUAL GATE | c |
| 157 | DUAL GATE | c + p | DUAL GATE | p |
| 158 | DUAL GATE | c + p | DUAL GATE | n |
| 159 | DUAL GATE | c + p | DUAL GATE | c |
| 160 | DUAL GATE | c + n + p | DUAL GATE | p |
| 161 | DUAL GATE | c + n + p | DUAL GATE | n |
| 162 | DUAL GATE | c + n + p | DUAL GATE | c |

FIG. 51

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 163 | DUAL GATE | p | TOP GATE | p |
| 164 | DUAL GATE | p | TOP GATE | n |
| 165 | DUAL GATE | n | TOP GATE | n |
| 166 | DUAL GATE | n | TOP GATE | p |
| 167 | DUAL GATE | c | TOP GATE | p |
| 168 | DUAL GATE | c | TOP GATE | n |
| 169 | DUAL GATE | c | TOP GATE | c |
| 170 | DUAL GATE | p | TOP GATE | c |
| 171 | DUAL GATE | n | TOP GATE | c |
| 172 | DUAL GATE | p | BOTTOM GATE | p |
| 173 | DUAL GATE | p | BOTTOM GATE | n |
| 174 | DUAL GATE | n | BOTTOM GATE | n |
| 175 | DUAL GATE | n | BOTTOM GATE | p |
| 176 | DUAL GATE | c | BOTTOM GATE | p |
| 177 | DUAL GATE | c | BOTTOM GATE | n |
| 178 | DUAL GATE | c | BOTTOM GATE | c |
| 179 | DUAL GATE | p | BOTTOM GATE | c |
| 180 | DUAL GATE | n | BOTTOM GATE | c |
| 181 | DUAL GATE | p | DUAL GATE | p |
| 182 | DUAL GATE | p | DUAL GATE | n |
| 183 | DUAL GATE | n | DUAL GATE | n |
| 184 | DUAL GATE | n | DUAL GATE | p |
| 185 | DUAL GATE | c | DUAL GATE | p |
| 186 | DUAL GATE | c | DUAL GATE | n |
| 187 | DUAL GATE | c | DUAL GATE | c |
| 188 | DUAL GATE | p | DUAL GATE | c |
| 189 | DUAL GATE | n | DUAL GATE | c |

FIG. 52

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 190 | DUAL GATE | c + n | TOP GATE | p |
| 191 | DUAL GATE | c + n | TOP GATE | n |
| 192 | DUAL GATE | c + n | TOP GATE | c |
| 193 | DUAL GATE | c + p | TOP GATE | p |
| 194 | DUAL GATE | c + p | TOP GATE | n |
| 195 | DUAL GATE | c + p | TOP GATE | c |
| 196 | DUAL GATE | c + n + p | TOP GATE | p |
| 197 | DUAL GATE | c + n + p | TOP GATE | n |
| 198 | DUAL GATE | c + n + p | TOP GATE | c |
| 199 | DUAL GATE | c + n | BOTTOM GATE | p |
| 200 | DUAL GATE | c + n | BOTTOM GATE | n |
| 201 | DUAL GATE | c + n | BOTTOM GATE | c |
| 202 | DUAL GATE | c + p | BOTTOM GATE | p |
| 203 | DUAL GATE | c + p | BOTTOM GATE | n |
| 204 | DUAL GATE | c + p | BOTTOM GATE | c |
| 205 | DUAL GATE | c + n + p | BOTTOM GATE | p |
| 206 | DUAL GATE | c + n + p | BOTTOM GATE | n |
| 207 | DUAL GATE | c + n + p | BOTTOM GATE | c |
| 208 | DUAL GATE | c + n | DUAL GATE | p |
| 209 | DUAL GATE | c + n | DUAL GATE | n |
| 210 | DUAL GATE | c + n | DUAL GATE | c |
| 211 | DUAL GATE | c + p | DUAL GATE | p |
| 212 | DUAL GATE | c + p | DUAL GATE | n |
| 213 | DUAL GATE | c + p | DUAL GATE | c |
| 214 | DUAL GATE | c + n + p | DUAL GATE | p |
| 215 | DUAL GATE | c + n + p | DUAL GATE | n |
| 216 | DUAL GATE | c + n + p | DUAL GATE | c |

FIG. 54

| TYPE OF SILICON OF MOSTFT | TYPE OF MOSTFT | |
|---|---|---|
| | PERIPHERAL DRIVING CIRCUIT SECTION | DISPLAY SECTION |
| SINNGLE-CRYSTAL | cMOS, n OR pMOS, OR cMOS + pMOS + nMOS | n OR pMOS OR cMOS |
| POLY-CRYSTALLINE | cMOS, n OR pMOS, OR cMOS + pMOS + nMOS | n OR pMOS OR cMOS |
| AMORPHOUS | — | n OR pMOS OR cMOS |

LIGHT

SINGLE-CRYSTAL
SILICON MOS TFT

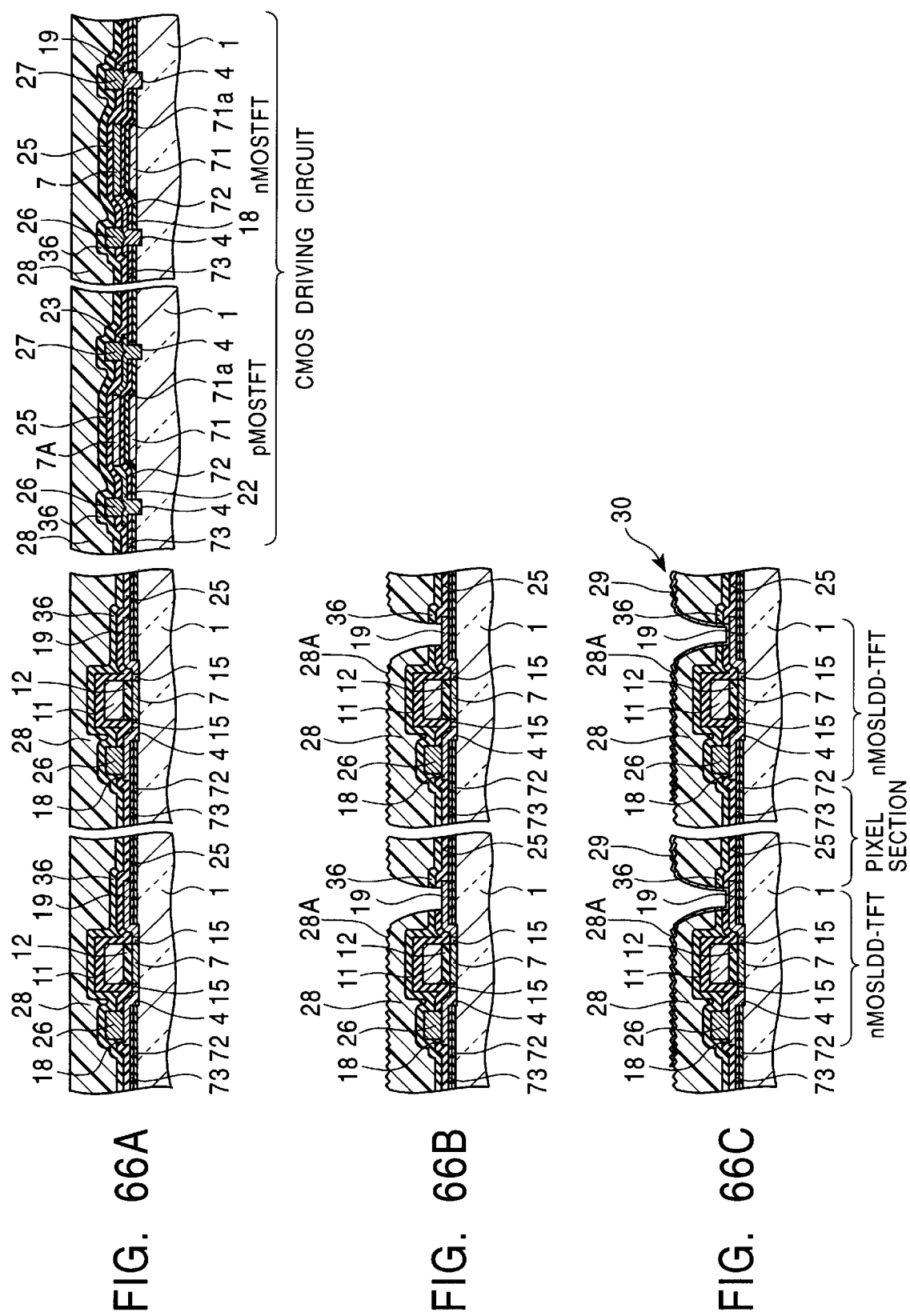

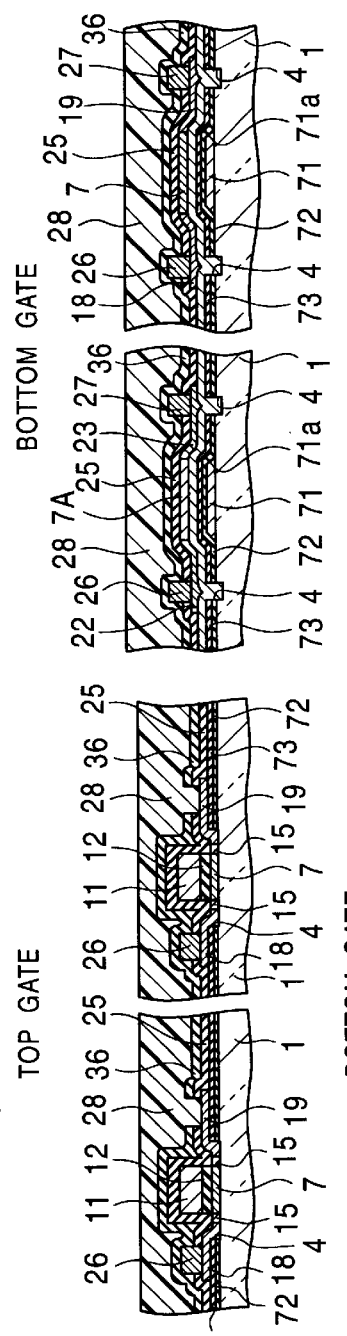
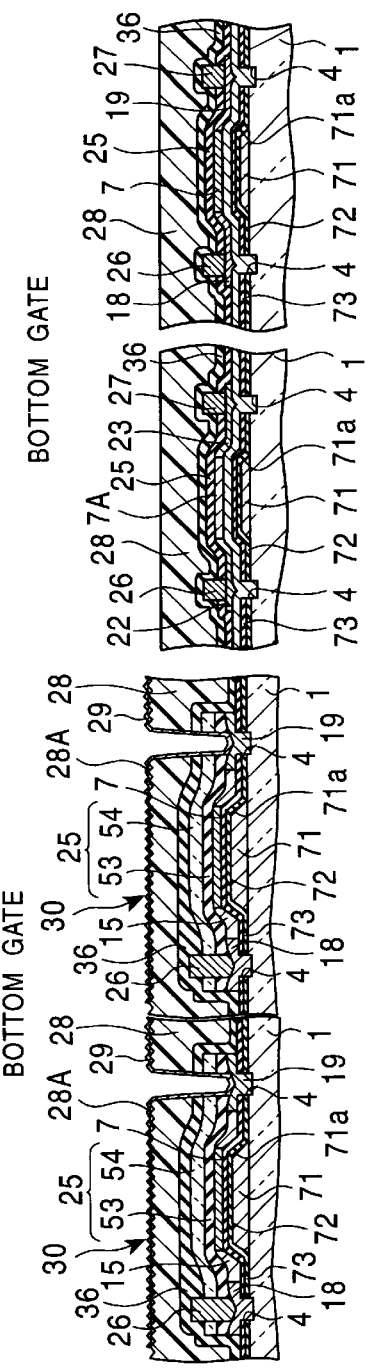
FIG. 67A
FIG. 67B
FIG. 67C

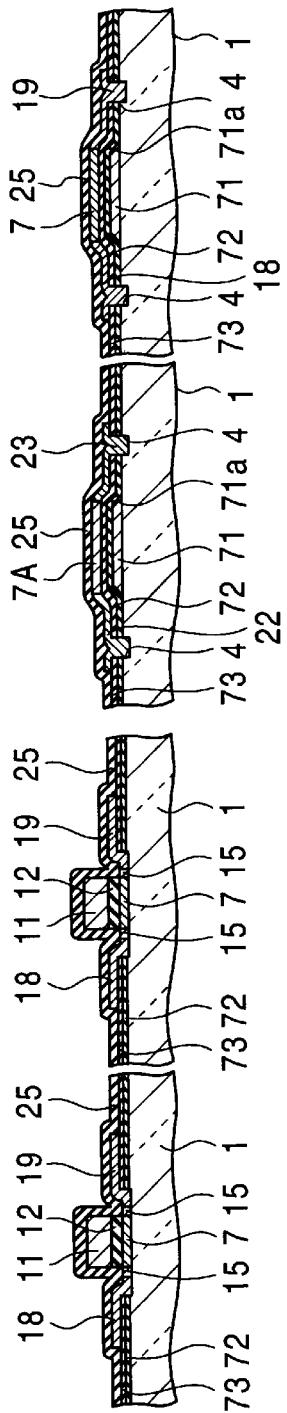
FIG. 68A
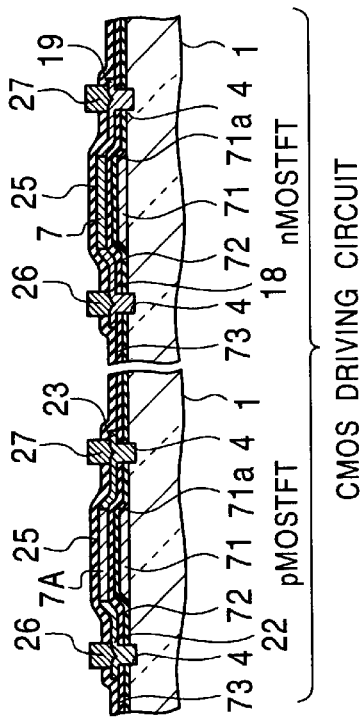
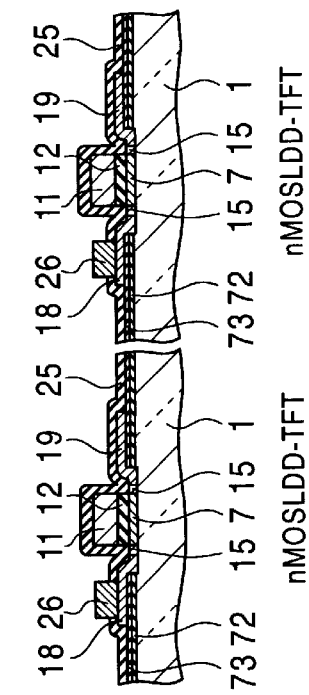
FIG. 68B

FIG. 70

| No. | PERIPHERAL DRIVING CIRCUIT SECTION | DISPLAY SECTION |
|---|---|---|
| 1 | BOTTOM-GATE TYPE | TOP-GATE TYPE |
| 2 | BOTTOM-GATE TYPE | BOTTOM-GATE TYPE |
| 3 | BOTTOM-GATE TYPE | DUAL-GATE TYPE |
| 4 | TOP-GATE TYPE + BOTTOM-GATE TYPE | TOP-GATE TYPE |
| 5 | TOP-GATE TYPE + BOTTOM-GATE TYPE | BOTTOM-GATE TYPE |
| 6 | TOP-GATE TYPE + BOTTOM-GATE TYPE | DUAL-GATE TYPE |
| 7 | BOTTOM-GATE TYPE + DUAL-GATE TYPE | TOP-GATE TYPE |
| 8 | BOTTOM-GATE TYPE + DUAL-GATE TYPE | BOTTOM-GATE TYPE |
| 9 | BOTTOM-GATE TYPE + DUAL-GATE TYPE | DUAL-GATE TYPE |
| 10 | TOP-GATE TYPE + BOTTOM-GATE TYPE + DUAL-GATE TYPE | TOP-GATE TYPE |
| 11 | TOP-GATE TYPE + BOTTOM-GATE TYPE + DUAL-GATE TYPE | BOTTOM-GATE TYPE |
| 12 | TOP-GATE TYPE + BOTTOM-GATE TYPE + DUAL-GATE TYPE | DUAL-GATE TYPE |

FIG. 71

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 1 | BOTTOM GATE | p | TOP GATE | p |
| 2 | BOTTOM GATE | p | TOP GATE | n |
| 3 | BOTTOM GATE | n | TOP GATE | n |
| 4 | BOTTOM GATE | n | TOP GATE | p |
| 5 | BOTTOM GATE | c | TOP GATE | p |
| 6 | BOTTOM GATE | c | TOP GATE | n |
| 7 | BOTTOM GATE | c | TOP GATE | c |
| 8 | BOTTOM GATE | p | TOP GATE | c |
| 9 | BOTTOM GATE | n | TOP GATE | c |
| 10 | BOTTOM GATE | p | BOTTOM GATE | p |
| 11 | BOTTOM GATE | p | BOTTOM GATE | n |
| 12 | BOTTOM GATE | n | BOTTOM GATE | n |
| 13 | BOTTOM GATE | n | BOTTOM GATE | p |
| 14 | BOTTOM GATE | c | BOTTOM GATE | p |
| 15 | BOTTOM GATE | c | BOTTOM GATE | n |
| 16 | BOTTOM GATE | c | BOTTOM GATE | c |
| 17 | BOTTOM GATE | p | BOTTOM GATE | c |
| 18 | BOTTOM GATE | n | BOTTOM GATE | c |
| 19 | BOTTOM GATE | p | DUAL GATE | p |
| 20 | BOTTOM GATE | p | DUAL GATE | n |
| 21 | BOTTOM GATE | n | DUAL GATE | n |
| 22 | BOTTOM GATE | n | DUAL GATE | p |
| 23 | BOTTOM GATE | c | DUAL GATE | p |
| 24 | BOTTOM GATE | c | DUAL GATE | n |
| 25 | BOTTOM GATE | c | DUAL GATE | c |
| 26 | BOTTOM GATE | p | DUAL GATE | c |
| 27 | BOTTOM GATE | n | DUAL GATE | c | p : p-CHANNEL TYPE n : n-CHANNEL TYPE c : COMPLEMENTARY TYPE OF COMBINATION OF p-CHANNEL TYPE AND n-CHANNEL TYPE

FIG. 72

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 28 | BOTTOM GATE | c + n | TOP GATE | p |
| 29 | BOTTOM GATE | c + n | TOP GATE | n |
| 30 | BOTTOM GATE | c + n | TOP GATE | c |
| 31 | BOTTOM GATE | c + p | TOP GATE | p |
| 32 | BOTTOM GATE | c + p | TOP GATE | n |
| 33 | BOTTOM GATE | c + p | TOP GATE | c |
| 34 | BOTTOM GATE | c + n + p | TOP GATE | p |
| 35 | BOTTOM GATE | c + n + p | TOP GATE | n |
| 36 | BOTTOM GATE | c + n + p | TOP GATE | c |
| 37 | BOTTOM GATE | c + n | BOTTOM GATE | p |
| 38 | BOTTOM GATE | c + n | BOTTOM GATE | n |
| 39 | BOTTOM GATE | c + n | BOTTOM GATE | c |
| 40 | BOTTOM GATE | c + p | BOTTOM GATE | p |
| 41 | BOTTOM GATE | c + p | BOTTOM GATE | n |
| 42 | BOTTOM GATE | c + p | BOTTOM GATE | c |
| 43 | BOTTOM GATE | c + n + p | BOTTOM GATE | p |
| 44 | BOTTOM GATE | c + n + p | BOTTOM GATE | n |
| 45 | BOTTOM GATE | c + n + p | BOTTOM GATE | c |
| 46 | BOTTOM GATE | c + n | DUAL GATE | p |
| 47 | BOTTOM GATE | c + n | DUAL GATE | n |
| 48 | BOTTOM GATE | c + n | DUAL GATE | c |
| 49 | BOTTOM GATE | c + p | DUAL GATE | p |
| 50 | BOTTOM GATE | c + p | DUAL GATE | n |
| 51 | BOTTOM GATE | c + p | DUAL GATE | c |
| 52 | BOTTOM GATE | c + n + p | DUAL GATE | p |
| 53 | BOTTOM GATE | c + n + p | DUAL GATE | n |
| 54 | BOTTOM GATE | c + n + p | DUAL GATE | c |

FIG. 73

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 55 | BOTTOM GATE | p | TOP GATE | p |
| 56 | BOTTOM GATE | p | TOP GATE | n |
| 57 | BOTTOM GATE | n | TOP GATE | n |
| 58 | BOTTOM GATE | n | TOP GATE | p |
| 59 | BOTTOM GATE | c | TOP GATE | p |
| 60 | BOTTOM GATE | c | TOP GATE | n |
| 61 | BOTTOM GATE | c | TOP GATE | c |
| 62 | BOTTOM GATE | p | TOP GATE | c |
| 63 | BOTTOM GATE | n | TOP GATE | c |
| 64 | BOTTOM GATE | p | BOTTOM GATE | p |
| 65 | BOTTOM GATE | p | BOTTOM GATE | n |
| 66 | BOTTOM GATE | n | BOTTOM GATE | n |
| 67 | BOTTOM GATE | n | BOTTOM GATE | p |
| 68 | BOTTOM GATE | c | BOTTOM GATE | p |
| 69 | BOTTOM GATE | c | BOTTOM GATE | n |
| 70 | BOTTOM GATE | c | BOTTOM GATE | c |
| 71 | BOTTOM GATE | p | BOTTOM GATE | c |
| 72 | BOTTOM GATE | n | BOTTOM GATE | c |
| 73 | BOTTOM GATE | p | DUAL GATE | p |
| 74 | BOTTOM GATE | p | DUAL GATE | n |
| 75 | BOTTOM GATE | n | DUAL GATE | n |
| 76 | BOTTOM GATE | n | DUAL GATE | p |
| 77 | BOTTOM GATE | c | DUAL GATE | p |
| 78 | BOTTOM GATE | c | DUAL GATE | n |
| 79 | BOTTOM GATE | c | DUAL GATE | c |
| 80 | BOTTOM GATE | p | DUAL GATE | c |
| 81 | BOTTOM GATE | n | DUAL GATE | c |

FIG. 74

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 82 | BOTTOM GATE | c + n | TOP GATE | p |
| 83 | BOTTOM GATE | c + n | TOP GATE | n |
| 84 | BOTTOM GATE | c + n | TOP GATE | c |
| 85 | BOTTOM GATE | c + p | TOP GATE | p |
| 86 | BOTTOM GATE | c + p | TOP GATE | n |
| 87 | BOTTOM GATE | c + p | TOP GATE | c |
| 88 | BOTTOM GATE | c + n + p | TOP GATE | p |
| 89 | BOTTOM GATE | c + n + p | TOP GATE | n |
| 90 | BOTTOM GATE | c + n + p | TOP GATE | c |
| 91 | BOTTOM GATE | c + n | BOTTOM GATE | p |
| 92 | BOTTOM GATE | c + n | BOTTOM GATE | n |
| 93 | BOTTOM GATE | c + n | BOTTOM GATE | c |
| 94 | BOTTOM GATE | c + p | BOTTOM GATE | p |
| 95 | BOTTOM GATE | c + p | BOTTOM GATE | n |
| 96 | BOTTOM GATE | c + p | BOTTOM GATE | c |
| 97 | BOTTOM GATE | c + n + p | BOTTOM GATE | p |
| 98 | BOTTOM GATE | c + n + p | BOTTOM GATE | n |
| 99 | BOTTOM GATE | c + n + p | BOTTOM GATE | c |
| 100 | BOTTOM GATE | c + n | DUAL GATE | p |
| 101 | BOTTOM GATE | c + n | DUAL GATE | n |
| 102 | BOTTOM GATE | c + n | DUAL GATE | c |
| 103 | BOTTOM GATE | c + p | DUAL GATE | p |
| 104 | BOTTOM GATE | c + p | DUAL GATE | n |
| 105 | BOTTOM GATE | c + p | DUAL GATE | c |
| 106 | BOTTOM GATE | c + n + p | DUAL GATE | p |
| 107 | BOTTOM GATE | c + n + p | DUAL GATE | n |
| 108 | BOTTOM GATE | c + n + p | DUAL GATE | c |

FIG. 75

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 109 | BOTTOM GATE | p | TOP GATE | p |
| 110 | BOTTOM GATE | p | TOP GATE | n |
| 111 | BOTTOM GATE | n | TOP GATE | n |
| 112 | BOTTOM GATE | n | TOP GATE | p |
| 113 | BOTTOM GATE | c | TOP GATE | p |
| 114 | BOTTOM GATE | c | TOP GATE | n |
| 115 | BOTTOM GATE | c | TOP GATE | c |
| 116 | BOTTOM GATE | p | TOP GATE | c |
| 117 | BOTTOM GATE | n | TOP GATE | c |
| 118 | BOTTOM GATE | p | BOTTOM GATE | p |
| 119 | BOTTOM GATE | p | BOTTOM GATE | n |
| 120 | BOTTOM GATE | n | BOTTOM GATE | n |
| 121 | BOTTOM GATE | n | BOTTOM GATE | p |
| 122 | BOTTOM GATE | c | BOTTOM GATE | p |
| 123 | BOTTOM GATE | c | BOTTOM GATE | n |
| 124 | BOTTOM GATE | c | BOTTOM GATE | c |
| 125 | BOTTOM GATE | p | BOTTOM GATE | c |
| 126 | BOTTOM GATE | n | BOTTOM GATE | c |
| 127 | BOTTOM GATE | p | DUAL GATE | p |
| 128 | BOTTOM GATE | p | DUAL GATE | n |
| 129 | BOTTOM GATE | n | DUAL GATE | n |
| 130 | BOTTOM GATE | n | DUAL GATE | p |
| 131 | BOTTOM GATE | c | DUAL GATE | p |
| 132 | BOTTOM GATE | c | DUAL GATE | n |
| 133 | BOTTOM GATE | c | DUAL GATE | c |
| 134 | BOTTOM GATE | p | DUAL GATE | c |
| 135 | BOTTOM GATE | n | DUAL GATE | c |

FIG. 76

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 136 | BOTTOM GATE | c + n | TOP GATE | p |
| 137 | BOTTOM GATE | c + n | TOP GATE | n |
| 138 | BOTTOM GATE | c + n | TOP GATE | c |
| 139 | BOTTOM GATE | c + p | TOP GATE | p |
| 140 | BOTTOM GATE | c + p | TOP GATE | n |
| 141 | BOTTOM GATE | c + p | TOP GATE | c |
| 142 | BOTTOM GATE | c + n + p | TOP GATE | p |
| 143 | BOTTOM GATE | c + n + p | TOP GATE | n |
| 144 | BOTTOM GATE | c + n + p | TOP GATE | c |
| 145 | BOTTOM GATE | c + n | BOTTOM GATE | p |
| 146 | BOTTOM GATE | c + n | BOTTOM GATE | n |
| 147 | BOTTOM GATE | c + n | BOTTOM GATE | c |
| 148 | BOTTOM GATE | c + p | BOTTOM GATE | p |
| 149 | BOTTOM GATE | c + p | BOTTOM GATE | n |
| 150 | BOTTOM GATE | c + p | BOTTOM GATE | c |
| 151 | BOTTOM GATE | c + n + p | BOTTOM GATE | p |
| 152 | BOTTOM GATE | c + n + p | BOTTOM GATE | n |
| 153 | BOTTOM GATE | c + n + p | BOTTOM GATE | c |
| 154 | BOTTOM GATE | c + n | DUAL GATE | p |
| 155 | BOTTOM GATE | c + n | DUAL GATE | n |
| 156 | BOTTOM GATE | c + n | DUAL GATE | c |
| 157 | BOTTOM GATE | c + p | DUAL GATE | p |
| 158 | BOTTOM GATE | c + p | DUAL GATE | n |
| 159 | BOTTOM GATE | c + p | DUAL GATE | c |
| 160 | BOTTOM GATE | c + n + p | DUAL GATE | p |
| 161 | BOTTOM GATE | c + n + p | DUAL GATE | n |
| 162 | BOTTOM GATE | c + n + p | DUAL GATE | c |

FIG. 77

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 163 | BOTTOM GATE | p | TOP GATE | p |
| 164 | BOTTOM GATE | p | TOP GATE | n |
| 165 | BOTTOM GATE | n | TOP GATE | n |
| 166 | BOTTOM GATE | n | TOP GATE | p |
| 167 | BOTTOM GATE | c | TOP GATE | p |
| 168 | BOTTOM GATE | c | TOP GATE | n |
| 169 | BOTTOM GATE | c | TOP GATE | c |
| 170 | BOTTOM GATE | p | TOP GATE | c |
| 171 | BOTTOM GATE | n | TOP GATE | c |
| 172 | BOTTOM GATE | p | BOTTOM GATE | p |
| 173 | BOTTOM GATE | p | BOTTOM GATE | n |
| 174 | BOTTOM GATE | n | BOTTOM GATE | n |
| 175 | BOTTOM GATE | n | BOTTOM GATE | p |
| 176 | BOTTOM GATE | c | BOTTOM GATE | p |
| 177 | BOTTOM GATE | c | BOTTOM GATE | n |
| 178 | BOTTOM GATE | c | BOTTOM GATE | c |
| 179 | BOTTOM GATE | p | BOTTOM GATE | c |
| 180 | BOTTOM GATE | n | BOTTOM GATE | c |
| 181 | BOTTOM GATE | p | DUAL GATE | p |
| 182 | BOTTOM GATE | p | DUAL GATE | n |
| 183 | BOTTOM GATE | n | DUAL GATE | n |
| 184 | BOTTOM GATE | n | DUAL GATE | p |
| 185 | BOTTOM GATE | c | DUAL GATE | p |
| 186 | BOTTOM GATE | c | DUAL GATE | n |
| 187 | BOTTOM GATE | c | DUAL GATE | c |
| 188 | BOTTOM GATE | p | DUAL GATE | c |
| 189 | BOTTOM GATE | n | DUAL GATE | c |

FIG. 78

| No. | TFTS IN PERIPHERAL DRIVING CIRCUIT | | TFT IN DISPLAY SECTION | |
|---|---|---|---|---|
| | GATE STRUCTURE | CHANNEL CONDUCTIVE TYPE | GATE STRUCTURE | CHANNEL CONDUCTIVE TYPE |
| 190 | BOTTOM GATE | c + n | TOP GATE | p |
| 191 | BOTTOM GATE | c + n | TOP GATE | n |
| 192 | BOTTOM GATE | c + n | TOP GATE | c |
| 193 | BOTTOM GATE | c + p | TOP GATE | p |
| 194 | BOTTOM GATE | c + p | TOP GATE | n |
| 195 | BOTTOM GATE | c + p | TOP GATE | c |
| 196 | BOTTOM GATE | c + n + p | TOP GATE | p |
| 197 | BOTTOM GATE | c + n + p | TOP GATE | n |
| 198 | BOTTOM GATE | c + n + p | TOP GATE | c |
| 199 | BOTTOM GATE | c + n | BOTTOM GATE | p |
| 200 | BOTTOM GATE | c + n | BOTTOM GATE | n |
| 201 | BOTTOM GATE | c + n | BOTTOM GATE | c |
| 202 | BOTTOM GATE | c + p | BOTTOM GATE | p |
| 203 | BOTTOM GATE | c + p | BOTTOM GATE | n |
| 204 | BOTTOM GATE | c + p | BOTTOM GATE | c |
| 205 | BOTTOM GATE | c + n + p | BOTTOM GATE | p |
| 206 | BOTTOM GATE | c + n + p | BOTTOM GATE | n |
| 207 | BOTTOM GATE | c + n + p | BOTTOM GATE | c |
| 208 | BOTTOM GATE | c + n | DUAL GATE | p |
| 209 | BOTTOM GATE | c + n | DUAL GATE | n |
| 210 | BOTTOM GATE | c + n | DUAL GATE | c |
| 211 | BOTTOM GATE | c + p | DUAL GATE | p |
| 212 | BOTTOM GATE | c + p | DUAL GATE | n |
| 213 | BOTTOM GATE | c + p | DUAL GATE | c |
| 214 | BOTTOM GATE | c + n + p | DUAL GATE | p |
| 215 | BOTTOM GATE | c + n + p | DUAL GATE | n |
| 216 | BOTTOM GATE | c + n + p | DUAL GATE | c |

METHOD OF PRODUCING ELECTROOPTICAL DEVICE AND METHOD OF PRODUCING DRIVING SUBSTRATE FOR DRIVING ELECTROOPTICAL DEVICE

BACKGROUND OF THE INVENTION

The present invention relates to a method of producing an electrooptical device and also to a method of producing a driving substrate for such an electrooptical device, the method being particularly suitable for production of, for example, a liquid crystal display device having an active region and a passive region, wherein the active region including a thin-film insulating-gate field-effect transistor of dual-gate type (hereinafter referred to as dual-gate MOSTFT)or of a bottom-gate type (hereinafter referred to as bottom-gate MOSTFT) using a single-crystal silicon layer grown by graphoepitaxy on an insulating substrate. The bottom-gate MOSTFT includes both an inverse-stagger NSI type and an inverse stagger ISI type MOSTFTS.

Various types of active-matrix liquid crystal displays are known: for example, a liquid crystal display having a display section using amorphous silicon for TFTS and an IC for an external driving circuit; a liquid crystal display integrating a driving circuit and a display section using solid-phase-deposited polycrystalline silicon for TFTS, as disclosed in Japanese Patent Application Laid-Open No. 6-242433); and a liquid crystal display device integrating a driving circuit and a display section using excimer laser annealing polycrystalline silicon TFTs, as disclosed in Japanese Patent Application Laid-Open No. 7-131030.

Although these known amorphous silicon TFTs have high productivity, they are not suitable for production of p-channel MOSTFTs (hereinafter referred to as pMOSTFTs) due to a low electron mobility of 0.5 to 1.0 $cm^2/v \cdot sec$. Since a peripheral driving section using pMOSTFTs and a display section cannot be formed on the same substrate, the driver IC must be an external component, which is mounted by, for example, a tape automated bonding (TAB) method, causing an impediment to reduction of the cost. This configuration inhibits production of high-resolution devices. Furthermore, the electron mobility as small as 0.5 to 1.0 $cm^2/v \cdot sec$ can produce only a small ON current; hence, the size of the transistors in the display section is inevitably large, resulting in a small aperture ratio of pixels.

Conventional polycrystalline silicon TFTs have an electron mobility of 70 to 100 $cm^2/v \cdot sec$ and can facilitate production of high-resolution devices, so that liquid crystal displays (LCDS) which use polycrystalline silicon and which are integrated with driving circuits are becoming conspicuous. The above electron mobility, however, is insufficient for driving a large LCD of 15 inches or more, and thus ICs for an external driving circuit are still required.

TFTs using polycrystalline silicon formed by a solid-phase deposition process require annealing at a temperature of 600° C. or more for ten or more hours and thermal oxidation at approximately 1,000° C. to form a gate $SiO_2$ layer, necessitating the use of a semiconductor production apparatus. Thus, the wafer size is limited to 8 to 12 inches and the use of expensive heat-resistant quartz glass is inevitable, causing an impediment to reduction in the cost. Thus, the use of such TFTs is limited to EVF and audiovisual (AV) projectors.

Polycrystalline silicon TFTs produced by excimer laser annealing have many problems, including unstable output of the excimer lasers, low productivity, increasing price of the apparatus with increasing size, low yield and low quality. These problems are pronounced when large glass substrates having a side length of, for example, 1 meter are used.

SUMMARY OF THE INVENTION

It is an object of the present invention is to make it possible to produce an active matrix substrate incorporating a high-performance driver, as well as an electrooptical device which is typically a display thin-film semiconductor device using such an active matrix substrate, through a uniform deposition of a single-crystal silicon layer having high electron/hole mobility particularly in a peripheral-driving-circuit section.

It is also an object of the present invention to implement a structure in which a display section and a peripheral-driving-circuit portion are integrated, wherein the display section comprises an n-channel MOSTFT (referred to as "nMOSTFT", hereinafter) or a pMOSTFT employing an LDD (Lightly Doped Drain) structure having high switching characteristic and operable with reduced leak current, or a complementary insulating gate field effect transistor (referred to as cMOSTFT) having high driving performance, while the peripheral-driving-circuit is constituted by a cMOSTFT, nMOSTFT, pMOSTFT or a combination thereof.

It is also an object to implement a large-size display panel having high image quality, high definition, narrow peripheral frame and high efficiency, while allowing the use of a large-sized glass substrate having a comparatively low distortion point, and while achieving a high yield and reduction in the production cost due to elimination of necessity for the use of expensive production facilities, as well as easy control of the threshold value which permits reduction in the electrical resistance to offer high-speed of operation and greater size of the display.

To these ends, according to one aspect of the present invention, there is provided a method of producing an electrooptical device having a first substrate, i.e., a driving substrate, carrying a display section provided with pixel electrodes, e.g., pixel electrodes arranged in the form of a matrix, and a peripheral-driving-circuit section provided on a periphery of the display section, a second substrate, i.e., a counter substrate, and an optical material such as a liquid crystal disposed between the first substrate and the second substrate, as well as a method for producing the driving substrate for such an electrooptical device; the method comprising the steps of: a gate-forming step for forming a gate portion including a gate electrode and a gate insulating film on one face of the first substrate; a step-forming step for forming a step difference on the one face of the first substrate; a layer-forming step for forming a polycrystalline or amorphous silicon layer having a predetermined thickness on the first substrate having the gate portion and the step difference and then forming a low-melting-point metal layer on or under the polycrystalline or amorphous silicon layer, or of forming a low-melting-point metal layer containing silicon on the first substrate having the step difference; a heating step for dissolving silicon of the polycrystalline or amorphous layer or of the low-melting-point metal layer into the low-melting-point metal layer by heating; a deposition step for depositing on the first substrate a single-crystal semiconductor layer by allowing the silicon of the polycrystalline or amorphous silicon layer or of the low-melting-point metal layer to grow by graphoepitaxy by a cooling treatment using as a seed the step difference on the substrate; a treating step for effecting a predetermined treatment on the single-crystal semiconductor layer, thereby forming a channel region, a source region and a drain region; and a step for forming a first thin-film transistor MOSTFT) of dual-gate type having the gate portions on the above and below the channel region and constituting at least part of the peripheral-driving-circuit section. In accordance with the present invention, the thin-film transistor may be either a field effect transistor (FET) or a bipolar transistor, and the FET may be either a MOSFET or a junction type.

The present invention offers the following remarkable advantages (A) to (G), by virtue of the use of a single-crystal silicon layer as a dual-gate MOSTFT of a peripheral driving circuit as a driving substrate such as an active matrix substrate or as a dual-gate MOSTFT of a peripheral driving circuit of an electrooptical device such as an LCD of the type having a display-driver integrated structure, wherein the single-crystal silicon layer is graphoepitaxially grown from a polycrystalline or amorphous silicon layer or from a low-melting-point metal layer using the step difference formed on the substrate as a seed.

(A) It is possible to produce an electrooptical device such as a display thin-film semiconductor device incorporating a high-performance driver, by virtue of the use of a single-crystal silicon layer having a high electron mobility of 540 $cm^2$/v·sec or higher that has been grown by graphoepitaxy conducted by using as a seed the bottom corner of a step of a predetermined size and shape formed on a substrate. Preferably, the step is formed to provide an indented section having such a cross-section that both side faces of the indented section are perpendicular to the bottom or slanted to form a basilar angle of not greater than 90° with respect to the bottom face of the indented section.

(B) Since the single-crystal silicon thin-film has high electron and hole mobility, single-crystal silicon top-gate MOSTFTs can form a structure having a display section and a peripheral driving circuit section integrated with each other, wherein the display section has nMOSTFTs, pMOSTFTS or cMOSTFTs having high switching characteristics and, preferably, a lightly-doped drain (LDD) structure that reduces leak current through reducing the electric field intensity, while the peripheral driving circuit includes cMOSTFTs, nMOSTFTs, pMOSTFTs, or a combination thereof, having high driving characteristics, whereby production of a large display panel with high quality, high definition, a narrow frame, and high efficiency is facilitated. In contrast to pMOSTFT that can hardly provide high hole mobility, the single-crystal silicon thin-film has high hole mobility and, therefore, a peripheral driving circuit for driving electrons and holes independently or in combination can be implemented and integrated with display TFTs of nMOS, pMOS or cMOS LDD-type. In a compact or small panel, either of a pair of vertical peripheral driving circuits may be omitted.

(C) In particular, the use of dual-gate MOSTFTs in the peripheral driving circuit makes it possible to obtain cMOS, nMOS or pMOSTFTs having driving power 1.5 to 2.0 times as large that obtainable with the use of single-gate TFTs, thus achieving higher performance and greater driving power of the TFTs, offering advantages particularly when TFTs having large driving power are to be used in a local portion of the peripheral driving circuit. For instance, this feature not only allows omission of one of a pair of peripheral vertical driver circuits but also enables the present invention to be advantageously applied to organic ELs and FEDS. Furthermore, the dual-gate structure can easily be changed to a top-gate type structure or a bottom-gate type structure through a selection of one of the upper and lower gates and, in addition, ensures safe operation even in the event of a failure in one of the upper.and lower gates because the other gate can safely be used.

(D) The polycrystalline or amorphous silicon layer can be formed by a plasma-enhanced or reduced-pressure CVD process at a substrate temperature of 100 to 400° C., by using the above-mentioned step difference as a seed for the graphoepitaxy, and the low-melting-point metal layer can be formed by a vacuum evaporation process or a sputtering process and, in addition, the above-mentioned epitaxial growth of silicon can be achieved at a comparatively low heating temperature of, for example, 930° C., so that the single-crystal silicon layer can be uniformly formed on the insulating substrate at a relatively low temperature of, for example, 400 to 450° C.

(E) The method in accordance with the present invention does not include annealing at a middle temperature (approximately 600° C.) for more than ten hours and excimer laser annealing that are required in solid-phase growth, thus offering a greater yield and reduction in the production cost due to elimination of the use of an expensive production facility.

(F) In the graphoepitaxy in the present invention, a single-crystal silicon thin-film having a variety of P-type impurity concentration and high mobility can be readily produced by adjusting the ratio of polycrystalline silicon or amorphous silicon to a low-melting-point metal, the heating temperature of the substrate, and the cooling rate, thus enabling easy control of the threshold voltage (Vth) of the device, which in turn enables the device to operate at a high speed due to reduced resistance.

(G) The low-melting-point metal layer containing polycrystalline or amorphous silicon when deposited may be doped with an adequate amount of Group III or V impurity, such as boron, phosphorus, antimony, arsenic, bismuth or aluminum, so that the type and the concentration of the impurity in the epitaxial single-crystal silicon, that is, the type (P-type or N-type) and the carrier concentration, are controllable.

In accordance with the present invention, it is preferred to form the aforementioned step difference in the insulating substrate or in a diffusion barrier such as a film of silicon nitride (referred to as SiN, hereinafter) or both in the insulating substrate and the diffusion barrier, so as to provide an indented section having such a cross-section that both side faces of the indented section are perpendicular to the bottom or slanted to form a basilar angle of not greater than 90° with respect to the bottom face of the indented section, and to use this step difference as a seed for the graphoepitaxy of the single-crystal silicon layer. Preferably, the step difference is formed along at least one side of a device region including the channel region, the source region and the drain region of the first thin-film transistor. When a passive device such as a resistor is formed of the aforementioned single-crystal silicon layer, the step difference is formed along at least one side of the device region in which the resistor is formed.

The first thin-film transistor such as MOSTFT may be formed inside, outside or both inside and outside the indented section defined by the step difference.

The step difference may be formed by a dry etching process, such as a reactive ion etching process, and the polycrystalline or amorphous silicon layer is formed preferably by a low-temperature deposition process at a substrate temperature of 100 to 400° C., for example, a reduced-pressure CVD process, a catalytic CVD process, a plasma-enhanced CVD process, or a sputtering process so that the thickness becomes several μm to 0.005 μm, followed by the deposition of the low-melting-point metal layer by a vacuum evaporation process or a sputtering process so that the thickness becomes several tens to several hundreds times the thickness of the polycrystalline or amorphous silicon layer, and then the aforesaid heating treatment is executed.

In this case, the low-melting-point metal layer may be formed above or below the polycrystalline or amorphous silicon layer formed by the low-temperature deposition process. Alternatively, the aforementioned low-melting-point metal layer containing silicon is deposited and then subjected to the heating treatment.

The substrate may be an insulating substrate, for example, a glass substrate or a heat-resistant organic substrate, and the low-melting-point metal layer may be formed of at least one metal selected from the group consisting of indium, gallium, tin, bismuth, lead, zinc, antimony and aluminum.

When the low-melting-point metal layer is formed of indium, this layer is heated preferably at 850 to 1,100° C. and more preferably 900 to 950° C. in a hydrogen-based atmosphere (pure hydrogen, a nitrogen-hydrogen mixture, or an argon-hydrogen mixture) to form an indium-silicon melt and, when the low-melting-point metal layer is formed of indium-gallium, this layer is heated preferably at 300 to 1,100° C. and more preferably 350 to 600° C. in a hydrogen-based atmosphere to form an indium-gallium-silicon melt, whereas, when the low-melting-point metal layer is formed of gallium, this layer is heated preferably at 400 to 1,100° C. and more preferably 420 to 600° C. in a hydrogen-based atmosphere to form a gallium-silicon melt. The substrate may be uniformly heated using an electrical furnace or a lamp or, alternatively, a predetermined region of the substrate may be locally heated using laser or electron beams.

With reference to FIG. 11, the melting point of the silicon-containing low-melting-point metal decreases as the content of the low-melting-point metal increases. The indium melt layer containing silicon, e.g., by 1 percent by weight, is formed at a substrate temperature of 850 to 1,100° C. when indium is used, because such a substrate temperature facilitates use of glass having low heat resistance, such as crystallized glass, in addition to quartz glass, as a substrate. A gallium melt layer containing 1 percent by weight of silicon may be formed at a temperature of 400 to 1,100° C. on any glass substrate.

When indium-gallium-silicon or gallium-silicon is used, a glass substrate having a low distortion point or a heat-resistant organic substrate can be used, so that a semiconductive crystalline layer can be formed on a large glass substrate having an area of, for example, 1 m², which is inexpensive and can readily be prepared in the form of a rolled long glass sheet. A single-crystal silicon thin-film can be formed continuously or discontinuously on the long glass or organic substrate by the described process employing graphoepitaxy.

Since the components of the glass having the low distortion point rapidly diffuse into the upper layer, a thin diffusion-barrier layer composed of, for example, silicon nitride having a thickness of 50 to 200 nm is preferably formed to suppress such diffusion. Thus, the polycrystalline or amorphous silicon layer or a silicon-containing low-melting-point metal layer is formed on the diffusion-barrier layer.

The silicon-containing low-melting-point metal layer is slowly cooled so that the single-crystal silicon layer is deposited by graphoepitaxy using the step difference as a seed, and then the low-melting-point metal layer is removed by, for example, hydrochloric acid, followed by a predetermined treatment to form an active device and a passive device.

After the low-melting-point metal layer such as of indium deposited on the single-crystal silicon layer after the cooling is dissolved and removed by, for example, hydrochloric acid, only a trace amount (approximately $10^{16}$ atoms/cc) of indium remains in the silicon layer, so that the single-crystal silicon layer becomes a p-type thin-film semiconductor. This layer is advantageous for production of a nMOSTFT. An n-type impurity such as phosphorus may be ion-implanted into the entire surface or selective regions of the single-crystal silicon layer to form an n-type single-crystal silicon thin-film, whereby a pMOSTFT can also be obtained. A cMOSTFT can also be formed. The polycrystalline or amorphous silicon layer or the silicon-containing low-melting-point metal layer may be doped with a Group III or V impurity having a large solubility, such as boron, phosphorus, antimony, arsenic, or bismuth, in a proper amount, during the deposition of this layer so as to control the type and/or the concentration of the impurity in the epitaxially grown silicon layer, that is, to control the doping type (n- or p-) and/or the concentration of the carrier.

Accordingly, the single-crystal silicon layer grown by graphoepitaxy on the substrate is used as a channel region, a source region and a drain region of a dual-gate MOSTFT which constitutes at least a part of the peripheral driving circuit, the type and the concentration of each region being controllable, as described above.

Thin-film transistors in the peripheral-driving-circuit section and the display section may constitute n-channel, p-channel or complementary insulating-gate field-effect transistors: for example, a thin-film transistor may comprise a combination of a complementary type and an n-channel type, a complementary type and a p-channel type, or a complementary type, an n-channel type and a p-channel type. Preferably at least a part of the thin-film transistors in the peripheral-driving-circuit section and/or the display section has a lightly-doped drain (LDD) structure of a single type having a LDD section between the gate and the source or drain, or of a double type having LDD sections between the gate and source and between the gate and the drain, respectively.

Preferably, the MOSTFT constitutes an LDD-type TFT of an nMOS, a pMOS or a cMOS in the display section, and a cMOSTFT, an nMOSTFT, a pMOSTFT, or a mixture thereof, in the peripheral-driving-circuit section.

The MOSTFT is preferably formed on at least one of the interior and the exterior of the indented section of the substrate.

In such a case, the step difference is formed on one surface of the first substrate, and a single-crystal, polycrystalline or amorphous silicon layer is formed on the surface having the step difference. The single-crystal, polycrystalline or amorphous silicon layer is used as a channel region, a source region and a drain region of a second thin-film transistor, and at least one gate section is provided above and/or below the channel region. That is, the second thin-film transistor may be a top-gate, bottom-gate or dual-gate thin-film transistor.

In this case also, the step difference forms an indented section having a cross-section in which a side face is perpendicular to or slanted to the bottom face so as to have a basilar angle of preferably 90° or less, and the step difference functions as a seed for graphoepitaxy of the single-crystal silicon layer.

The second thin-film transistor may be formed in a region including the indented section defined by the step difference formed in the first substrate and/or the film formed on the first substrate, and the graphoepitaxial single-crystal silicon layer may be used to form the source, drain and channel regions of the second thin-film transistor, as in the case of the first thin-film transistor.

In this second thin-film transistor also, the type and the concentration of the Group III or V impurity in the single-crystal, polycrystalline or amorphous silicon layer may be controlled as described above, and a step difference may be formed along at least one side of a device region including the channel region, the source region and the drain region of the second thin-film transistor. A gate electrode below the single-crystal, polycrystalline or amorphous silicon layer is preferably trapezoidal at the side end section. A diffusion-barrier layer may be provided between the first substrate and the single-crystal, polycrystalline or amorphous silicon layer.

The source or drain electrodes of the first and/or second thin-film transistors are preferably formed on a region including the step difference.

The first thin-film transistor may comprise at least the dual-gate type among a top-gate type having a gate section above the channel region, a bottom-gate type having a gate section below the channel region, and a dual-gate type having one gate section above and one below the channel region, and the switching device may comprise one of a top-gate second thin-film transistor, a bottom-gate second thin-film transistor and a dual-gate second thin-film transistor.

In this case, the gate section formed below the channel region in the bottom-gate or dual-gate second thin-film transistor preferably comprises a heat resistant material, and an upper-gate electrode of the second thin-film transistor and a gate electrode of the first thin-film transistor may comprise a common material.

The peripheral-driving-circuit section may comprise, in addition to the above-mentioned first thin-film transistor, at least one of a top-gate, bottom-gate or dual-gate thin-film transistor having a channel region of a polycrystalline or amorphous silicon layer and a gate region formed above or below the channel region, and may further comprise a diode, a resistor, a capacitor and an inductor, each comprising a single-crystal, polycrystalline or amorphous silicon layer.

Thin-film transistors in the peripheral driving circuit and/or the display section have a single-gate or a multi-gate configuration.

Preferably, when the n- or p-channel thin-film transistor in the peripheral-driving-circuit section and/or the display section is a dual-gate type, the upper or a lower-gate electrode is electrically opened or a given negative voltage for the n-channel type or a given positive voltage for the p-channel type is applied so that the dual-gate type thin-film transistors operate as bottom- or top-gate type thin-film transistors.

The thin-film transistor in the peripheral-driving-circuit section may be the first thin-film transistor of an n-channel, p-channel or complementary type, and the thin-film transistor in the display section may be an n-channel, p-channel or complementary type when the channel region is a single-crystal silicon layer, a polycrystalline silicon layer, or an amorphous silicon layer.

After the single-crystal silicon layer is deposited, an upper-gate section including a gate insulating film and a gate electrode may be formed on the single-crystal silicon layer, and the single-crystal silicon layer may be doped with a Group III or V impurity through the upper-gate section to form the channel region, the source region and the drain region.

When the second thin-film transistor is a bottom-gate type or a dual-gate type, a lower-gate electrode composed of a heat resistant material is provided below the channel region, and a gate insulating film is formed on the gate electrode to form a lower-gate section, and the second thin-film transistor is formed by the same steps including the step for forming the step difference as those in the first thin-film transistor. In such a case the upper-gate electrode of the second thin-film transistor and the gate electrode of the first thin-film transistor may be composed of a common material.

The single-crystal silicon layer formed on the lower-gate section may be doped with a Group III or V impurity to form a source region and a drain region, followed by an activation treatment.

The source and drain regions of the second thin-film transistor may be formed by ion-implantation of the above impurity on the single-crystal silicon layer through a resist mask and may be subjected to activation treatment, and the gate electrode of the first thin-film transistor, and the upper-gate electrode of the second thin-film transistor, if necessary, may be formed after the formation of the gate insulating film.

When the thin-film transistor is a top-gate type, the source and drain regions of the first and second thin-film transistors may be formed on the single-crystal silicon layer by ion implantation of the impurity through a resist mask and may be subjected to activation treatment, and then the gate sections including the gate insulating films and the gate electrodes of the first and second thin-film transistors may be formed.

Alternatively, when the thin-film transistor is of the top-gate type, the gate sections including the gate insulating films and the gate electrodes of the first and second thin-film transistors may be formed, and then the source and drain regions of the first and second thin-film transistors may be formed on the single-crystal silicon layer by ion implantation of the impurity through a resist mask, followed by an activation treatment.

The resist mask used when the LDD structure was formed may be left unremoved and the ion implantation for forming the source and drain regions may be performed through a resist mask which covers the remaining mask.

The substrate may be optically opaque or transparent, and may be provided with pixel electrodes for a reflective or transmissive display.

The display section may have a lamination configuration of the pixel electrodes and a color filter layer which may be formed on a display array, whereby the aperture ratio and the luminance are improved and costs can be decreased due to omission of a color filter substrate and improved productivity.

When the pixel electrodes are reflective electrodes, unevenness is preferably imparted to a resin film so that the resin film has optimized reflective characteristics and viewing-angle characteristics, and then the pixel electrodes are formed, whereas, when the pixel electrodes are transparent electrodes, the surface is preferably planarized by a transparent planarization film and then the pixel electrodes are formed on the planarized plane.

The display section is illuminated or dimmed by being driven by the above-described MOSTFT: for instance, the display section may comprise, for example, a liquid crystal display (LCD), an electroluminescent (EL) display, a field emission display (FED), a light-emitting polymer display (LEPD), or a light-emitting diode (LED) display. In this case, the arrangement may be such that a plurality of pixel electrodes are arranged in a matrix in the display section and a switching device is connected to each pixel electrode.

In accordance with a second aspect of the present invention, there is provided a method of producing an electrooptical device having a first substrate, i.e., a driving substrate, carrying a display section provided with pixel electrodes, e.g., pixel electrodes arranged in the form of a matrix, and a peripheral-driving-circuit section proivded on a periphery of the display section, a second substrate, i.e., a counter substrate, and an optical material such as a liquid crystald disposed between the first substrate and the second substrate, as well as a method for producing the driving substrate for such an electrooptical device, the method comprising the steps of:

a gete-forming step for forming a gate portion including a gaqte electrode andd a gate insulating film on one face of the first substrate;

a step-forming step for forming a step difference on the one face of the first substrate;

a layer-forming step for forming a melt layer of a low-melting-point metal containing silicon on the first substrate having the gate portion and the step difference;

a deposition step for deposititing a single-crystal silicon layer by allowing the silicon of the melt layer to grow by graphoepitaxy by a cooling treatment using as a seed the step difference on the substrate;

a step for effecting a predetermined treatment on the single-crystal silicon layer, thereby forming a channel region, a source region and a drain region; and a step for forming a first thin-film transistor (MOSTFT) of dual gate type having the gate portions on the above and below the channel region and constituting at least part of the peripheral-driving-sircuit section. In accordance with the second aspect of the present invention, the thin-film transistor may be either a field effect transistor (FET) or a bipolar transistor, and the FET may be either a MOSTFT or a junction type.

The second aspect of the present invention offers the following remarkable advantages (A) to (G), by virtue of the use of a single-crystal silicon layer as a dual-gate MOSTFT of a peripheral driving circuit as a driving substrate such as an active matrix substrate or as a dual-gate MOSTFT of a peripheral driving circuit of an electrooptical device such as an LCD of the type having a display-driver integrated structure, wherein the single-crystal silicon layer is graphoepitaxially grown from a melt of a low-melting-point metal containing silicon using the step difference formed on the substrate as a seed.

(A) It is possible to produce an electrooptical device such as a display thin-film semiconductor device incorporating a high-performance driver, by virtue of the use of a single-crystal silicon layer having a high electron mobility of 540 $cm^2/v \cdot sec$ or higher that has been grown by graphoepitaxy conducted by using as a seed the bottom corner of a step of a predetermined size and shape formed on a substrate. Preferably, the step is formed to provide an indented section having such a cross-section that both side faces of the indented section are perpendicular to the bottom or slanted to form a basilar angle of not greater than 90° with respect to the bottom face of the indented section.

(B) Since the single-crystal silicon thin-film has high electron and hole mobility, single-crystal silicon top-gate MOSTFTs can form a structure having a display section and a peripheral driving circuit section integrated with each other, wherein the display section has nMOSTFTs, pMOSTFTs or cMOSTFTs having high switching characteristics and, preferably, a lightly-doped drain (LDD) structure that reduces leak current through reducing the electric field intensity, while the peripheral driving circuit includes cMOSTFTs, nMOSTFTs, pMOSTFTs, or a combination thereof, having high driving characteristics, whereby production of a large display panel with high quality, high definition, a narrow frame, and high efficiency is facilitated. In contrast to pMOSTFT that can hardly provide high hole mobility, the single-crystal silicon thin-film has high hole mobility and, therefore, a peripheral driving circuit for driving electrons and holes independently or in combination can be implemented and integrated with display TFTs of nMOS, pMOS or cMOS LDD-type. In compact to medium-sized panels, one of a pair of vertical peripheral driving circuits may be omitted.

(C) In particular, the use of dual-gate MOSTFTs in the peripheral driving circuit makes it possible to obtain cMOS, nMOS or pMOSTFTs having driving power 1.5 to 2.0 times as large that obtainable with the use of single-gate TFTS, thus achieving higher performance and greater driving power of the TFTs, offering advantages particularly when TFTs having large driving power are to be used in a local portion of the peripheral driving circuit. For instance, this feature not only allows omission of one of a pair of peripheral vertical driver circuits but also enables the present invention to be advantageously applied to organic ELs and FEDS. Furthermore, the dual-gate structure can easily be changed to a top-gate type structure or a bottom-gate type structure through a selection of one of the upper and lower gates and, in addition, ensures safe operation even in the event of a failure in one of the upper and lower gates because the other gate can safely be used.

(D) The melt of the low-melting-point metal is prepared at a temperature of, for example, 350° C., by using the above-mentioned step difference as a seed for the graphoepitaxy, and the melt can be fromed on the substrate which is heated at a temperature slightly higher than the temperature of the melt by an application process, so that the single-crystal silicon film can be uniformly formed at a relatively low temperature of, for example, 300 to 400° C.

(E) The method in accordance with the present invention does not include annealing at a middle temperature (approximately 600° C.) for more than ten hours and excimer laser annealing that are required in solid-phase growth, thus offering a greater yield and reduction in the production cost due to elimination of the use of an expensive production facility.

(F) In the graphoepitaxy, a single-crystal silicon layer having a variety of P-type impurity concentration and high mobility can be readily produced by adjusting the composition ratio of the melt, the temperature of the melt, the heating temperature of the substrate, and the cooling rate, thus enabling easy control of the threshold voltage (Vth) of the device, which in turn enables the device to operate at a high speed due to reduced resistance.

(G) The melt layer of the low-melting-point metal containing silicon may be doped with an adequate amount of Group III or V impurity, such as boron, phosphorus, antimony, arsenic, bismuth or aluminum, so that the type and the concentration of the impurity in the epitaxial single-crystal silicon layer, that is, the type (P-type or N-type) and the carrier concentration, are controllable.

The step difference may be formed by a dry etching process, such as a reactive ion etching process, and the melt of the low-melting-point metal containing 2.0 to 0.005 percent by weight of, for example, 1 percent by weight of silicon may be applied to the heated insulating substrate and maintained for a predetermined period, for example, several to several tens of minutes, and then a cooling treatment may be performed. This can provide a single-crystal silicon layer having a thickness of several to 0.005 $\mu$m, for example, 1 $\mu$m.

The substrate may be an insulating substrate, for example, a glass substrate or a heat-resistant organic substrate, and the low-melting-point metal may comprise at least one metal selected from the group consisting of indium, gallium, tin, bismuth, lead, zinc, antimony, and aluminum.

When the low-melting-point metal comprises indium, the melt may be applied to the insulating substrate heated preferably at a temperature of 850 to 1,100° C. and more preferably 900 to 950° C. and when the low-meting-point metal comprises indium-gallium, the melt may be applied to the insulating substrate heated preferably at a temperature of 300 to 1,100° C. and more preferably 350 to 600° C., whereas when the low-melting-point layer comprises gallium, the melt may be applied to the insulating substrate heated preferably at a temperature of 400 to 1,100° C. and more preferably 420 to 600° C. The substrate may be uniformly heated using an electrical furnace or a lamp or, alternatively, a predetermined region of the substrate may be locally heated using laser or electron beams.

With reference to FIG. 11, the melting point of the silicon-containing low-melting-point metal decreases as the content of the low-melting-point metal increases. The indium melt layer containing silicon, e.g., by 1 percent by weight, is formed at a substrate temperature of 850 to 1,100° C. when indium is used, because such a substrate temperature facilitates use of glass having low heat resistance, such as crystallized glass, in addition to quartz glass, as a substrate. A gallium melt layer containing 1 percent by weight of silicon may be formed at a temperature of 400 to 1,100° C. on any glass substrate.

When indium-gallium-silicon or gallium-silicon is used, a glass substrate having a low distortion point or a heat-resistant organic substrate can be used, so that a semiconductive crystalline layer can be formed on a large glass substrate having an area of, for example, 1 m$^2$, which is inexpensive and can readily be prepared in the form of a rolled long glass sheet. A single-crystal silicon thin-film can be formed continuously or discontinuously on the long glass or organic substrate by the described process employing graphoepitaxy.

While the substrate is cooled after being maintained for a fixed period in the aforementioned application process, a dipping process in which the glass substrate is dipped with the melt and maintained for a fixed period and then, the substrate is gradually pulled up, or a floating process in which the substrate is cooled while being moved in the melt or while the surface of the substrate is being moved at an adequate speed may be employed. The thickness of an eptaxially grown layer, and the carrier impurity concentration can be controlled by the composition ratio and the temperature of the melt and the pulling-up speed. The substrate can be continuously or intermittently processed by the application process, dipping process and floating process, so that mass productivity is increased.

Since the components of the glass having the low distortion point rapidly diffuse into the upper layer, a thin diffusion-barrier layer composed of, for example, silicon nitride having a thickness of 50 to 200 nm is preferably formed to suppress such diffusion. Thus, the polycrystalline or amorphous silicon layer or a silicon-containing low-melting-point metal layer is formed on the diffusion-barrier layer.

The silicon-containing low-melting-point metal layer is slowly cooled so that the single-crystal silicon layer is deposited by graphoepitaxy using the step difference as a seed, and then the low-melting-point metal layer is removed by, for example, hydrochloric acid, followed by a predetermined treatment to form an active device and a passive device.

After the low-melting-point metal layer such as of indium deposited on the single-crystal silicon layer after the cooling is dissolved and removed by, for example, hydrochloric acid, only a trace amount (approximately 10$^{16}$ atoms/cc) of indium remains in the silicon layer, so that the single-crystal silicon layer becomes a p-type thin-film semiconductor. This layer is advantageous for production of a nMOSTFT. An n-type impurity such as phosphorus may be ion-implanted into the entire surface or selective regions of the single-crystal silicon layer to form an n-type single-crystal silicon thin-film, whereby a pMOSTFT can also be obtained. A cMOSTFT can also be formed. The polycrystalline or amorphous silicon layer or the silicon-containing low-melting-point metal layer may be doped with a Group III or V impurity having a large solubility, such as boron, phosphorus, antimony, arsenic, or bismuth, in a proper amount, during the deposition of this layer so as to control the type and/or the concentration of the impurity in the epitaxially grown silicon layer, that is, to control the doping type (n- or p-) and/or the concentration of the carrier.

Accordingly, the single-crystal silicon layer grown by graphoepitaxy on the substrate is used as a channel region, a source region and a drain region of a top-gate MOSTFT which constitutes at least a part of the peripheral driving circuit, the type and the concentration of each region being controllable, as described above.

Thin-film transistors in the peripheral-driving-circuit section and the display section may constitute n-channel, p-channel or complementary insulating-gate field-effect transistors: for example, a thin-film transistor may comprise a combination of a complementary type and an n-channel type, a complementary type and a p-channel type, or a complementary type, an n-channel type and a p-channel type. Preferably at least a part of the thin-film transistors in the peripheral-driving-circuit section and/or the display section has a lightly-doped drain (LDD) structure of a single type having a LDD section between the gate and the source or drain, or of a double type having LDD sections between the gate and source and between the gate and the drain, respectively.

Preferably, the MOSTFT constitutes an LDD-type TFT of an nMOS, a pMOS or a cMOS in the display section, and a cMOSTFT, an nMOSTFT, a pMOSTFT, or a mixture thereof, in the peripheral-driving-circuit section.

The MOSTFT is preferably formed on at least one of the interior and the exterior of the indented section of the substrate.

In such a case, the step difference is formed on one surface of the first substrate, and a single-crystal, polycrystalline or amorphous silicon layer is formed on the surface having the step difference. The single-crystal, polycrystalline or amorphous silicon layer is used as a channel region, a source region and a drain region of a second thin-film transistor, and at least one gate section is provided above and/or below the channel region. That is, the second thin-film transistor may be a top-gate, bottom-gate or dual-gate thin-film transistor.

In this case also, the step difference forms an indented section having a cross-section in which a side face is perpendicular to or slanted to the bottom face so as to have a basilar angle of preferably 90° or less, and the step difference functions as a seed for graphoepitaxy of the single-crystal silicon layer.

The second thin-film transistor may be formed in a region including the indented section defined by the step difference formed in the first substrate and/or the film formed on the first substrate, and the graphoepitaxial single-crystal silicon layer may be used to form the source, drain and channel regions of the second thin-film transistor, as in the case of the first thin-film transistor.

In this second thin-film transistor also, the type and the concentration of the Group III or V impurity in the single-crystal, polycrystalline or amorphous silicon layer may be controlled as described above, and a step difference may be formed along at least one side of a device region including the channel region, the source region and the drain region of the second thin-film transistor. A gate electrode below the single-crystal, polycrystalline or amorphous silicon layer is preferably trapezoidal at the side end section. A diffusion-barrier layer may be provided between the first substrate and the single-crystal, polycrystalline or amorphous silicon layer.

The source or drain electrodes of the first and/or second thin-film transistors are preferably formed on a region including the step difference.

The first thin-film transistor may comprise at least the top-gate type among a top-gate type having a gate section above the channel region, a bottom-gate type having a gate section below the channel region, and a dual-gate type having one gate section above and one below the channel region, and the switching device may comprise one of a top-gate second thin-film transistor, a bottom-gate second thin-film transistor and a dual-gate second thin-film transistor.

In this case, the gate section formed below the channel region in the bottom-gate or dual-gate second thin-film transistor preferably comprises a heat resistant material, and an upper-gate electrode of the second thin-film transistor and a gate electrode of the first thin-film transistor may comprise a common material.

The peripheral-driving-circuit section may comprise, in addition to the above-mentioned first thin-film transistor, at least one of a top-gate, bottom-gate or dual-gate thin-film transistor having a channel region of a polycrystalline or amorphous silicon layer and a gate region formed above or below the channel region, and may further comprise a diode, a resistor, a capacitor and an inductor, each comprising a single-crystal, polycrystalline or amorphous silicon layer.

Thin-film transistors in the peripheral driving circuit and/or the display section have a single-gate or a multi-gate configuration.

Preferably, when the n- or p-channel thin-film transistor in the peripheral-driving-circuit section and/or the display section is a dual-gate type, the upper or a lower-gate electrode is electrically opened or a given negative voltage for the n-channel type or a given positive voltage for the p-channel type is applied so that the dual-gate type thin-film transistors operate as bottom- or top-gate type thin-film transistors.

The thin-film transistor in the peripheral-driving-circuit section may be the first thin-film transistor of an n-channel, p-channel or complementary type, and the thin-film transistor in the display section may be an n-channel, p-channel or complementary type when the channel region is a single-crystal silicon layer, a polycrystalline silicon layer, or an amorphous silicon layer.

After the single-crystal silicon layer is deposited, an upper-gate section including a gate insulating film and a gate electrode may be formed on the single-crystal silicon layer, and the single-crystal silicon layer may be doped with a Group III or V impurity through the upper-gate section to form the channel region, the source region and the drain region.

When the second thin-film transistor is a bottom-gate type or a dual-gate type, a lower-gate electrode composed of a heat resistant material is provided below the channel region, and a gate insulating film is formed on the gate electrode to form a lower-gate section, and the second thin-film transistor is formed by the same steps including the step for forming the step difference as those in the first thin-film transistor. In such a case the upper-gate electrode of the second thin-film transistor and the gate electrode of the first thin-film transistor may be composed of a common material.

The single-crystal silicon layer formed on the lower-gate section may be doped with a Group III or V impurity to form a source region and a drain region, followed by an activation treatment.

The source and drain regions of the second thin-film transistor may be formed by ion-implantation of the above impurity on the single-crystal silicon layer through a resist mask and may be subjected to activation treatment, and the gate electrode of the first thin-film transistor, and the upper-gate electrode of the second thin-film transistor, if necessary, may be formed after the formation of the gate insulating film.

When the thin-film transistor is a top-gate type, the source and drain regions of the first and second thin-film transistors may be formed on the single-crystal silicon layer by ion implantation of the impurity through a resist mask and may be subjected to activation treatment, and then the gate sections including the gate insulating films and the gate electrodes of the first and second thin-film transistors may be formed.

Alternatively, when the thin-film transistor is of the top-gate type, the gate sections including the gate insulating films and the gate electrodes of the first and second thin-film transistors may be formed, and then the source and drain regions of the first and second thin-film transistors may be formed on the single-crystal silicon layer by ion implantation of the impurity through a resist mask, followed by an activation treatment.

The resist mask used when the LDD structure was formed may be left unremoved and the ion implantation for forming the source and drain regions may be performed through a resist mask which covers the remaining mask.

The substrate may be optically opaque or transparent, and may be provided with pixel electrodes for a reflective or transmissive display.

The display section may have a lamination configuration of the pixel electrodes and a color filter layer which may be formed on a display array, whereby the aperture ratio and the luminance are improved and costs can be decreased due to omission of a color filter substrate and improved productivity.

When the pixel electrodes are reflective electrodes, unevenness is preferably imparted to a resin film so that the resin film has optimized reflective characteristics and viewing-angle characteristics, and then the pixel electrodes are formed, whereas, when the pixel electrodes are transparent electrodes, the surface is preferably planarized by a transparent planarization film and then the pixel electrodes are formed on the planarized plane.

The display section is illuminated or dimmed by being driven by the above-described MOSTFT: for instance, the display section may comprise, for example, a liquid crystal display (LCD), an electroluminescent (EL) display, a field emission display (FED), a light-emitting polymer display (LEPD), or a light-emitting diode (LED) display. In this case, the arrangement may be such that a plurality of pixel electrodes are arranged in a matrix in the display section and a switching device is connected to each pixel electrode.

In accordance with a third aspect of the present invention, there is provided a method of producing an electrooptical device, as well as a method of producing a driving substrate for such an electrooptical device, having a first substrate carrying a display section provided with pixel electrodes and a peripheral-driving-circuit section provided on a periphery of the display section, a second substrate, and an optical material disposed between the first substrate and the second substrate; the method comprising the steps of: a gate-forming step for forming a gate portion including a gate electrode and a gate insulating film on one face of the first substrate; a step-forming step for forming a step difference on the one face of the first substrate; a layer-forming step for forming a polycrystalline or amorphous silicon layer having a predetermined thickness on the first substrate having the gate portion and the step difference and then forming a low-melting-point metal layer on or under the polycrystalline or amorphous silicon layer, or of forming a low-melting-point metal layer containing silicon on the first substrate having the step difference; a heating step for dissolving silicon of the polycrystalline or amorphous layer or of the low-melting-point metal layer into the low-melting-point metal layer by heating; a deposition step for depositing on the first substrate a single-crystal silicon layer by allowing the silicon of the polycrystalline or amorphous silicon layer or of the low-melting-point metal layer to grow by graphoepitaxy by a cooling treatment using as a seed the step difference on the substrate; a step for effecting a predetermined treatment on the single-crystal silicon layer, thereby forming a channel region, a source region and a drain region; and a step for forming a first thin-film transistor of bottom-gate type having the gate portions on the below the channel region and constituting at least part of the peripheral-driving-circuit section. The above-mentioned thin-film transistor may be a field effect transistor (FET) or a bipolar transistor. The FET, when used, may be a MOS-type FET or a junction-type FET.

In accordance with this aspect of the present invention, the same advantages as those offered by the first aspect of the invention are obtainable, except for the advantage derived in the first aspect from the use of the dual-gate structure of the thin-film transistor.

In accordance with the present invention, it is preferred to form the aforementioned step difference in the insulating substrate or in a diffusion barrier such as a film of silicon nitride (referred to as SiN, hereinafter) or both in the insulating substrate and the diffusion barrier, so as to provide an indented section having such a cross-section that both side faces of the indented section are perpendicular to the bottom or slanted to form a basilar angle of not greater than 90° with respect to the bottom face of the indented section, and to use this step difference as a seed for the graphoepitaxy of the single-crystal silicon layer. Preferably, the step difference is formed along at least one side of a device region including the channel region, the source region and the drain region of the first thin-film transistor. When a passive device such as a resistor is formed of the aforementioned single-crystal silicon layer, the step difference is formed along at least one side of the device region in which the resistor is formed.

The first thin-film transistor such as MOSTFT may be formed inside, outside or both inside and outside the indented section defined by the step difference.

The step difference may be formed by a dry etching process, such as a reactive ion etching process, and the polycrystalline or amorphous silicon layer is formed preferably by a low-temperature deposition process at a substrate temperature of 100 to 400° C., for example, a reduced-pressure CVD process, a catalytic CVD process, a plasma-enhanced CVD process, or a sputtering process so that the thickness becomes several $\mu$m to 0.005 $\mu$m, followed by the deposition of the low-melting-point metal layer by a vacuum evaporation process or a sputtering process so that the thickness becomes several tens to several hundreds times the thickness of the polycrystalline or amorphous silicon layer, and then the heating treatment is executed.

In this case, the low-melting-point metal layer may be formed above or below the polycrystalline or amorphous silicon layer formed by the low-temperature deposition process. Alternatively, the aforementioned low-melting-point metal layer containing silicon is deposited and then subjected to the heating treatment.

The substrate may be an insulating substrate, for example, a glass substrate or a heat-resistant organic substrate, and the low-melting-point metal layer may be formed of at least one metal selected from the group consisting of indium, gallium, tin, bismuth, lead, zinc, antimony and aluminum.

When the low-melting-point metal layer is formed of indium, this layer is heated preferably at 850 to 1,100° C. and more preferably 900 to 950° C. in a hydrogen-based atmosphere (pure hydrogen, a nitrogen-hydrogen mixture, or an argon-hydrogen mixture) to form an indium-silicon melt and, when the low-melting-point metal layer is formed of indium-gallium, this layer is heated preferably at 300 to 1,100° C. and more preferably 350 to 600° C. in a hydrogen-based atmosphere to form an indium-gallium-silicon melt, whereas, when the low-melting-point metal layer is formed of gallium, this layer is heated preferably at 400 to 1,100° C. and more preferably 420 to 600° C. in a hydrogen-based atmosphere to form a gallium-silicon melt. The substrate may be uniformly heated using an electrical furnace or a lamp or, alternatively, a predetermined region of the substrate may be locally heated using laser or electron beams.

With reference to FIG. 11, the melting point of the silicon-containing low-melting-point metal decreases as the content of the low-melting-point metal increases. The indium melt layer containing silicon, e.g., by 1 percent by weight, is formed at a substrate temperature of 850 to 1,100° C. when indium is used, because such a substrate temperature facilitates use of glass having low heat resistance, such as crystallized glass, in addition to quartz glass, as a substrate. A gallium melt layer containing 1 percent by weight of silicon may be formed at a temperature of 400 to 1,100° C. on any glass substrate.

When indium-gallium-silicon or gallium-silicon is used, a glass substrate having a low distortion point or a heat-resistant organic substrate can be used, so that a single-crystal silicon layer can be formed on a large glass substrate having an area of, for example, 1 m$^2$, which is inexpensive and can readily be prepared in the form of a rolled long glass sheet.

Since the components of the glass having the low distortion point rapidly diffuse into the upper layer, a thin diffusion-barrier layer composed of, for example, silicon nitride having a thickness of 50 to 200 nm is preferably formed to suppress such diffusion. Thus, the polycrystalline or amorphous silicon layer or a silicon-containing low-melting-point metal layer is formed on the diffusion-barrier layer.

The silicon-containing low-melting-point metal layer is slowly cooled so that the single-crystal silicon layer is deposited by graphoepitaxy using the step difference as a seed, and then the low-melting-point metal layer is removed by, for example, hydrochloric acid, followed by a predetermined treatment to form an active device and a passive device.

After the low-melting-point metal layer such as of indium deposited on the single-crystal silicon layer after the cooling is dissolved and removed by, for example, hydrochloric acid, only a trace amount (approximately $10^{16}$ atoms/cc) of indium remains in the silicon layer, so that the single-crystal silicon layer becomes a p-type thin-film semiconductor. This layer is advantageous for production of a nMOSTFT. An n-type impurity such as phosphorus may be ion-implanted into the entire surface or selective regions of the single-crystal silicon layer to form an n-type single-crystal silicon thin-film, whereby a pMOSTFT can also be obtained. A cMOSTFT can also be formed. A cMOSTFT can also be formed. The polycrystalline or amorphous silicon layer or the silicon-containing low-melting-point metal layer may be doped with a Group III or V impurity having a large solubility, such as boron, phosphorus, antimony, arsenic, or bismuth, in a proper amount, during the deposition of this layer so as to control the type and/or the concentration of the impurity in the epitaxially grown silicon layer, that is, to control the doping type (n- or p-) and/or the concentration of the carrier.

Accordingly, the single-crystal silicon layer grown by graphoepitaxy on the substrate is used as a channel region, a source region and a drain region of a dual-gate MOSTFT which constitutes at least a part of the peripheral driving circuit, the type and the concentration of each region being controllable, as described above.

Thin-film transistors in the peripheral-driving-circuit section and the display section may constitute n-channel, p-channel or complementary insulating-gate field-effect transistors: for example, a thin-film transistor may comprise a combination of a complementary type and an n-channel type, a complementary type and a p-channel type, or a complementary type, an n-channel type and a p-channel type. Preferably at least a part of the thin-film transistors in the peripheral-driving-circuit section and/or the display section has a lightly-doped drain (LDD) structure of a single type having a LDD section between the gate and the source or drain, or of a double type having LDD sections between the gate and source and between the gate and the drain, respectively.

Preferably, the MOSTFT constitutes an LDD-type TFT of an nMOS, a pMOS or a cMOS in the display section, and a cMOSTFT, an nMOSTFT, a pMOSTFT, or a mixture thereof, in the peripheral-driving-circuit section.

The MOSTFT is preferably formed on at least one of the interior and the exterior of the indented section of the substrate.

In such a case, the step difference is formed on one surface of the first substrate, and a single-crystal, polycrystalline or amorphous silicon layer is formed on the surface having the step difference. The single-crystal, polycrystalline or amorphous silicon layer is used as a channel region, a source region and a drain region of a second thin-film transistor, and at least one gate section is provided above and/or below the channel region. That is, the second thin-film transistor may be a top-gate, bottom-gate or dual-gate thin-film transistor.

In this case also, the step difference forms an indented section having a cross-section in which a side face is perpendicular to or slanted to the bottom face so as to have a basilar angle of preferably 90° or less, and the step difference functions as a seed for graphoepitaxy of the single-crystal silicon layer.

The second thin-film transistor may be formed in a region including the indented section defined by the step difference formed in the first substrate and/or the film formed on the first substrate, and the graphoepitaxial single-crystal silicon layer may be used to form the source, drain and channel regions of the second thin-film transistor, as in the case of the first thin-film transistor.

In this second thin-film transistor also, the type and the concentration of the Group III or V impurity in the single-crystal, polycrystalline or amorphous silicon layer may be controlled as described above, and a step difference may be formed along at least one side of a device region including the channel region, the source region and the drain region of the second thin-film transistor. A gate electrode below the single-crystal, polycrystalline or amorphous silicon layer is preferably trapezoidal at the side end section. A diffusion-barrier layer may be provided between the first substrate and the single-crystal, polycrystalline or amorphous silicon layer.

The source or drain electrodes of the first and/or second thin-film transistors are preferably formed on a region including the step difference.

The first thin-film transistor may comprise at least the bottom-gate type among a top-gate type having a gate section above the channel region, a bottom-gate type having a gate section below the channel region, and a dual-gate type having one gate section above and one below the channel region, and the switching device may comprise one of a top-gate second thin-film transistor, a bottom-gate second thin-film transistor and a dual-gate second thin-film transistor.

In this case, the gate section formed below the channel region in the bottom-gate or dual-gate second thin-film transistor preferably comprises a heat resistant material, and an upper-gate electrode of the second thin-film transistor and a gate electrode of the first thin-film transistor may comprise a common material.

The peripheral-driving-circuit section may comprise, in addition to the above-mentioned first thin-film transistor, at least one of a top-gate, bottom-gate or dual-gate thin-film transistor having a channel region of a polycrystalline or amorphous silicon layer and a gate region formed above or below the channel region, and may further comprise a diode, a resistor, a capacitor and an inductor, each comprising a single-crystal, polycrystalline or amorphous silicon layer.

Thin-film transistors in the peripheral driving circuit and/or the display section have a single-gate or a multi-gate configuration.

Preferably, when the n- or p-channel thin-film transistor in the peripheral-driving-circuit section and/or the display section is a dual-gate type, the upper or a lower-gate electrode is electrically opened or a given negative voltage for the n-channel type or a given positive voltage for the p-channel type is applied so that the dual-gate type thin-film transistors operate as bottom- or top-gate type thin-film transistors.

The thin-film transistor in the peripheral-driving-circuit section may be the first thin-film transistor of an n-channel, p-channel or complementary type, and the thin-film transistor in the display section may be an n-channel, p-channel or complementary type when the channel region is a single-crystal silicon layer, a polycrystalline silicon layer, or an amorphous silicon layer.

After the single-crystal silicon layer is deposited, an upper-gate section including a gate insulating film and a gate electrode may be formed on the single-crystal silicon layer, and the single-crystal silicon layer may be doped with a Group III or V impurity through the upper-gate section to form the channel region, the source region and the drain region.

When the second thin-film transistor is a bottom-gate type or a dual-gate type, a lower-gate electrode composed of a heat resistant material is provided below the channel region, and a gate insulating film is formed on the gate electrode to form a lower-gate section, and the second thin-film transistor is formed by the same steps including the step for forming the step difference as those in the first thin-film transistor. In such a case the upper-gate electrode of the second thin-film transistor and the gate electrode of the first thin-film transistor may be composed of a common material.

The single-crystal silicon layer formed on the lower-gate section may be doped with a Group III or V impurity to form a source region and a drain region, followed by an activation treatment.

The source and drain regions of the second thin-film transistor may be formed by ion-implantation of the above impurity on the single-crystal silicon layer through a resist mask and may be subjected to activation treatment, and the gate electrode of the second thin-film transistor may be formed after the formation of the gate insulating film.

The method also may be such that, when the second thin-film transistor is of the top-gate type, the source and drain regions of the first and second thin-film transistors are formed by ion implantation of the above-mentioned impurities through a mask constituted by a resist, followed by an activation treatment, and thereafter a gate portion composed of a gate insulating film and the gate electrode of the second thin-film transistor is formed.

The method also may be such that, when the second thin-film transistor is of the top-gate type, a gate portion of the second thin-film transistor, composed of a gate insulating film and a gate electrode made of a heat-resistant material, is formed after the deposition of the single-crystal silicon layer, and the source and drain regions of the first and second thin-film transistors are formed by ion implantation of the above-mentioned impurities through a mask constituted by the above-mentioned gate portion and a resist, followed by an activation treatment.

The resist mask used when the LDD structure was formed may be left unremoved and the ion implantation for forming the source and drain regions may be performed through a resist mask which covers the remaining mask.

The substrate may be optically opaque or transparent, and may be provided with pixel electrodes for a reflective or transmissive display.

The display section may have a lamination configuration of the pixel electrodes and a color filter layer which may be formed on a display array, whereby the aperture ratio and the luminance are improved and costs can be decreased due to omission of a color filter substrate and improved productivity.

When the pixel electrodes are reflective electrodes, unevenness is preferably imparted to a resin film so that the resin film has optimized reflective characteristics and viewing-angle characteristics, and then the pixel electrodes are formed, whereas, when the pixel electrodes are transparent electrodes, the surface is preferably planarized by a transparent planarization film and then the pixel electrodes are formed on the planarized plane.

The display section is illuminated or dimmed by being driven by the above-described MOSTFT: for instance, the display section may comprise, for example, a liquid crystal display (LCD), an electroluminescent (EL) display, a field emission display (FED), a light-emitting polymer display (LEPD), or a light-emitting diode (LED) display. In this case, the arrangement may be such that a plurality of pixel electrodes are arranged in a matrix in the display section and a switching device is connected to each pixel electrode.

In accordance with a fourth aspect of the present invention, there is provided a method of producing an electrooptical device, as well as a method of producing a driving substrate for such an electrooptical device, having a first substrate carrying a display section provided with pixel electrodes and a peripheral-driving-circuit section provided on a periphery of the display section, a second substrate, and an optical material disposed between the first substrate and the second substrate; the method comprising the steps of: a gate-forming step for forming a gate portion including a gate electrode and a gate insulating film on one face of the first substrate; a step-forming step for forming a step difference on the one face of the first substrate; a layer-forming step for forming a melt layer of a low-melting-point metal containing silicon on the first substrate having the gate portion and the step difference; a deposition step for depositing a single-crystal silicon layer by allowing the silicon of the melt layer to grow by graphoepitaxy by a cooling treatment using as a seed the step difference on the substrate; a step for effecting a predetermined treatment on the single-crystal silicon layer, thereby forming a channel region, a source region and a drain region; and a step for forming a first thin-film transistor of bottom-gate type having the gate portions on the below the channel region and constituting at least part of the peripheral-driving-circuit section. The above-mentioned thin-film transistor may be a field effect transistor (FET) or a bipolar transistor. The FET, when used, may be a MOS-type FET or a junction-type FET.

In accordance with this aspect of the present invention, the same advantages as those offered by the first aspect of the invention are obtainable, except for the advantage derived in the first aspect from the use of the dual-gate structure of the thin-film transistor. In addition, this aspect offers the following advantage by virtue of the use of the melt layer of silicon-containing low-melting-point metal.

Namely, the melt of the low-melting-point metal can be prepared at a comparatively low temperature of, for example, 350° C., and can easily be applied to the substrate having the step differences serving as the seed, provided that the substrate has been heated to a temperature slightly above the temperature at which the melt is prepared. Thus, a single-crystal silicon layer can uniformly be formed at a comparatively low temperature of from, for example, 350 to 400° C.

In the graphoepitaxy in used in this aspect of the present invention, a single-crystal silicon thin-film having a variety of P-type impurity concentration and high mobility can be readily produced by adjusting the composition ratio of the melt of the melting-point metal, the temperature of the melt, the heating temperature of the substrate, and the cooling rate, thus enabling easy control of the threshold voltage (Vth) of the device, which in turn enables the device to operate at a high speed due to reduced resistance.

The melt layer of the silicon-containing low-melting-point metal may be doped with an adequate amount of Group III or V impurity, such as boron, phosphorus, antimony, arsenic, bismuth or aluminum, so that the type and the concentration of the impurity in the epitaxial single-crystal silicon, that is, the type (P-type or N-type) and the carrier concentration, are controllable.

Other features of the fourth aspect are substantially the same as those of the first, second and third aspects of the present invention.

BRIEF DESCRIPTION OF THE DRAWINGS

FIGS. 2A to 2C are cross-sectional views showing the subsequent production steps of the LCD in accordance with the first embodiment of the present invention;

FIGS. 4A to 4C are cross-sectional views showing the subsequent production steps of the LCD in accordance with the first embodiment of the present invention;

FIGS. 7A to 7C are cross-sectional views showing the subsequent production steps of the LCD in accordance with the first embodiment of the present invention;

FIG. 14 is a schematic block diagram of the LCD in accordance with the first embodiment of the present invention;

FIGS. 29A and 29B are cross-sectional views showing production steps of a LCD in accordance with an eighth embodiment of the present invention;

FIGS. 31A and 31B are cross-sectional views showing the subsequent production steps of the LCD in accordance with the eighth embodiment of the present invention;

FIGS. 44 to 52 are tables showing various combinations of TFTs in a display section and a peripheral-driving-circuit section of a LCD in accordance with a twelfth embodiment of the present invention;

FIG. 54 is a table showing combinations of TFTs in the display section and the peripheral-driving-circuit section of the LCD in accordance with the thirteenth embodiment of the present invention;

FIGS. 66A to 66C are sectional views showing subsequent steps of the process for producing LCD in accordance with the first embodiment of a second aspect of the present invention;

FIGS. 67A to 67C are sectional views showing steps of a process for producing an LCD in accordance with a fourth embodiment of the third aspect of the present invention;

FIGS. 68A to 68B are sectional views showing steps of a process for producing an LCD in accordance with an eighth embodiment of the third aspect of the present invention;

FIGS. 70 to 78 are tables showing various combinations of TFTs in a display section and a peripheral-driving-circuit section of a LCD in accordance with a twelfth embodiment of the third aspect of the present invention;

DESCRIPTION OF THE PREFERRED EMBODIMENTS

The present invention will now be described in more detail with reference to the following preferred embodiments.

A description will first be given of first to fifteenth embodiments of the first aspect of the present invention which employs a low-melting-point metal layer and which has the step of forming a dual-gate first thin-film transistor.

FIG. 1A to FIG. 14 show a first embodiment of the first aspect of the present invention.

Figure 12:
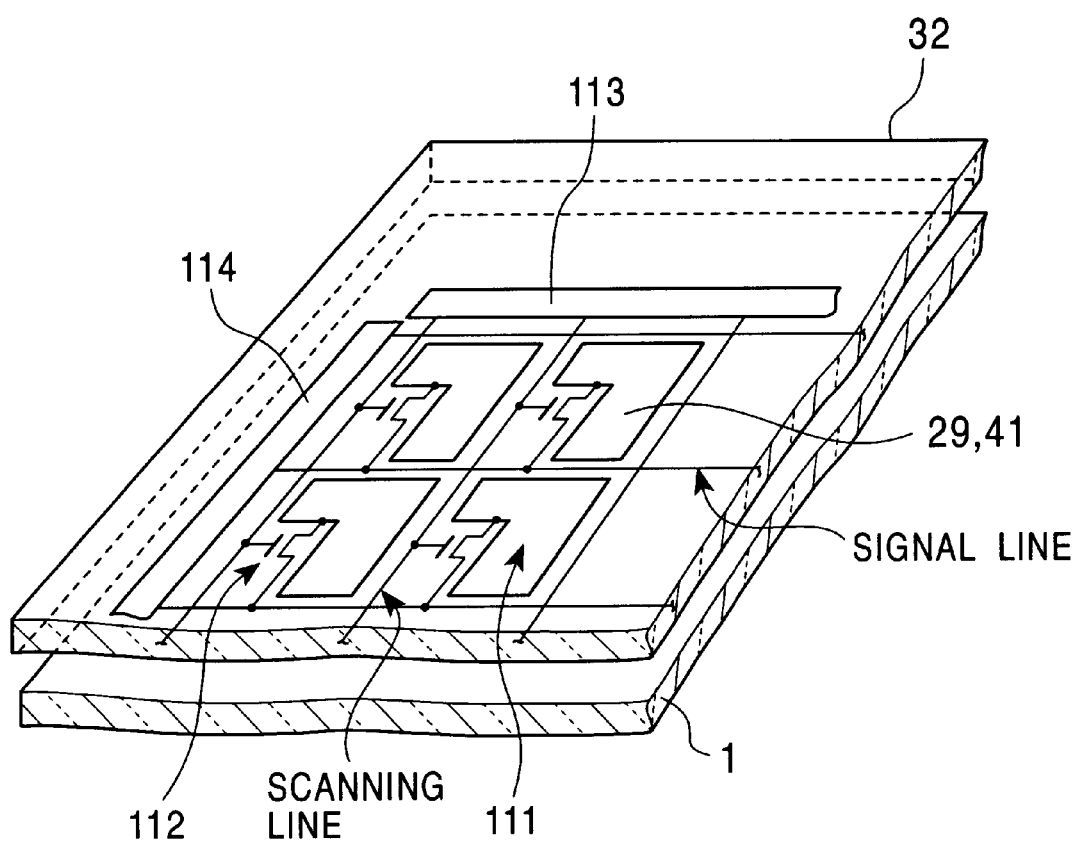
FIG. 12 is a schematic perspective view of a LCD in accordance with a first embodiment of the present invention.
Figure 13:
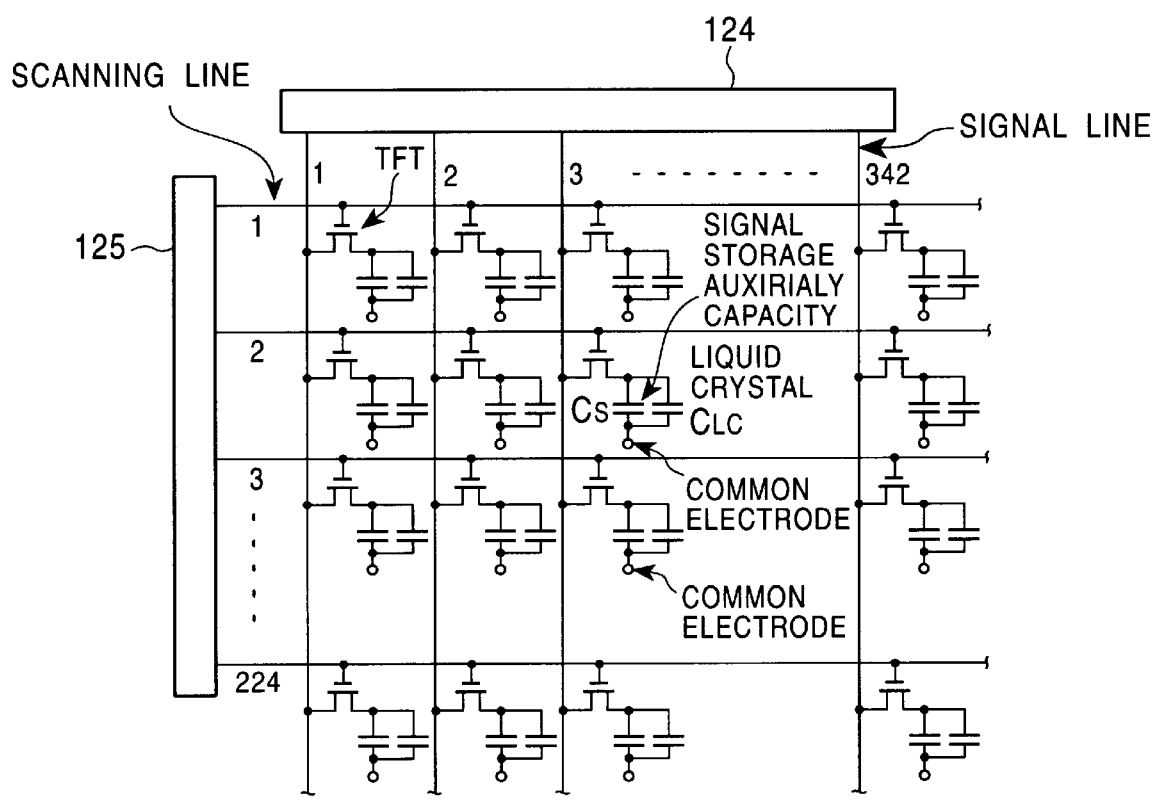
FIG. 13 is an equivalent circuit diagram of the LCD in accordance with the first embodiment of the present invention.

The first embodiment relates to an active-matrix reflective liquid crystal display (LCD) having a peripheral driving circuit incorporating dual-gate MOSTFTs formed by a single-crystal silicon layer which are formed by graphoepitaxy of indium-silicon at high temperature using as a seed an indented section defined by a step difference provided on a substrate as a seed. FIGS. 12 to 14 show an overall layout of the reflective LCD.

With reference to FIG. 12, the active-matrix reflective LCD has a flat panel configuration including a main substrate 1 (active-matrix substrate) and a counter substrate 32 which are bonded to each other with a spacer provided therebetween (not shown in this Figure), and the space between the main substrate 1 and the counter substrate 32 is filled with a liquid crystal (not shown in this Figure). Provided on a surface of the main substrate 1 are a display section which includes pixel electrodes 29 or 41 arranged in a matrix and switching devices 112 for driving the pixel electrodes, and peripheral driving circuit sections connected to the display section.

Each switching device in the display section is composed of an nMOS, pMOS, or cMOS top-gate TFT having a LDD structure in accordance with the present invention. Also, in the peripheral-driving-circuit sections, cMOS, nMOS and/or pMOS dual-gate MOSTFTs in accordance with the present invention are formed as circuit components. One of the peripheral-driving-circuit sections includes a horizontal driving circuit which drives the TFTs of the pixels in a line-by-line fashion while supplying these pixels with data signals, whereas the other of the peripheral-driving-circuit portions is a vertical driving circuit which drives the gates of the TFTs of the pixels on the scan-line-basis, both the horizontal and vertical driving circuits being arranged on both peripheral sides of the display section. These driving circuits may be a dot-sequential analog type or a line-sequential digital type.

With reference to FIG. 13, the TFTs are arranged at intersections of gate bus lines and orthogonal data bus lines, and are activated to write image information into liquid crystal capacitors ($C_{LC}$) and the charge in the liquid crystal capacitors is retained until the next information is written. Since the channel resistance of each TFT is not sufficient to retain the information, a storage capacitor ($C_S$), serving as an auxiliary capacitor, may be provided in parallel to the liquid crystal capacitor to compensate for a drop of voltage across the liquid crystal due to a leakage current. Characteristics required for TFTs used in the pixel or display region are different from characteristics required for TFTs used in the peripheral driving circuits: namely, an important property of the TFTs in the pixel region is to control an OFF current and to retain an ON current. Providing TFTs having a LDD structure in the display section can reduce an electric field between the gate and the drain and thus reduces the effective electric field applied to the channel region, the OFF current and a change in characteristics. The production process, however, is complicated, the size of the device is inevitably increased, and the ON current is decreased. Thus, the designs must be optimized to meet the respective purposes.

Among the usable liquid crystals are TN liquid crystals (nematic liquid crystals used in a TN mode of active-matrix driving), super-twisted nematic (STN) liquid crystals, guest-host (GH) liquid crystals, phase change (PC) liquid crystals, ferroelectric liquid crystals (FLCs), antiferroelectric liquid crystals (AFLCs), and polymer dispersion-type liquid crystals (PDLCs).

The system of and the method for driving the peripheral driving circuits will now be briefly described with reference to FIG. 14. The driving circuits include a gate driving circuit and a data driving circuit each of which must implement a shift register. Each shift resistor generally may be a cMOS circuit including both pMOSTFTs and nMOSTFTs or may be a circuit including either pMOSTFTs or nMOSTFTs, among which suitably used is a cMOSTFT or cMOS circuit in view of the operational speed, reliability, and low power consumption.

The scanning driving circuit includes shift registers and buffers and supplies pulses to lines in synchronism with a horizontal scanning period. The data driving circuit may be a dot-sequential driving system or a line-sequential driving system, but the dot-sequential driving system as illustrated has a relatively simplified configuration and writes display signals directly into pixels through analog switches under control of the shift registers. The signals are sequentially written into pixels in a line within a scanning time for the line (R, G and B in the drawing schematically represent red, green and blue pixels).

With reference to FIGS. 1A to 10F, the active-matrix reflective LCD in this embodiment will be described in accordance with the production steps. In FIGS. 1A to 6C, the left side of each drawing shows the production steps for the display section and the right side shows the production steps for the peripheral-driving-circuit section.

Figure 1A:
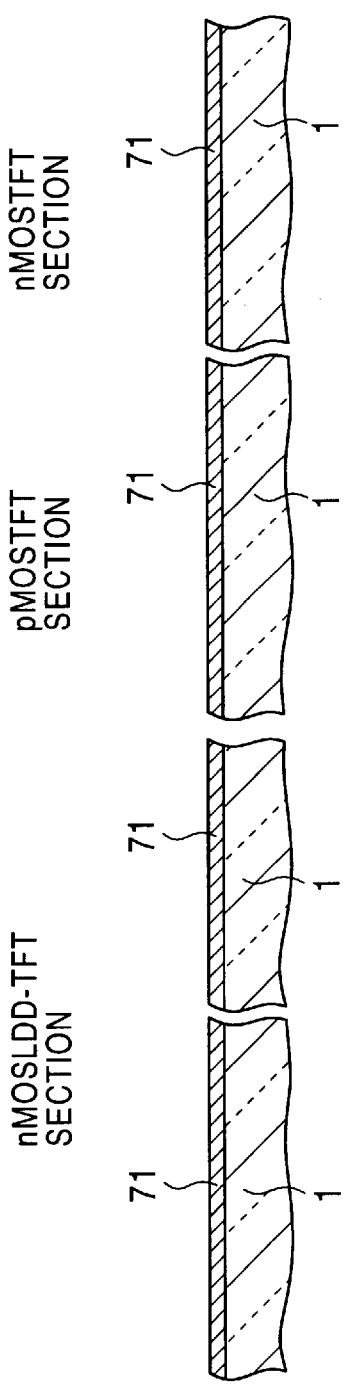
FIGS. 1A to 1C are cross-sectional views showing production steps of a liquid crystal display (LCD) in accordance with a first embodiment of a first aspect of the present invention.

Referring first to FIG. 1A, a film 71 of about 500 to 600 nm thick is formed from a molybdenum/tantalum (Mo—Ta) alloy by sputtering on a major surface of an insulating substrate 1 made of, for example, a quartz glass or a transparent crystalline glass.

Figure 1B:
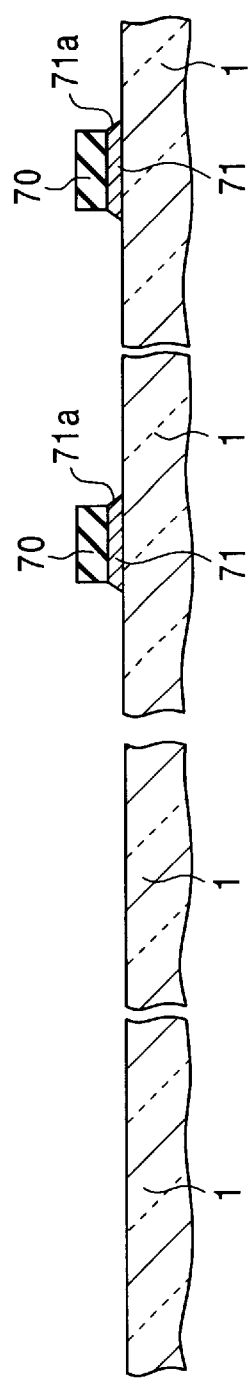

Then, as shown in FIG. 1B, a photoresist 70 is formed in a given pattern and the Mo—Ta film 71 is taper-etched through a mask constituted by the photoresist 70, whereby a gate electrode 71 is formed to have side faces that are gently slanted at an angle of 20 to 45 degrees to provide a substantially trapezoidal cross-section.

Figure 1C:
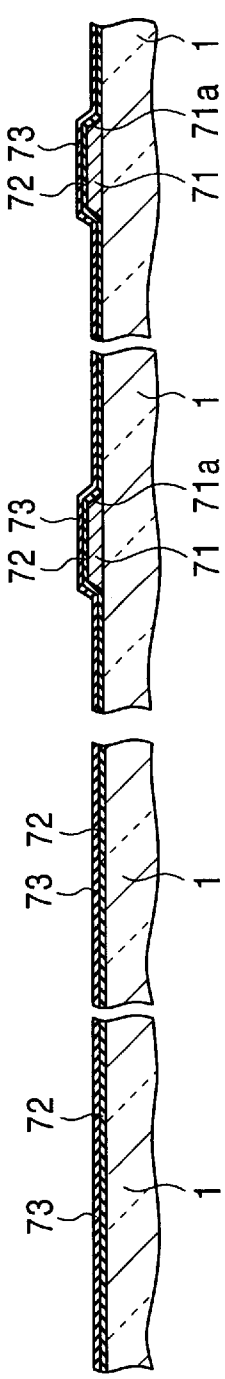

Then, as shown in FIG. 1C, a gate insulating film composed of an SiN film 72 (about 100 nm thick) and an $SiO_2$ film 73 (about 200 nm thick) laminated in this order is deposited by, for example, a plasma CVD process on the substrate 1 having the molybdenum.tantalum alloy film 71, after removal of the photoresist 70.

Subsequently, as shown in FIG. 2A, a photoresist 2 having a given pattern is formed in at least a TFT-forming region, and the surface is irradiated with, for example, $F^+$ ions 3 of $CF_4$ plasma through the mask constituted by the photoresist 2, and a plurality of step differences 4 having a given shape and a given size are formed in the gate insulating film (and further in the substrate 1) by typical photolithography, such as reactive ion etching (RIE), and then by etching (photoetching).

The insulating substrate 1 may be composed of a highly-heat-resistant substrate having a diameter of 8 to 12 inches and a thickness of 700 to 800 $\mu$m, such as quartz glass, crystallized glass, or ceramic, although in a transmissive LCD described below an opaque ceramic substrate cannot be used. The step differences 4 function as seeds for graphoepitaxy of single-crystal silicon. Each step difference 4 has, for example, a depth d of 0.3 to 0.4 $\mu$m, a width w of 2 to 10 $\mu$m, and a length l of 10 to 20 $\mu$m (in the direction perpendicular to the drawing sheet). The basilar angle defined by the bottom face and the side face is a right angle. In order to prevent diffusion of ions such as Na ions from the glass substrate, an SiN film of, for example, 50 to 200 nm thick and, as desired, a silicon oxide film (referred to as $SiO_2$ film, hereinafter) of, for example, 100 nm thick may be formed on the glass substrate, in advance of the steps described heretofore.

With reference to FIG. 2B, after the photoresist layer 2 is removed, a polycrystalline silicon film 5 having a thickness of several $\mu$m to 0.005 $\mu$m, for example, 0.1 $\mu$m, is deposited on the entire surface including the step differences 4 by a known catalytic CVD process, a plasma-enhanced CVD process, or a sputtering process. Since both side faces of the underlying gate electrode 71 are gently slanted, impediment to epitaxial growth attributable to the presence of the step differences 4 does not occur on these side faces, whereby a single-crystal silicon layer 7 grows on these side faces without discontinuity. Although an amorphous silicon film may be formed in place of the polycrystalline silicon film 5, the polycrystalline silicon film 5 will be described as a typical example in this embodiment.

Then, as shown in FIG. 2C, an indium film 6 is formed on the polysilicon film 5 by a MOCVD process, a sputtering process or a vacuum evaporation process using trimethylindium, in which the thickness of the indium film 6 is, for example, 10 to 15 $\mu$m which is several ten to several hundred times the thickness of the polycrystalline silicon film 5.

The substrate 1 is placed in a hydrogen-based atmosphere, such as hydrogen, a nitrogen-hydrogen mixture, or an argon-hydrogen mixture at a temperature not higher than 1,000° C., preferably 900 to 930° C., for 5 minutes. The polycrystalline silicon 5 is thereby melted into the melt of the indium film 6. Silicon in this melt can be precipitated at a temperature which is significantly lower than the original precipitation temperature. The substrate 1 may be uniformly heated using an electrical furnace etc or, alternatively, a predetermined region, for example, a TFT-forming region of the substrate 1 may be locally heated using laser or electron beams.

Figure 3A:
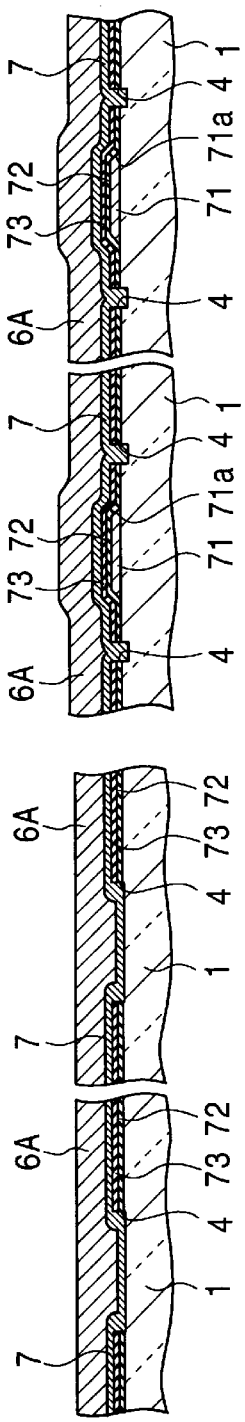
FIGS. 3A to 3C are cross-sectional views showing the subsequent production steps of the LCD in accordance with the first embodiment of the present invention.

Then, the substrate 1 is gradually cooled so that silicon dissolved in indium is deposited by graphoepitaxy, using the bottom corner of each step difference 4 as a seed, as show in FIG. 3A, whereby a P-type single-crystal silicon layer 7 having a thickness of, for example, approximately 0.1 $\mu$m is formed.

Figure 9A:
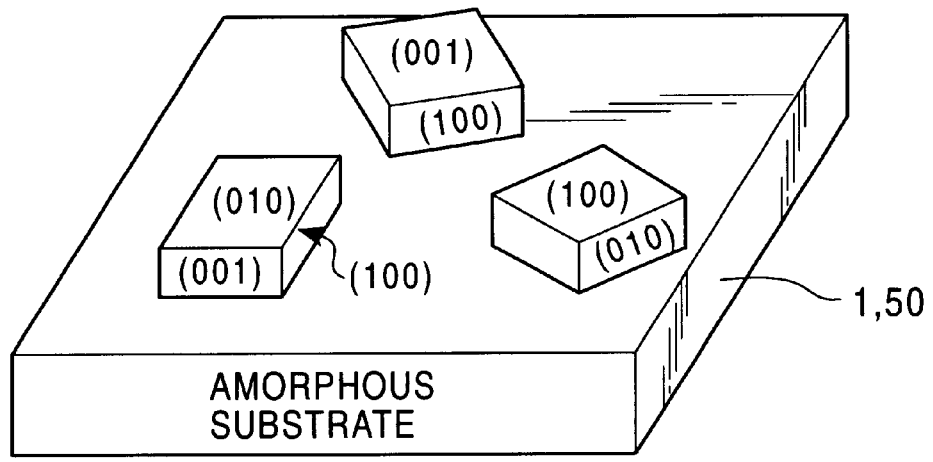
FIGS. 9A and 9B are schematic perspective views showing deposition of silicon crystals on an amorphous substrate.
Figure 9B:
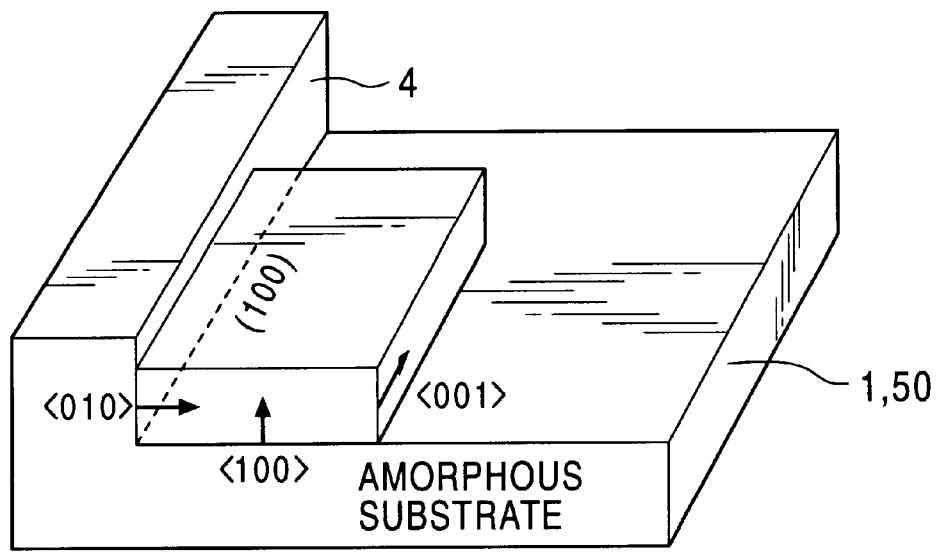
Figure 10A:
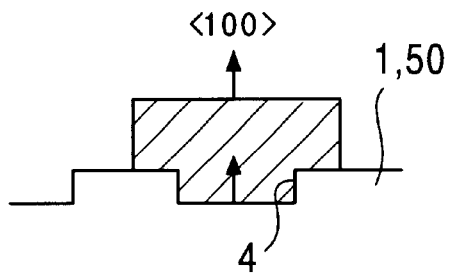
FIGS. 10A to 10F are cross-sectional views showing the shapes of the step difference and the orientation of the deposited silicon crystal in graphoepitaxy.
Figure 10B:
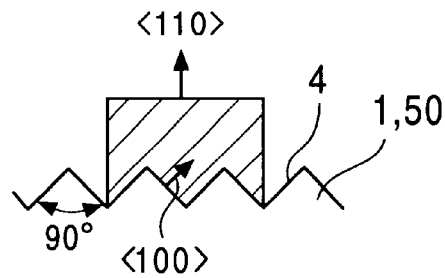
Figure 10C:
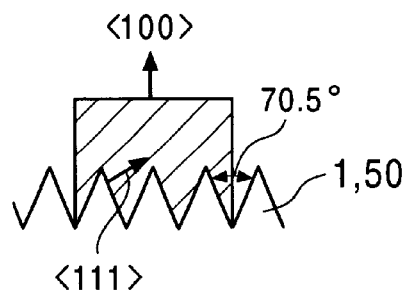
Figure 10D:
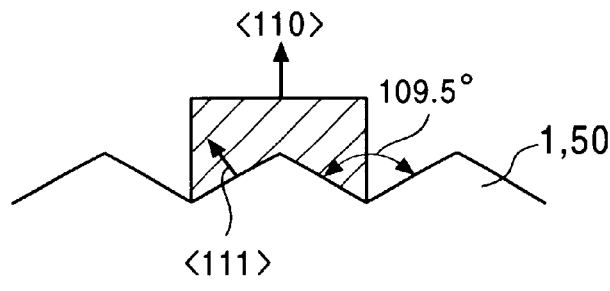
Figure 10E:
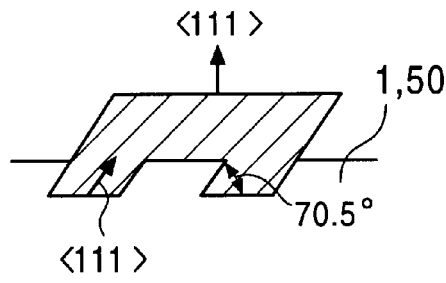
Figure 10F:
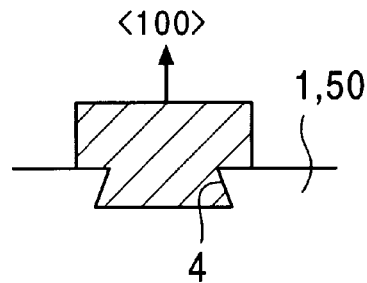
Figure 11A:
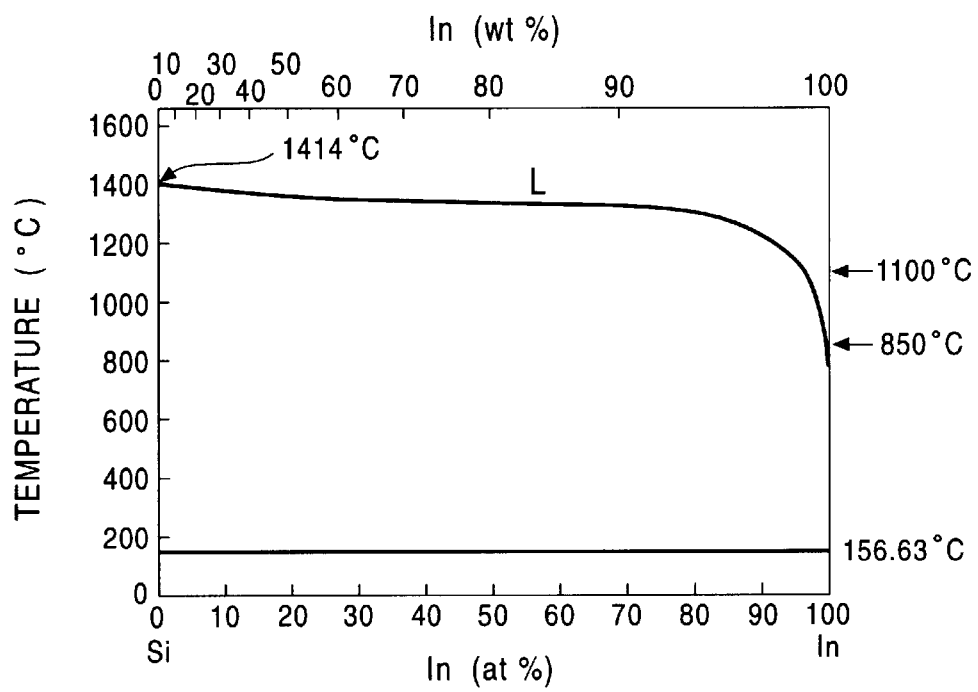
FIGS. 11A and 11B are equilibrium diagrams of a Si—In alloy and a Si—Ga alloy, respectively.
Figure 11B:
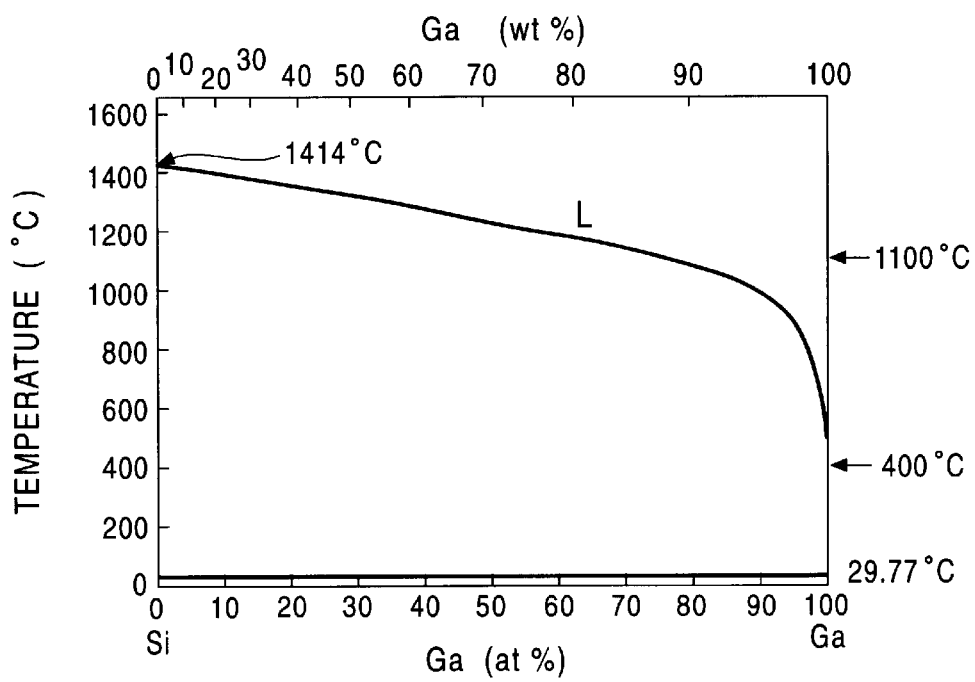

In the single-crystal silicon layer 7 as deposited, a (100) plane is epitaxially grown on the substrate, and this is known as graphoepitaxy. With reference to FIGS. 9A and 9B, a vertical wall, such as the above-mentioned step difference 4, is formed on the amorphous substrate 1, such as a glass substrate and an epitaxial layer is formed thereon, so that the (100) plane of a single-crystal is grown along the side face of the step difference 4 as shown in FIG. 9B, whereas a crystal having random plane orientation is grown on a flat amorphous substrate 1, as shown in FIG. 9A. The size of the single-crystal grain increases in proportion to the temperature and the time: when the temperature is lowered or when the time is shortened, the distance between the step differences should be decreased. The orientation of the grown crystal can be controlled by changing the shape of the step differences, as shown in FIGS. 10A to 10F. When MOS transistors are formed, the (100) plane is most frequently used. Accordingly, the step difference 4 can have any cross-sectional shape which facilitates crystal growth, for example, the angle at the bottom corner (basilat angle) may be a right angle or, alternatively, the side wall may be inclined inwardly or outwardly towards the lower end. The basilar angle of the step difference 4 is preferably 90° or less and the bottom corner is preferably slightly rounded.

Figure 3B:
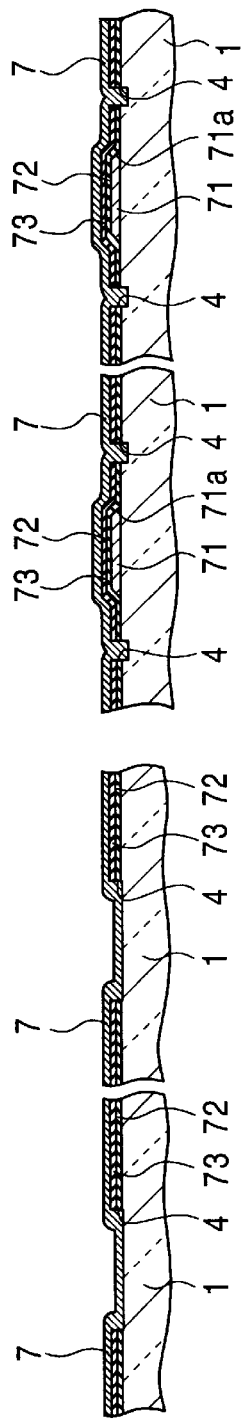

With reference to FIG. 3B, after the deposition of the single-crystal silicon layer by graphoepitaxy on the substrate 1, the indium film 6A deposited on the surface is removed using hydrochloric acid or sulfuric acid, followed by post-treatment to avoid the formation of a low-grade silicon oxide film, whereby a bottom-gate MOSTFT and a top-gate MOSTFT are formed in the peripheral-driving-circuit section and in the display section, respectively, using the single-crystal silicon layer 7 as the channel regions.

Figure 3C:
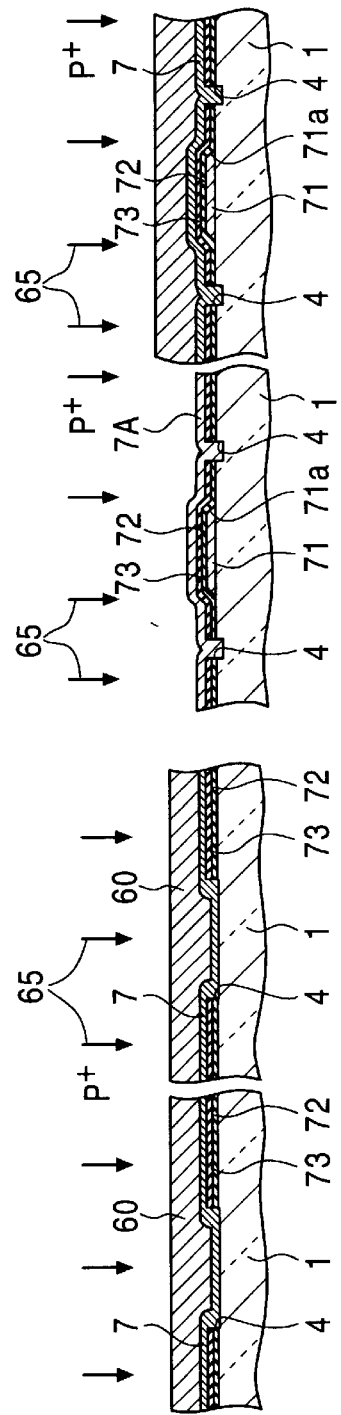

The single-crystal silicon layer 7 deposited by graphoepitaxy contains is a p-type layer due to its indium content, and the concentration of the P-type impurity fluctuates, so that adjustment of the specific resistance is performed by doping with p-type impurity ions such as $B^+$ at 10 kV and at a dosage of $2.7 \times 10^{11}$ atoms/cm, with the p-channel MOSTFT section masked by a photoresist (not shown in the drawing). With reference to FIG. 3C, in order to control the concentration of the impurity in the pMOSTFT-forming region, the nMOSTFT section is masked with a photoresist 60 and is doped with n-type impurity ions 65 such as $P^+$ at 10 kV and at a dosage of $1 \times 10^{11}$ atoms/cm² to form an n-type well 7A.

With reference to FIG. 4A, a $SiO_2$ film having a thickness of approximately 200 nm and then a SiN film having a thickness of approximately 100 nm are continuously deposited on the entire single-crystal silicon layer 7 by a plasma-enhanced CVD process, a high-density plasma-enhanced CVD process or a catalytic CVD process to form a gate insulating film 8, followed by a sputtering to deposit a molybdenum-tantalum (Mo—Ta) alloy film 9 of 500 to 600 nm thereon.

With reference to FIG. 4B, photoresist patterns 10 are formed in the step difference regions (indented sections) of the TFT sections in the display region and outside the step difference regions of the TFT sections of the peripheral driving region by any conventional photolithographic process, and a continuous etching is executed, whereby gate electrodes 11 of the Mo—Ta alloy film and gate insulating films 12 of $SiN-SiO_2$ are formed and the single-crystal silicon layer 7 is exposed. The Mo—Ta alloy film 9 is etched using an acidic etchant, SiN is etched by plasma etching using $CF_4$ gas, and $SiO_2$ is etched using a hydrofluoric acidic etchant.

With reference to FIG. 4C, all of the nMOSs and pMOST-FTs in the peripheral driving region, as well as the gate sections of the nMOSTFTs in the display region, are covered with a photoresist 13, and the exposed source and drain regions of the nMOSTFTs are doped with, for example, phosphorus ions 14 by ion implantation at 20 kV and at a dosage of $5 \times 10^{13}$ atoms/cm² to form LDD sections 15 of an $N^-$-type layer by self-alignment.

Figure 5A:
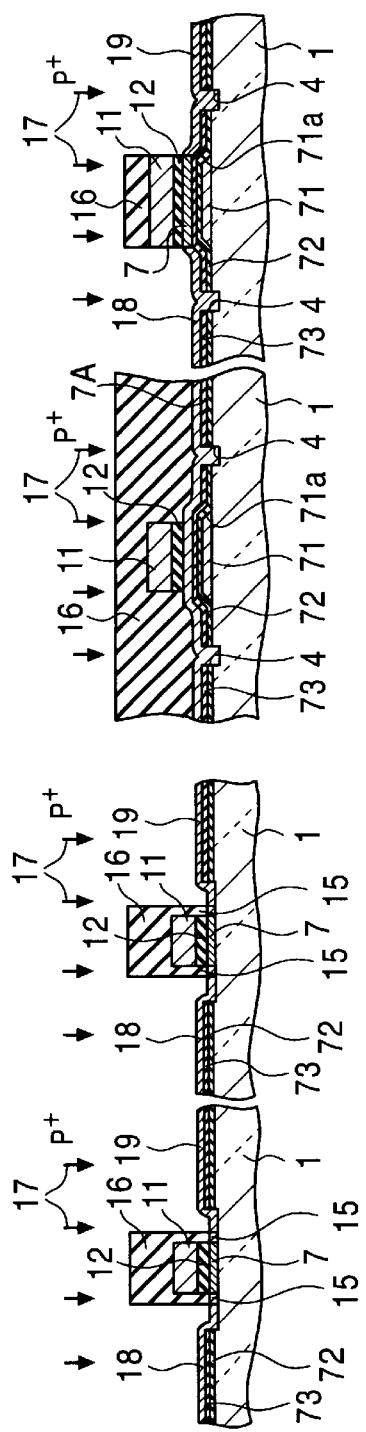
FIGS. 5A to 5C are cross-sectional views showing the subsequent production steps of the LCD in accordance with the first embodiment of the present invention.

With reference to FIG. 5A, all of the pMOSTFTs in the peripheral driving region, the gate sections of the nMOSTFTs in the peripheral driving region, and the gate sections and the LDD sections of the nMOSTFTs in the display region are covered with a photoresist 16, and the exposed regions are doped with phosphorus or arsenic ions 17 by ion implantation at 20 kV and at a dosage of $5 \times 10^{15}$ atoms/cm² to form source sections 18, drain sections 19 and the LDD sections 15 of an $N^+$-type layer of the nMOSTFTs.

Figure 5B:
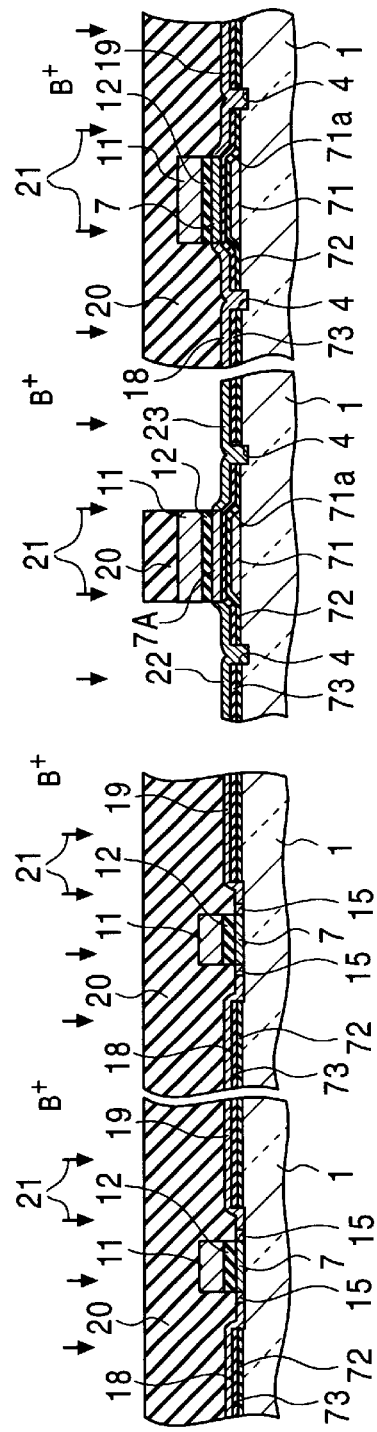

With reference to FIG. 5B, all of the nMOSTFTs in the peripheral driving region and the display region and the gate sections of the pMOSTFTs in the peripheral driving region are covered with a photoresist 20, and the exposed regions are doped with boron ions 21 by ion implantation at 10 kV and at a dosage of $5 \times 10^{15}$ atoms/cm² to form source sections 22 and drain sections 23 of an $P^+$-type layer of the pMOST-FTS. In the case of an nMOS peripheral driving circuit, this step is not necessary since the circuit does not have a pMOSTFT.

Figure 5C:
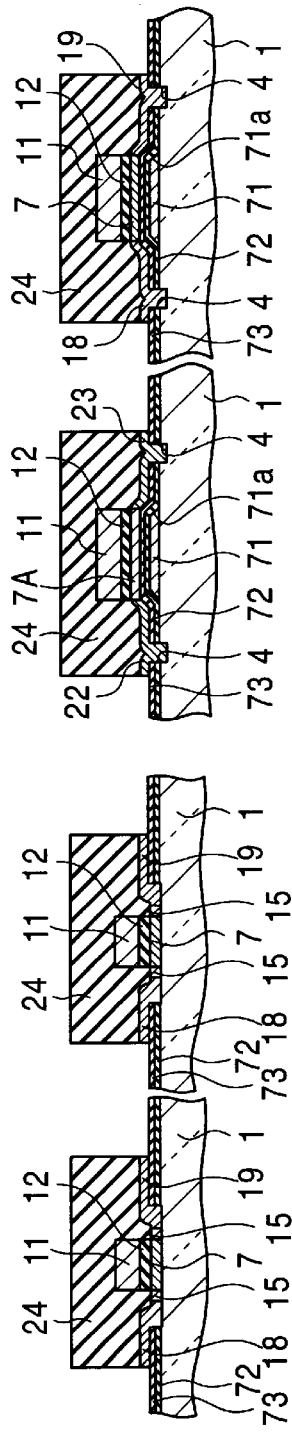

With reference to FIG. 5C, in order to island the active device sections including TFTs and diodes and the passive device sections including resistors and inductors, photoresist layers 24 are provided on all of the active device sections and the passive device sections in the peripheral driving region and the display section, and the single-crystal silicon layer 7 in other sections is removed by a conventional photolithographic process or an etching process using a hydrofluoric acid solution.

Figure 6A:
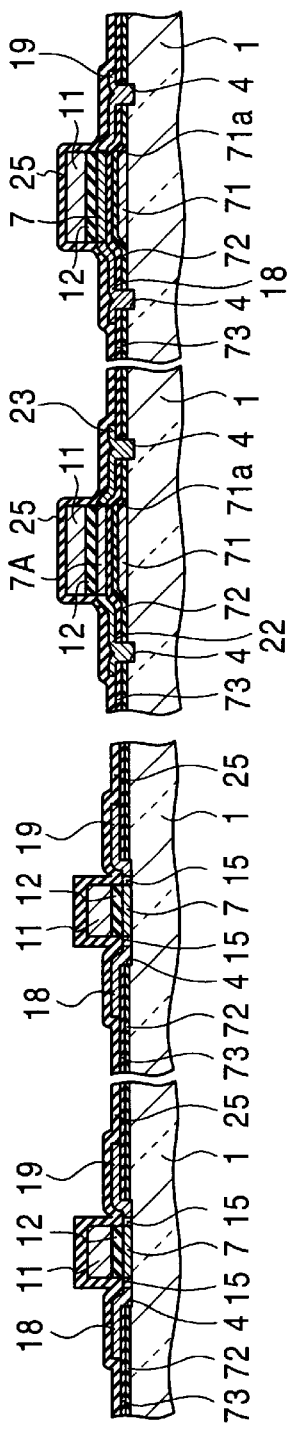
FIGS. 6A to 6C are cross-sectional views showing the subsequent production steps of the LCD in accordance with the first embodiment of the present invention.

With reference to FIG. 6A, a $SiO_2$ film having a thickness of approximately 200 nm and then a phosphosilicate glass (PSG) film having a thickness of approximately 300 nm are continuously deposited to form a protective film 25 on the entire surface by a plasma-enhanced CVD process, a high-density plasma-enhanced CVD process or a catalytic CVD process.

In such a state, the single-crystal silicon layer is activated. Activation treatment is performed at approximately 1,000° C. for approximately 10 seconds using, for example, a halogen lamp, and the gate electrode composed of the Mo—Ta alloy having a high melting point is durable during the annealing for activation. The Mo—Ta alloy can be used not only for the gate section but also as lead lines over a wide range. In the activation, excimer laser annealing requiring high process costs is generally not used. If excimer laser annealing is used, overlapping scanning of 90% or more is preferably performed on the entire surface or selectively the active device section and the passive device section using XeCl (wavelength: 308 nm).

Figure 6B:
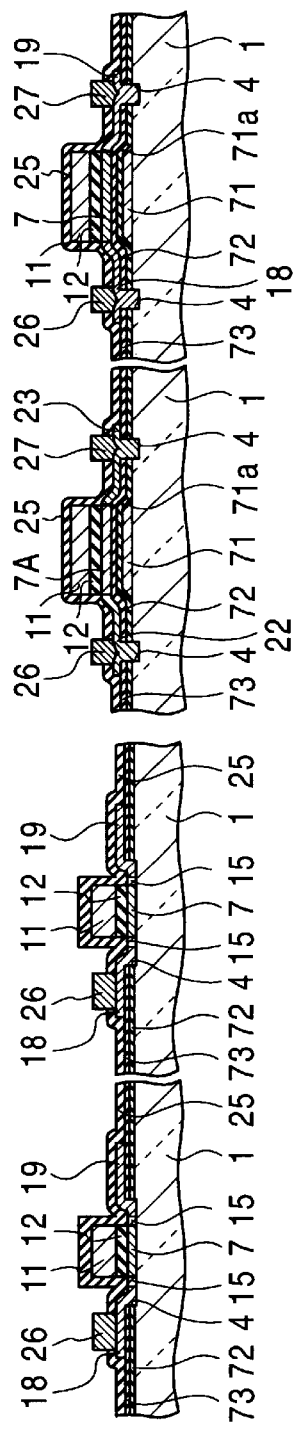

With reference to FIG. 6B, contact holes are formed for all of the source-drain sections of the TFTS in the peripheral driving circuit and the source sections of the TFTs in the display region, by a conventional photolithographic process and an etching process.

A film having a thickness of 500 to 600 nm is formed on the entire surface, from aluminum or an aluminum alloy, e.g., an aluminum alloy containing 1 wt % Si or 1 to 2 wt % copper and, by a conventional photolithographic process and an etching process, source electrodes 26 of all TFTs both in the peripheral driving circuit section and the display section, as well as the drain electrodes 27 in the peripheral driving circuit section, are formed, simultaneously with the formation of data lines and gate lines. The structure thus formed is subjected to sintering at approximately 400° C. for 1 hour in a forming gas ($N_2+H_2$).

Figure 6C:
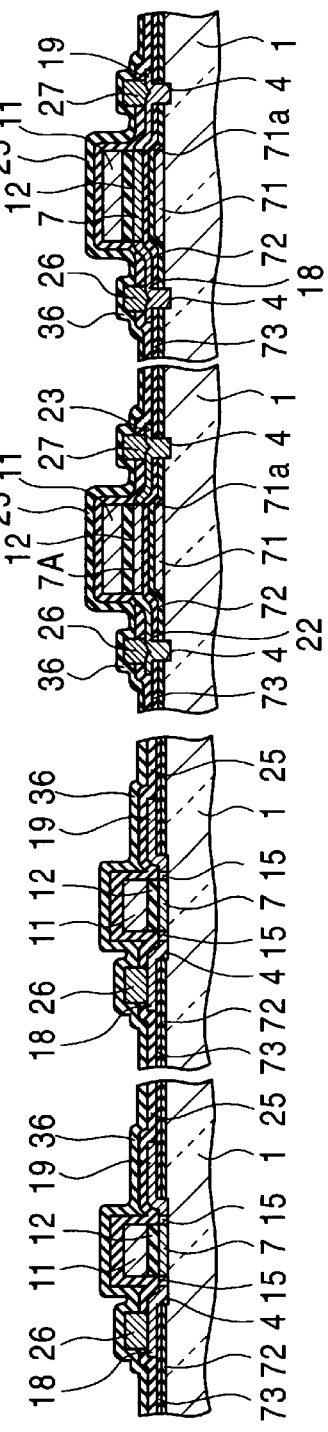

With reference to FIG. 6C, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed for the drain sections of TFTs in the display region. It is not necessary to remove the $SiO_2$, PSG and SiN films in the pixel sections.

Basic requirements of a reflective liquid crystal display are to reflect the light incident on the display towards the interior of the liquid crystal panel and, at the same time, to scatter the light. This is because the direction of the incident light is uncertain whereas the position of the observer with respect to the display is substantially fixed. Thus, the reflector must be designed on an assumption that point light sources are present at arbitrary positions. As shown in FIG. 7A, a photosensitive resin film 28 having a thickness of 2 to 3 μm is formed on the entire surface by spin coating and, as shown in FIG. 7B, an uneven pattern is formed in at least the pixel region by a conventional photolithographic process and an etching process so that the pixel section has optimized reflective characteristics and viewing-angle characteristics, followed by a reflow to form a lower portion of the reflective face of an uneven surface 28A. Contact holes are simultaneously formed in the resin film for the drain sections of TFTs in the display region.

With reference to 7C, a sputtering film having a thickness of 400 to 500 nm is deposited from aluminum or an aluminum alloy, e.g., an alloy containing 1 wt % Si, on the entire surface, and the sputtering film at the region other than the pixel sections is removed by a general photolithographic process and an etching process, thereby to form an uneven aluminum reflective sections 29 which are connected to the drain sections 19. The reflective sections 29 are used as pixel electrodes for displaying. Next, these are subjected to sintering at approximately 300° C. for 1 hour in a forming gas to enhance the contact. Silver or a silver alloy may be used instead of aluminum to increase the reflectance.

As described above, a single-crystal silicon layer 7 is formed by high-temperature graphoepitaxy using the step differences as the seeds, and an active-matrix substrate 30 integrating a display section and a peripheral-driving-circuit section is produced by forming, both in the display section and in the peripheral-driving circuit section which employ the single-crystal silicon layer 7, top-gate nMOSLDD-TFTs and cMOS circuits which are composed of dual-gate pMOSTFTs and dual-gate nMOSTFTs.

Figure 8:
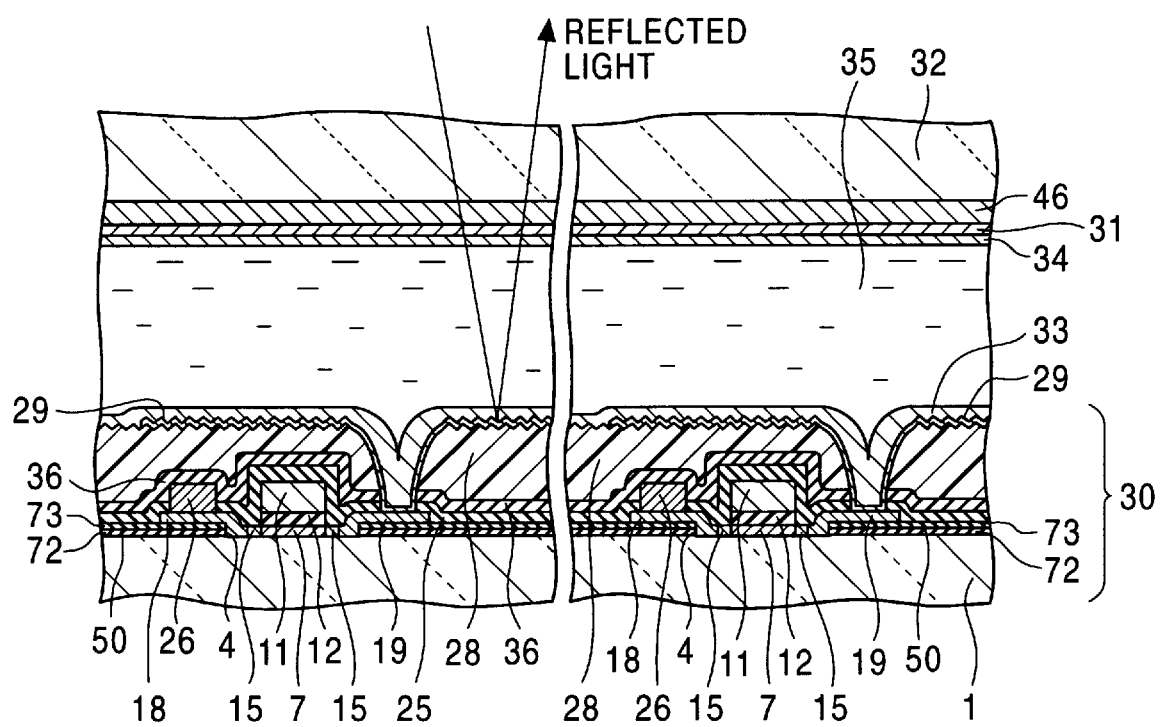
FIG. 8 is a cross-sectional view of a critical portion of the LCD of the first embodiment.

With reference to FIG. 8, a method of producing a reflective liquid crystal display using the active-matrix substrate (driving substrate) 30 will now be described. Hereinafter, the active-matrix substrate is referred to as a TFT substrate.

When a liquid crystal cell in this LCD is produced by double-side assembly (suitable for medium to large liquid crystal panels of 2 inches or greater), polyimide alignment films 33 and 34 are formed one surface of the TFT substrate 30 and on a device-mounting surface of a counter electrode 32 having a solid indium tin oxide (ITO) electrode, respectively. The polyimide alignment films are formed by roll coating or spin coating so that thicknesses are in a range of 50 to 100 nm and are cured at 180° C. for 2 hours.

The TFT substrate 30 and the counter substrate 32 are aligned by rubbing or by an optical method. Although rubbing may be performed using cotton or rayon, cotton is preferable in view of dust produced by rubbing and retardation. In optical alignment, liquid crystal molecules are aligned by noncontact linearly polarized UV light irradiation. Polymer alignment film can also be formed by polarized or unpolarized light which is diagonally incident, such polymer films being, for example, polymethyl methacrylate polymers containing azobenzene.

After washing, a common material is applied to the TFT substrate 30 whereas a sealing agent is applied to the counter electrode 32. The washing is conducted with water or IPA (isopropyl alcohol), for the purpose of removing buffing dust. The common material may be an acrylic, an epoxy-acrylate or epoxy adhesive containing a conductive filler, while the sealing agent may be an acrylic, an epoxy-acrylate or epoxy adhesive. Although curing may be performed by heating, UV irradiation, or a combination thereof, a combination of heating and UV irradiation is preferable due to high overlapping alignment accuracy and ready working operations.

Spacers are distributed on the counter substrate 32 to form a given gap and the counter substrate 32 is overlapped with the TFT substrate 30. After achieving alignment such that an alignment mark of the counter substrate 32 is precisely aligned to an alignment mark of the TFT substrate 30, the sealing agent is preliminarily cured by UV irradiation, and then cured by heat at once.

Then, independent liquid crystal panels each having the TFT substrate 30 and the counter electrode 32 are formed by scribe-break process.

The gap between the two substrates 30 and 32 is filled with a liquid crystal 35 through an injection port which is then sealed with an UV-curable adhesive, and washing with isopropyl alcohol is executed. Any type of liquid crystal may be used, and a nematic liquid crystal used in a twisted nematic mode having high-speed response is generally used.

The liquid crystal 35 is aligned by heating and a subsequent quenching.

Flexible lead lines are connected to the panel electrode extraction section of the TFT substrate 30 by thermal compressive bonding using an anisotropic conductive film, and then a polarizer is bonded to the counter electrode 32.

When the liquid crystal panel is produced by single-side assembly (suitable for compact liquid crystal panels of 2 inches or smaller), polyimide alignment films 33 and 34 are formed one surface of the TFT substrate 30 and on a device-mounting surface of the counter electrode 32, respectively, and then these substrates 30 and 32 are aligned by rubbing or noncontact optical alignment using linearly polarized UV light.

The TFT substrate 30 and the counter substrate 32 are divided into segments by dicing or scribing and are washed with water or isopropyl alcohol. A common material is applied to each divided TFT substrate 30 whereas a sealing agent containing spacers is applied to each counter substrate 32, and these substrates are overlapped with each other. The subsequent process is substantially the same as above.

In the above-described reflective LCD, he counter substrate 32 of the reflective LCD is a color filter (CF) substrate having a color filter layer 46 provided below the ITO electrodes 31. The light incident to the counter substrate 32 is effectively reflected by the reflective film 29 and is emitted from the counter substrate 32.

Besides the substrate structure as shown in FIG. 8, the TFT substrate may have an on-chip color filter (OCCF) structure in which the TFT substrate 30 has a color filter, wherein ITO electrodes or ITO electrodes with a black masks are directly bonded to the counter electrode 32.

When the auxiliary storage capacitor (Cs) described before with reference to FIG. 13 is provided in the pixel section, a dielectric layer (not shown in the drawing) provided on the substrate 1 is connected to the drain region 19 of the single-crystal silicon.

As described above, this embodiment offers the following noticeable advantages.

(A) The step differences 4 having a predetermined size and a shape are formed on the substrate 1, and the single-crystal silicon layer 7 is deposited by high-temperature graphoepitaxy using the bottom corner of each step difference as a seed (heating during the graphoepitaxy is performed at a relatively low temperature of 900 to 930° C.), whereby a single-crystal silicon layer 7 having a high electron mobility of 540 $cm^2$/v·sec or more is obtained to enable production of a LCD having high-performance drivers.

(B) The single-crystal silicon layer has higher electron or hole mobility, comparable with that of a single-crystal silicon substrate and is higher than that of conventional amorphous or polycrystalline silicon thin-films, so that single-crystal silicon dual-gate MOSTFTs using this single-crystal silicon layer can implement an integral structure composed of a display section and a peripheral-driving-circuit section, wherein the display section has nMOSTFTs, pMOSTFTs or cMOSTFTs with LDD structures that offer high switching performance and low-leak current characteristics, while the peripheral-driving-circuit section includes cMOSTFTs, nMOSTFTs and/or pMOSTFTs which exhibit high driving performance, thus implementing a display panel having high image quality, high definition, a narrow frame, a large screen and a high luminescent efficiency. Since the single-crystal silicon layer 7 has sufficiently high hole mobility, the peripheral driving circuit can drive by using only electrons or holes, or by a combination thereof, and can be combined with the display TFTs having pMOSTFT or cMOSTFTs with LDD structures, thus realizing an integrated panel structure. In compact to medium-sized panels, one of a pair of vertical peripheral driving circuits may be omitted.

(C) In particular, the use of dual-gate MOSTFTs in the peripheral driving circuit makes it possible to obtain cMOS, nMOS or pMOSTFTs having driving power 1.5 to 2.0 times as large that obtainable with the use of single-gate TFTs, thus achieving higher performance and greater driving power of the TFTs, offering advantages particularly when TFTs having large driving power are to be used in a local portion of the peripheral driving circuit. Furthermore, the dual-gate structure can easily be changed to a top-gate type structure or a bottom-gate type structure through a selection of one of the upper and lower gates and, in addition, ensures safe operation even in the event of a failure in one of the upper and lower gates because the other gate can safely be used.

(D) The polycrystalline or amorphous silicon layer 5 can be formed by a plasma-enhanced CVD process or a reduced-pressure CVD process at a substrate temperature of 100 to 400° C,, while the low-melting-point metal layer 6 can be formed by a vacuum evaporation process or a sputtering process and, in addition, heating during graphoepitaxy can be performed at 930° C. or less, so that the single-crystal silicon layer 7 can be uniformly formed on the insulating substrate at a relatively low temperature of, for example, 900 to 930° C. or less. Quartz glass, crystallized glass or ceramic can be used as a substrate.

(E) Since this process does not require long-term annealing at a medium temperature nor excimer annealing, which is essential for solid phase epitaxy, this process has high productivity and does not require expensive facilities, resulting in reduced production costs.

(F) In the high-temperature graphoepitaxy, a single-crystal silicon layer having a variety of p-type impurity concentrations and a high mobility can be readily produced by controlling the ratio of indium to silicon, the heating temperature of the substrate, and the cooling rate, allowing the threshold voltage (Vth) to be readily controlled to reduce the resistance to facilitate high-speed operations.

(G) When a color filter is provided on the display array, the aperture ratio of the display panel and the luminance are improved, and costs are decreased due to omission of a color filter substrate and improved productivity.

Figure 15A:
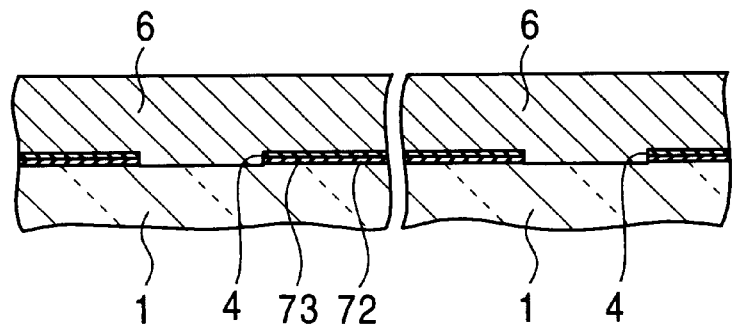
FIGS. 15A to 15C are cross-sectional views showing production steps of a LCD in accordance with a second embodiment of the present invention.
Figure 15B:
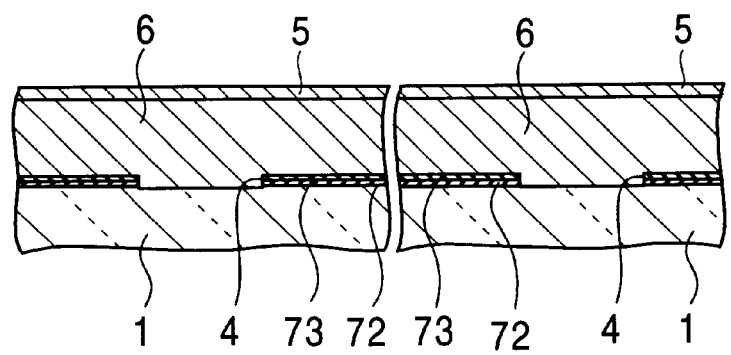
Figure 15C:
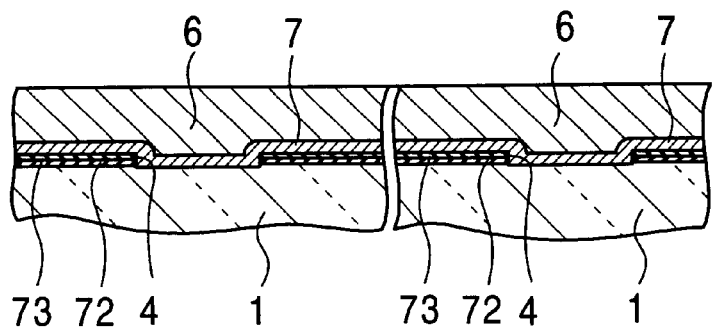

FIGS. 15A to 15C show a second embodiment of the first aspect of the present invention.

This embodiment also is an active-matrix reflective LCD as is the case of the first embodiment, but is different from the first embodiment in that, after the processing shown in FIG. 2A, for example, an indium film 6 having a thickness of 10 to 20 μm is formed on the entire surface including the step differences 4 by a sputtering process or a vacuum evaporation process, as shown in FIG. 15A.

With reference to FIG. 15B, an amorphous silicon film 5 having a thickness of several μm to 0.005 μm (for example, 0.1 μm) is formed on the indium film 6 by a known plasma-enhanced CVD process.

Since the temperature for forming the silicon film must not significantly exceed the melting point of the low-melting-point metal 6 (156° C. for indium or 29.77° C. for gallium), it is difficult to form a polycrystalline silicon film which is optimally formed at 600° C. to 650° C. Therefore, the amorphous silicon film 5 is formed on the indium film 6 by a plasma-enhanced CVD process.

The substrate 1 is maintained in a hydrogen atmosphere at 1,000° C. or less (particularly 900 to 930° C.) for approximately 5 minutes so that the amorphous silicon film 5 is dissolved in the indium melt.

With reference to FIG. 15C, the substrate 1 is gradually cooled so that the silicon dissolved in the indium melt is deposited by graphoepitaxy on the substrate 1 using the step differences 4 as the seeds, whereby a single-crystal silicon layer 7 having a thickness of, for example, approximately 0.1 μm is formed.

In this case, the (100) plane of the single-crystal silicon layer 7 is deposited on the substrate by epitaxy as described before, and the orientation of the crystal layer can be controlled by changing the shape of the step differences as shown in FIGS. 9A to 9F.

After the deposition of the single-crystal silicon layer 7 by graphoepitaxy on the substrate 1, indium at the surface is removed by hydrochloric acid as in the first embodiment, and each TFT in the display section and the peripheral-driving-circuit section is produced after effecting a predetermined treatment on the single-crystal silicon layer 7.

In this embodiment, heat-melting and cooling treatments are performed after forming the amorphous silicon layer 5 on the low-melt-point metal layer 6 which is formed to cover the step differences 4, but the graphoepitaxial growth of the single-crystal silicon from the melt of the low-melt-point metal takes place as in the case of the preceding embodiment.

Figure 16A:
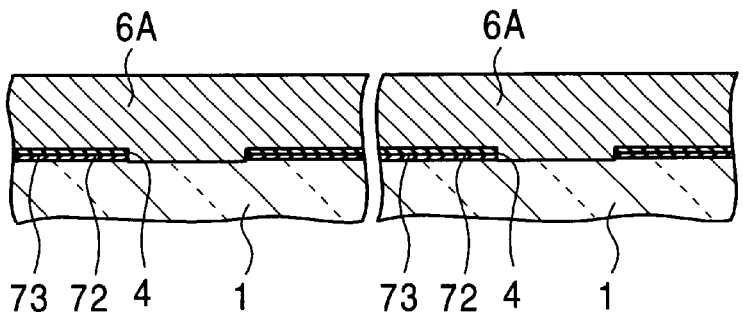
FIGS. 16A and 16B are cross-sectional views showing production steps of a LCD in accordance with a third embodiment of the present invention.
Figure 16B:
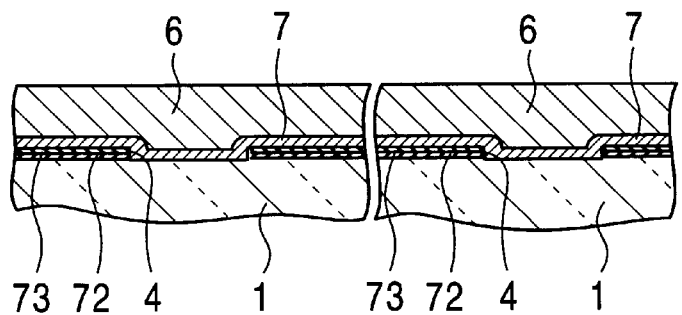

FIGS. 16A and 16B show a third embodiment of the first aspect of the present invention.

This embodiment also is an active-matrix reflective LCD as is the case of the first embodiment, but is different from the first embodiment in that, after the processing shown in FIG. 2A, an indium film 6A having a thickness of 10 to 20 µm and containing a given amount (for example approximately 1 percent by weight) of silicon is formed on the entire surface including the step differences 4 by a sputtering process or a vacuum evaporation process, as shown in FIG. 16A.

The substrate 1 is maintained in a hydrogen atmosphere at 1,000° C. or less (particularly 900 to 930° C.) for approximately 5 minutes, so that the silicon is dissolved in the indium melt.

The substrate 1 is gradually cooled so that the silicon dissolved in the indium melt is deposited by graphoepitaxy on the substrate 1 using the step differences 4 as a seed, whereby a single-crystal silicon layer 7 having a thickness of approximately 0.1 µm is formed, as shown in FIG. 16B.

The (100) plane of the single-crystal silicon layer 7 is deposited on the substrate by epitaxy as described before, and the orientation of the crystal layer can be controlled by changing the shape of the step differences as shown in FIGS. 9A to 9F.

After the deposition of the single-crystal silicon layer 7 by graphoepitaxy, indium at the surface is removed by hydrochloric acid as in the first embodiment, and each TFT in the display section and the peripheral-driving-circuit section is produced after effecting a predetermined treatment on the single-crystal silicon layer 7.

In this embodiment, heat-melting and cooling treatments are performed after forming the amorphous silicon layer 5 on the low-melt-point metal layer 6 which is formed to cover the step differences 4, but the graphoepitaxial growth of the single-crystal silicon from the melt of the low-melt-point metal takes place as in the case of the preceding embodiment.

Figure 17A:
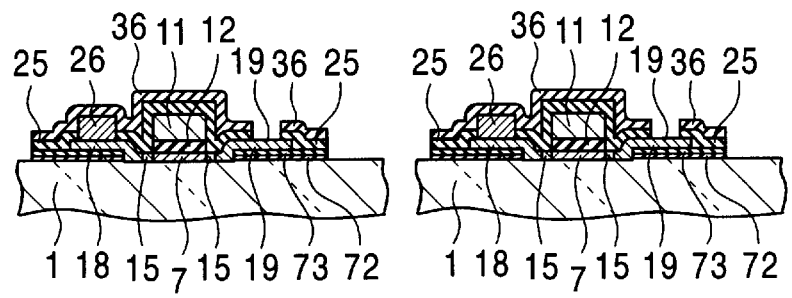
FIGS. 17A–17C are cross-sectional views showing production steps of a LCD in accordance with a fourth embodiment of the present invention.
Figure 19A:
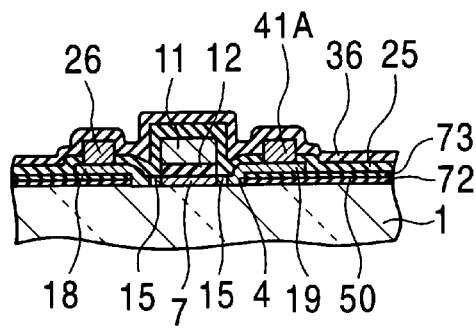
FIGS. 19A to 19D are cross-sectional views showing the subsequent production steps of the LCD in accordance with the fourth embodiment of the present invention.
Figure 19B:
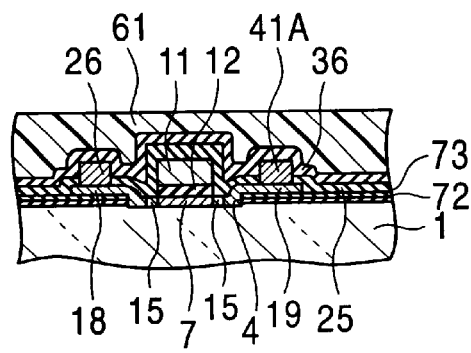
Figure 19C:
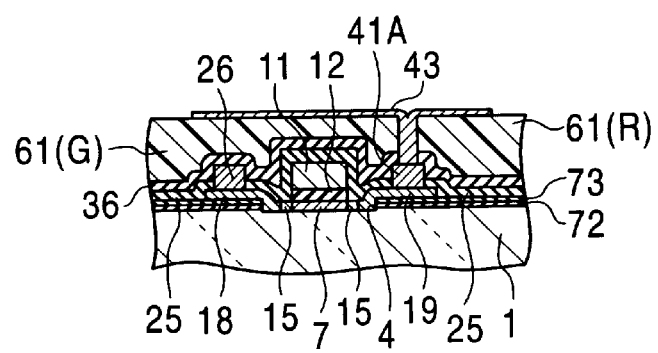
Figure 19D:
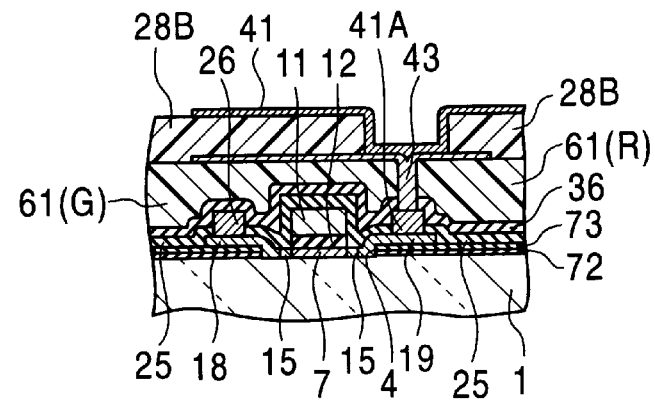

FIGS. 17A and 19D show a fourth embodiment of the first aspect of the present invention.

This embodiment has, as in the case of the first embodiment, top-gate MOSTFTs in the display section and dual-gate MOSTFTs in the peripheral driving circuit section, but pertains to a transmissive LCD, unlike the first embodiment. More specifically, in this embodiment, the transmissive LCD is produced by following the procedure as Steps shown in FIG. 1A to FIG. 6C as in the first embodiment, but in the subsequent process, contact holes 19 for the drain sections of TFTs in the display section are formed in insulating films 25 and 36, as shown in FIG. 17A, and the unnecessary SiO$_2$ film, PSG film and Si film in the pixel-opening section are removed to improve the transmittance.

Thus, an opaque ceramic substrate cannot be used.

Figure 17B:
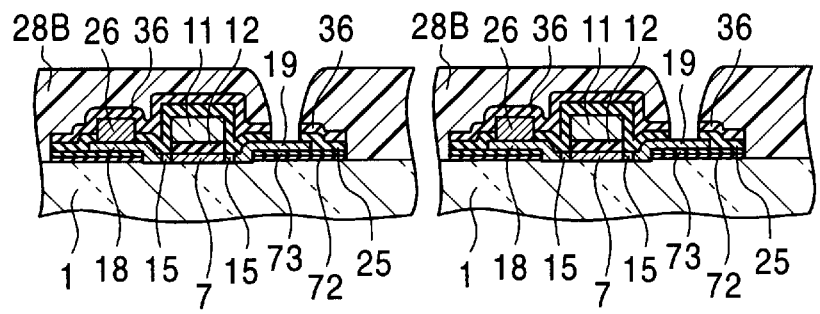

With reference to FIG. 17B, a planarization film 28B, which is composed of an acrylic photosensitive transparent resin and has a thickness of 2 to 3 µm, is formed on the entire surface by spin coating etc., and then contact holes for drains of TFTs in the displaying section (display TFTS) are formed in the transparent resin 28B, followed by curing of the transparent resin 28B executed under a given condition.

Figure 17C:
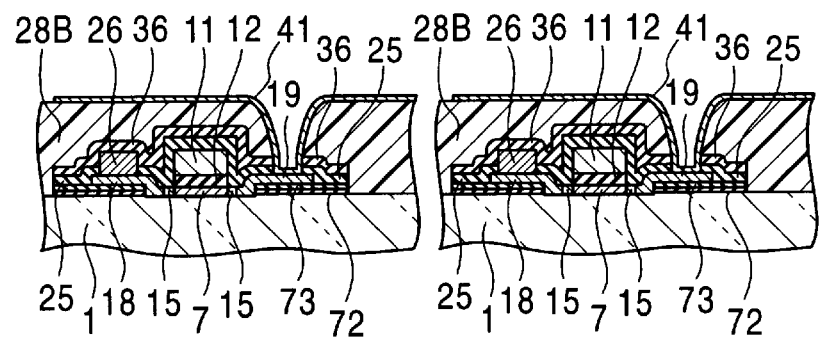

With reference to FIG. 17C, an ITO film having a thickness of 130 to 150 nm is formed on the entire surface by sputtering, and then an ITO transparent electrodes 41 in contact with the drain section 19 in the display region are formed by photolithography and etching. Next, a heat-treatment in a forming gas at 200 to 250° C. for 1 hour is performed to reduce the contact resistance between the drain of each TFT in the display section and the ITO and to improve the transparency of the ITO.

Figure 18:
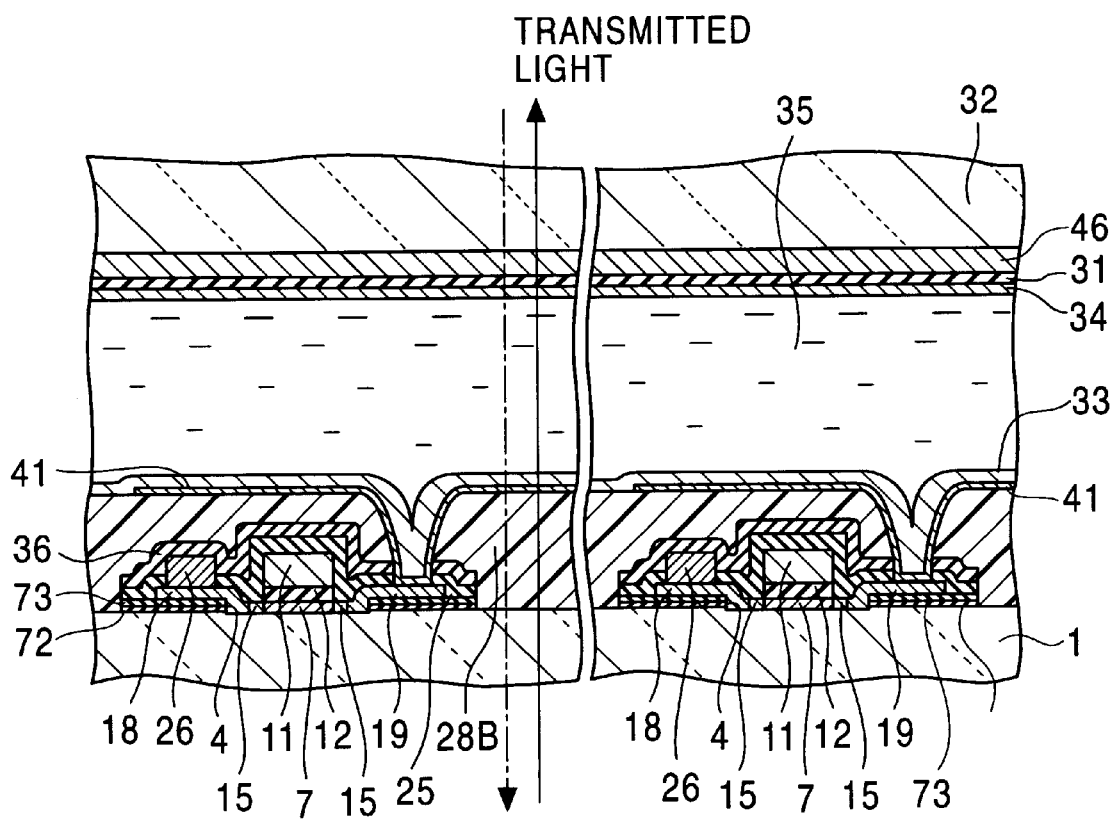
FIG. 18 is a cross-sectional view of a critical portion of the LCD of the second embodiment.

Then, a transmissive LCD is assembled combining this TFT substrate 1 with a counter substrate 32 as in the first embodiment, as shown in FIG. 18. In this embodiment, however, a polarizer is provided also on the TFT substrate. Although transmission light runs in this transmissive LCD as shown by a solid line in the drawing, the arrangement may be such that transmission light is available from the counter substrate 32.

An on-chip color-filter (OCCF) structure and an on-chip black (OCB) structure can be made from this transmissive LCD, as follows.

After performing Steps shown in FIGS. 1A to 6A, contact holes are also formed at the drain sections of the PSG-SiO$_2$ insulating film 25 as shown in FIG. 19A, and an aluminum embedded layer 41A for a drain electrode is formed, followed by deposition of the SiN-PSG insulating film 36.

With reference to FIG. 19B, a photoresist 61 containing a red, green or blue pigment having a thickness of 1 to 1.5 µm is formed on the corresponding color segments and, as shown in FIG. 19C, color filter layers 61(R), 61(G) and 61(B) are formed by a general photolithographic process in such a pattern as to leave the colors only at predetermined locations corresponding to the pixels. (OCCF structure). Contact holes are also formed at the drain sections. This embodiment excludes the use of an opaque ceramics substrates and substrates made of low-transmissivity glass or heat-resistant resin.

With reference to FIG. 19C, a metal shading layer 43 servable as a black mask layer is formed over the contact holes communicating with the drains of the display TFTs and over the color filter layer, by a patterning process using a metal. For example, a molybdenum film having a thickness of 200 to 250 nm is formed by a sputtering process and is then patterned to form a given shape for shading the display TFTs (OCB structure).

With reference to FIG. 19D, a planarization film 28B composed of a transparent resin is formed, and then ITO transparent electrodes 41 are formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

A fifth embodiment of the first aspect of the present invention will now be described.

This embodiment relates to an active-matrix reflective liquid crystal display (LCD) including top-gate MOSTFTs formed of a single-crystal silicon layer which is deposited by low-temperature graphoepitaxy from an indium-gallium-silicon or gallium-silicon melt, using as seeds step differences (indents) on a glass substrate having a low distortion point.

In contrast to the first embodiment, the substrate 1 used in this embodiment is a glass substrate having a low distortion point or maximum usable temperature as low as 600° C. or so, such as borosilicate glass or aluminosilicate glass, as the substrate employed in Step shown in FIG. 1A. Such a glass is inexpensive and can easily be produced in large sizes, e.g., 500 mm×600 mm×0.1 to 1.1 mm can be formed using long rolled glass. Obviously, quartz and crystallized glass may be used as well.

After forming the step differences 4 as in the preceding embodiments, an indium-gallium (or gallium) film is formed in Step shown in FIG. 2C on the polycrystalline silicon film S by a MOCVD, sputtering or vacuum evaporation process using trimethyl indium gallium or trimethyl gallium so that the thickness thereof becomes several ten to several hundred times the thickness of the polycrystalline silicon film 5, for example, the thickness becomes 10 to 20 µm.

The substrate 1 is maintained in a hydrogen atmosphere at 300 to 600° C. (or 420 to 600° C.) for 5 minutes. As a result, the polycrystalline silicon 6 (or amorphous silicon) is dissolved into the indium-gallium or gallium melt. Silicon in the melt is precipitated at a temperature which is lower than the temperature for pure silicon.

When the substrate 1 is gradually cooled, as shown in FIG. 3A, silicon dissolved in indium-gallium (or indium) is deposited by graphoepitaxy on the bottom corners of the step differences 4 serving as seeds to form a single-crystal silicon layer 7 having a thickness of, for example, 0.1 µm.

In this case also, the (100) plane of the single-crystal silicon layer 7 is deposited on the substrate by epitaxy and the orientation of the crystal layer can be controlled by changing the shape of the step differences 4, as shown in FIGS. 9A to 9F.

After the deposition of the single-crystal silicon layer 7 by graphoepitaxy on the substrate 1, indium and gallium at the surface are removed by hydrochloric acid or sulfuric acid, as shown in FIG. 2C.

Using the single-crystal silicon layer 7, top-gate MOST-FTs are formed in the display section and bottom-gate MOSTFTs are formed in the peripheral-driving-circuit section, as in the first embodiment. The structure shown in FIG. 8 may also be employed in this embodiment.

This embodiment has the following noticeable advantages, in addition to the advantages of the first embodiment.

(A) The single-crystal silicon layer 7 can be more uniformly formed on the glass substrate 1 by graphoepitaxy at a lower temperature of approximately 300 to 600° C. (or 420 to 600° C.).

(B) This process enables the formation of the single-crystal silicon layer on an insulating substrate such as an organic substrate, other than the glass substrate, allowing the use of any inexpensive material having a low distortion point and improved physical properties as the substrate, thus facilitating production of large-size substrates. Accordingly, a thin, long and rolled glass or organic substrate provided with a single-crystal silicon layer can be produced using such a material at a reduced cost and with high productivity. When the constituents in the glass substrate are diffused into the upper layer and affect the transistor characteristics, a thin barrier layer, for example, a silicon nitride layer having a thickness of 50 to 200 nm, is preferably provided, in order to suppress such a diffusion.

(C) In the low-temperature graphoepitaxy, a single-crystal silicon layer having a variety of p-type impurity concentrations and a high mobility can be readily produced by controlling the ratio of indium to gallium of the indium-gallium film, the heating temperature of the substrate, and the cooling rate, thus facilitating the control of the threshold voltage (Vth) and reducing the resistance to afford high-speed operation.

A sixth embodiment of the first aspect of the present invention will now be described.

In contrast to the preceding fifth embodiment, this embodiment relates to a transmissive LCD in which a single-crystal silicon layer is formed by low-temperature graphoepitaxy using an indium-gallium film, as in the fourth embodiment.

Using the single-crystal silicon layer, the transmissive LCD is produced by the process shown in FIG. 17A to FIG. 19D, as in the fourth embodiment. Opaque ceramic substrates and opaque or translucent organic substrates are not suitable for the transmissive LCD.

Accordingly, this embodiment has the advantages of both the fourth and fifth embodiments. Thus, this embodiment offers the following advantages in addition to those produced by the first embodiment: borosilicate glass and heat-resistant organic materials which are inexpensive and facilitate the formation of long thin rolled substrates can be used as the substrate 1; the conductive type and Vth of the single-crystal silicon layer can be readily adjusted by the ratio of indium to gallium; and the color filter 42 and the black mask 43 provided on the display array section improve the aperture ratio of the liquid crystal display panel and decreases electrical power consumption of the display module including a back light.

FIGS. 20A to 28C show a seventh embodiment of the first aspect of the present invention.

In this embodiment, the peripheral-driving-circuit section includes a cMOS driving circuit including dual-gate-type pMOSTFTs and nMOSTFTs as in the first embodiment. The display section is of a reflective type and includes TFTs having various gate configurations arranged in a variety o combinations.

Figure 20A:
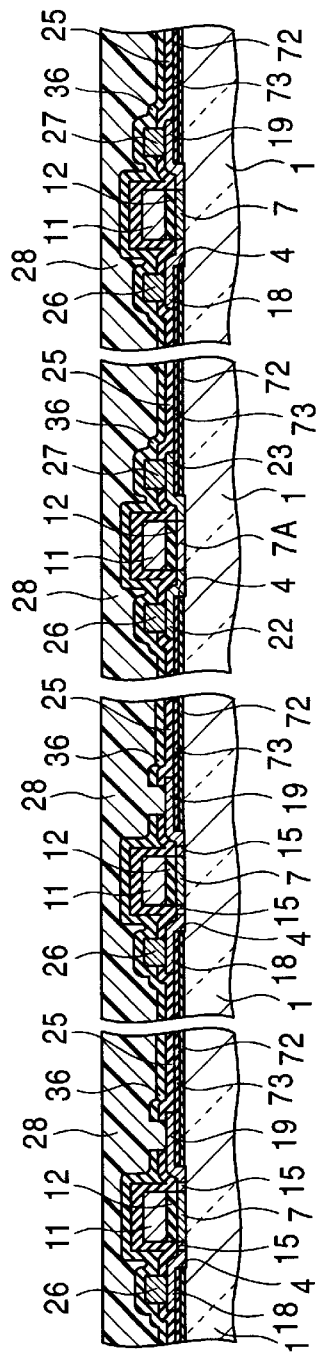
FIGS. 20A to 20C are cross-sectional views showing production steps of a LCD in accordance with a seventh embodiment of the present invention.
Figure 20B:
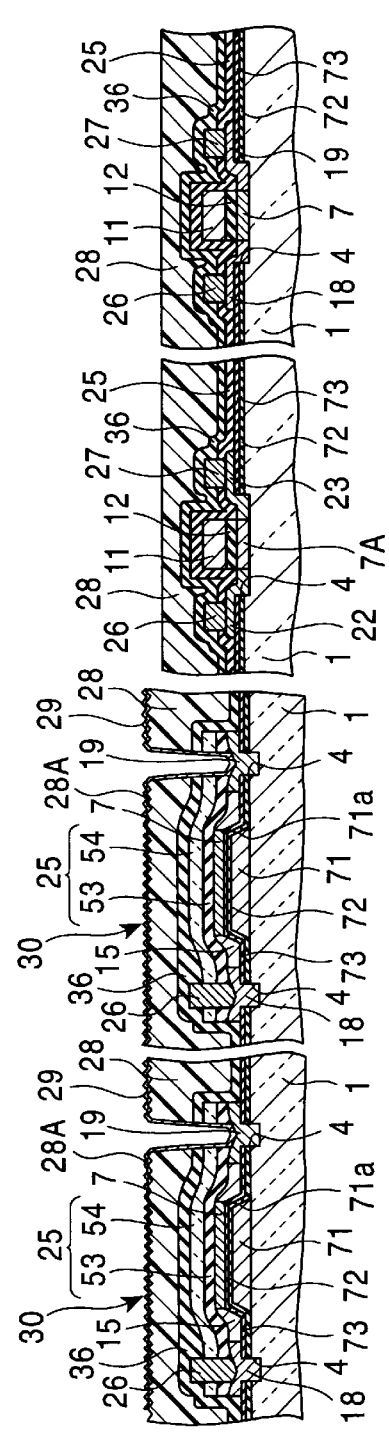
Figure 20C:
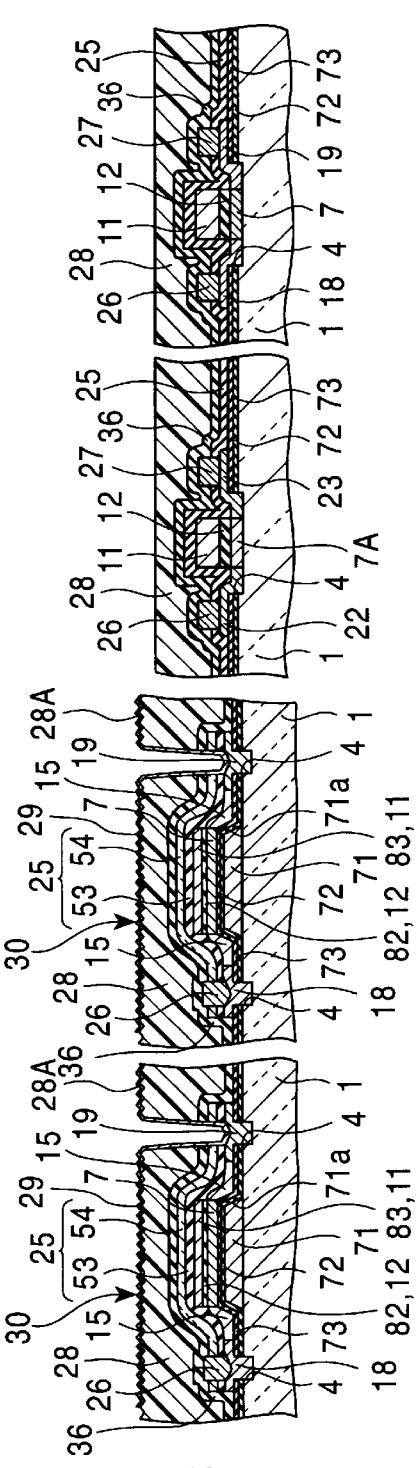

The display section shown in FIG. 20A includes top-gate nMOSLDD-TFTs as in the first embodiment, while the display section shown in FIG. 20B includes bottom-gate nMOSLDD-TFTs, whereas the display section shown in FIG. 20C includes dual-gate nMOSLDD-TFTs. These bottom-gate and dual-gate MOSTFTs can be produced by the same process for the dual-gate MOSTFTs of the peripheral-driving-circuit section, as will be described later, the dual-gate MOSTFT having higher driving ability and being suitable for high-speed switching by virtue of the presence of upper and lower gates and, furthermore, the upper or lower gate may be selectively used to implement a top- or bottom-gate type during operation.

In the bottom-gate MOSTFT shown in FIG. 20B, a gate electrode 71 is composed of, for example, molybdenum-tantalum, and a gate insulating film is composed of a SiN film 72 and a $SiO_2$ film 73. A channel region and so forth using the single-crystal silicon layer are formed on the gate insulating film as in the case of the dual-gate MOSTFT of the peripheral-driving-circuit section. The dual-gate MOSTFT shown in FIG. 20C has the lower-gate section substantially the same as that in the bottom-gate MOSTFT, whereas the upper-gate section includes an upper-gate electrode 83 formed on a gate insulating film 82 composed of a $SiO_2$ film and a SiN film. In all the cases, each gate section is formed in the exterior of the step difference 4 which serves as a seed for graphoepitaxy.

A method of producing the above-mentioned bottom-gate MOSTFT will be described with reference to FIGS. 21A to 25C, and a method of producing the dual-gate MOSTFT will be described with reference to FIGS. 26A to 28C. The method of producing the dual-gate MOSTFT in the peripheral-driving-circuit section is the same as that described before with reference to FIGS. 1A to 6C and is therefore not illustrated.

Figure 21A:
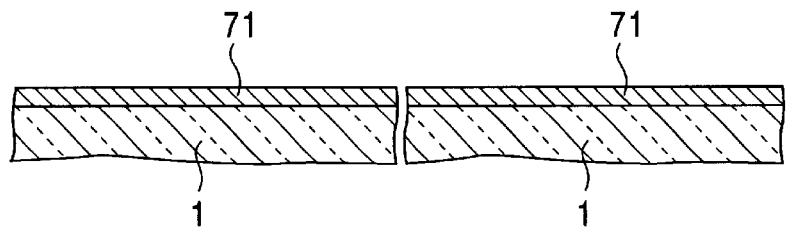
FIGS. 21A to 21D are cross-sectional views showing production steps of the LCD in accordance with the seventh embodiment of the present invention.

With reference to FIG. 21A, in the production of the bottom-gate MOSTFT in the display section, a molybdenum-tantalum alloy film 71 having a thickness of 500 to 600 nm is formed on a substrate 1 by sputtering.

Figure 21B:
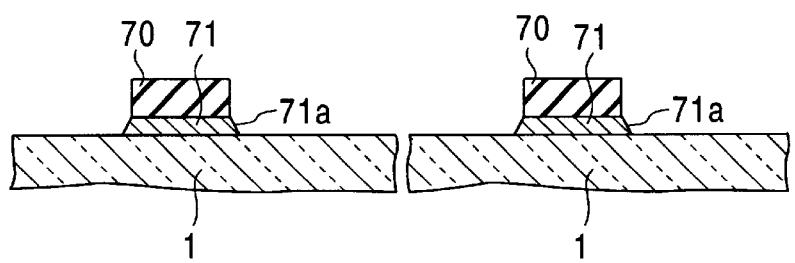

With reference to FIG. 21B, a photoresist 70 having a given pattern is formed by a processing which is the same as that described with reference to FIG. 1B, and the molybdenum-tantalum alloy film 71 is subjected to taper etching using the photoresist 70 as a mask to form a gate electrode 71 having a trapezoidal side base 71a with an angle of 20 to 45 degrees.

Figure 21C:
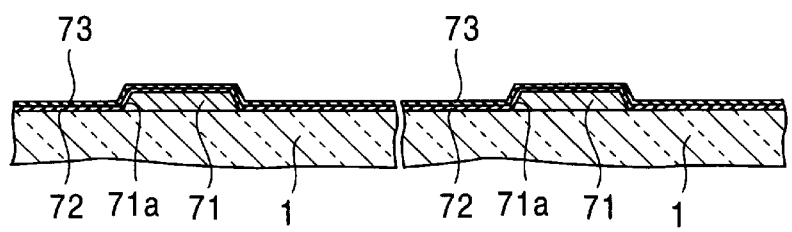

With reference to FIG. 21C, the processing which is the same as that shown in FIG. 1C is conducted in which, after the photoresist 70 is removed, a SiN film 72 having a thickness of approximately 100 nm and then a SiO$_2$ film 73 having a thickness of approximately 200 nm are deposited on the substrate 1 including the molybdenum-tantalum alloy film 71, by a plasma-enhanced CVD process, thereby to form a gate insulating film.

Figure 21D:
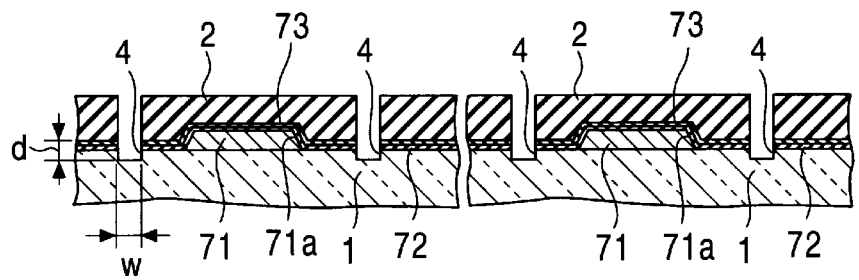

With reference to FIG. 21D, the same process as that described before in connection with FIG. 2A is executed in which a photoresist 2 having a given pattern is formed in at least the TFT-forming region, and a plurality of step differences 4 having a proper shape and size are formed in the gate insulating film and further in the substrate 1 through a mask constituted by the photoresist 2, as described above. The step differences 4 function as seeds during graphoepitaxy of the single-crystal silicon layer as will be described later, and have a depth d of 0.3 to 0.4 μm, a width of 2 to 3 μm, a length of 10 to 20 μm perpendicular to the drawing sheet, and an basilar angle (between the bottom and the side wall) which is a right angle.

Figure 22A:
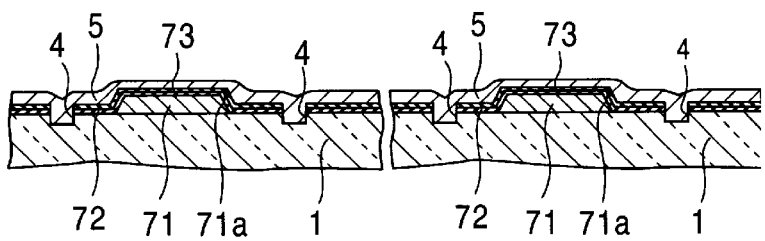
FIGS. 22A to 22E are cross-sectional views showing the subsequent production steps of the LCD in accordance with the seventh embodiment of the present invention.

Then, after removal of the photoresist 2, the same processing as FIG. 2B is conducted to form a polysilicon film 5, as in FIG. 22A.

Figure 22B:
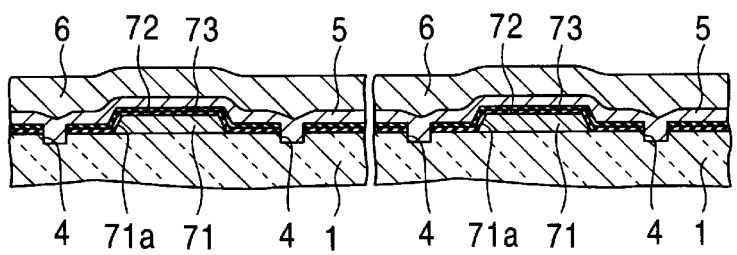
Figure 22C:
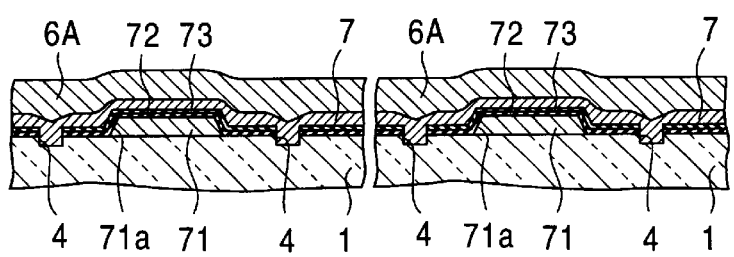

The same processing as that shown in FIG. 2C is conducted so as to deposit a film 6 of indium, or of indium-gallium, as shown in FIG. 22B.

Then, the same process as FIG. 3A is executed to cause graphoepitaxial growth of a single-crystal silicon, whereby a single-crystal silicon layer of a thickness of, for example, 0.1 μm or so is deposited. In this process, the side faces 71a of the underlying gate electrode 71 are gently tapered, so that these side faces do not cause impediment to the epitaxial growth on the seeds constituted by the step differences, whereby the single-crystal silicon layer 7 can grow on these side faces without discontinuity.

Figure 22D:
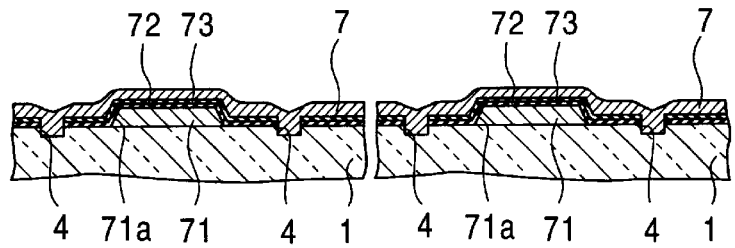

Then, the film 6A of indium is removed as shown in FIG. 22D and, after execution of Steps shown in FIGS. 3C to 4B, the processing which is the same as that of FIG. 4C is executed in which the gate section of the nMOSTFTs in the display section are covered by the photoresist 13, and source and drain regions of the nMOSTFTs left exposed are doped by ion implantation with phosphor ions 14, whereby an LDD section 15 composed of an N-type layer is formed by self-alignment. In this process, the bottom-gate electrode 71 permits easy recognition of the height differences or pattern, thus facilitating positioning of the photoresist 13, i.e., mask alignment, thereby suppressing misalignment.

Figure 23A:
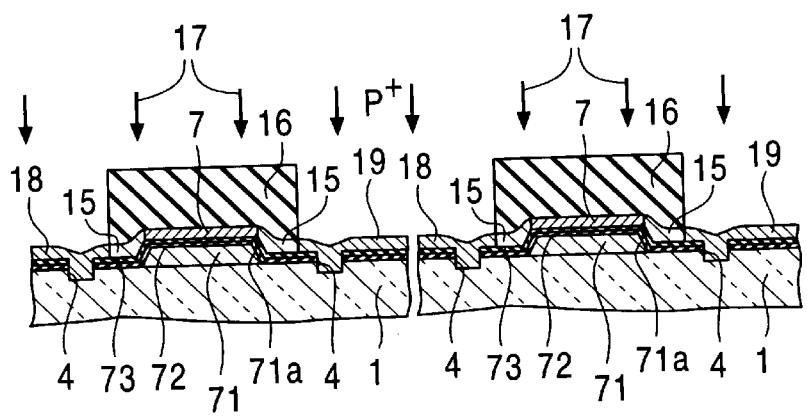
FIGS. 23A to 23D are cross-sectional views showing the subsequent production steps of the LCD in accordance with the seventh embodiment of the present invention.

With reference to FIG. 23A, the gate section and the LDD section of the nMOSTFT are covered with a photoresist 16 and the exposed region is doped with phosphorus or arsenic ions 17 by ion implantation to form a source section 18 and a drain section 19 composed of an N$^+$-type layer of the nMOSTFT, as in Step shown in FIG. 5A.

Figure 23B:
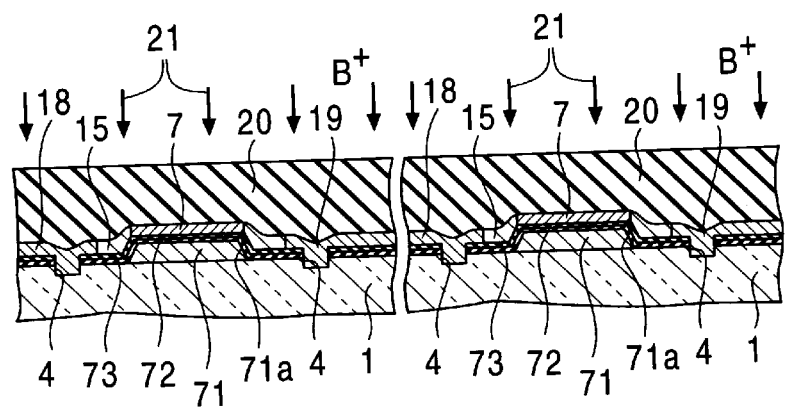

With reference to FIG. 23B, the entire nMOSTFT is covered with a photoresist 20 and then doped with boron ions 21 by ion implantation to form a source section and a drain section of the p$^{30}$ layer of the pMOSTFTs in the peripheral-driving-circuit section, as in Step shown in FIG. 5B.

Figure 23C:
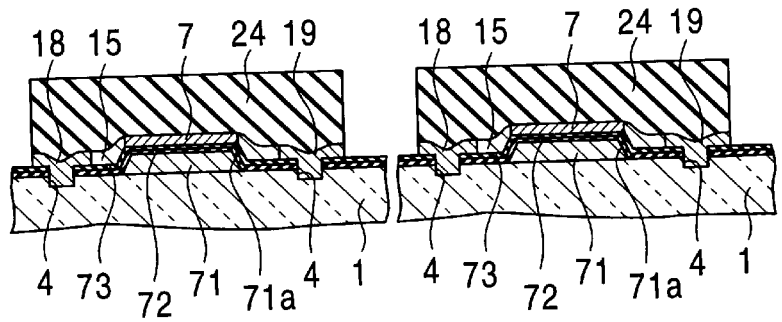

With reference to FIG. 23C, a photoresist 24 is provided and then the single-crystal silicon layer is selectively removed by conventional photolithography and etching to island the active device section and the passive device section, as in Step shown in FIG. 5C.

Figure 23D:
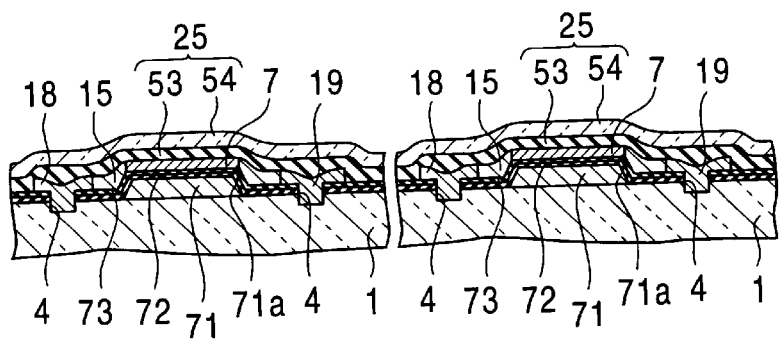

With reference to FIG. 23D, a SiO$_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in Step shown in FIG. 6A. The SiO$_2$ film 53 and the PSG film 54 correspond to the aforementioned protective film 25. The single-crystal silicon layer is then subjected to an activation treatment as described before.

Figure 24A:
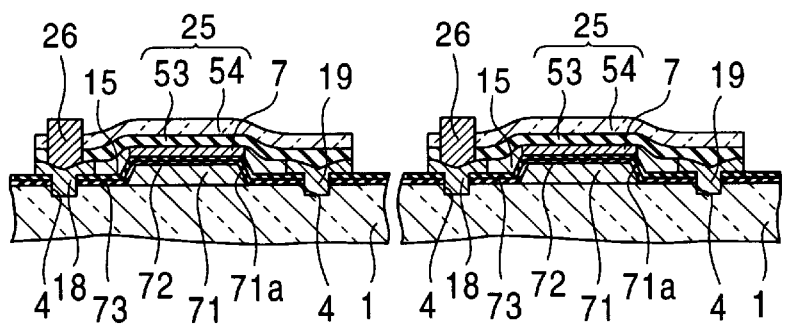
FIGS. 24A to 24D are cross-sectional views showing the subsequent production steps of the LCD in accordance with the seventh embodiment of the present invention.

With reference to FIG. 24A, contact holes are formed for the source sections by conventional photolithography and etching, as in Steps shown in FIG. 6B. An aluminum sputtering film having a thickness of 400 to 500 nm is formed on the entire surface, and source electrodes 26 of the TFTs, data lines and gate lines are simultaneously formed by conventional photolithography and etching. The substrate is then sintered in a forming gas at approximately 400° C for 1 hour.

Figure 24B:
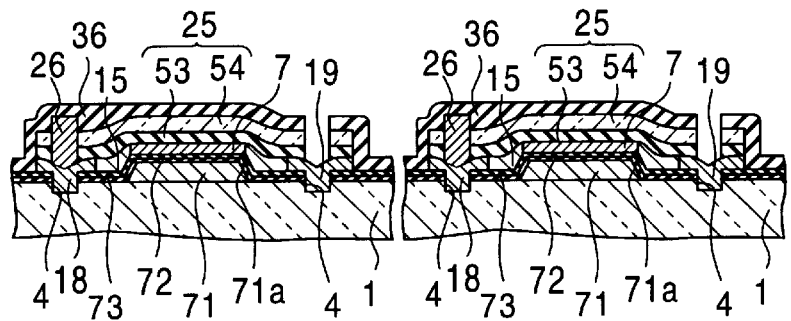

With reference to FIG. 24B, an insulating film 36 composed of a PSG film having a thickness of approximately 300 nm and a SiN film having a thickness of approximately 300 nm is formed on the entire surface by a high-density plasma-enhanced CVD process or a catalytic CVD process, and contact holes are formed at the drain sections of display TFTs, as in FIG. 6C.

Figure 24C:
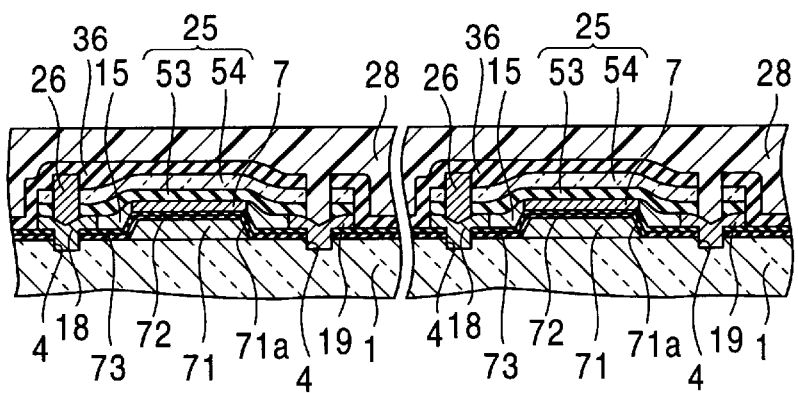
Figure 24D:
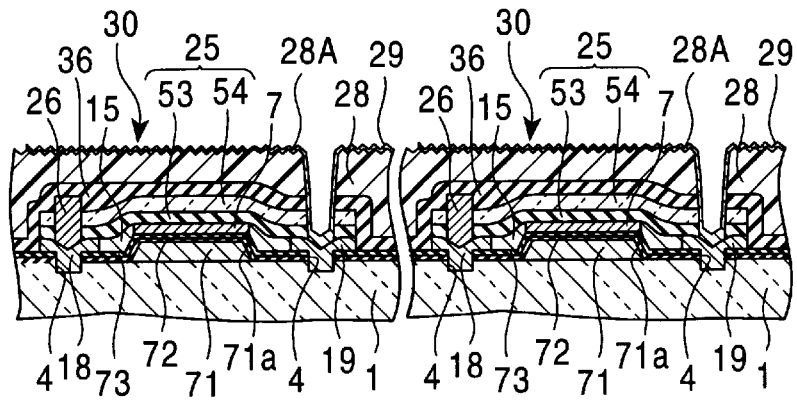

With reference to FIG. 24C, a photosensitive resin film 28 having a thickness of 2 to 3 μm is formed by spin coating, as in Step 16 shown in FIG. 7A, followed by a Step shown in FIG. 24D in which an uneven pattern is formed and then subjected to reflow to form a lower portion of a reflective layer having an uneven surface 28A so that the pixel section has optimized reflective and viewing-angle characteristics. At the same time, contact holes are formed in the resin for allowing contact of the drain sections of the display TFTs.

With reference to FIG. 24D, an aluminum sputtering film having a thickness of 400 to 500 nm is formed on the entire surface, and then an uneven aluminum reflective section 29 connecting to the drain sections 19 of the display TFTs is formed by conventional photolithography and etching, as in Step shown in FIG. 7C.

As described above, the resulting active-matrix substrate 30 integrates a display section and a peripheral-driving-circuit section, in which the display section includes bottom-gate nMOSLDD-TFTs using the single-crystal silicon layer 7 formed by high-temperature graphoepitaxy on the step differences 4 as a seed, while the peripheral-driving-circuit section includes a cMOS driving circuit having dual-gate pMOSTFTs and dual-gate nMOSTFTs.

Figure 25A:
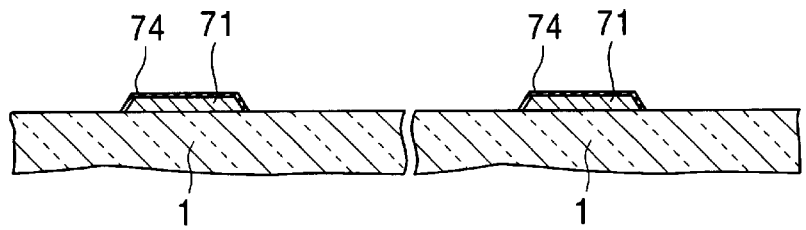
FIGS. 25A to 25C are cross-sectional views showing production steps of the LCD in accordance with the seventh embodiment of the present invention.
Figure 25B:
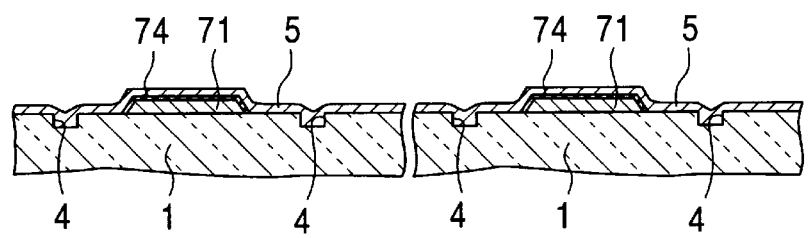
Figure 25C:
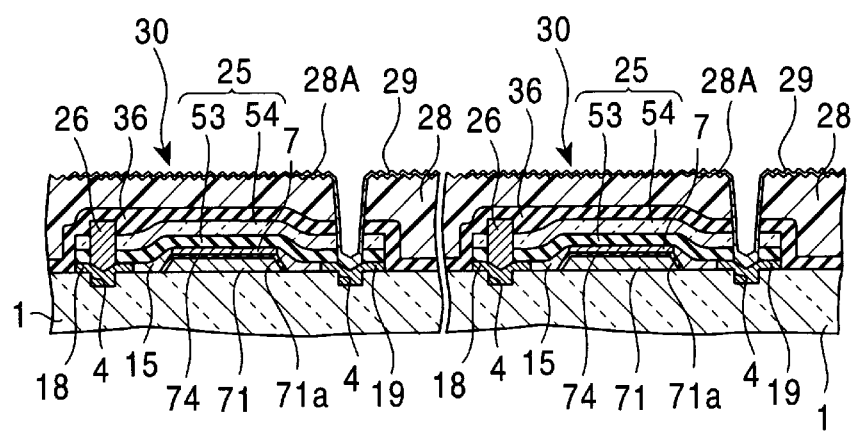

FIGS. 25A to 25C show the formation of the gate insulating film of the above-mentioned bottom-gate MOSTFT in the display section by anodic oxidation of molybdenum-tantalum.

After the step of FIG. 21B, the molybdenum-tantalum alloy film 71 is subjected to conventional anodic oxidation treatment, as shown in FIG. 25A, to form on the surface a gate insulating film 74 composed of Ta$_2$O$_5$ and having a thickness of 100 to 200 nm.

Next, with reference to FIG. 25B, the step differences 4 are formed and a single-crystal layer 7 is deposited thereon graphoepitaxy, as in the steps shown in FIGS. 21D to 22D, followed by execution of processing similar to those of FIGS. 22D to 24D to form an active matrix substrate 30 as shown in FIG. 25C.

When the dual-gate MOSTFTs are produced in the display section, the processes are executed in the same way as those shown in FIGS. 21A to 22D.

Figure 26A:
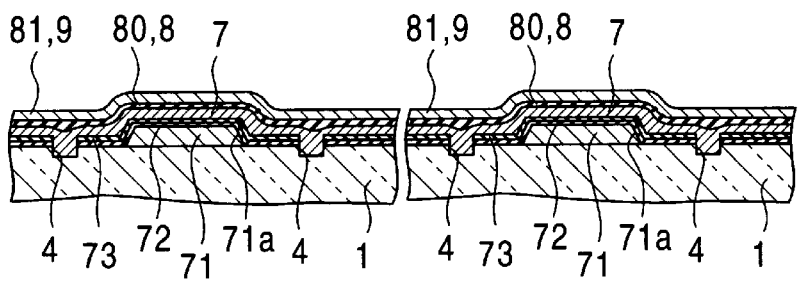
FIGS. 26A to 26D are cross-sectional views showing production steps of the LCD in accordance with the seventh embodiment of the present invention.

More specifically, with reference to FIG. 26A, step differences 4 are formed in the substrate 1 through the insulating films 72 and 73, and then a single-crystal silicon layer 7 is deposited by graphoepitaxy on the step differences 4 as a seed. Next, a step which is the same as that shown in FIG. 4A is executed so that a $SiO_2$ film having a thickness of approximately 200 nm and then a SiN film having a thickness of approximately 100 nm are successively formed on the entire surface of the single-crystal silicon layer 7 by a plasma-enhanced CVD process or a catalytic CVD process, thereby to form an insulating film 80 corresponding to the insulating film 8. Then, a molybdenum-tantalum alloy film 81 having a thickness of 500 to 600 nm, corresponding to the sputtering film 9, is formed by sputtering.

Figure 26B:
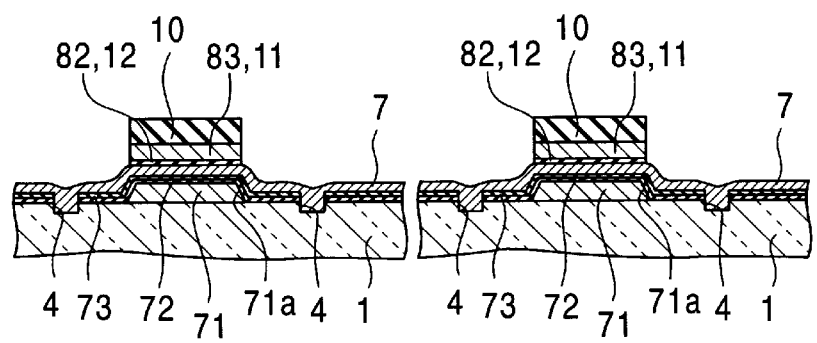

With reference to FIG. 26B, processing which is the same as that shown in FIG. 4B is executed: namely, a photoresist pattern 10 is formed and is subjected to continuous etching to form a top-gate electrode 82 (corresponding to the gate electrode 12) composed of the molybdenum-tantalum alloy and a gate insulating film (corresponding to the gate insulating film 11), thereby exposing the single-crystal silicon layer 7.

Figure 26C:
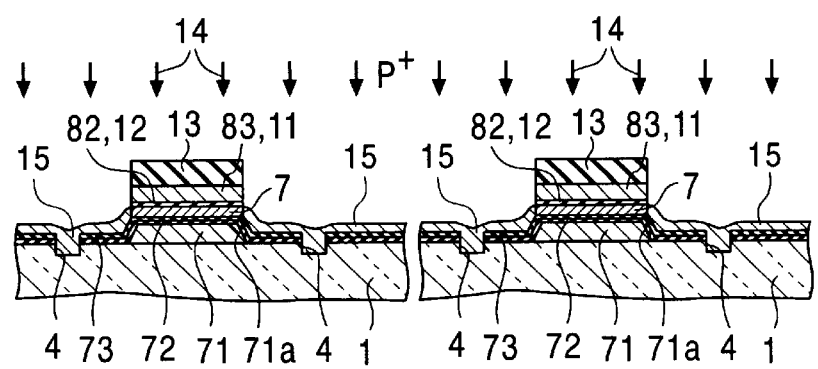

With reference to FIG. 26C, the same processing as that shown in FIG. 4C is executed: namely, the top-gate section of the nMOSTFT is covered with a photoresist 13, and the exposed source and drain regions of the nMOSTFT for display are doped with phosphorus ions 14 by ion implantation to form an $N^-$-type LDD section 15.

Figure 26D:
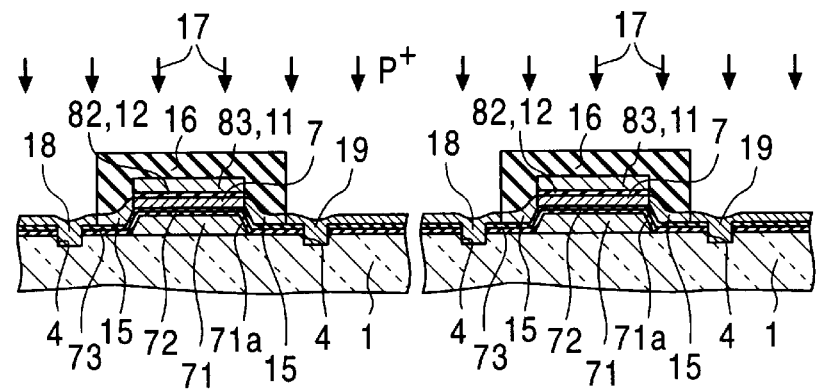

With reference to FIG. 26D, the same processing as that shown in FIG. 5A is executed: namely, the gate section and the LDD section of the nMOSTFT are covered with a photoresist 16, and the exposed region is doped with phosphorus or arsenic ions 17 by ion implantation, thereby to form a source section 18 and a drain section 19 of nMOSTFT composed of an $N^+$-type layer.

Figure 27A:
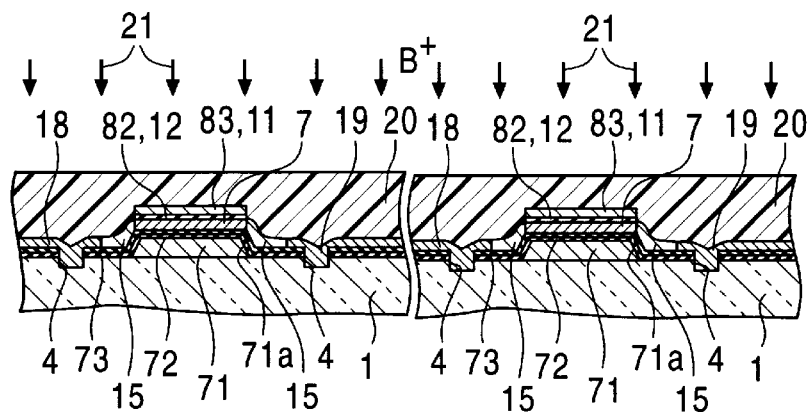
FIGS. 27A to 27D are cross-sectional views showing the subsequent production steps of the LCD in accordance with the seventh embodiment of the present invention.

With reference to FIG. 27A, the same processing as that shown in FIG. 5B is performed: namely, the gate section of the pMOSTFT is covered with a photoresist 20 and the exposed region is doped with boron ions 21 by ion implantation to form a source section and a drain section of the pMOSTFT composed of a $P^+$-layer in the peripheral-driving-circuit section.

Figure 27B:
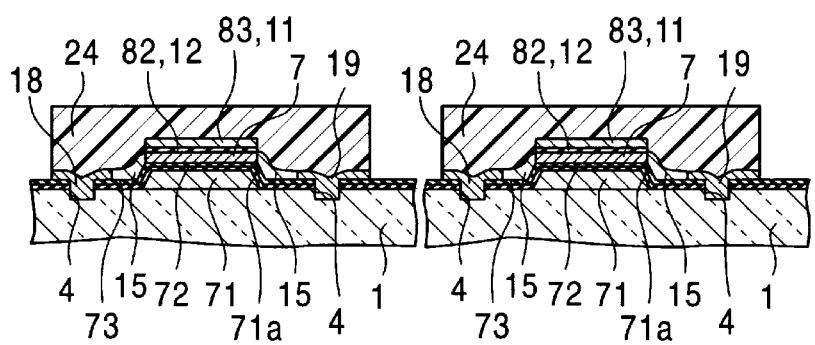

With reference to FIG. 27B, the same processing as that shown in FIG. 5C is executed: namely, a photoresist layer 24 is provided and the single-crystal silicon layer is selectively removed at portions other than the active and passive device sections by conventional photolithography and etching, thereby to island the active device section and the passive device section.

Figure 27C:
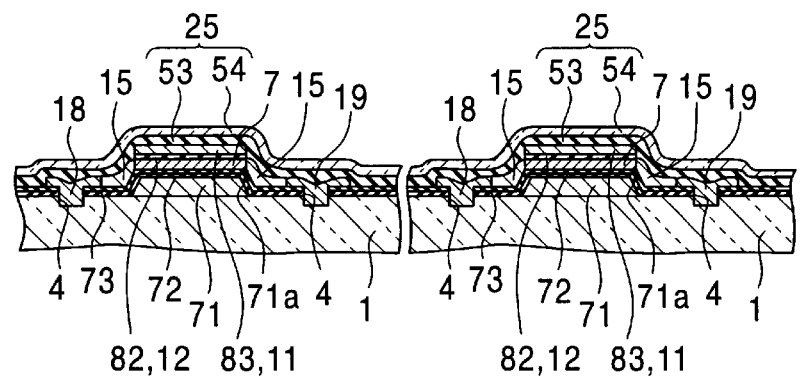

With reference to FIG. 27C, the same process as that shown in FIG. 6A is performed: namely, a $SiO_2$ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process. These films 53 and 54 correspond to the aforesaid protective film 25. Then, an activation treatment is effected on the single-crystal silicon layer 7.

Figure 27D:
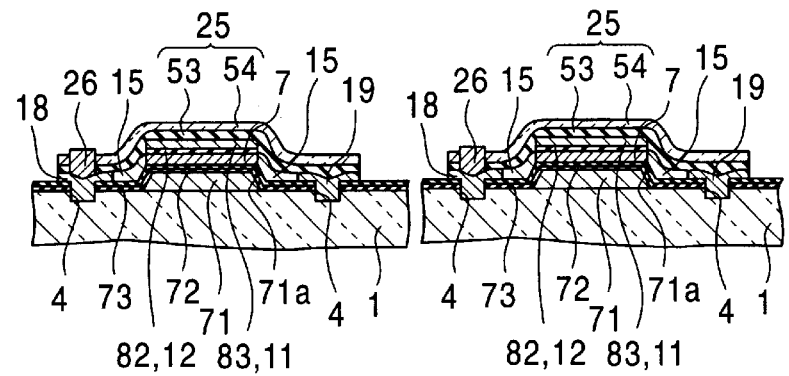

With reference to FIG. 27D, the same processing as that shown in FIG. 6B is executed; namely, contact holes are formed for the source sections. 5B. An aluminum sputtering film having a thickness of 400 to 500 nm is formed on the entire surface, and then source electrodes 26, data lines and gate lines are simultaneously formed by conventional photolithography and etching.

Figure 28A:
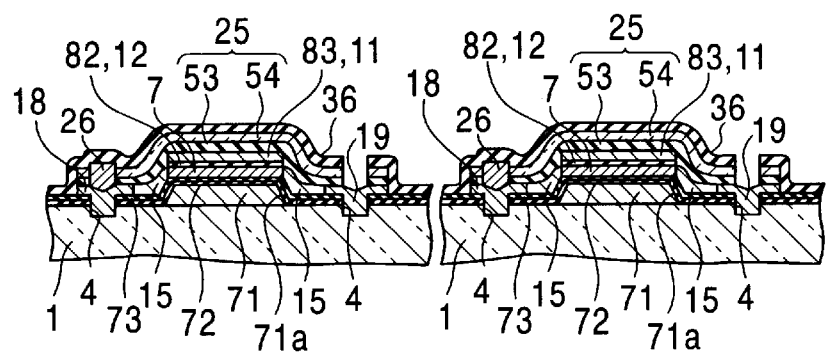
FIGS. 28A to 28C are cross-sectional views showing the subsequent production steps of the LCD in accordance with the seventh embodiment of the present invention.

With reference to FIG. 28A, the same processing as that shown in FIG. 6C is executed: namely, an insulating film 36 including a PSG film having a thickness of approximately 300 nm and a SiN film having a thickness of approximately 300 nm is formed on the entire surface, and contact holes are formed for the drain sections of the display TFTS.

Figure 28B:
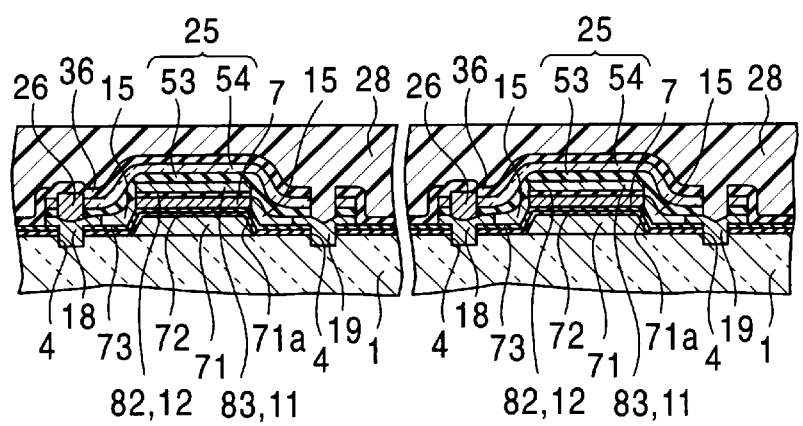
Figure 28C:
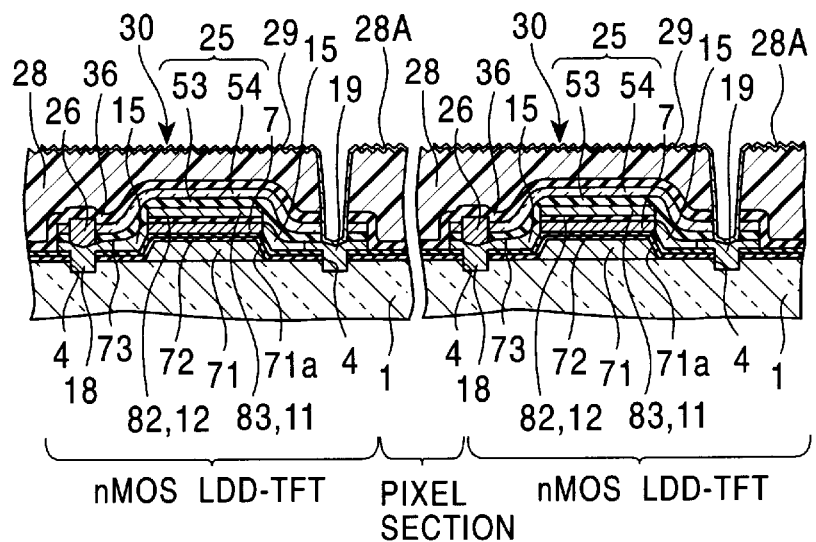

With reference to FIG. 28B, a photosensitive resin film 28 having a thickness of 2 to 3 $\mu$m is formed on the entire surface by, for example, spin coating. With reference to FIG. 28C, Steps which are the same as those of FIGS. 7B and 7C are performed: namely, a lower portion of a reflective face comprising an uneven surface 28A is formed in at least the pixel section, contact holes are formed for the drain sections of the display TFTs, and an uneven aluminum reflective section 29 connecting to the drain sections 19 of the display TFTs are formed so that optimum reflective and viewing-angle characteristics are achieved.

The resulting active-matrix substrate 30 integrates a display section and a peripheral-driving-circuit section, in which the display section includes dual-gate nMOSLDD-TFTs and the peripheral-driving-circuit section includes a cMOS driving circuit having dual-gate nMOSTFTs and dual-gate pMOSTFTs, wherein these TFTs are formed by using the single-crystal silicon layer 7 deposited by high-temperature graphoepitaxy on the step differences 4 as seeds.

FIGS. 29A to 36B show an eighth embodiment of the first aspect of the present invention.

In this embodiment, the gate electrode at the top gate section is composed of a material having relatively low thermal resistance, such as aluminum, unlike the preceding embodiments.

For the purpose of forming top-gate MOSTFTs in the display section while forming dual-gate MOSTFTs in the peripheral-driving-circuit section, the same steps as those shown in FIGS. 1A to 3B are executed as in the first embodiment and, thereafter, an N-type well 7A is formed in the pMOSTFT sections of the peripheral-driving-circuit section, as shown in FIG. 29A.

With reference to FIG. 29B, all of the nMOSTFTs and pMOSTFTs in the peripheral-driving-circuit section and the gate sections of the nMOSTFTs in the display section are covered with a photoresist 13, and the exposed source and drain regions of the nMOSTFTs are doped with phosphorus ions 14 by ion implantation, for example, at 20 kV and at a dosage of $5\times10^{13}$ atoms/cm² to form by self-alignment a LDD section 15 composed of an $N^-$-type layer.

Figure 30A:
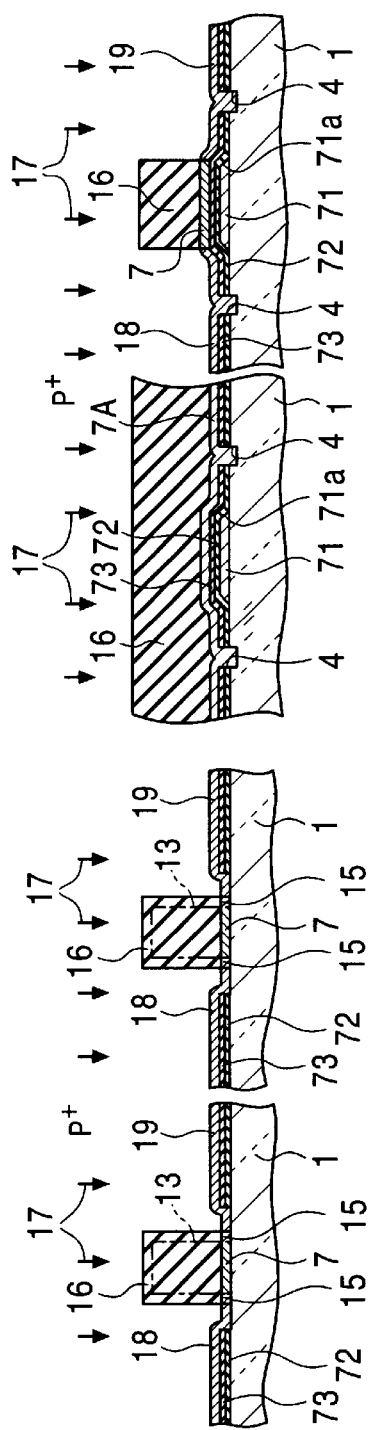
FIGS. 30A to 30C are cross-sectional views showing the subsequent production steps of the LCD in accordance with the eighth embodiment of the present invention.

With reference to FIG. 30A, all of the pMOSTFTs in the peripheral-driving-circuit section, the gate sections of the nMOSTFTs in the peripheral-driving-circuit section, and the gate section and the LDD section of the nMOSTFTs in the display section are covered with a photoresist 16, and the exposed region is doped with phosphorus or arsenic ions 17, for example, at 20 kV and at a dosage of $5\times10^{15}$ atoms/cm² by ion implantation, thereby to form a source section 18, drain section 19 and an LDD section 15 of nMOSTFT composed of an $N^+$-type layer. Preferably, the resist 13 is left unremoved, as shown by the dotted line in the drawing, and the resist 16 is provided so as to cover the resist 13, so that, in the formation process of the resist 16, a mask is readily aligned with high accuracy by using the resist 13 as a reference, thus diminishing the risk of misalignment.

Figure 30B:
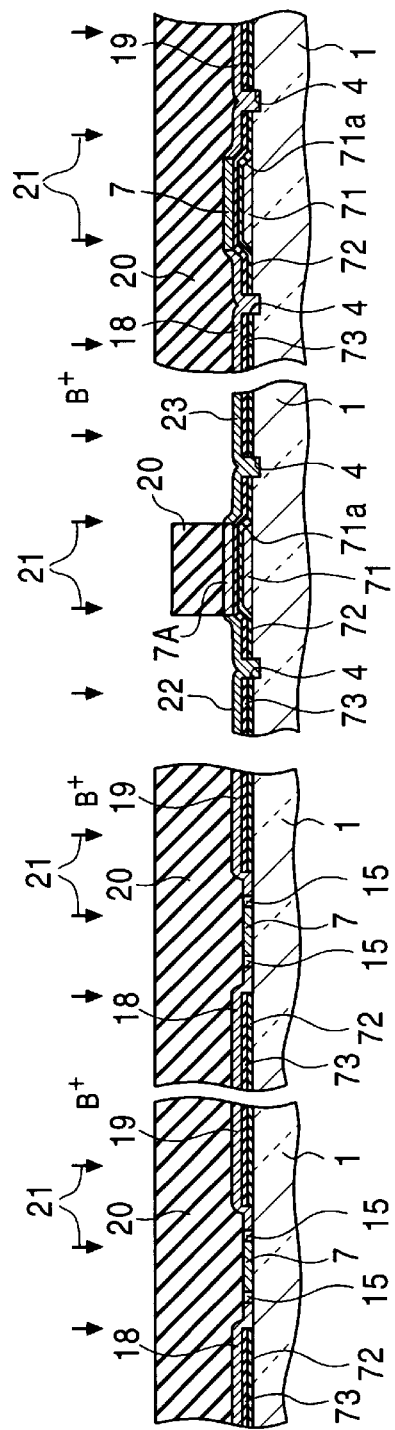

With reference to FIG. 30B, all of the nMOSTFTs in the peripheral-driving-circuit section and all of the NMOSTFTS and the gate sections of the pMOSTFTs in the display section are covered with a photoresist 20, and the exposed regions are doped with boron ions 21 by ion implantation at 10 kV and at a dose of $5 \times 10^{15}$ atoms/cm$^2$ to form source sections 22 and drain sections 23 of the pMOSTFTS composed of a P$^+$-type layer.

Figure 30C:
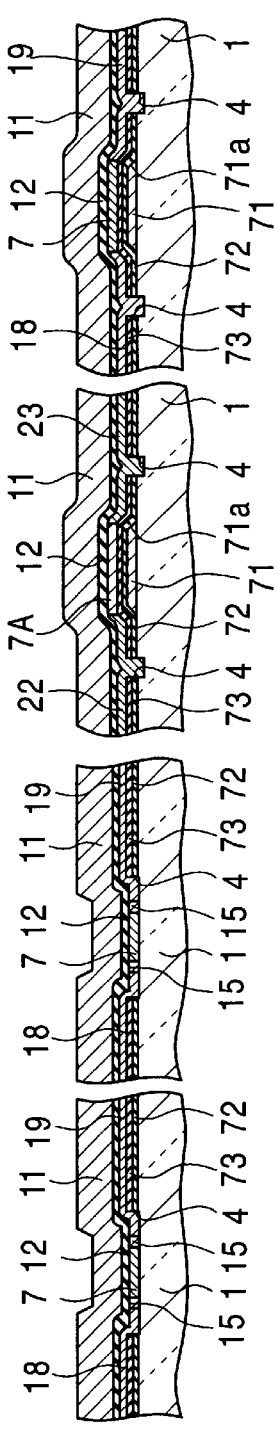

With reference to FIG. 30C, after the removal of the resist 20, the single-crystal silicon layers 7 and 7A are activated in the same way as that described before, followed by deposition of a gate insulating film 12 and a gate electrode material layer 11 which is of aluminum or aluminum alloy containing 1 percent y weight of Si. The gate electrode material layer 11 may be formed by a vacuum evaporation process or a sputtering process.

After a patterning of the respective gate sections, the active device section and the passive device section are isolated, in the same way as that described before and, as shown in FIG. 31A, a SiO$_2$ film having a thickness of approximately 200 nm and then a phosphosilicate glass (PSG) film having a thickness of approximately 300 nm are deposited on the entire surface, thereby to form a protective film 25.

With reference to FIG. 31B, contact holes are formed for the source and drain sections of all TFTs in the peripheral-driving-circuit section and the source sections of the display TFTs, by conventional photolithography and etching.

A film having a thickness of 500 to 600 nm is formed on the entire surface by sputtering, with aluminum or an aluminum alloy containing 1 weight percent of Si and, thereafter, the source electrodes 26 of all TFTs in the peripheral-driving-circuit section and the display section, drain electrodes 27 in the peripheral-driving-circuit section, data lines and gate lines are simultaneously formed by conventional photolithography and etching. The substrate is then subjected to sintering treatment in a forming gas (N$_2$ +H$_2$) at approximately 400° C. for 1 hour.

Then, Steps which are the same as those shown in FIG. 6C to FIG. 7C are executed, whereby an active-matrix substrate 30 is obtained integrating a display section and a peripheral-driving-circuit section by using the single-crystal silicon layer 7, in which the display section includes top-gate nMOSLDD-TFTs having gate electrodes of aluminum or aluminum alloy containing 1 weight percent of Si, while the peripheral-driving-circuit section has a cMOS driving circuit having dual-gate pMOSTFTs and dual-gate nMOSTFTs.

Since the aluminum or aluminum-alloy gate electrodes 11 are formed after the activation treatment of the single-crystal silicon layer 7, the gate electrode material is not subject to the heat during the activation treatment, so that inexpensive material having relatively low heat resistance, such as aluminum or 1 wt % Si aluminum alloy, can be used as the gate electrode, offering a wider selection of the electrode materials. This applies also to the case where the display section includes bottom-gate MOSTFTs.

Figure 32A:
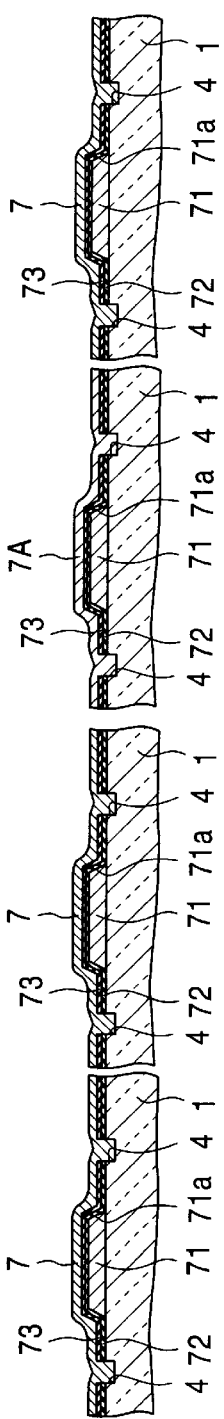
FIGS. 32A and 32B are cross-sectional views showing the subsequent production steps of the LCD in accordance with the eighth embodiment of the present invention.

For implementing a configuration in which dual-gate MOSTFTs are formed both in the display section and the peripheral-driving-circuit section, respectively, the processes shown in FIGS. 21A to 22D are performed, and then an N-type well 7A is formed at the pMOSTFT section in the peripheral-driving-circuit section, as shown in FIG. 32A.

Figure 22E:
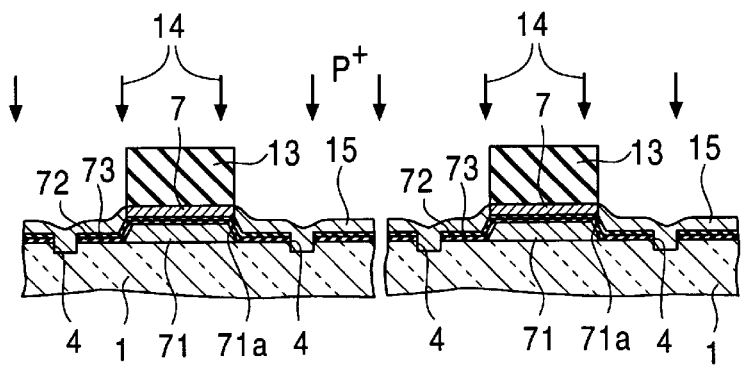
Figure 32B:
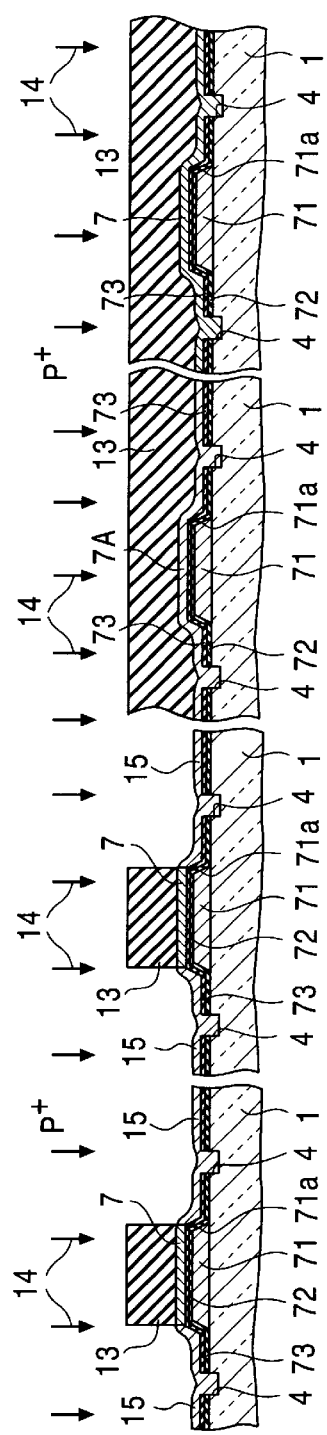

With reference to FIG. 32B, the TFT s in the display section are doped with phosphorus ions 14 to form LDD sections 15, as in the step shown in FIG. 22E.

Figure 33A:
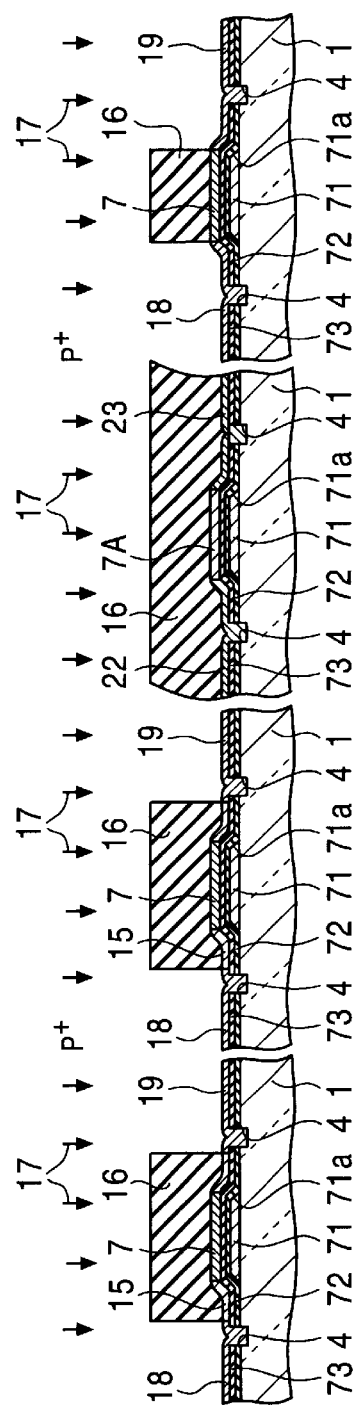
FIGS. 33A to 33C are cross-sectional views showing the subsequent production steps of the LCD in accordance with the eighth embodiment of the present invention.

With reference to FIG. 33A, the same processing as that shown in FIG. 23A is executed: namely, the nMOSTFT sections in the display section and the peripheral-driving-circuit section are doped with phosphorus ions 17 to form N$^+$-type source regions 18 and drain regions 19.

Figure 33B:
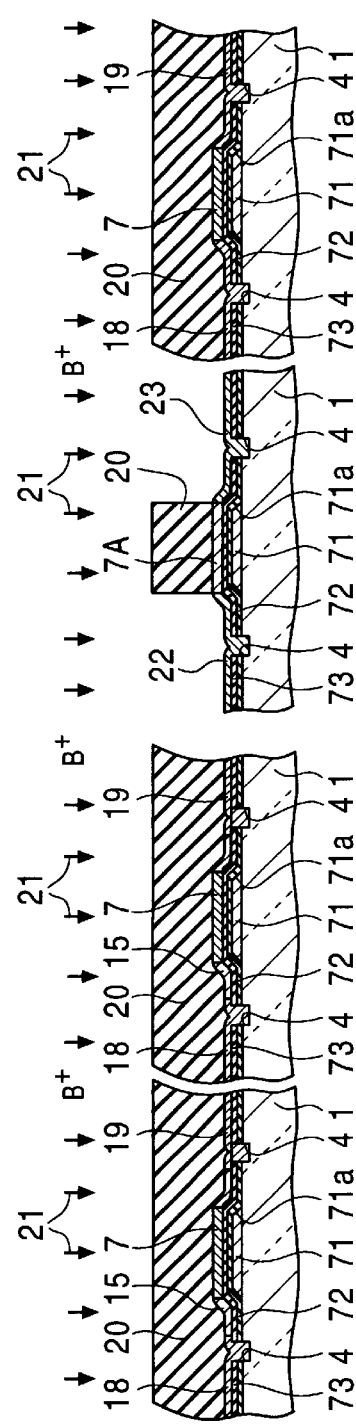

With reference to FIG. 33B, the same process as that shown in FIG. 23B is executed: namely, the pMOSTFT section in the peripheral-driving-circuit section is doped with boron ions 21 to form a P$^+$-type source region 22 and a drain region 23.

Figure 33C:
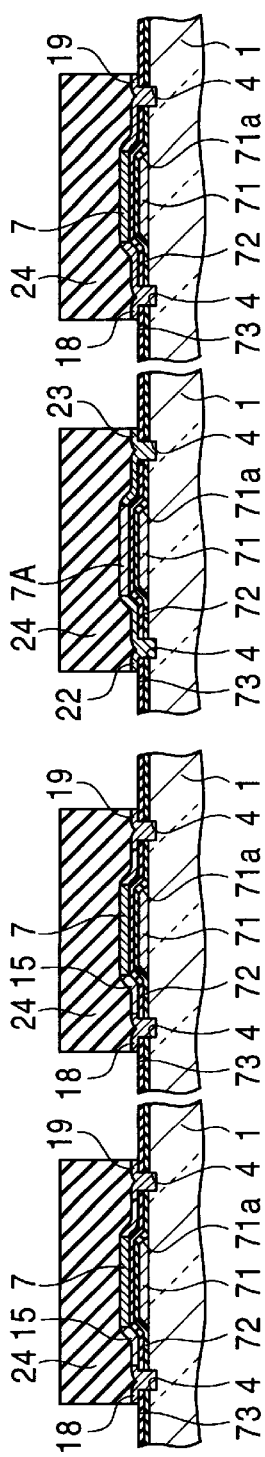
Figure 34A:
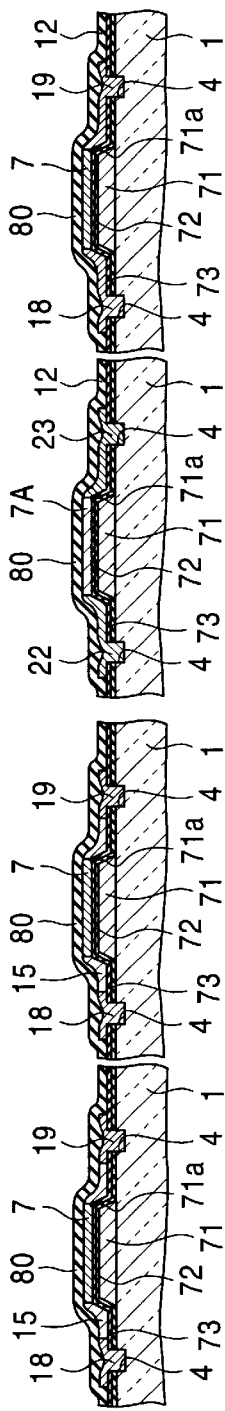
FIGS. 34A to 34C are cross-sectional views showing the subsequent production steps of the LCD in accordance with the eighth embodiment of the present invention.

With reference to FIG. 33C, after the removal of the resist 20, the single-crystal silicon layer 7 is patterned to island the active device section and the passive device section and, thereafter, as shown in FIG. 34A, the single-crystal silicon layers 7 and 7A are activated in the same way as that described before, followed by formation of a gate insulating film 80 in the display section and formation of a gate insulating film 12 in the peripheral-driving-circuit section, respectively.

Figure 34B:
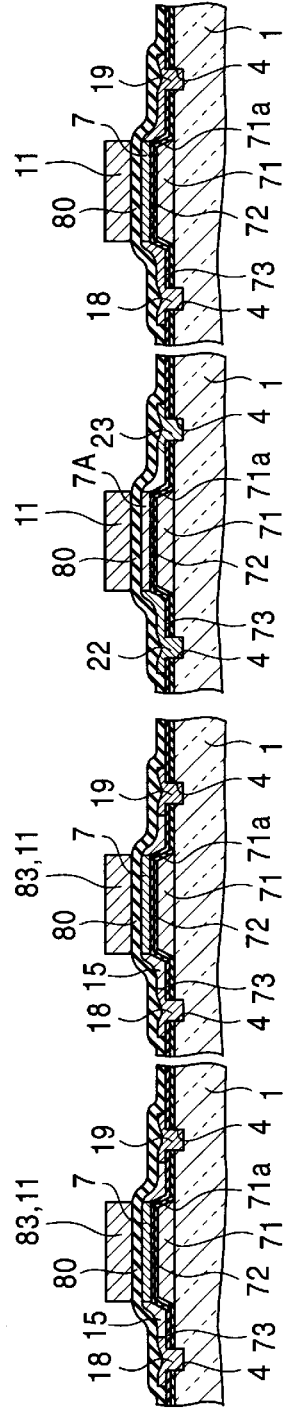

With reference to FIG. 34B, an aluminum film sputtered on the entire surface is patterned to form upper-gate electrodes 83 in the display section and upper-gate electrodes 11 in the peripheral-driving-circuit section.

Figure 34C:
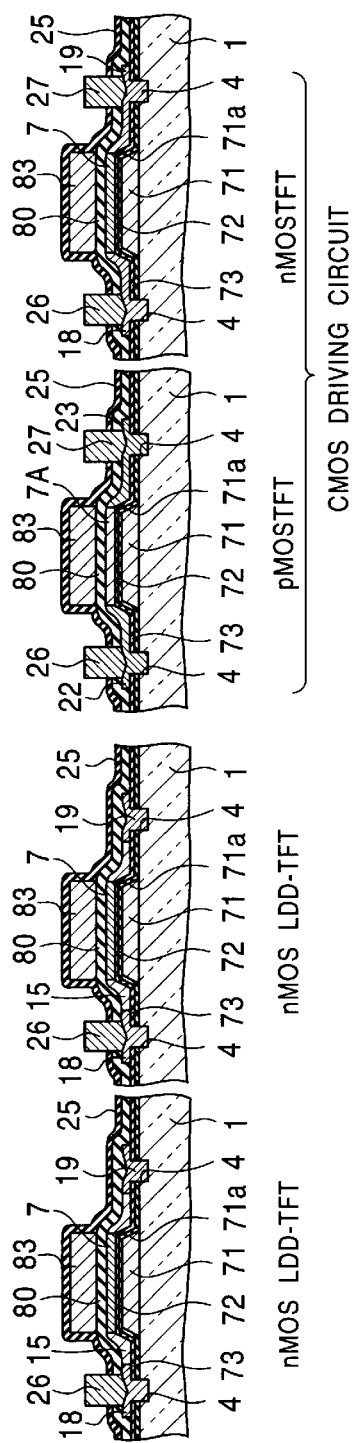

With reference to FIG. 34C, a SiO$_2$ film having a thickness of approximately 200 nm and then a PSG film having a thickness of approximately 300 nm are deposited to form a protective film 25.

Source electrodes 26 of all TFTs in the peripheral-driving-circuit section and the display section and drain electrodes 27 in the peripheral-driving-circuit section are formed by the same process as that described before, whereby an active-matrix substrate 30 is obtained integrating the display section and the peripheral-driving-circuit section using the single-crystal silicon layer 7, wherein the display section includes dual-gate nMOSLDD-TFTs having aluminum top gate electrodes, while the peripheral-driving-circuit section includes a CMOS driving circuit having dual-gate pMOSLDD-TFTs and dual-gate nMOSTFTs.

Since the gate electrodes 11 and 83 are formed after the activation treatment of the single-crystal silicon layer in this embodiment, the gate electrode material does not undergo the heat applied during the activation treatment, so that any inexpensive material having relatively low heat resistance, such as aluminum, may be used for the gate electrode, thus widening the selection of the electrode materials. The source electrodes 26 (and the drain electrodes also) may be simultaneously formed in Step shown in FIG. 34B, thus offering advantages in the production process.

Figure 35A:
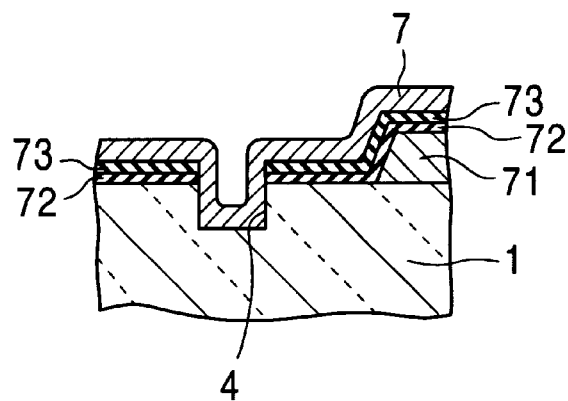
FIGS. 35A to 35C are cross-sectional views of main portions in the production steps of the LCD in accordance with the eighth embodiment of the present invention.
Figure 35B:
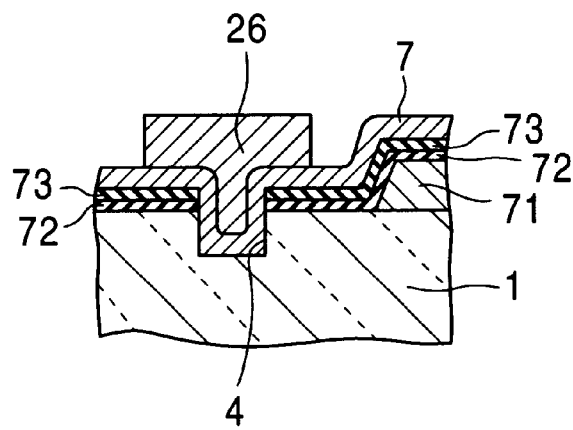
Figure 35C:
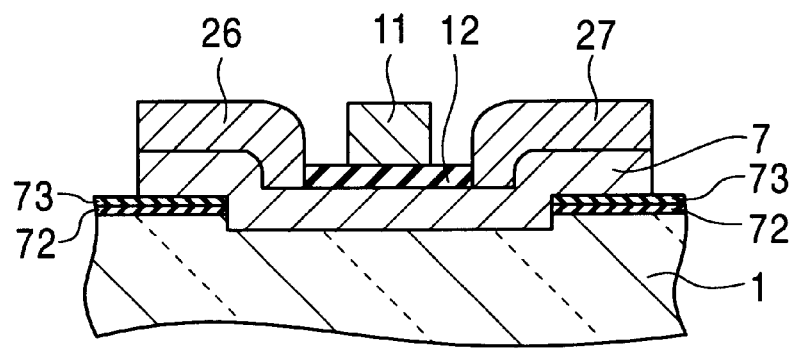

When the bottom-gate or top-gate or dual-gate MOSTFTs are formed in any of above-described embodiments, the single-crystal silicon layer 7 deposited on the step difference 4 may have discontinuity or thinned portions, as schematically shown in FIG. 35A, leading to connection failure or increase in the resistance and, therefore, the source electrode 26 (or the drain electrode 27) is preferably provided in a region including the step difference 4 in order to ensure the connection to the single-crystal silicon layer 7, as shown in FIGS. 35B and 35C.

As an alternative to Step shown in FIG. 2B or Step shown in FIG. 32B, after the formation of the top-gate insulating film on the single-crystal silicon layer 7, ion implantation and activation treatment may be performed and then the top-gate electrodes and source and drain electrodes may be simultaneously formed.

Figure 36A:
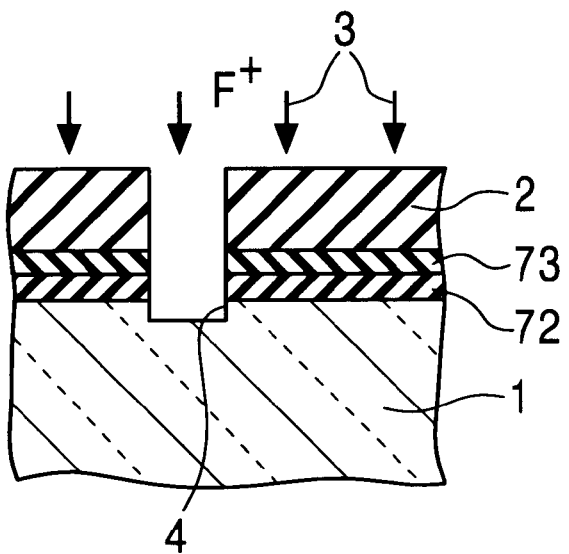
FIGS. 36A and 36B are cross-sectional views of main portions in the production steps of the LCD in accordance with the eighth embodiment of the present invention.

The step differences 4 are formed in the substrate 1 (and in the overlying SiN film) in the described embodiment as shown in FIG. 36A, this is only illustrative and the step differences 4 may be formed on a SiN film 51 on the substrate 1 so that the SiN film 51 inhibits diffusion of ions from the glass substrate 1. The arrangement also may be such that the gate insulating films 72 and 73 are formed in place of the SiN film 51 or on the SiN film 51 and the step differences are formed in these gate insulating films.

FIG. 37A to FIG. 39 show a ninth embodiment of the present invention.

In this embodiment, TFTs are formed at the exterior of the step differences 4, that is, in regions other than the step differences 4. In these drawings, the single-crystal silicon layer 7 and the gate electrodes 11, source electrodes 26 and drain electrodes 27 are shown only schematically.

Figure 37A:
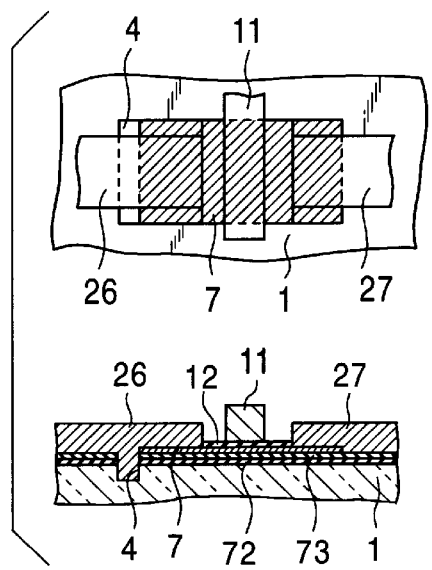
FIGS. 37A to 37E are plan views and cross-sectional views of various TFTs in a LCD in accordance with a ninth embodiment of the present invention.
Figure 37B:
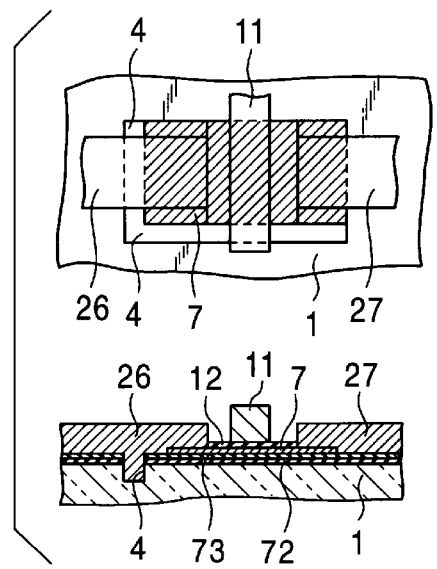
Figure 37C:
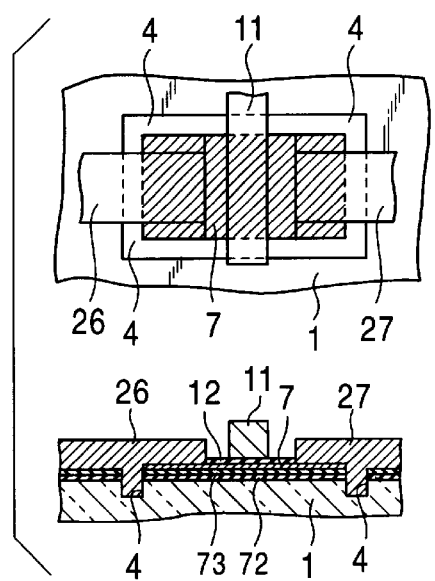
Figure 37D:
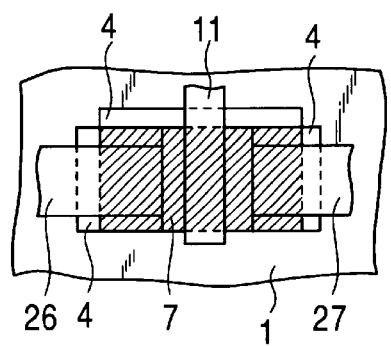
Figure 37E:
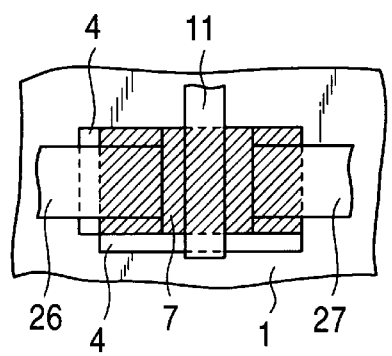

FIG. 37A to FIG. 37E show top-gate MOSTFTS. Referring first to FIG. 37A, the indented section formed by the step difference 4 is located along and on one side of the source region, and the gate insulating film 12 and the gate electrodes 11 are formed on the areas of the single-crystal silicon layer 7 where there is no indented section. FIG. 37B shows an arrangement in which the indented section has an L-like shape, with one leg extending along the side of the source region and the other leg extending in the direction of length of the channel down to the end of the drain region. FIG. 37C shows an arrangement in which the indented section has a rectangular form with four sides surrounding the TFT active region. FIG. 37D shows an arrangement in which the indented section has three sides. In FIG. 37E, an indented section has an L-shape with two sides. In all these cases, adjacent indented sections 4 are discrete and isolated from each other.

Thus, the indented sections or step differences 4 may have any suitable shape, and the TFTs are formed on the areas other than these step differences 4, so that the TFTs can be fabricated without difficulty.

Figure 38A:
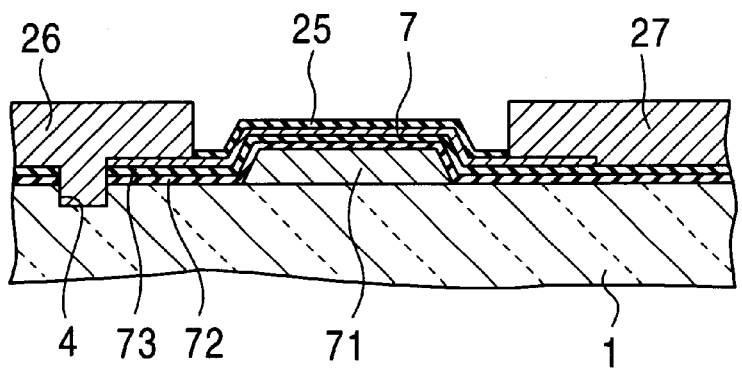
FIGS. 38A to 38C are cross-sectional views of various TFTs in the LCD under production in accordance with the ninth embodiment of the present invention.
Figure 38B:
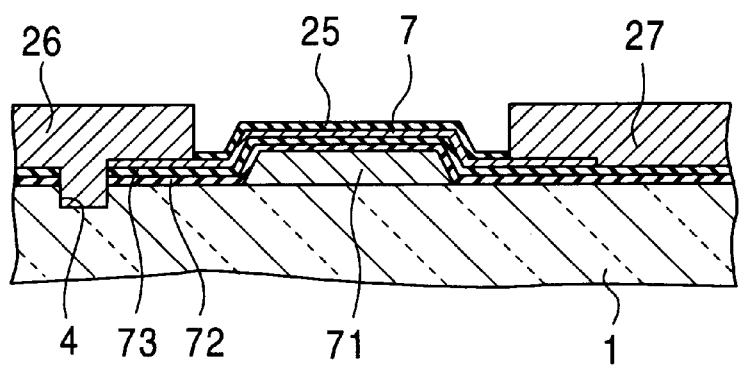
Figure 38C:
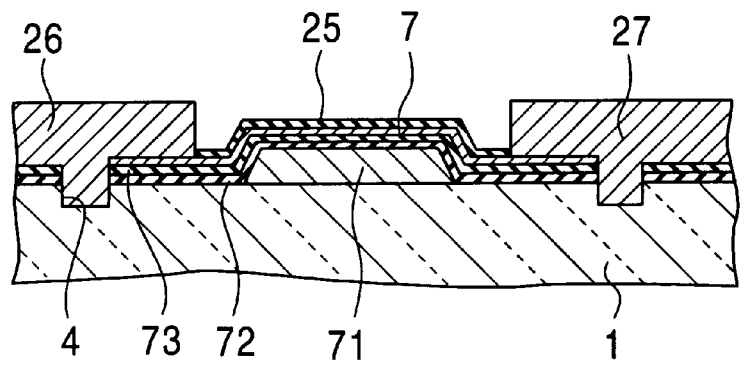

FIGS. 38A to 38C show bottom-gate MOSTFTs. Any type of step difference 4 shown in FIGS. 36A to 36E may be employed also in this type of MOSTFTs. In FIG. 38A corresponding to FIG. 37A, the bottom-gate MOSTFT is formed on the flat portion other than the step difference 4. Likewise, FIG. 38B corresponds to FIG. 37B, and FIG. 38C corresponds to FIG. 37C or 37D.

Figure 39:
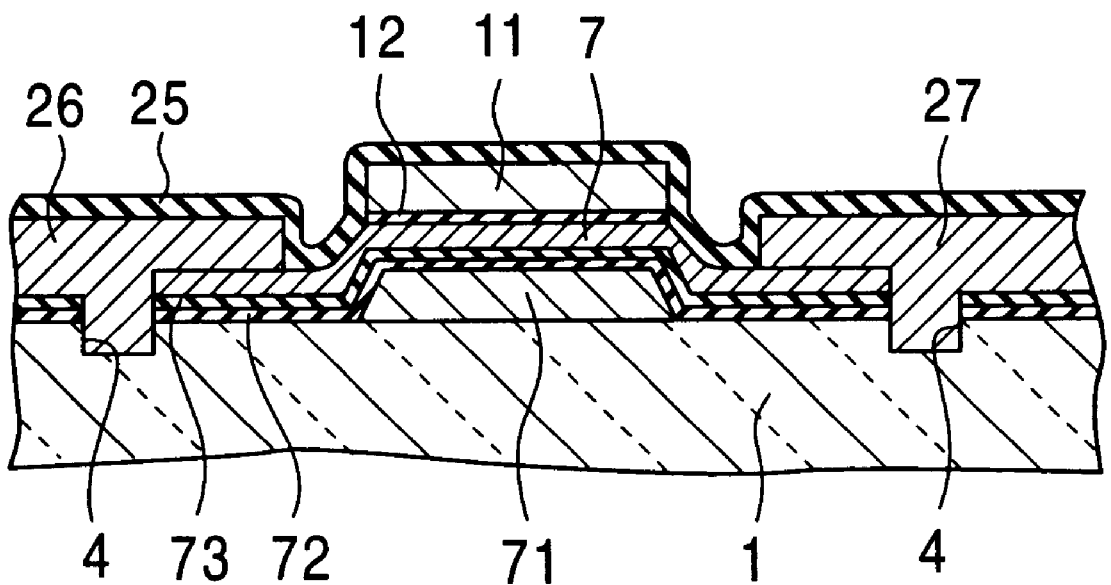
FIG. 39 is a cross-sectional view of the LCD in accordance with the ninth embodiment of the present invention.

FIG. 39 shows a dual-gate MOSTFT. Any type of step difference 4 shown in FIGS. 37A to 37E may also be employed in this type. For example, the dual-gate MOSTFT may be formed on the flat portion in the interior of the step difference 4 shown in FIG. 37C or 37D.

FIGS. 40A to 42 show a tenth embodiment of the present invention.

Figure 40A:
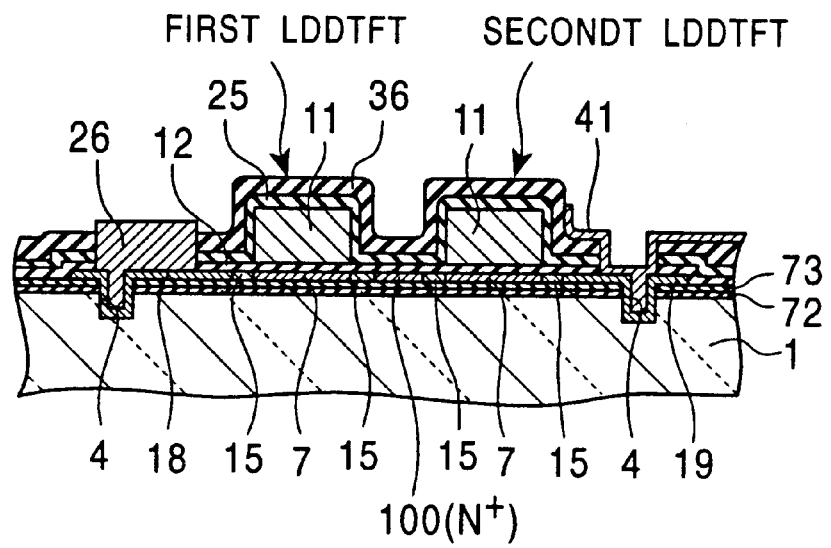
FIGS. 40A and 40B are a cross-sectional view of a critical portion of an LCD in accordance with a tenth embodiment of the present invention.
Figure 40B:
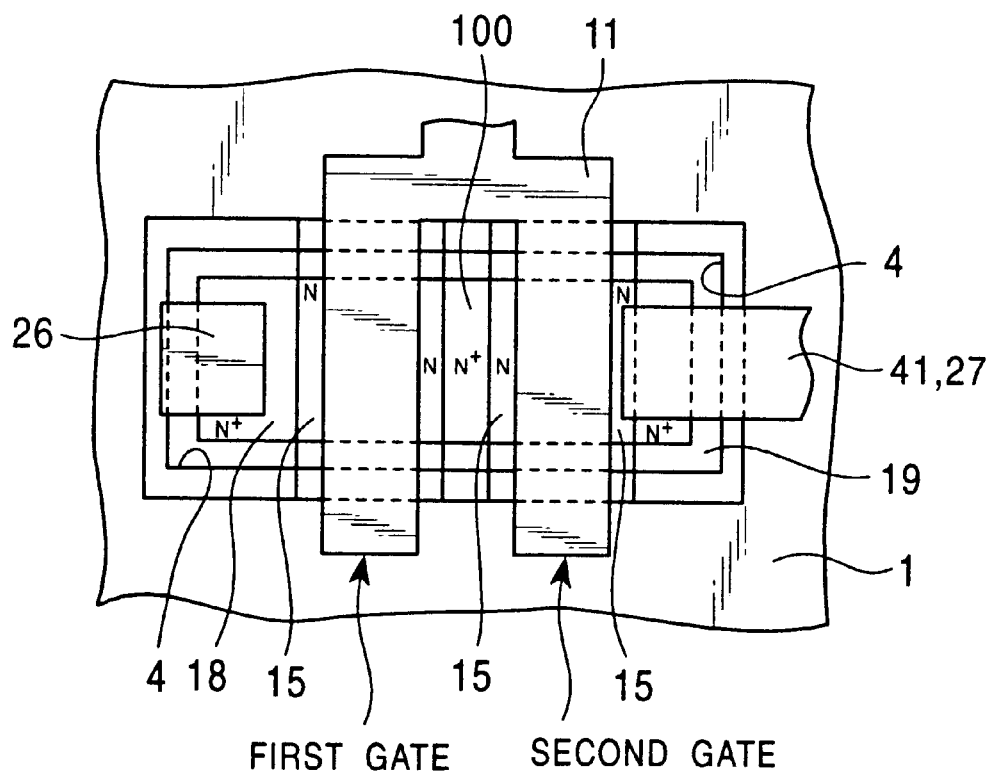

FIGS. 40A and 40B show a self-alignment type LDD-TFT, for example, a double-gate MOSTFT including a plurality of top-gate MOSLDD-TFTs.

A gate electrode 11 has two branches, that is, a first gate 11A and a second gate 11B, wherein the first gate 11A is used for a first LDD-TFT 51 and the second gate is used for a second LDD-TFT 52, and preferably An $N^+$-type region 100 is provided in the center of the single-crystal silicon layer between these gates in order to decrease resistance. Different voltages may be applied to these gates and, in the event that one gate has become inoperable due to any reason, the other gate will perform transfer of carriers between the source and the drain, thus offering high reliability of the device. The first LDD-TFT 51 and the second LDD-TFT 52 are connected in series and function as a thin-film transistor for driving a pixel, so that the voltage applied between the source and the drain of each thin-film transistor can be significantly reduced in the OFF mode of operation. Thus, the leakage current in the OFF mode can be reduced, resulting in improved contrast and image quality in the liquid crystal display. Since these two LDD transistors are connected to each other only through the semiconductor layer which is the same as the low-concentration drain region, the conductive distance between the transistors can be shortened, avoiding an increase in the transistor area despite the dual LDD transistor configuration. The first and second gates may be isolated from each other for independent operation.

Figure 41A:
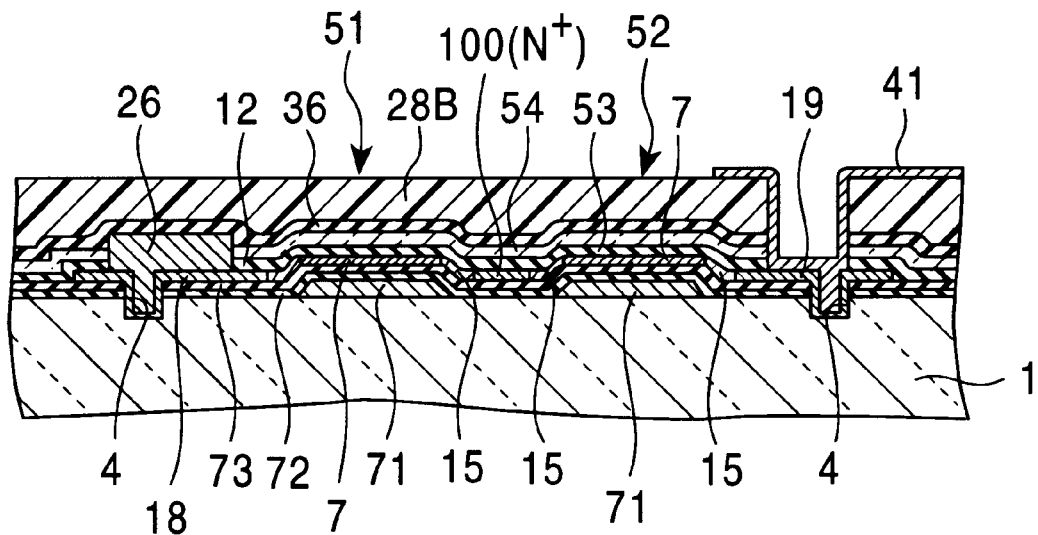
FIGS. 41A and 41B are cross-sectional views of critical portions of TFTs in the LCD in accordance with the tenth embodiment of the present invention.
Figure 41B:
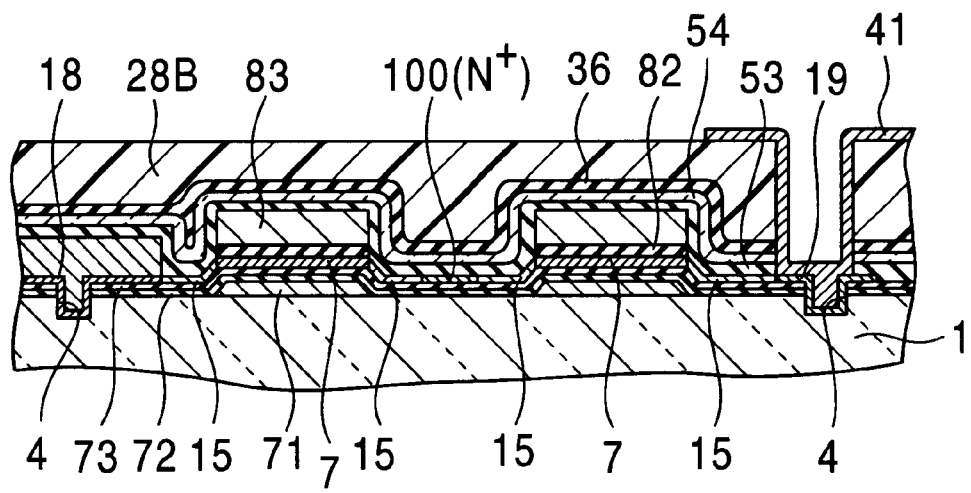

FIG. 41A shows a double gate configuration of bottom-gate MOSTFTs, and FIG. 41B shows a double gate configuration of dual-gate MOSTFTS.

These double-gate MOSTFTs have the same advantages as those in the above-described top-gate type. Use of dual-gate structure offers a further advantage in that, if one gate section is not operable in the dual-gate type, the other gate section can be used.

Figure 42A:
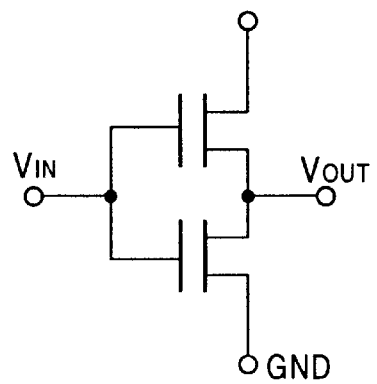
FIGS. 42A to 42C are equivalent circuit diagrams of TFTS in the LCD in accordance with the tenth embodiment of the present invention.
Figure 42B:
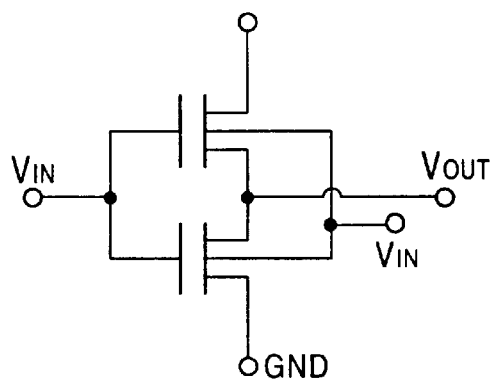
Figure 42C:
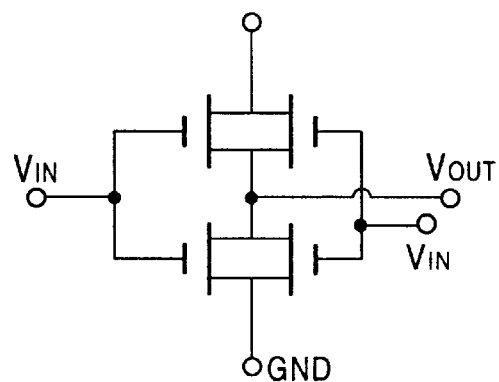

FIGS. 42A to 42C are equivalent circuit diagrams of the respective types of the double-gate configuration. The gate may be branched or divided into three or more, although in the illustrated embodiment it is branched into two. In the double- or multi-gate configuration, the branched gate electrodes having the same potential, or gate electrodes isolated by the division and having the same potential or different potentials, may be provided in the channel region.

Figure 43A:
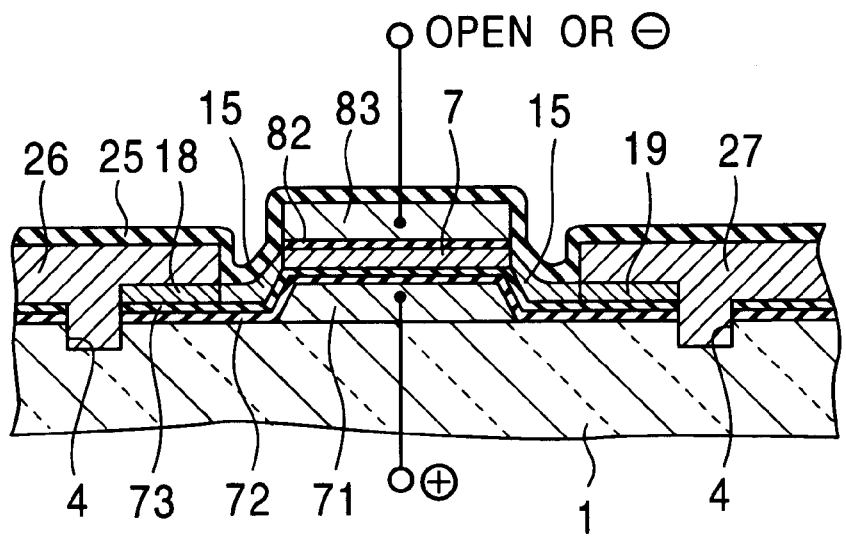
FIGS. 43A and 43B are cross-sectional views of TFTs in a LCD in accordance with an eleventh embodiment of the present invention.
Figure 43B:
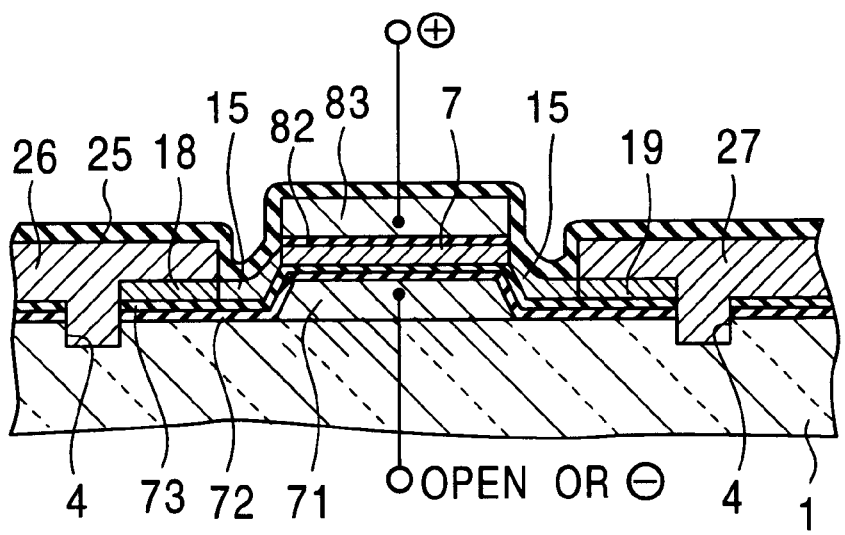

FIGS. 43A and 43B show an eleventh embodiment of the present invention, wherein one of the upper and lower-gate sections of a dual-gate type nMOSTFT is used in a transistor operation, whereas the other operates as follows.

In an nMOSTFT shown in FIG. 43A, an appropriate negative voltage is constantly applied to the gate electrode at the top gate side to reduce the leakage current in the back channel. When the top gate electrode is opened, this is used as a bottom-gate type. In FIG. 43B, an appropriate negative voltage is constantly applied to the gate electrode at the bottom gate side to reduce the leakage current in the back channel. When the bottom gate electrode is opened, this is used as a top-gate type. In case of a pMOSTFT, leakage current in the back channel can be reduced by constantly applying an appropriate positive voltage to the gate electrode.

The interface between the single-crystal silicon layer 7 and the insulating film has low crystallinity and readily causes a leakage current, but the above-mentioned negative voltage applied to the gate electrode can effectively reduce the leakage current. This advantage is added to that offered by the LDD structure. Furthermore, the bottom gate electrode shades the light incident on the substrate 1, so that the leakage current caused by the incident light can be reduced.

FIG. 44 to FIG. 52 show a twelfth embodiment of the present invention.

As described above, the top-gate, bottom-gate and dual gate TFTs have different structures, functions and characteristics. A variety of combinations of these TFTs may be employed in the display section and the peripheral-driving-circuit section to obtain various advantageous effects.

For example, as shown in FIG. 44, when any one of the top-gate MOSTFT, the bottom-gate MOSTFT and the dual-gate MOSTFT is used in the display section, at least the dual-gate type is used alone or in a combination with at least one of the other types, in the peripheral-driving-circuit section. In this case, there are 12 types of combination identified by Nos. 1 to 12. When a dual-gate structure is employed in the MOSTFT in the peripheral-driving-circuit section, this dual-gate structure functions as a top-gate type or a bottom-gate type by selecting the upper or lower gate, and the dual-gate type structure also is preferred when a local portion of the peripheral driving circuit requires TFTs having large driving power. For example, electrooptical devices using organic EL or FED will require such TFTs having large driving power.

A variety of combinations (Nos. 1 to 216) of channel conduction types are available for the MOSTFTs to be used in the peripheral-driving-circuit section and the display section, specifically: FIGS. 45 and 46 show combinations possible when the MOSTFTs in the display section do not have a LDD structure; FIGS. 47 and 48 show combinations possible when the MOSTFTS in the display section have a LDD structure; FIGS. 49 and 50 show combinations possible when the peripheral-driving-circuit section includes TFTs having a LDD structure; and FIGS. 51 and 52 show combinations possible when both the peripheral-driving-circuit section and the display section include TFTs having a LDD structure.

Thus, the details of the combinations shown in FIG. 44 are shown in FIGS. 45 to 52. These combinations are also available when the peripheral-driving-circuit section includes the top-gate MOSTFT and the other-type MOSTFT (s). These combinations are applicable not only when the channel regions of the TFTs are formed of a single-crystal silicon but also when the channel region of the TFT is formed of polycrystalline silicon or amorphous silicon (only in the display section).

Figure 53A:
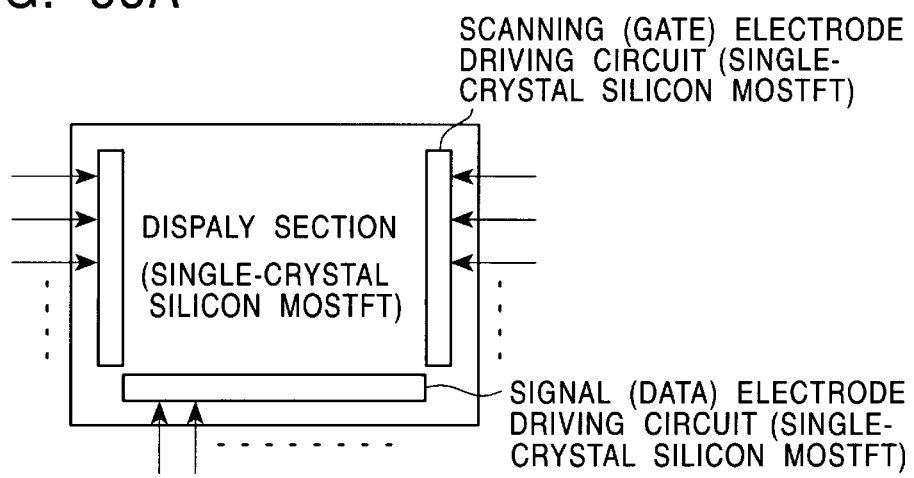
FIGS. 53A to 53C are outline schematic views of devices in accordance with a thirteenth embodiment of the present invention.

FIG. 53A to FIG. 54 show a thirteenth embodiment of the present invention.

This embodiment is an active-matrix LCD which includes TFTs having high driving power and using the above-mentioned single-crystal silicon layer in the peripheral-driving-circuit section, in order to attain a greater driving power. This, however, is not exclusive and the TFTs may employ not only dual-gate MOSTFTs but also other gate types together with the dual-gate type, as well as a variety of channel conduction types, and may further include MOSTFTs using polycrystalline silicon layer. In contrast, the MOSTFTs of the display section preferably use a single-crystal silicon layer, although they may use a polycrystalline or amorphous silicon layer or at least two out of the three types of silicon layers in combination. It is to be noted, however, when the display section is constituted by nMOSTFTs, a single-crystal or polycrystalline silicon layer is preferably used because such types of silicon layer enables a reduction in the areas of TFTS and is preferred to amorphous silicon also from the viewpoint of reduction in pixel defects, although a practically acceptable switching speed is still attainable also with the amorphous silicon layer. Polysilicon, in addition to single-crystal silicon, may be formed during graphoepitaxy, thereby forming a continuous grain silicon (CGS) structure which can be advantageously used for the formation of the active device and the passive device in some cases.

Figure 53B:
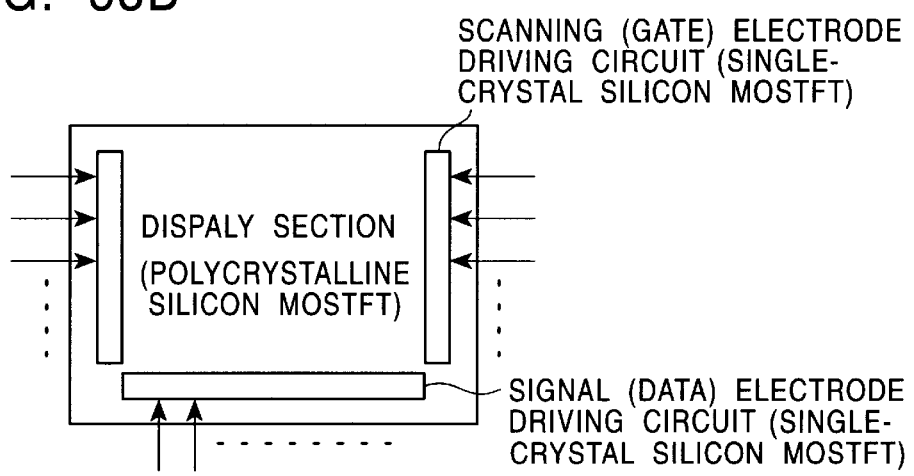
Figure 53C:
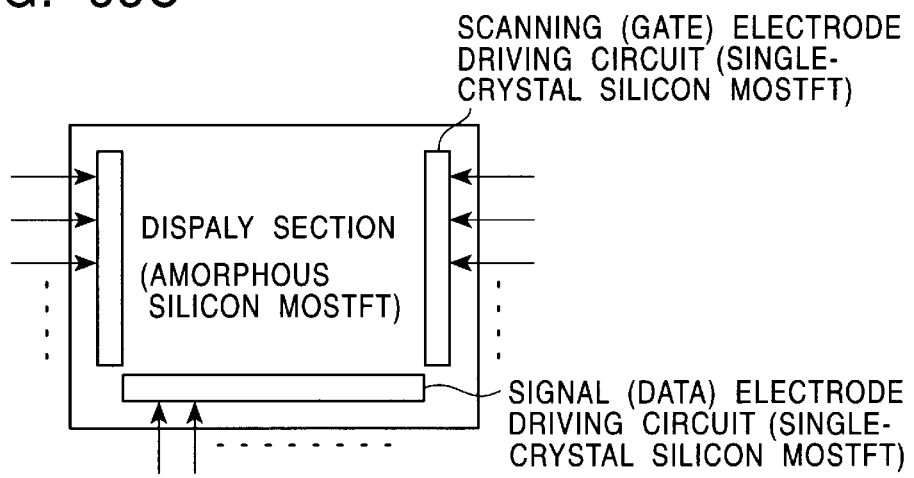

FIGS. 53A to 53C show possible combinations of various MOSTFTs. FIG. 54 shows the details of these combinations. The use of single-crystal silicon causes improved current driving ability. The use of a single-crystal silicon serves to improve current driving power, thus offering advantages such as a reduction in the device size, an increase in the screen size, and an increase in the aperture ratio.

In the peripheral-driving-circuit section, an electric circuit integrating diodes, capacitors, resistors, and inductors, in addition to the MOSTFTS, can be consolidated on the insulating substrate such as a glass substrate.

Figure 55:
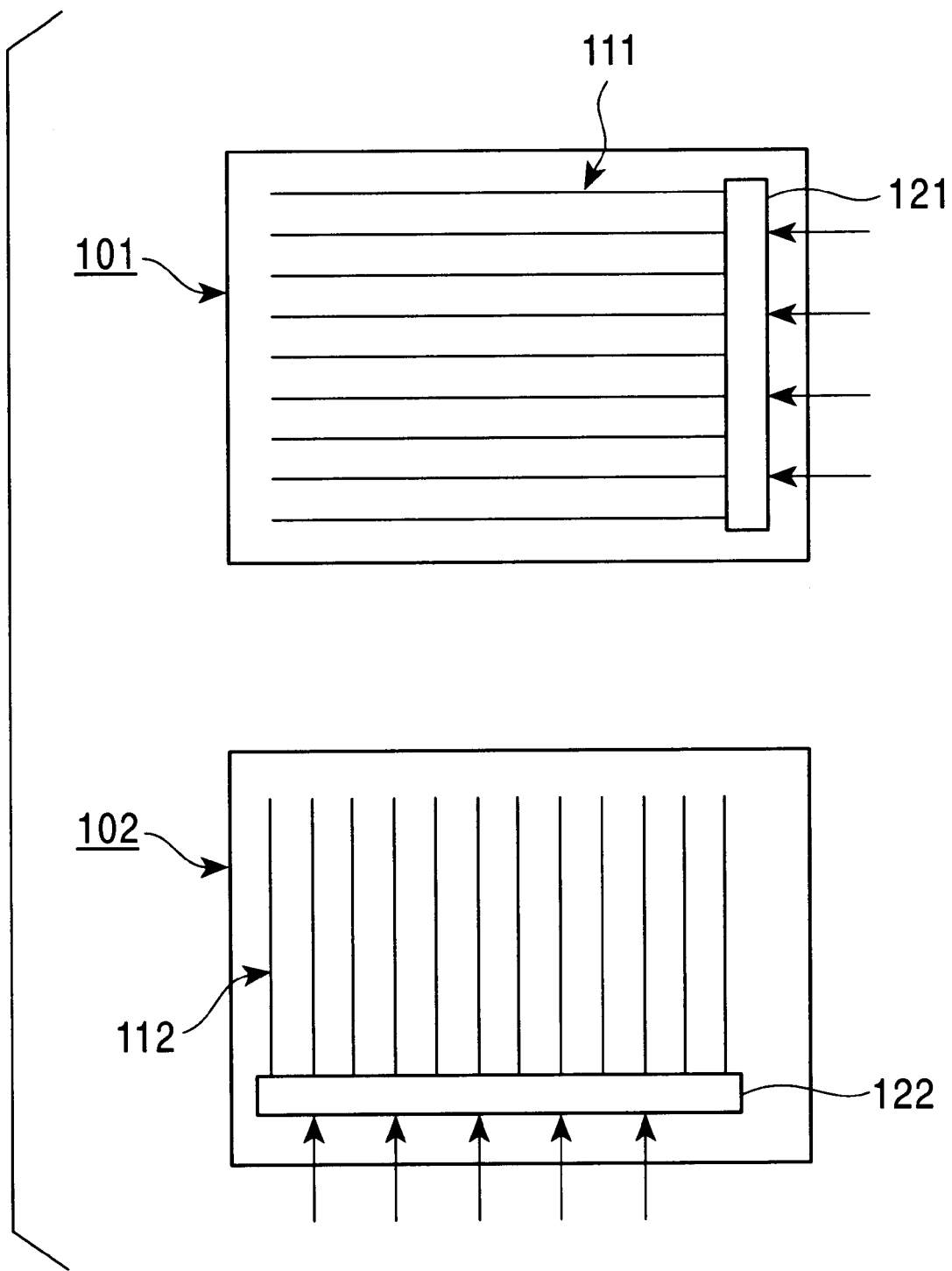
FIG. 55 is a schematic view of a device in accordance with a fourteenth embodiment of the present invention.

FIG. 55 shows a fourteenth embodiment of the present invention.

This embodiment implements a passive-matrix drive, in contrast to the preceding embodiments that are focused on active-matrix drive configurations.

In this embodiment, therefore, the display section does not have switching devices such as MOSTFTS, and modulation of the incident or reflected light in the display section is performed only by the variation in the voltage applied between a pair of electrodes formed on two opposing substrates. Examples of such modulation devices include reflective or transmissive LCDS, organic or inorganic EL devices (electroluminescent devices), FEDs (field emission display devices), LEPDs (light-emitting polymer display devices), and LEDs (light-emitting diodes).

Figure 56A:
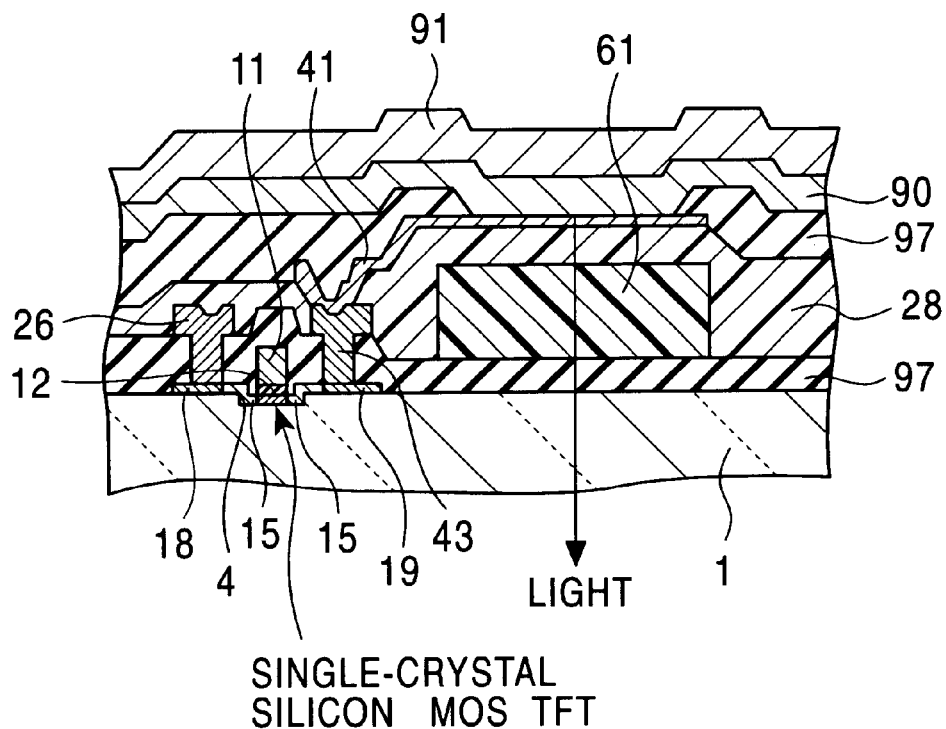
FIGS. 56A and 56B are cross-sectional views of an EL device and an FED, respectively, in accordance with a fifteenth embodiment of the present invention.
Figure 56B:
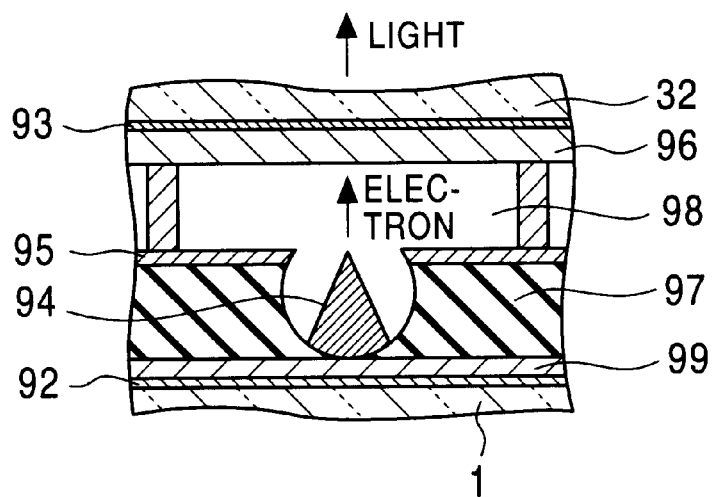

FIGS. 56A and 56B show a fifteenth embodiment of the present invention.

This embodiment is directed to an electrooptical device other than an LCD, such as an organic or inorganic EL device (electroluminescent device), FED (field emission display device), LEPD (light-emitting polymer display device), and LED (light-emitting diode).

FIG. 56A shows an active-matrix EL device, comprising a substrate 1, an organic EL layer 90 composed of, for example, an amorphous organic compound or, alternatively, an inorganic EL layer such as of ZnS:Mn, formed on the substrate 1, a transparent ITO electrode 41 provided below the EL layer 90, and a cathode 91 is formed on the EL layer 90, whereby colored light is emitted through a color filter 61 in response to a voltage applied to these electrodes 41 and 91.

In order to apply a data voltage to the transparent electrode 41 by active-matrix drive, the substrate 1 is provided with a single-crystal silicon n MOSTFT, i.e., nMOSLDD-TFT, formed thereon by using a single-crystal silicon layer deposited by graphoepitaxy on a step difference 4 serving as a seed on the substrate 1. Similar TFTs are also formed in a peripheral driving circuit. Since this EL device is driven by MOSLDD-TFTs using the single-crystal silicon layer, the EL device has a high switching rate and a reduced leakage current. The color filter 61 may be omitted if the EL layer 90 emits a specified color.

Since the EL device requires a high driving voltage, the peripheral driving circuit preferably has driver devices having high dielectric strength, such as high-dielectric-strength cMOSTFTs and bipolar devices, in addition to the MOST-FTs.

FIG. 56B shows a passive-matrix FED in which, when a voltage is applied between electrodes 92 and 93, electrons are emitted from a cold cathode 94 in a vacuum section 98 between two opposing glass substrates 1 and 32, and are incident on a fluorescent layer 96 under selection by a gate line 95, whereby light having a predetermined color is emitted.

The emitter line 92 is connected to a peripheral driving circuit and is driven by a data voltage, the peripheral driving circuit including MOSTFTs using a single-crystal silicon layer based on the present invention and contributing to high-speed driving of the emitter line 92. In FIG. 55B, numeral 99 represents a resistance film. In this FED, the above-mentioned MOSTFT may be connected to each pixel electrode so that the FED is driven by an active-matrix system.

When a conventional light-emitting polymer is used instead of the EL layer 90 in the EL device shown in FIG. 56A, this device functions as a passive-matrix or an active-matrix light-emitting polymer device (LEPD). In the FED shown in FIG. 56B, a diamond thin-film may be used as the cathode to implement a device similar to FED. In a light emitting diode, a light emitting section composed of a gallium-based film, such as gallium-aluminum-arsenic, may be driven by MOSTFTs of single-crystal silicon epitaxially grown in accordance with the present invention.

The above-described embodiments of the present invention may have the following modifications without departing from the spirit of the present invention.

When the polycrystalline silicon film 5 is deposited, the film 5 may be doped with a Group III or V element having high solubility, e.g., boron, phosphorus, antimony, arsenic, aluminum, gallium, indium, or bismuth, in an adequate amount to control the channel conductive type (P or N) of and the carrier content in the epitaxial silicon layer 7.

The second or third embodiment may be applied to the fifth embodiment which uses an indium-gallium alloy or metallic gallium.

In order to avoid diffusion of ions from the glass substrate, a SiN film having a thickness of, for example, 50 to 200 nm and a $SiO_2$ film having a thickness of 100 nm, if necessary, may be formed on the substrate surface, and the above-described step differences 4 may be formed in these films. The step differences may be formed by ion milling instead of the above-mentioned RIE process.

Although the single-crystal silicon layer in accordance with the present invention can suitably be employed for the production of TFTS of a peripheral-driving-circuit section, such single-crystal silicon layer may be used for production of, for example, active regions, such as diodes, and passive regions, such as resistors and inductors, of devices.

A description will now be given of first to thirteenth embodiments of the second aspect of the present invention which employs a melt layer of a low-melting-point metal and which has the step of forming a dual-gate first thin-film transistor.

FIGS. 1A to 1C, FIGS. 57A and 57B, FIG. 3A to FIG. 14 show a first embodiment of the second aspect of the present invention.

The first embodiment relates to an active-matrix reflective liquid crystal display (LCD) having a peripheral driving circuit incorporating dual-gate MOSTFTs formed by a single-crystal silicon layer which is formed by graphoepi-tacy of indium-silicon melt at high temperature using as a seed an indented section difined by a step difference provided on a substrate. FIGS. 12 to 14 show an overall layout of the reflective LCD.

With reference to FIG. 12, the active-matrix reflective LCD has a flat panel configuration including a main substrate 1 (active-matrix substrate) and a counter substrate 32 which are bonded to each other with a spacer provided therebetween (not shown in this Figure), and the space between the main substrate 1 and the counter substrate 32 is filled with a liquid crystal (not shown in this Figure). Provided on a surface of the main substrate 1 are a display section which includes pixel electrodes 29 or 41 arranged in a matrix and switching devices 112 for driving the pixel electrodes, and peripheral driving circuit sections connected to the display section.

Each switching device in the display section is composed of an nMOS, pMOS, or cMOS top-gate TFT having a LDD structure in accordance with the present invention. Also, in the peripheral-driving-circuit sections, cMOS, nMOS and/or pMOS dual-gate MOSTFTs in accordance with the present invention are formed as circuit components. One of the peripheral-driving-circuit sections includes a horizontal driving circuit which drives the TFTs of the pixels in a line-by-line fashion while supplying these pixels with data signals, whereas the other of the peripheral-driving-circuit portions is a vertical driving circuit which drives the gates of the TFTs of the pixels on the scan-line-basis, both the horizontal and vertical driving circuits being arranged on both peripheral sides of the display section. These driving circuits may be a dot-sequential analog type or a line-sequential digital type.

With reference to FIG. 13, the TFTs are arranged at intersections of gate bus lines and orthogonal data bus lines, and are activated to write image information into liquid crystal capacitors ($C_{LC}$) and the charge in the liquid crystal capacitors is retained until the next information is written. Since the channel resistance of each TFT is not sufficient to retain the information, a storage capacitor ($C_S$), serving as an auxiliary capacitor, may be provided in parallel to the liquid crystal capacitor to compensate for a drop of voltage across the liquid crystal due to a leakage current. Characteristics required for TFTs used in the pixel or display region are different from characteristics required for TFTs used in the peripheral driving circuits: namely, an important property of the TFTs in the pixel region is to control an OFF current and to retain an ON current. Providing TFTs having a LDD structure in the display section can reduce an electric field between the gate and the drain and thus reduces the effective electric field applied to the channel region, the OFF current and a change in characteristics. The production process, however, is complicated, the size of the device is inevitably increased, and the ON current is decreased. Thus, the designs must be optimized to meet the respective purposes.

Among the usable liquid crystals are TN liquid crystals (nematic liquid crystals used in a TN mode of active-matrix driving), super-twisted nematic (STN) liquid crystals, guest-host (GH) liquid crystals, phase change (PC) liquid crystals, ferroelectric liquid crystals (FLCs), antiferroelectric liquid crystals (AFLCs), and polymer dispersion-type liquid crystals (PDLCs).

The system of and the method for driving the peripheral driving circuits will now be briefly described with reference to FIG. 14. The driving circuits include a gate driving circuit and a data driving circuit each of which must implement a shift resistor. Each shift resistor generally may be a cMOS circuit including both pMOSTFTs and nMOSTFTs or may be a circuit including either pMOSTFTs or nMOSTFTs, among which suitably used is a cMOSTFT or CMOS circuit in view of the operational speed, reliability, and low power consumption.

The scanning driving circuit includes shift registers and buffers and supplies pulses to lines in synchronism with a horizontal scanning period. The data driving circuit may be a dot-sequential driving system or a line-sequential driving system, but the dot-sequential driving system as illustrated has a relatively simplified configuration and writes display signals directly into pixels through analog switches under control of the shift registers. The signals are sequentially written into pixels in a line within a scanning time for the line (R, G and B in the drawing schematically represent red, green and blue pixels).

With reference to FIGS. 1A to 1C, FIGS. 57A and 57B, and FIGS. 3A to 10B, the active-matrix reflective LCD in this embodiment will be described in accordance with the production steps. In FIGS. 1A to 1C, FIGS. 57A and 57B, and FIGS. 3A to 6C, the left side of each drawing shows the production steps for the display section and the right side shows the production steps for the peripheral-driving-circuit section.

Referring first to FIG. 1A, a film 71 of about 500 to 600 nm thick is formed from a molybdenum/tantalum (Mo—Ta) alloy by sputtering on a major surface of an insulating substrate 1 made of, for example, a quartz glass or a transparent crystalline glass.

Then, as shown in FIG. 1B, a photoresist 70 is formed in a given pattern and the Mo-Ta film 71 is taper-etched through a mask constituted by the photoresist 70, whereby a gate electrode 71 is formed to have side faces that are gently slanted at an angle of 20 to 45 degrees to provide a substantially trapezoidal cross-section.

Then, as shown in FIG. 1C, a gate insulating film composed of an SiN film 72 (about 100 nm thick) and an $SiO_2$ film 73 (about 200 nm thick) laminated in this order is deposited by, for example, a plasma CVD process on the substrate 1 having the molybdenum Etantalum alloy film 71, after removal of the photoresist 70.

Figure 57A:
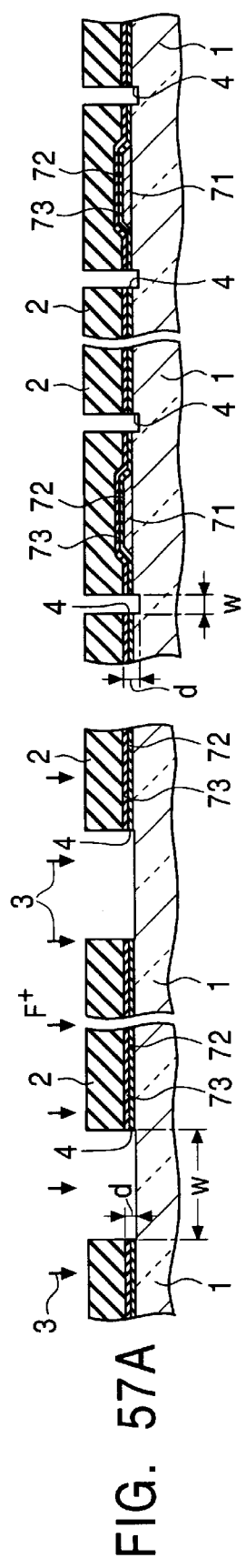
FIGS. 57A and 57B are sectional views showing steps of a process for producing an LCD in accordance with a first embodiment of a second aspect of the present invention.

Subsequently, as shown in FIG. 57A, a photoresist 2 having a given pattern is formed in at least a TFT-forming region, and the surface is irradiated with, for example, $F^+$ ions 3 of $CF_4$ plasma through the mask constituted by the photoresist 2, and a plurality of step differences 4 having a given shape and a given size are formed in the gate insulating film (and further in the substrate 1) by typical photolithography, such as reactive ion etching (RIE), and then by etching (photoetching).

The insulating substrate 1 may be composed of a highly-heat-resistant substrate having a diameter of 8 to 12 inches and a thickness of 700 to 800 $\mu$m, such as quartz glass, crystallized glass, or ceramic, although in a transmissive LCD described below an opaque ceramic substrate cannnot be used. The step differences 4 function as seeds for graphoeitaxy of single-crystal silicon. Each step difference 4 has, for example, a depth d of 0.3 to 0.4 $\mu$m, a width w of 2 to 10 $\mu$m, and a length 1 of 10 to 20 $\mu$m (in the direction perpendicular to the drawing sheet). The basilar angle defined by the bottom face and the side face is a right angle. In order to prevent diffusion of ions such as Na ions from the glass substrate, an SiN film of, for example, 50 to 200 nm thick and, as desired, a silicon oxide film (referred to as $SiO_2$ film, hereinafter) of, for example, 100 nm thick may be formed on the glass substrate, in advance of the steps described heretofore.

Figure 57B:
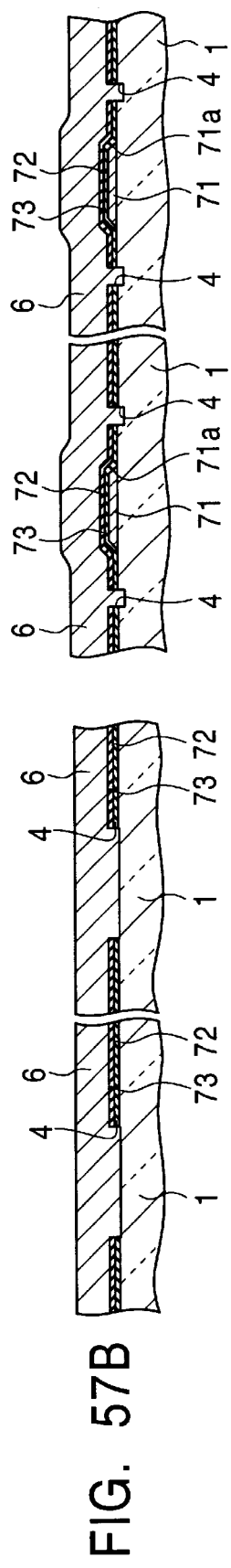

With reference to FIG. 57B, after the photoresist layer 2 is removed, a silicon-indium melt containing about 1 percent by weight of silicon is applied to the substrate 1 heated at a temperature of 900 to 930° C. Alternatively, the substrate 1 may be dipped with the melt. A process for floating the substrate 1 by gradually moving the melt surface, a jet process, or a contact process under ultrasonic operation may be employed.

Then, after being maintained for several to several tens of minutes, the substrate 1 is gradually cooled (pulled up in the case of dipping) so that silicon dissolved in indium is deposited by graphoepitaxy, using the bottom corner of each step difference 4 as a seed, as shown in FIG. 3A, whereby a P-type single-crystal silicon layer 7 having a thickness of, for example, approximately 0.1 $\mu$m is formed. In this process, the side faces 71a of the underlying gate electrode 71 are gently tapered, so that these side faces do not cause impediment to the epitaxial growth on the seeds constituted by the step differences, whereby the single-crystal silicon layer 7 can grow on these side faces without discontinuity. According to the dipping process and the floating process, the composition of the melt, the temperature and the pulling-up speed can be easily controlled, and the thickness of the epitaxially grown layer and the P-type carrier impurity concentration can be easily controlled.

In the single-crystal silicon layer 7 as deposited, a (100) plane is epitaxially grown on the substrate, and this is known as graphoepitaxy. With reference to FIGS. 9A and 9B, a vertical wall, such as the above-mentioned step difference 4, is formed on the amorphous substrate 1, such as a glass substrate and an epitaxial layer is formed thereon, so that the (100) plane of a single-crystal is grown along the side face of the step difference 4 as shown in FIG. 9B, whereas a crystal having random plane orientation is grown on a flat amorphous substrate 1, as shown in FIG. 9A. The size of the single-crystal grain increases in proportion to the temperature and the time: when the temperature is lowered or when the time is shortened, the distance between the step differences should be decreased. The orientation of the grown crystal can be controlled by changing the shape of the step differences, as shown in FIGS. 10A to 10F. When MOS transistors are formed, the (100) plane is most frequently used. Accordingly, the step difference 4 can have any cross-sectional shape which facilitates crystal growth, for example, the angle at the bottom corner (basilar angle) may be a right angle or, alternatively, the side wall may be inclined inwardly or outwardly towards the lower end. The basilar angle of the step difference 4 is preferably 90° or less and the bottom corner is preferably slightly rounded.

With reference to FIG. 3B, after the deposition of the single-crystal silicon layer by graphoepitaxy on the substrate 1, the indium film 6A deposited on the surface is removed using hydrochloric acid or sulfuric acid, followed by post-treatment to avoid the formation of a low-grade silicon oxide film, whereby a dual-gate MOSTFT and a top-gate MOSTFT are formed in the peripheral-driving-circuit section and in the display section, respectively, using the single-crystal silicon layer 7 as the channel regions.

The single-crystal silicon layer 7 deposited by graphoepitaxy contains is a p-type layer due to its indium content, and the concentration of the P-type impurity fluctuates, so that adjustment of the specific resistance is performed by doping with p-type impurity ions such as $B^+$ at 10 kV and at a dosage of $2.7 \times 10^{11}$ atoms/cm$^2$, with the p-channel MOSTFT section masked by a photoresist (not shown in the drawing). With reference to FIG. 3C, in order to control the concentration of the impurity in the pMOSTFT-forming region, the nMOSTFT section is masked with a photoresist 60 and is doped with n-type impurity ions 65 such as $P^+$ at 10 kV and at a dosage of $1 \times 10^{11}$ atoms/cm$^2$ to form an n-type well 7A.

With reference to FIG. 4A, a $SiO_2$ film having a thickness of approximately 200 nm and then a SiN film having a thickness of approximately 100 nm are continuously deposited on the entire single-crystal silicon layer 7 by a plasma-enhanced CVD process, a high-density plasma-enhanced CVD process or a catalytic CVD process to form a gate insulating film 8, followed by a sputtering to deposite a molybdenum-tantalum (Mo—Ta) alloy film 9 of 500 to 600 nm thereon.

With reference to FIG. 4B, photoresist patterns 10 are formed in the step difference regions (indented sections) of the TFT sections in the display region and outside the step difference regions of the TFT sections of the peripheral driving region by any convnetional photolithographic process, and a continuous etching is executed, whereby gate electrodes 11 of the Mo—Ta alloy film and gate insulating films 12 of SiN—$SiO_2$ are formed and the single-crystal silicon layer 7 is exposed. The Mo—Ta alloy film 9 is etched using an acidic etchant, SiN is etched by plasma ethching using $CF_4$ gas, and $SiO_2$ is etched using a hydrofluoric acidic echant.

With reference to FIG. 4C, all of the nMOSs and pMOST-FTs in the peripheral driving region, as well as the gate sections of the nMOSTFTs in the display region, are covered with a photoresist 13, and the exposed source and drain regions of the nMOSTFTs are doped with, for example, phosphorus ions 14 by ion implantation at 20 kV and at a dosage of $5 \times 10^{13}$ atoms/cm$^2$ to form LDD sections 15 of an N$^-$-type layer by self-alignment.

With reference to FIG. 5A, all of the nMOSTFTs in the peripheral driving region, the gate sections of the nMOST- FTs in the peripheral driving region, and the gate sections and the LDD sections of the nMOSTFTs in the display region are covered with a photoresist 16, and the exposed regions are doped with phosphorus or arsenic ions 17 by ion implantation at 20 kV and at a dosage of $5\times10^{15}$ atoms/cm$^2$ to form source sections 18, drain sections 19 and the LDD sections 15 of an N$^+$-type laye rof the nMOSTFTs.

With reference to FIG. 5B, all of the nMOSTFTs in the peripheral driving region and the display region and the gate sections of the pMOSTFTs in the peripheral driving region are covered with a photoresist 20, and the exposed regions are doped with boron ions 21 by ion implantation at 10 kV and at a dosage of $5\times10^{15}$ atoms/cm$^2$ to form source sections 22 and drain sections 23 of a P$^+$-type layer of the pMOST-FTs. In the case of an RMOS peripheral driving circuit, this step is not necessary since the circuit does not have a pMOSTFT.

With reference to FIG. 5C, in order to island the active device sections including TFTs and diodes and the passive device sections including resistors and inductors, photoresist layers 24 are provided on all of the active device sections and the passive device sections in the peripheral driving region and the display section, and the single-crystal silicon layer 7 in other sections is removed by a conventional photolithographic process or an etching process using a hydrofluoric acid solution.

With reference to FIG. 6A, a SiO$_2$ film having a thickness of approximately 200 nm and then a phosphosilicate glass (PSG) film having a thickness of approximately 300 nm are continuously deposited to form a protective film 25 on the entire surface by a plasma-enhanced CVD process, a high-density plasma-enhanced CVD process or a catalytic CVD process.

In such a state, the single-crystal silicon layer is activated. Activation treatment is performed at approximately 1,000° C. for approximately 10 seconds using, for example, a halogen lamp, and the gate electrode composed of the Mo—Ta alloy having a high melting point is durable during the annealing for activation. The Mo—Ta alloy can be used not only for the gate section but also as lead lines over a wide range. In the activation, excimer laser annealing requiring high process costs is generally not used. If excimer laser annealing is used, overlapping scanning of 90% or more is preferably performed on the entire surface or selectively the active device section and the passive device section using XeCl (wavelength:308 nm).

With reference to FIG. 6B, contact holes are formed for all of the source-drain sections of the TFTs in the peripheral driving circuit and the source sections of the TFTs in the display region, by a conventional photolithographic process and an etching process.

A film having a thickness of 500 to 600 nm is formed on the entire surface, from aluminum or an aluminum alloy, e.g., an aluminum alloy containing 1 wt % Si or 1 to 2 wt % copper and, by a conventional photolithographic process and an etching process, source electrodes 26 of all TFTs both in the peripheral driving circuit section and the display section, as well as the drain electrodes 27 in the peripheral driving circuit section, are formed, simultaneously with the formation of data lines and gate lines. The substrate is then subjected to sintering treatment in a forming gas (N$_2$+H$_2$) at approximately 400° C. for 1 hour.

With reference to FIG. 6C, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed for the drain sections of TFTs in the display region. It is not necessary to remove the SiO$_2$, PSG and SiN films in the pixel sections.

Basic requirements of a reflective liquid crystal display are to reflect the light incident on the display towards the interior of the liquid crystal panel and, at the same time, to scatter the light. This is because the direction of the incident light is uncertain whereas the position of the observer with respect to the display is substantially fixed. Thus, the reflector must be designed on an assumption that point light sources are present at arbitrary positions. As shown in FIG. 7A, a photosensitive resin film 28 having a thickness of 2 to 3 $\mu$m is formed on the entire surface by spin coating and, as shown in FIG. 7B, an uneven pattern is formed in at least the pixel region by a conventional photolithographic process and an etching process so that the pixel section has optimized reflective characteristics and viewing-angle characteristics, followed by a reflow to form a lower portion of the reflective face of an uneven surface 28A. At the same time, contact holes are formed in the resin for allowing contact of the drain sections of the display TFTs.

With reference to FIG. 7C, a sputtering film having a thickness of 400 to 500 nm is deposited from aluminum or an aluminum allowy, e.g., an allowy containing 1 wt % Si, on the entire surface, and the sputtering film at the region other than the pixel sections is removed by a general photolithographic process and an ethcing process, thereby to form an uneven aluminum reflective sections 29 which are connected to the drain sections 19. The reflective sections 29 are used as pixel electrodes for displaying. Next, these are subjected to sintering at approximately 300° C. for 1 hour in a forming gas to enhance the contact. Silver or a silver alloy may be used instead of aluminum to increase the reflectance.

As described above, a single-crystal silicon layer 7 is formed by high-temperature graphoepitaxy using the step differences as the seeds, and an active-matrix substrate 30 integrating a display section and a peripheral-driving-circuit section is produced by forming, both in the display section and in the peripheral-driving circuit section which employ the single-crystal silicon layer 7, top-gate nMOSLDD-TFTs and CMOS circuits which are composed of dual-gate pMOSTFTs and dual-gate nMOSTFTs.

With reference to FIG. 8, a method of producing a reflective liquid crystal display using the active-matrix substrate (driving substrate) 30 will now be described. Hereinafter, the active-matrix substrate is referred to as a TFT substrate.

When a liquid crystal cell in this LCD is produced by double-side assembly (suitable for medium to large liquid crystal panels of 2 inches or greater), polyimide alignment films 33 and 34 are formed one surface of the TFT substrate 30 and on a device-mounting surface of a counter electrode 32 having a solid indium tin oxide (ITO) electrode, respectively. The polyimide alignment films are formed by roll coating or spin coating so that thicknesses are in a range of 50 to 100 nm and are cured at 180° C. for 2 hours.

The TFT substrate 30 and the counter substrate 32 are aligned by rubbing or by an optical method. Although rubbing may be performed using cotton or rayon, cotton is preferable in view of dust produced by rubbing and retardation. In optical alignment, liquid crystal molecules are aligned by noncontact linearly polarized UV light irradiation. Polymer alignment film can also be formed by polarized or unpolarized light which is diagonally incident, such polymer films being, for example, polymethyl methacrylate polymers containing azobenzene.

After washing, a common material is applied to the TFT substrate 30 whereas a sealing agent is applied to the counter electrode 32. The washing is conducted with water or IPA (isopropyl alcohol), for the purpose of removing buffing dust. The common material may be an acrylic, an epoxy-acrylate or epoxy adhesive containing a conductive filler, while the sealing agent may be an acrylic, an epoxy-acrylate or epoxy adhesive. Although curing may be performed by heating, UV irradiation, or a combination thereof, a combination of heating and UV irradiation is preferable due to high overlapping alignment accuracy and ready working operations.

Spacers are distributed on the counter substrate 32 to form a given gap and the counter substrate 32 is overlapped with the TFT substrate 30. After achieving alignment such that an alignment mark of the counter substrate 32 is precisely aligned to an alignment mark of the TFT substrate 30, the sealing agent is preliminarily cured by UV irradiation, and then cured by heat at once.

Then, independent liquid crystal panels each having the TFT substrate 30 and the counter electrode 32 are formed by scribe-break process.

The gap between the two substrates 30 and 32 is filled with a liquid crystal 35 through an injection port which is then sealed with an UV-curable adhesive, and washing with isopropyl alcohol is executed. Any type of liquid crystal may be used, and a nematic liquid crystal used in a twisted nematic mode having high-speed response is generally used.

The liquid crystal 35 is aligned by heating and a subsequent quenching.

Flexible lead lines are connected to the panel electrode extraction section of the TFT substrate 30 by thermal compressive bonding using an anisotropic conductive film, and then a polarizer is bonded to the counter electrode 32.

When the liquid crystal panel is produced by single-side assembly (suitable for compact liquid crystal panels of 2 inches or smaller), polyimide alignment films 33 and 34 are formed one surface of the TFT substrate 30 and on a device-mounting surface of the counter electrode 32, respectively, and then these substrates 30 and 32 are aligned by rubbing or noncontact optical alignment using linearly polarized UV light.

The TFT substrate 30 and the counter substrate 32 are divided into segments by dicing or scribing and are washed with water or isopropyl alcohol. A common material is applied to each divided TFT substrate 30 whereas a sealing agent containing spacers is applied to each counter substrate 32, and these substrates are overlapped with each other. The subsequent process is substantially the same as above.

In the above-described reflective LCD, he counter substrate 32 of the reflective LCD is a color filter (CF) substrate having a color filter layer 46 provided below the ITO electrodes 31. The light incident to the counter substrate 32 is effectively reflected by the reflective film 29 and is emitted from the counter substrate 32.

Besides the substrate structure as shown in FIG. 8, the TFT substrate may have an on-chip color filter (OCCF) structure in which the TFT substrate 30 has a color filter, wherein ITO electrodes or ITO electrodes with a black masks are directly bonded to the counter electrode 32.

When the auxiliary storage capacitor ($C_S$) described before with reference to FIG. 13 is provided in the pixel section, a dielectric layer (not shown in the drawing) provided on the substrate 1 is connected to the drain region 19 of the single-crystal silicon.

As described above, this embodiment offers the following noticeable advantages.

(A) The step differences 4 having a predetermined size and a shape are formed on the substrate 1, and the single-crystal silicon layer 7 is deposited by high-temperature graphoepitaxy using the bottom corner of each step difference as a seed (heating during the graphoepitaxy is performed at a relatively low temperature of 900 to 930° C.), whereby a single-crystal silicon layer 7 having a high electron mobility of 540 cm$^2$/v sec or more is obtained to enable production of a LCD having high-performance drivers.

(B) The single-crystal silicon layer has higher electron or hole mobility, comparable with that of a single-crystal silicon substrate and is higher than that of conventional amorphous or polycrystalline silicon thin-films, so that single-crystal silicon dual-gate MOSTFTs using this single-crystal silicon layer can implement an integral structure composed of a display section and a peripheral-driving-circuit section, wherein the display section has nMOSTFTs, pMOSTFTs or cMOSTFTs with LDD structures that offer high switching performance and low-leak current characteristics, while the peripheral-driving-circuit section includes cMOSTFTs, nMOSTFTs and/or pMOSTFTs which exhibit high driving performance, thus implementing a display panel having high image quality, high definition, a narrow frame, a large screen and a high luminescent efficiency. Since the single-crystal silicon layer 7 has sufficiently high hole mobility, the peripheral driving circuit can drive by using only electrons or holes, or by a combination thereof, and can be combined with the display TFTs having pMOSTFT or cMOSTFTs with LDD structures, thus realizing an integrated panel structure. In compact to medium-sized panels, one of a pair of vertical peripheral driving circuits may be omitted.

(C) In particular, the use of dual-gate MOSTFTs in the peripheral driving circuit makes it possible to obtain cMOS, nMOS or pMOSTFTs having driving-power 1.5 to 2.0 times as large that obtainable with the use of single-gate TFTs, thus achieving higher performance and greater driving power of the TFTs, offering advantages particularly when TFTs having large driving power are to be used in a local portion of the peripheral driving circuit. Furthermore, the dual-gate structure can easily be changed to a top-gate type structure or a bottom-gate type structure through a selection of one of the upper and lower gates and, in addition, ensures safe operation even in the event of a failure in one of the upper and lower gates because the other gate can safely be used.

(D) In adition, heating during graphoepitaxy can be performed at 930° C. or less, so that the single-crystal silicon layer 7 can be uniformly formed on the insulating substrate at a relatively low temperature of, for example, 900 to 930° C. or less. Quartz glass, crystallized glass or ceramic can be used as a substrate.

(E) Since this process does not require long-term annealing at a medium temperature nor excimer annealing, which is essential for solid phase epitaxy, this process has high productivity and does not require expensive facilities, resulting in reduced production costs.

(F) In the high-temperature graphoepitaxy, a single-crystal silicon layer having a variety of p-type impurity concnetrations and a high mobility can be readily produced by controlling the ratio of indiumu to silicion, the heating temperature of the substrate, and the cooling rate, allowing the threshold voltage (Vth) to be readily controlled to reduce the resistance to facilitage high-speed operations.

(G) When a color filter is provided on the display array, the aperture ratio of the display panel and the luminance are improved, and costs are decreased due to omission of a color filter substrate and improved productivity.

A description will be given of a second embodiment of the second aspect of the present invention with reference to FIGS. 58A to 60D.

Figure 58A:
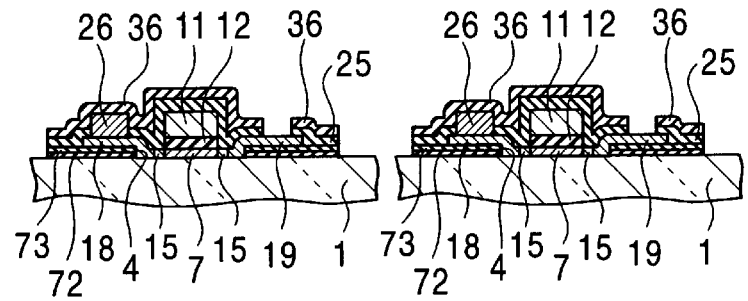
FIGS. 58A to 58C are sectional views showing steps of a process for producing an LCD in accordance with a second embodiment of a second aspect of the present invention.

This embodiment has, as in the case of the first embodiment, top-gate MOSTFTs in the display section and dual-gate MOSTFTs in the peripheral driving circuit section, but pertains to a transmissive LCD, unlike the first embodiment. More particularly, in this embodiment, the transmissive LCD is produced by following the procedure as Steps shown in FIGS. 1A to 1C, FIG. 57A and 57B, and FIGS. 3A to 6C as in the first embodiment, but in the subsequent process, contact holes 19 for the drain sections of TFTs in the display sections are formed in insulating films 25 and 36, as shown in FIG. 58A, and the unnecessary $SiO_2$ film, PSG film and Si film in the pixel-opening section are removed to improve the transmittance.

Figure 58B:
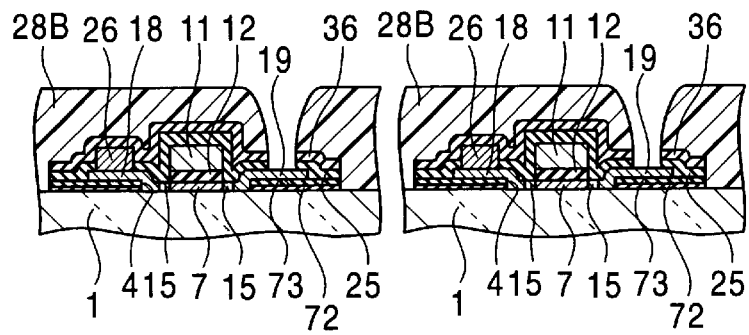

With reference to FIG. 58B, a planarization film 28B, which is composed of an acrylic photosensitive transparent resin and has a thickness of 2 to 3 $\mu$m, is formed on the entire surface by spin coating etc., and then contact holes for drains of TFTs in the displaying section are formed in the transparent resin 28B, followed by curing of the transparent resin 28B executed under a given condition.

Figure 58C:
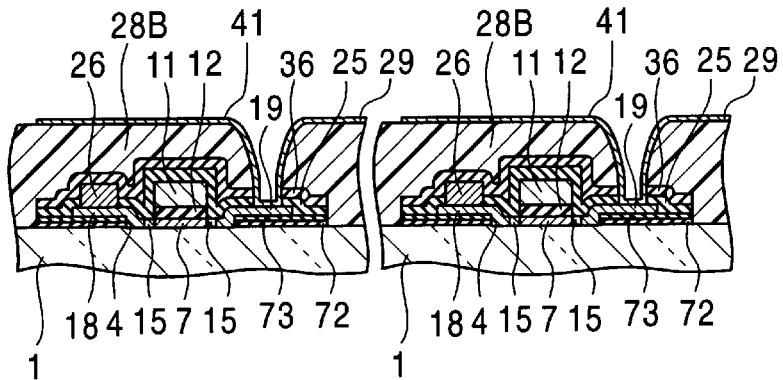

With reference to FIG. 58C, an ITO film having a thickness of 130 to 150 nm is formed on the entiere surface by sputtering, and then an ITO transparent electrodes 41 in contact with the drain section 19 in the display region are formed by photolithography and etching. Next, a heat-treatment in a forming gas at 200 to 250° C. for 1 hour is performed to reduce the contact resistance between the drain of each TFT in the display section and the ITO and to improve the transparency of the ITO.

Figure 59:
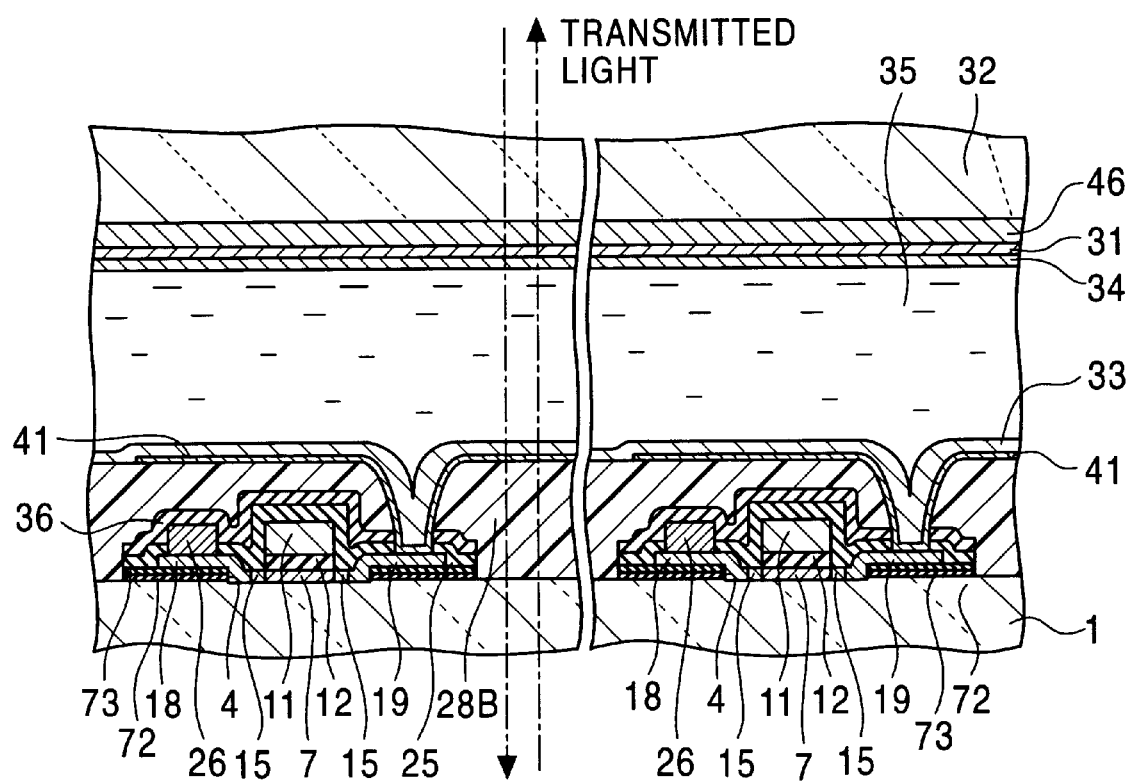
FIG. 59 is a sectional view of a critical portion of the LCD of the second embodiment.

Then, a transmissive LCD is assembled combining this TFT substrate 1 with a conter substrate 32 as in the first embodimen, as shown in FIG. 59. In this embodiment, however, a polarizer is provided also on the TFT substrate. Although transmission light runs in this transmissive LCD as shown by a solid line in the drawing, the arrangement may be such that transmission light is available from the counter substrate 32.

An on-chip color-filter (OCCF) structure and an on-chip black (OCB) structure can be made from this transmissive LCD, as follows.

Figure 60A:
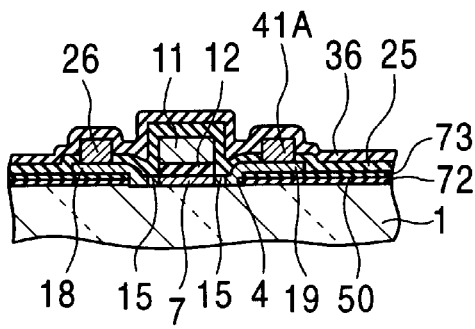
FIGS. 60A to 60C are sectional views showing subsequent steps of the process for producing the LCD of the second embodiment of the second aspect of the present invention.

After performing Steps shown in FIGS. 1A to 1C, FIGS. 57A and 57B, and FIG. 3A to FIG. 6A, contact holes are also formed at the drain sections of the PSG-$SiO_2$ insulating film 25 as shown in FIG. 60A, and an aluminum embedded layer 41A for a drain electrode is formed, followed by deposition of the SiN-PSG insulating film 36.

Figure 60B:
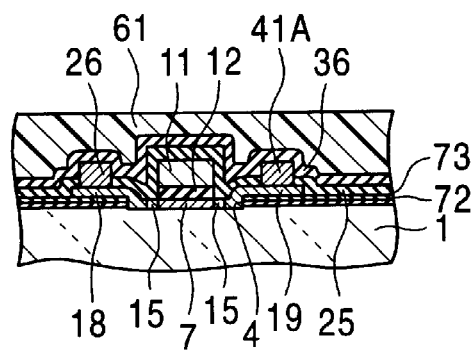
Figure 60C:
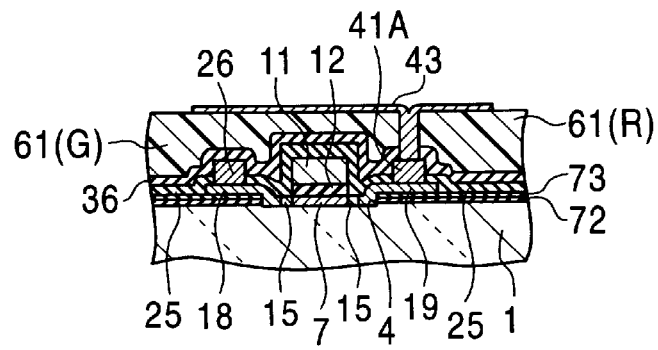

With reference to FIG. 60B, a photoresist 61 containing a red, green, or blue pigment having a thickness of 1 to 1.5 $\mu$m is formed on the corresponding color segments and, as shown in FIG. 60C, color filter layers 61(R), 61(G), and 61(B) are formed by a general photolithographic process in such a pattern as to leave the colors only at predetermined locations corresponding to the pixels. (OCCF structure). Contact holes are also formed at the drain sections. This embodiment excludes the use of an opaque ceramics substrates and substrates made of low-transmissivity glass or heat-resistant resin.

With reference to FIG. 60C, a metal shading layer 43 servable as a black mask layer is formed over the contact holes communicating with the drains of the display TFTs and over the color filter layer, by a patterning process using a metal. For example, a molybdenum film having a thickness of 200 to 250 nm is formed by a sputtering process and is then patterned to form a given shape for shading the display TFTs (OCB structure).

Figure 60D:
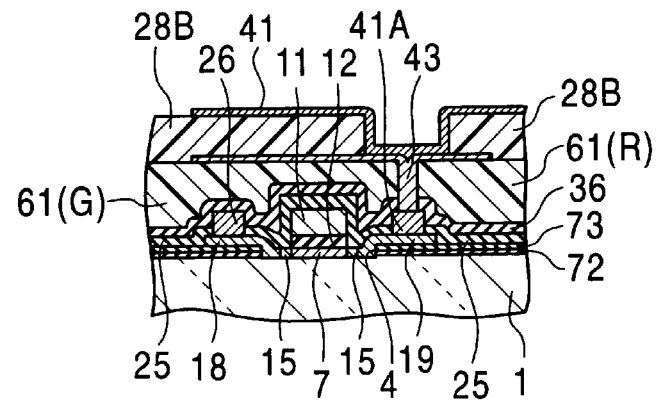

With reference to FIG. 60D, a planarization film 28B composed of a transparent resin is formed, and then ITO transparent electrodes 41 are formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

A description will be given of a third embodiment of the second aspect of the present invention.

This embodiment relates to an active-matrix reflective liquid crystal display (LCD) including top-gate MOSTFTs formed of a single-crystal silicon layer which is deposited by low-temperature graphoepitaxy from an indium-gallium-silicon or gallium-silicon melt, using as seeds step differences (indents) on a glass substrate having a low distortion point.

In contrast to the first embodiment, the substrate 1 used in this embodiment is a glass substrate having a low distortion point or maximum usable temperature as low as 600° C. or so, such as borosilicate glass or aluminosilicate glass, as the substrate employed in Step shown in FIG. 1A. Such a glass is inexpensive and can easily be produced in large sizes, e.g., 500 mm×600 mm×0.1 to 1.1 mm can be formed using long rolled glass. obviously, quartz and crystallized glass may be used as well.

After forming the step differences 4 as in the preceding embodiments, an indium-gallium (or gallium) melt containing silicon is applied to the substrate 1 in Step shown in FIG. 57B.

When the substrate 1 is gradually cooled, as shown in FIG. 3A, silicon dissolved in indium-gallium (or indium) is deposited by graphoepitaxy on the bottom corners of the step differences 4 serving as seeds to form a single-crystal silicon layer 7 having a thickness of, for exmaple, 0.1 $\mu$m.

In this case also, the (100) plane of the single-crystal silicon layer 7 is deposited on the substrate by epitaxy and the orientation of the crystal layer can be controlled by changing the shape of the step differences 4, as shown in FIGS. 9A to 9F.

After the deposition of the single-crystal silicon layer 7 by graphoepitaxy on the substrate 1, indium-gallium (or gullium)at the surfae are removed by hydrochloric acid or sulfuric acid, as shown in FIG. 3B.

Using the single-crystal silicon layer 7, top gate MOSTFTs are formed in the display section and the peripheral-driving-circuit section, as in the first embodiment. The structure shown in FIG. 8 may also be employed in this embodiment.

This embodiment has the following noticeable advantages, in addition to the advantages of the first embodiment.

(A) The single-crystal silicon layer 7 can be more uniformly formed on the glass substrate 1 by graphoepitaxy at a lower temperature of approximately 300 to 600° C. (or 420 to 600° C.).

(B) This process enables the formation of the single-crystal silicon layer on an insulating substrate such as an organic substrate, other than the glass substrate, allowing the use of any inexpensive material having a low distortion point and improved physical properties as the substrate, thus facilitating production of large-size substrates. Accordingly, a thin, long and rolled glass or organic substrate provided with a single-crystal silicon layer can be produced using such a material at a reduced cost and with high productivity. When the constituents in the glass substrate are diffused into the upper layer and affect the transistor characteristics, a thin barrier layer, for example, a silicon nitride layer having a thickness of 50 to 200 nm, is preferably provided, in order to suppress such a diffusion.

(C) In the low-temperature graphoepitaxy, a single-crystal silicon layer having a variety of p-type impurity concentrations and a high mobility can be readily produced by controlling the ratio of indium to gallium of the indium-gallium film, the heating temperature of the substrate, and the cooling rate, thus facilitating the control of the threshold voltage (Vth) and reducing the resistance to afford high-speed operation.

A description will be given of a fourth embodiment of the second aspect of the present invention.

In contrast to the preceding third embodiment, this embodiment relates to a transmnissive LCD in which a single-crystal silicon layer is formed by low-temperature graphoepitacy using an indium-gallim melt, as in the second embodiment.

Using the single-crystal silicon layer, the transmissive LCD is produced by the process shown in FIG. 58A to FIG. 60D. opaque ceramic substrates and opaque or translucent organic substrates are not suitable for the transmissive LCD.

Accordingly, this embodiment has the advantages of both the second and the third embodiments. Thus, this embodiment offers the following advantages in addition to those produced by the first embodiment: borosilicate glass and heat-resistant organic materials which are inexpensive and facilitate the formation of long thin rolled substrates can be used as the substrate 1; the conductive type and Vth of the single-crystal silicon layer can be readily adjusted by the ratio of indium to gallium; and the color filter 42 and the black mask 43 provided on the display array section improve the aperture ratio of the liquid crystal display panel and decreases electrical power consumption of the display module including a back light.

FIG. 20A to FIG. 21D, FIGS. 61A to 62D, and FIGS. 24A to 28C show a fifth embodiment of the second aspect of the present invention.

In this embodiment, the peripheral-driving-circuit section includes a CMOS driving circuit including dual-gate-type pMOSTFTs and nMOSTFTs as in the first embodiment. The display section is of a reflective type and includes TFTs having various gate configurations arranged in a variety o combinations.

The display section shown in FIG. 20A includes top-tate nMOSLDD-TFTs as in the first embodiment, while the display section shown in FIG. 20B includes bottom-gate nMOSLDD-TFTs, whereas the display section shown in FIG. 20C includes dual-gate nMOSLDD-TFTs. These bottom-gate and dual-gate MOSTFTs can be produced by the same process for the dual-gate MOSTFTs of the peripheral-driving-circuit section, as will be described later, the dual-gate MOSTFT having higher driving ability and being suitable for high-speed switching by virtue of the presence of upper and lower gates and, furthermore, the upper or lower gate may be selectively used to implement a top- or bottom-gate type during operation.

In the bottom-gate MOSTFT shown in FIG. 20B, a gate electrode 71 is composed of, for example, molybdenum-tantalum, and a gate insulating film is composed of a SiN film 72 and a $SiO_2$ film 73. A channel region and so forth using the single-crystal silicon layer are formed on the gate insulating film as in the cse of the dual-gate MOSTFT of the peripheral-driving-circuit section. The dual-gate MOSTFT shown in FIG. 20C has the lower-gate section substantially the same as that in the bottom-gate MOSTFT, whereas the upper-gate section includes an upper-gate electrode 83 formed on a gate insulating film 82 composed of a $SiO_2$ film and a SiN film. In all the cases, each gate section is formed in the exterior of the step difference 4 which serves as a seed for graphoepitaxy.

A method of producing th eabove-mentioned bottom-gate MOSTFT will be described with reference to FIGS. 21A to 21D, FIGS. 61A to 61D, FIGS. 62A to 62D, and FIGS. 24A to to 25C, and a method of producing the dual-gate MOSTFT will be described with reference to FIGS. 26A to 28C. The method of producing the dual-gate MOSTFT in the peripheral-driving-circuit section is the same as that described before with reference to FIGS. 1A to 6C and is therefore not illustrated.

With reference to FIG. 21A, ih the production of the bottom-gate MOSTFT in the display section, a molybdenum-tantalum alloy film 71 having a thickness of 500 to 600 nm is formed on a substrate 1 by sputtring.

With reference to FIG. 21B, a photoresist 70 having a given pattern is formed by a processing which is the same as that described with reference to FIG. 1B, and the molybdenum-tantalum alloy film 71 is subjected to taper etching using the photoresist 70 as a mask to form a gate electrode 71 having a trapezoidal side base 71a with an angle of 20 to 45 degrees.

With reference to FIG. 21C, the processing which is the same as that shown in FIG. 1C is conducted in which, after the photoresist 70 is removed, a SiN film 72 having a thickness of approximately 100 nm and then a $SiO_2$ film 73 having a thickness of approximately 200 nm are deposited on the substrate 1 including the molybdenum-tantalum alloy film 71, by a plasma-enhanced CVD process, thereby to form a gate insulating film.

With reference to FIG. 21D, the same process as that described before in connection with FIG. 57A is executed in which a photoresist 2 having a given pattern is formed in at least the TFT-forming region, and a plurality of step differences 4 having a proper shape and size are formed in the gate insulating film and further in the substrate 1 through a mask constituted by the photoresist 2, as described above. The step differences 4 function as seeds during graphoepitaxy of the single-crystal silicon layer as will be described later, and have a depth d of 0.3 to 0.4 μm, a width of 2 to 3 μm, a length of 10 to 20 μm perpendicular to the drawing sheet, and an basilar angle (between the bottom and the side wall) which is a right angle.

Figure 61A:
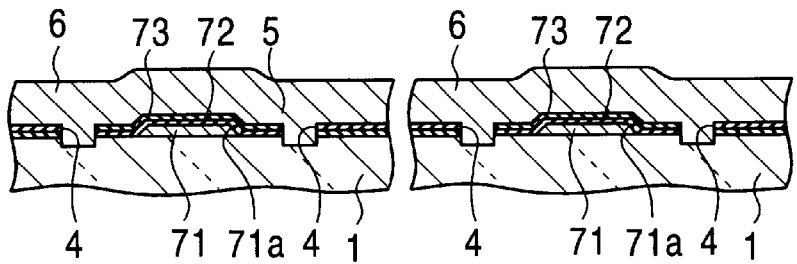
FIGS. 61A to 61D are sectional views showing steps of a process for producing an LCD of a fifth embodiment of the second aspect of the present invention.

Then, after removal of the photoresist 2, the same processing as FIG. 57B is conducted to apply an indium (or indium-gallium or gallium) containing silicon, as in FIG. 61A.

Figure 61B:
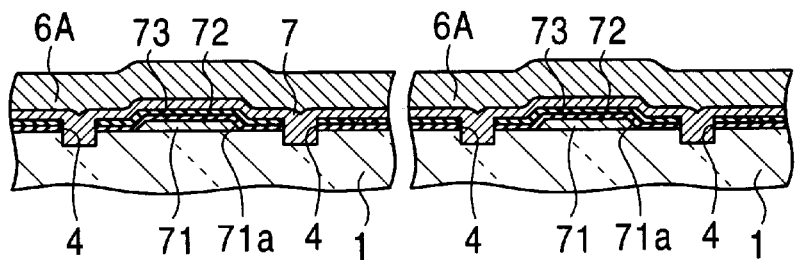

Then, the same process as FIG. 3A is executed to cause graphoepitaxial growth of a single-crystal silicon, whereby a single-crystal silicon layer of a thickness of, for example, 0.1 μm or so is deposited, as shown in FIG. 61B. In this process, the side faces 71a of the underlying gate electrode 71 are gently tapered, so that these side faces do not cause impediment to the epitaxial growth on the seeds constituted by the step differences, whereby the single-crystal silicon layer 7 can grow on these side faces without discontinuity.

Figure 61C:
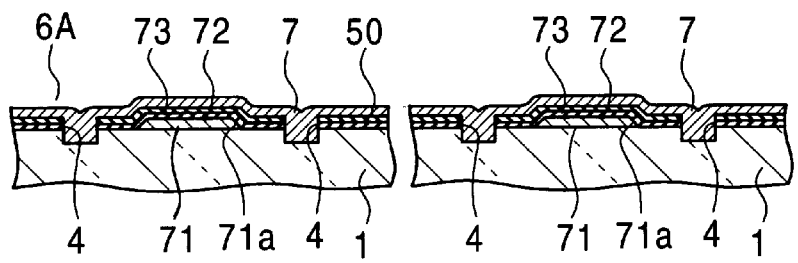
Figure 61D:
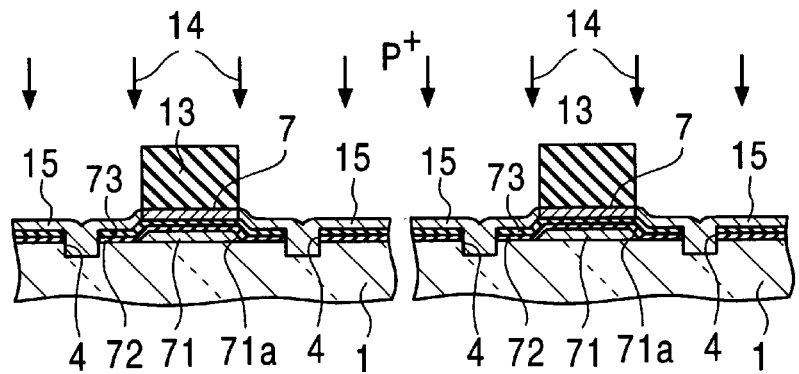

Then, the film 6A of indium is removed as shown in FIG. 61C and, after execution of Steps shown in FIGS. 3C to 4B, the processing which is the same as that of FIG. 4C is executed in which the gate section of the nMOSTFTs in the display section are covered by the photoresist 13, and source and drain regions of the nMOSTFTs left exposed are doped by ion implantation with phosphor ions 14, whereby an LDD section 15 composed of an N-type layer is formed by self-alignment, as shown in FIG. 61D. In this process, the bottom-gate electrode 71 permits easy recognition of the height differences or pattern, thus facilitating positioning of the photoresist 13, i.e., mask alignment, thereby suppressing misalignment.

Figure 62A:
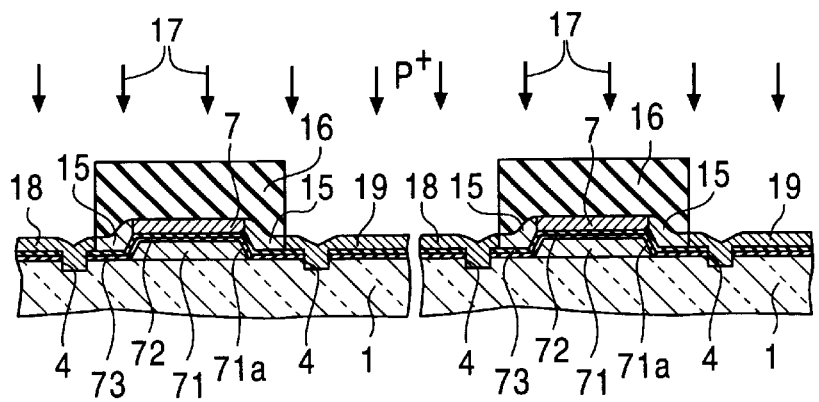
FIGS. 62A to 62D are sectional views showing subsequent steps of the process for producing LCD of the fifth embodiment of the second aspect of the present invention.

With reference to FIG. 62A, the gate section and the LDD section of the nMOSTFT are covered with a photoresist 16 and the exposed region is doped with phosphorus or arsenic ions 17 by ion implantation to form a source section 18 and a drain section 19 composed of an $N^+$-type layer of the nMOSTFT, as in Step shown in FIG. 5A.

Figure 62B:
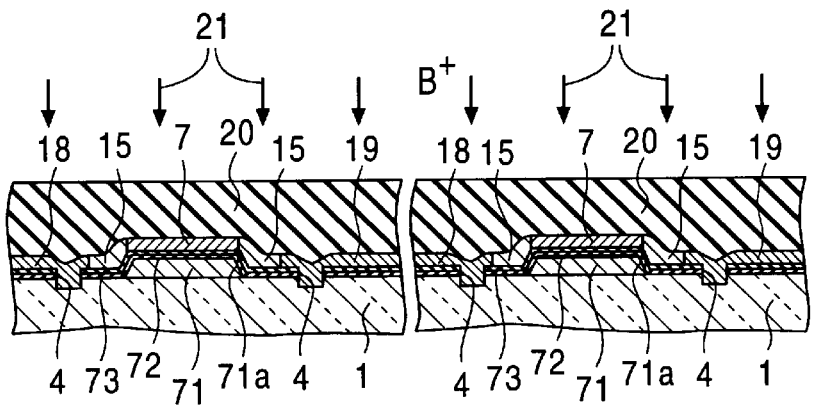

With reference to FIG. 62B, the entire nMOSTFT is covered with a photoresist 20 and then doped with boron ions 21 by ion implantation to form a source section and a drain section of the $p^+$ layer of the pMOSTFTS in the peripheral-driving-circuit section, as in Step shown in FIG. 5B.

Figure 62C:
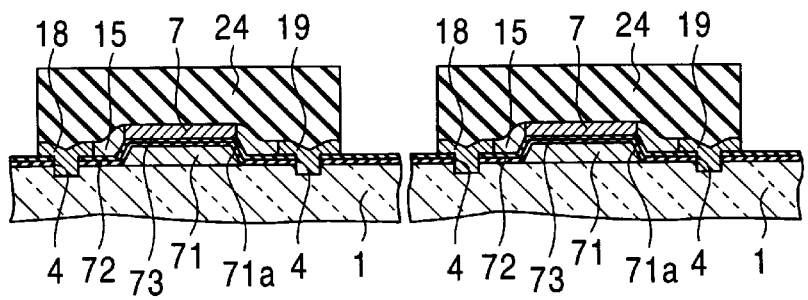

With reference to FIG. 62C, a photoresist 24 is provided and then the single-crystal silicon layer is selectively removed by conventional photolithography and etching to island the active device section and the passive device section, as in Step shown in FIG. 5C.

Figure 62D:
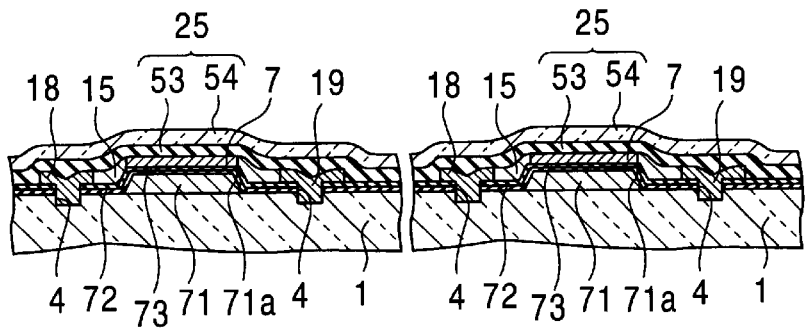

With reference to FIG. 62D, a $SiO_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in Step shown in FIG. 6A. The $SiO_2$ film 53 and the PSG film 54 correspond to the aforementioned protective film 25. The single-crystal silicon layer is then subjected to an activation treatment as described before.

With reference to FIG. 24A, contact holes are formed for the source sections by conventional photolithography and etching, as in Steps shown in FIG. 6B. An aluminum sputtering film having a thickness of 400 to 500 nm is formed on the entire surface, and source electrodes 26 of the TFTs, data lines and gate lines are simultaneously formed by conventional photolithography and etching. The substrate is then sintered in a forming gas at approximately 400° C. for 1 hour.

With reference to FIG. 24B, an insulating film 36 composed of a PSG film having a thickness of approximately 300 nm and a SiN film having a thickness of approximately 300 nm is formed on the entire surface by a high-density plasma-enhanced CVD process or a catalytic CVD process, and contact holes are formed at the drain sections of display TFTS, as in FIG. 6C.

With reference to FIG. 24C, a photosensitive resin film 28 having a thickness of 2 to 3 $\mu S$ is formed by spin coating, as in step 16 shown in FIG. 7A, followed by a Step shown in FIG. 24D in which an uneven pattern is formed and then subjected to reflow to form a lower portion of a reflective layer having an uneven surface 28A so that the pixel section has optimized reflective and viewing-angle characteristics. At the same time, contact holes are formed in the resin for allowing contact of the drain sections of the display TFTs.

With reference to FIG. 24D, an aluminum sputtering film having a thickness of 400 to 500 nm is formed on the entire surface, and then an uneven aluminum reflective section 29 connecting to the drain sections 19 of the display TFTs is formed by conventional photolithography and etching, as in Step shown in FIG. 7C.

As described above, the resulting active-matrix substrate 30 integrates a display section and a peripheral-driving-circuit section, in which the display section includes bottom-gate nMOSLDD-TFTs using the single-crystal silicon layer 7 formed by high-temperature graphoepitaxy on the step differences 4 as a seed, while the peripheral-driving-circuit section includes a cMOS driving circuit having dual-gate pMOSTFTs and dual-gate nMOSTFTs.

FIGS. 25A to 25C show the formation of the gate insulating film of the above-mentioned bottom-gate MOSTFT in the display section by anodic oxidation of molybdenum-tantalum.

After the step of FIG. 21B, the molybdenum-tantalum alloy film 71 is subjected to conventional anodic oxidation treatment, as shown in FIG. 25A, to form on the surface a gate insulating film 74 composed of $Ta_2O_5$ and having a thickness of 100 to 200 nm.

Next, with reference to FIG. 25B, the step differences 4 are formed and a single-crystal layer 7 is deposited thereon graphoepitaxy, as in the steps shown in FIGS. 21A to 21D and FIGS. 61A to 61C, followed by execution of processing similar to those of FIGS. 61D to 62D, and FIGS. 23A to 24D to form an active matrix substrate 30 as shown in FIG. 25C.

When the dual-gate MOSTFTs are produced in the display section, the processes are executed in the same way as those shown in FIGS. 21A to 21D and FIGS. 61A to 61C.

More specifically, with reference to FIG. 26A, step differences 4 are formed in the substrate 1 through the insulating films 72 and 73, and then a single-crystal silicon layer 7 is deposited by graphoepitaxy on the step differences 4 as a seed. Next, a step which is the same as that shown in FIG. 4A is executed so that a $SiO_2$ film having a thickness of approximately 200 nm and then a SiN film having a thickness of approximately 100 nm are successively formed on the entire surface of the single-crystal silicon layer 7 by a plasma-enhanced CVD process or a catalytic CVD process, thereby to form an insulating film 80 corresponding to the insulating film 8. Then, a molybdenum-tantalum alloy film 81 having a thickness of 500 to 600 nm, corresponding to the sputtering film 9, is formed by sputtering.

With reference to FIG. 26B, processing which is the same as that shown in FIG. 4B is executed: namely, a photoresist pattern 10 is formed and is subjected to continuous etching to form a top-gate electrode 82 (corresponding to the gate electrode 12) composed of the molybdenum-tantalum alloy and a gate insulating film (corresponding to the gate insulating film 11), thereby exposing the single-crystal silicon layer 7.

With reference to FIG. 26C, the same processing as that shown in FIG. 4C is executed: namely, the top-gate section of the nMOSTFT is covered with a photoresist 13, and the exposed source and drain regions of the nMOSTFT for display are doped with phosphorus ions 14 by ion implantation to form an $N^-$-type LDD section 15.

With reference to FIG. 26D, the same processing as that shown in FIG. 5A is executed: namely, the gate section and the LDD section of the nMOSTFT are covered with a photoresist 16, and the exposed region is doped with phosphorus or arsenic ions 17 by ion implantation, thereby to form a source section 18 and a drain section 19 of nMOSTFT composed of an $N^+$-type layer.

With reference to FIG. 27A, the same processing as that shown in FIG. 5B is performed: namely, the gate section of the pMOSTFT is covered with a photoresist 20 and the exposed region is doped with boron ions 21 by ion implantation to form a source section and a drain section of the pMOSTFT composed of a P⁺-layer in the peripheral-driving-circuit section.

With reference to FIG. 27B, the same processing as that shown in FIG. 5C is executed: namely, a photoresist layer 24 is provided and the single-crystal silicon layer is selectively removed at portions other than the active and passive device sections by conventional photolithography and etching, thereby to island the active device section and the passive device section.

With reference to FIG. 27C, the same process as that shown in FIG. 6A is performed: namely, a SiO₂ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process. These films 53 and 54 correspond to the aforesaid protective film 25. Then, an activation treatment is effected on the single-crystal silicon layer 7.

With reference to FIG. 27D, the same processing as that shown in FIG. 6B is executed: namely, contact holes are formed for the source sections. An aluminum sputtering film having a thickness of 400 to 500 nm is formed on the entire surface, and then source electrodes 26, data lines and gate lines are simultaneously formed by conventional photolithography and etching.

With reference to FIG. 28A, the same processing as that shown in FIG. 6C is executed: namely, an insulating film 36 including a PSG film having a thickness of approximately 300 nm and a SiN film having a thickness of approximately 300 nm is formed on the entire surface, and contact holes are formed for the drain sections of the display TFTs.

With reference to FIG. 28B, a photosensitive resin film 28 having a thickness of 2 to 3 $\mu$m is formed on the entire surface by, for example, spin coating. With reference to FIG. 28C, Steps which are the same as those of FIGS. 7A and 7B are performed: namely, a lower portion of a reflective face comprising an uneven surface 28A is formed in at least the pixel section, contact holes are formed for the drain sections of the display TFTS, and an uneven aluminum reflective section 29 connecting to the drain sections 19 of the display TFTs are formed so that optimum reflective and viewing-angle characteristics are achieved.

The resulting active-matrix substrate 30 integrates a display section and a peripheral-driving-circuit section, in which the display section includes dual-gate nMOSLDD-TFTs and the peripheral-driving-circuit section includes a cMOS driving circuit having dual-gate nMOSTFTs and dual-gate pMOSTFTs, wherein these TFTs are formed by using the single-crystal silicon layer 7 deposited by high-temperature graphoepitaxy on the step differences 4 as seeds.

FIGS. 29A to 36B show a sixth embodiment of the second aspect of the present invention.

In this embodiment, the gate electrode at the top gate section is composed of a material having relatively low thermal resistance, such as aluminum, unlike the preceding embodiments.

For the purpose of forming top-gate MOSTFTs in the display section while forming dual-gate MOSTFTs in the peripheral-driving-circuit section, the same steps as those shown in FIGS. 1A to 3B are executed as in the first embodiment and, thereafter, an N-type well 7A is formed in the pMOSTFT sections of the peripheral-driving-circuit section, as shown in FIG. 29A.

With reference to FIG. 29B, all of the nMOSTFTs and pMOSTFTs in the peripheral-driving-circuit section and the gate sections of the nMOSTFTs in the display section are covered with a photoresist 13, and the exposed source and drain regions of the nMOSTFTs are doped with phosphorus ions 14 by ion implantation, for example, at 20 kV and at a dosage of 5×10¹³ atoms/cm² to form by self-alignment a LDD section 15 composed of an N⁻-type layer.

With reference to FIG. 30A, all of the pMOSTFTs in the peripheral-driving-circuit section, the gate sections of the nMOSTFTs in the peripheral-driving-circuit section, and the gate section and the LDD section of the nMOSTFTs in the display section are covered with a photoresist 16, and the exposed region is doped with phosphorus or arsenic ions 17, for example, at 20 kV and at a dosage of 5×10¹⁵ atoms/cm² by ion implantation, thereby to form a source section 18, drain section 19 and an LDD section 15 of nMOSTFT composed of an N⁺-type layer. Preferably, the resist 13 is left unremoved, as shown by the dotted line in the drawing, and the resist 16 is provided so as to cover the resist 13, so that, in the formation process of the resist 16, a mask is readily aligned with high accuracy by using the resist 13 as a reference, thus diminishing the risk of misalignment.

With reference to FIG. 30B, all of the nMOSTFTs in the peripheral-driving-circuit section and all of the nMOSTFTs and the gate sections of the pMOSTFTs in the display section are covered with a photoresist 20, and the exposed regions are doped with boron ions 21 by ion implantation at 10 kV and at a dose of 5×10¹⁵ atoms/cm² to form source sections 22 and drain sections 23 of the pMOSTFTs composed of a P⁺-type layer.

With reference to FIG. 30C, after the removal of the resist 20, the single-crystal silicon layers 7 and 7A are activated in the same way as that described before, followed by deposition of a gate insulating film 12 and a gate electrode material layer 11 which is of aluminum or aluminum alloy containing 1 percent by weight of Si. The gate electrode material layer 11 may be formed by a vacuum evaporation process or a sputtering process.

After a patterning of the respective gate sections, the active device section and the passive device section are isolated, in the same way as that described before and, as shown in FIG. 31A, a SiO₂ film having a thickness of approximately 200 nm and then a phosphosilicate glass (PSG) film having a thickness of approximately 300 nm are deposited on the entire surface, thereby to form a protective film 25.

With reference to FIG. 31B, contact holes are formed for the source and drain sections of all TFTs in the peripheral-driving-circuit section and the source sections of the display TFTS, by conventional photolithography and etching.

A film having a thickness of 500 to 600 nm is formed on the entire surface by sputtering, with aluminum or an aluminum alloy containing 1 weight percent of Si and, thereafter, the source electrodes 26 of all TFTs in the peripheral-driving-circuit section and the display section, drain electrodes 27 in the peripheral-driving-circuit section, data lines and gate lines are simultaneously formed by conventional photolithography and etching. The substrate is then subjected to sintering treatment in a forming gas (N₂+H₂) at approximately 400° C. for 1 hour.

Then, Steps which are the same as those shown in FIGS. 6C to 7C are executed, whereby an active-matrix substrate 30 is obtained integrating a display section and a peripheral-driving-circuit section by using the single-crystal silicon layer 7, in which the display section includes top-gate nMOSLDD-TFTs having gate electrodes of aluminum or aluminum alloy containing 1 weight percent of Si, while the peripheral-driving-circuit section has a CMOS driving circuit having dual-gate pMOSTFTS and dual-gate nMOST-FTs.

Since the aluminum or aluminum-alloy gate electrodes 11 are formed after the activation treatment of the single-crystal silicon layer 7, the gate electrode material is not subject to the heat during the activation treatment, so that inexpensive material having relatively low heat resistance, such as aluminum or 1 wt % Si aluminum alloy, can be used as the gate electrode, offering a wider selection of the electrode materials. This applies also to the case where the display section includes bottom-gate MOSTFTs.

For implementing a configuration in which dual-gate MOSTFTs are formed both in the display section and the peripheral-driving-circuit section, respectively, the processes shown in FIGS. 21A to 21D, and FIGS. 61A to 61C are performed, and then an N-type well 7A is formed at the pMOSTFT section in the peripheral-driving-circuit section, as shown in FIG. 32A.

With reference to FIG. 32B, the TFT s in the display section are doped with phosphorus ions 14 to form LDD sections 15, as in the step shown in FIG. 61D.

With reference to FIG. 33A, the same processing as that shown in FIG. 62A is executed: namely, the nMOSTFT sections in the display section and the peripheral-driving-circuit section are doped with phosphorus ions 17 to form $N^+$-type source regions 18 and drain regions 19.

With reference to FIG. 33B, the same process as that shown in FIG. 62B is executed: namely, the pMOSTFT section in the peripheral-driving-circuit section is doped with boron ions 21 to form a $P^+$-type source region 22 and a drain region 23.

With reference to FIG. 33C, after the removal of the resist 20, the single-crystal silicon layer 7 is patterned to island the active device section and the passive device section and, thereafter, as shown in FIG. 34A, the single-crystal silicon layers 7 and 7A are activated in the same way as that described before, followed by formation of a gate insulating film 80 in the display section and formation of a gate insulating film 12 in the peripheral-driving-circuit section, respectively.

With reference to FIG. 34B, an aluminum film sputtered on the entire surface is patterned to form upper-gate electrodes 83 in the display section and upper-gate electrodes 11 in the peripheral-driving-circuit section.

With reference to FIG. 34C, a $SiO_2$ film having a thickness of approximately 200 nm and then a PSG film having a thickness of approximately 300 nm are deposited to form a protective film 25.

Source electrodes 26 of all TFTs in the peripheral-driving-circuit section and the display section and drain electrodes 27 in the peripheral-driving-circuit section are formed by the same process as that described before, whereby an active-matrix substrate 30 is obtained integrating the display section and the peripheral-driving-circuit section using the single-crystal silicon layer 7, wherein the display section includes dual-gate nMOSLDD-TFTs having aluminum top gate electrodes, while the peripheral-driving-circuit section includes a cMOS driving circuit having dual-gate pMOST-FTs and dual-gate nMOSTFT.

Since the gate electrodes 11 and 83 are formed after the activation treatment of the single-crystal silicon layer 7 in this embodiment, the gate electrode material does not undergo the heat applied during the activation treatment, so that any inexpensive material having relatively low heat resistance, such as aluminum, may be used for the gate electrode, thus widening the selection of the electrode materials. The source electrodes 26 (and the drain electrodes also) may be simultaneously formed in Step shown in FIG. 34B, thus offering advantages in the production process.

When the bottom-gate or top-gate or dual-gate MOSTFTs are formed in any of above-described embodiments, the single-crystal silicon layer 7 deposited on the step difference 4 may have discontinuity or thinned portions, as schematically shown in FIG. 35A, leading to connection failure or increase in the resistance and, therefore, the source electrode 26 (or the drain electrode 27) is preferably provided in a region including the step difference 4 in order to ensure the connection to the single-crystal silicon layer 7, as shown in FIGS. 35B and 35C.

As an alternative to Step shown in FIG. 29B or Step shown in FIG. 32B, after the formation of the top-gate insulating film on the single-crystal silicon layer 7, ion implantation and activation treatment may be performed and then the top-gate electrodes and source and drain electrodes may be simultaneously formed.

Figure 36B:
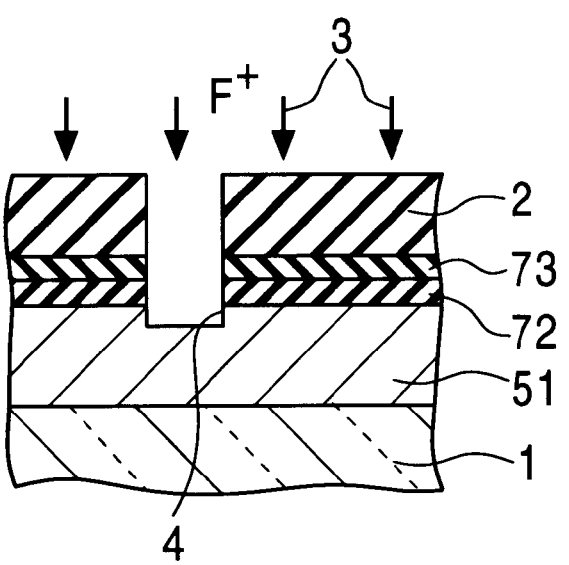

The step differences 4 are formed in the substrate 1 (and in the overlying SiN film) in the described embodiment as shown in FIG. 36A, this is only illustrative and the step differences 4 may be formed on a SiN film 51 on the substrate 1, as shown in FIG. 36B so that the SiN film 51 inhibits diffusion of ions from the glass substrate 1. The arrangement also may be such that the gate insulating films 72 and 73 are formed in place of the SiN film 51 or on the SiN film 51 and the step differences are formed in these gate insulating films.

FIGS. 37A to FIGS. 39 show a seventh embodiment of the second aspect of the present invention.

In this embodiment, TFTs are formed at the exterior of the step differences 4, that is, in regions other than the step differences 4. In these drawings, the single-crystal silicon layer 7 and the gate electrodes 11, source electrodes 26 and drain electrodes 27 are shown only schematically.

FIGS. 37A to 37E show top-gate MOSTFTS. Referring first to FIG. 37A, the indented section formed by the step difference 4 is located along and on one side of the source region, and the gate insulating film 12 and the gate electrodes 11 are formed on the areas of the single-crystal silicon layer 7 where there is no indented section. FIG. 37B shows an arrangement in which the indented section has an L-like shape, with one leg extending along the side of the source region and the other leg extending in the direction of length of the channel down to the end of the drain region. FIG. 37C shows an arrangement in which the indented section has a rectangular form with four sides surrounding the TFT active region. FIG. 37D shows an arrangement in which the indented section has three sides. In FIG. 37E, an indented section has an L-shape with two sides. In all these cases, adjacent indented sections 4 are discrete and isolated from each other.

Thus, the indented sections or step differences 4 may have any suitable shape, and the TFTs are formed on the areas other than these step differences 4, so that the TFTs can be fabricated without difficulty.

FIGS. 38A to 38C show bottom-gate MOSTFTs. Any type of step difference 4 shown in FIGS. 37A to 37E may be employed also in this type of MOSTFTs. In FIG. 38A corresponding to FIG. 37A, the bottom-gate MOSTFT is formed on the flat portion other than the step difference 4. Likewise, FIG. 38B corresponds to FIGS. 37B, and FIG. 38C corresponds to FIG. 37C or 37D.

FIG. 39 shows a dual-gate MOSTFT. Any type of step difference 4 shown in FIGS. 37A to 37E may also be employed in this type. For example, the dual-gate MOSTFT may be formed on the flat portion in the interior of the step difference 4 shown in FIG. 37C or 37D.

FIGS. 40A to 42C show an eighth embodiment of the second aspect of the present invention.

FIGS. 40A and 40B show a self-alignment type LDD-TFT, for example, a double-gate MOSTFT including a plurality of top-gate MOSLDD-TFTs.

A gate electrode 11 has two branches, that is, a first gate 11A and a second gate 11B, wherein the first gate 11A is used for a first LDD-TFT 51 and the second gate is used for a second LDD-TFT 52, and preferably An $N^+$-type region 100 is provided in the center of the single-crystal silicon layer between these gates in order to decrease resistance. Different voltages may be applied to these gates and, in the event that one gate has become inoperable due to any reason, the other gate will perform transfer of carriers between the source and the drain, thus offering high reliability of the device. The first LDD-TFT 51 and the second LDD-TFT 52 are connected in series and function as a thin-film transistor for driving a pixel, so that the voltage applied between the source and the drain of each thin-film transistor can be significantly reduced in the OFF mode of operation. Thus, the leakage current in the OFF mode can be reduced, resulting in improved contrast and image quality in the liquid crystal display. Since these two LDD transistors are connected to each other only through the semiconductor layer which is the same as the low-concentration drain region, the conductive distance between the transistors can be shortened, avoiding an increase in the transistor area despite the dual LDD transistor configuration. The first and second gates may be isolated from each other for independent operation.

FIG. 41A shows a double gate configuration of bottom-gate MOSTFTS, and FIG. 41B shows a double gate configuration of dual-gate MOSTFTS.

These double-gate MOSTFTs have the same advantages as those in the above-described top-gate type. Use of dual-gate structure offers a further advantage in that, if one gate section is not operable in the dual-gate type, the other gate section can be used.

FIGS. 42A to 42C are equivalent circuit diagrams of the respective types of the double-gate configuration. The gate may be branched or divided into three or more, although in the illustrated embodiment it is branched into two. In the double- or multi-gate configuration, the branched gate electrodes having the same potential, or gate electrodes isolated by the division and having the same potential or different potentials, may be provided in the channel region.

FIGS. 43A and 43B show a ninth embodiment of the second aspect of the present invention, wherein one of the upper and lower-gate sections of a dual-gate type nMOSTFT is used in a transistor operation, whereas the other operates as follows.

In an nMOSTFT shown in FIG. 43A, an appropriate negative voltage is constantly applied to the gate electrode at the top gate side to reduce the leakage current in the back channel. When the top gate electrode is opened, this is used as a bottom-gate type. In FIG. 43B, an appropriate negative voltage is constantly applied to the gate electrode at the bottom gate side to reduce the leakage current in the back channel. When the bottom gate electrode is opened, this is used as a top-gate type. In case of a pMOSTFT, leakage current in the back channel can be reduced by constantly applying an appropriate positive voltage to the gate electrode.

The interface between the single-crystal silicon layer 7 and the insulating film has low crystallinity and readily causes a leakage current, but the above-mentioned negative voltage applied to the gate electrode can effectively reduce the leakage current. This advantage is added to that offered by the LDD structure. Furthermore, the bottom gate electrode shades the light incident on the substrate 1, so that the leakage current caused by the incident light can be reduced.

FIG. 44 to FIG. 52 show a tenth embodiment of the second aspect of the present invention.

As described above, the top-gate, bottom-gate and dual gate TFTs have different structures, functions and characteristics. A variety of combinations of these TFTs may be employed in the display section and the peripheral-driving-circuit section to obtain various advantageous effects.

For example, as shown in FIG. 44, when any one of the top-gate MOSTFT, the bottom-gate MOSTFT and the dual-gate MOSTFT is used in the display section, at least the dual-gate type is used alone or in a combination with at least one of the other types, in the peripheral-driving-circuit section. In this case, there are 12 types of combination identified by Nos. 1 to 12. When a dual-gate structure is employed in the MOSTFT in the peripheral-driving-circuit section, this dual-gate structure functions as a top-gate type or a bottom-gate type by selecting the upper or lower gate, and the dual-gate type structure also is preferred when a local portion of the peripheral driving circuit requires TFTs having large driving power. For example, electrooptical devices using organic EL or FED will require such TFTs having large driving power.

A variety of combinations (Nos. 1 to 216) of channel conduction types are available for the MOSTFTs to be used in the peripheral-driving-circuit section and the display section, specifically: FIGS. 45 and 46 show combinations possible when the MOSTFTs in the display section do not have a LDD structure; FIGS. 47 and 48 show combinations possible when the MOSTFTs in the display section have a LDD structure; FIGS. 49 and 50 show combinations possible when the peripheral-driving-circuit section includes TFTs having a LDD structure; and FIGS. 51 and 52 show combinations possible when both the peripheral-driving-circuit section and the display section include TFTs having a LDD structure.

Thus, the details of the combinations shown in FIG. 44 are shown in FIGS. 45 to 52. These combinations are also available when the peripheral-driving-circuit section includes the top-gate MOSTFT and the other-type MOSTFT (s). These combinations shown in FIGS. 44 to 52 are applicable not only when the channel regions of the TFTs are formed of a single-crystal silicon but also when the channel region of the TFT is formed of polycrystalline silicon or amorphous silicon (only in the display section).

FIGS. 53A to FIG. 54 show a thirteenth embodiment of the second aspect of the present invention.

This embodiment is an active-matrix LCD which includes TFTs having high driving power and using the above-mentioned single-crystal silicon layer in the peripheral-driving-circuit section, in order to attain a greater driving power. This, however, is not exclusive and the TFTs may employ not only dual-gate MOSTFTs but also other gate types together with the dual-gate type, as well as a variety of channel conduction types, and may further include MOSTFTs using polycrystalline silicon layer. In contrast, the MOSTFTs of the display section are preferably use a single-crystal silicon layer, although they may use a polycrystalline or amorphous silicon layer or at least two out of the three types of silicon layers in combination. It is to be noted, however, when the display section is constituted by nMOSTFTs, a single-crystal or polycrystalline silicon layer is preferably used because such types of silicon layer enables a reduction in the areas of TFTs and is preferred to amorphous silicon also from the viewpoint of reduction in pixel defects, although a practically acceptable switching speed is still attainable also with the amorphous silicon layer. Polysilicon, in addition to single-crystal silicon, may be formed during graphoepitaxy, thereby forming a continuous grain silicon (CGS) structure which can be advantageously used for the formation of the active device and the passive device in some cases.

FIGS. 53A to 53C show possible combinations of various MOSTFTs. FIG. 54 shows the details of these combinations. The use of single-crystal silicon causes improved current driving ability. The use of single-crystal silicon causes improved current driving ability. The use of a single-crystal silicon serves to improve current driving power, thus offering advantages such as a reduction in the device size, an increase in the screen size, and an increase in the aperture ratio.

In the peripheral-driving-circuit section, an electric circuit integrating diodes, capacitors, resistors, and inductors, in addition to the MOSTFTs, can be consolidated on the insulating substrate such as a glass substrate.

FIG. 55 shows a twelfth embodiment of the second aspect of the present invention.

This embodiment implements a passive-matrix drive, in contrast to the preceding embodiments that are focused on active-matrix drive configurations.

In this embodiment, therefore, the display section does not have switching devices such as MOSTFTs, and modulation of the incident or reflected light in the display section is performed only by the variation in the voltage applied between a pair of electrodes formed on two opposing substrates. Examples of such modulation devices include reflective or transmissive LCDs, organic or inorganic EL devices (electroluminescent devices), FEDs (field emission display devices), LEPDs (light-emitting polymer display devices), and LEDs (light-emitting diodes).

FIGS. 56A and 56B show a thirteenth embodiment of the second aspect of the present invention.

This embodiment is directed to an electrooptical device other than an LCD, such as an organic or inorganic EL device (electroluminescent device), FED (field emission display device), LEPD (light-emitting polymer display device), and LED (light-emitting diode).

FIG. 56A shows an active-matrix EL device, comprising a substrate 1, an organic EL layer 90 composed of, for example, an amorphous organic compound or, alternatively, an inorganic EL layer such as of ZnS:Mn, formed on the substrate 1, a transparent ITO electrode 41 provided below the EL layer 90, and a cathode 91 is formed on the EL layer 90, whereby colored light is emitted through a color filter 61 in response to a voltage applied to these electrodes 41 and 91.

In order to apply a data voltage to the transparent electrode 41 by active-matrix drive, the substrate 1 is provided with a single-crystal silicon MOSTFT, i.e., nMOSLDD-TFT, formed thereon by using a single-crystal silicon layer deposited by graphoepitaxy on a step difference 4 serving as a seed on the substrate 1. Similar TFTs are also formed in a peripheral driving circuit. Since this EL device is driven by MOSLDD-TFTs using the single-crystal silicon layer, the EL device has a high switching rate and a reduced leakage current. The color filter 61 may be omitted if the EL layer 90 emits a specified color.

Since the EL device requires a high driving voltage, the peripheral driving circuit preferably has driver devices having high dielectric strength, such as high-dielectric-strength cMOSTFTs and bipolar devices, in addition to the MOST-FTs.

FIG. 56B shows a passive-matrix FED in which, when a voltage is applied between electrodes 92 and 93, electrons are emitted from a cold cathode 94 in a vacuum section 98 between two opposing glass substrates 1 and 32, and are incident on a fluorescent layer 96 under selection by a gate line 95, whereby light having a predetermined color is emitted.

The emitter line 92 is connected to a peripheral driving circuit and is driven by a data voltage, the peripheral driving circuit including MOSTFTs using a single-crystal silicon layer based on the present invention and contributing to high-speed driving of the emitter line 92. In FIG. 55B, numeral 99 represents a resistance film. In this FED, the above-mentioned MOSTFT may be connected to each pixel electrode so that the FED is driven by an active-matrix matrix system.

When a conventional light-emitting polymer is used instead of the EL layer 90 in the EL device shown in FIG. 56A, this device functions as a passive-matrix or an active-matrix light-emitting polymer device (LEPD). In the FED shown in FIG. 56B, a diamond thin-film may be used as the cathode to implement a device similar to FED. In a light emitting diode, a light emitting section composed of a gallium-based film, such as gallium-aluminum-arsenic, may be driven by MOSTFTs of single-crystal silicon epitaxially grown in accordance with the present invention.

The above-described embodiments of the present invention may have the following modifications without departing from the spirit of the present invention.

When the melt 6 of the low-melting-point metal is applied, the polycrystalline silicon or amorphous silicon film 5 may be doped with a Group III or V element having high solubility, e.g., boron, phosphorus, antimony, arsenic, aluminum, gallium, indium, or bismuth, in an adequate amount to control the channel conductive type (P or N) of and the carrier content in the epitaxial silicon layer 7.

In order to avoid diffusion of ions from the glass substrate, a SiN film having a thickness of, for example, 50 to 200 nm and a $SiO_2$ film having a thickness of 100 nm, if necessary, may be formed on the substrate surface, and the above-described step differences 4 may be formed in these films. The step differences may be formed by ion milling instead of the above-mentioned RIE process.

A description will now be given of first to fifteenth embodiments of a third aspect of the present invention which employs a low-melting-point metal layer and which has the step of forming a bottom-gate first thin-film transistor.

The first embodiment of the third aspect of the present invention will be described with reference to FIGS. 1A to 3C, FIGS. 63A to 66C, and FIGS. 8 to 14.

The first embodiment relates to an active-matrix reflective liquid crystal display (LCD) having a peripheral driving circuit incorporating bottom-gate MOSTFTs formed by a single-crystal silicon layer which are formed by graphoepitaxy of indium-silicon at high temperature using as a seed an indented section defined by a step difference provided on a substrate as a seed. FIGS. 12 to 14 show an overall layout of the reflective LCD.

The structural and operational features of this active-matrix reflective LCD is basically the same as those of the first embodiment of the first aspect described before with reference to FIG. 12 and other Figures, except for the use of bottom-gate MOSTFTs in place of the dual-gate MOSTFTS used in the first aspect of the invention. The description therefore will be mainly focused on the features peculiar to this embodiment, and the features common to the first aspect are not fully described.

With reference to FIGS. 1A to 3C, FIGS. 63A to 66C, and FIG. 8 to FIG. 10, the active-matrix reflective LCD in this embodiment will be described in accordance with the production steps. In FIGS. 1A to 3C and FIGS. 63A to 66C, the left side of each drawing shows the production steps for the display section and the right side shows the production steps for the peripheral-driving-circuit section.

The production process begins with the step shown in FIG. 1A in which a film 71 of about 500 to 600 nm thick is formed from a molybdenum/tantalum (Mo—Ta) alloy by sputtering on a major surface of an insulating substrate 1 made of, for example, a quartz glass or a transparent crystalline glass. The process then proceeds to the step shown in FIG. 3C in which an N-type well 7A is formed, via the same steps as those described before with reference to FIGS. 1B to 3B.

Figure 63A:
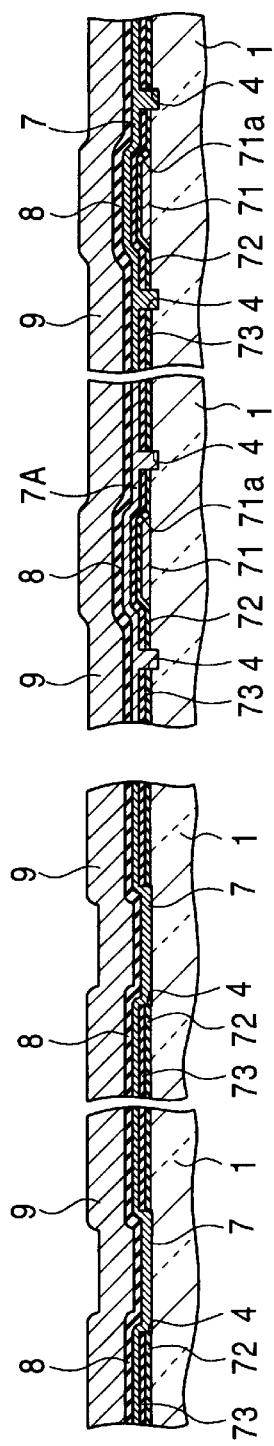
FIGS. 63A to 63C are sectional views showing steps of a process for producing an LCD in accordance with a first embodiment of a third aspect of the present invention.

With reference to FIG. 63A, a $SiO_2$ film having a thickness of approximately 200 nm and then a SiN film having a thickness of approximately 100 nm are continuously deposited on the entire single-crystal silicon layer 7 by a plasma-enhanced CVD process, a high-density plasma-enhanced CVD process or a catalytic CVD process to form a gate insulating film 8, followed by a sputtering to deposit a molybdenum-tantalum (Mo—Ta) alloy film 9 of 500 to 600 nm thereon.

Figure 63B:
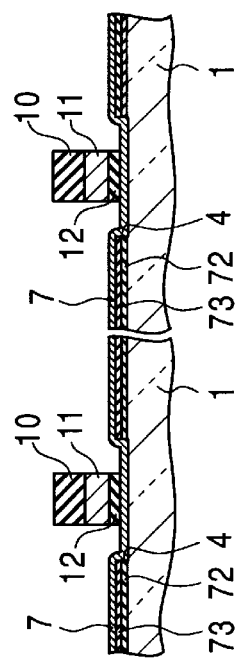

With reference to FIG. 63B, photoresist patterns 10 are formed in the step difference regions (indented sections) of the TFT sections in the display region of the TFT sections of the peripheral driving region by any conventional photolithographic process, and a continuous etching is executed, whereby gate electrodes 11 of the Mo—Ta alloy film and gate insulating films 12 of $SiN$—$SiO_2$ are formed and the single-crystal silicon layer 7 is exposed. The Mo—Ta alloy film 9 is etched using an acidic etchant, SiN is etched by plasma etching using $CF_4$ gas, and $SiO_2$ is etched using a hydrofluoric acidic etchant.

Figure 63C:
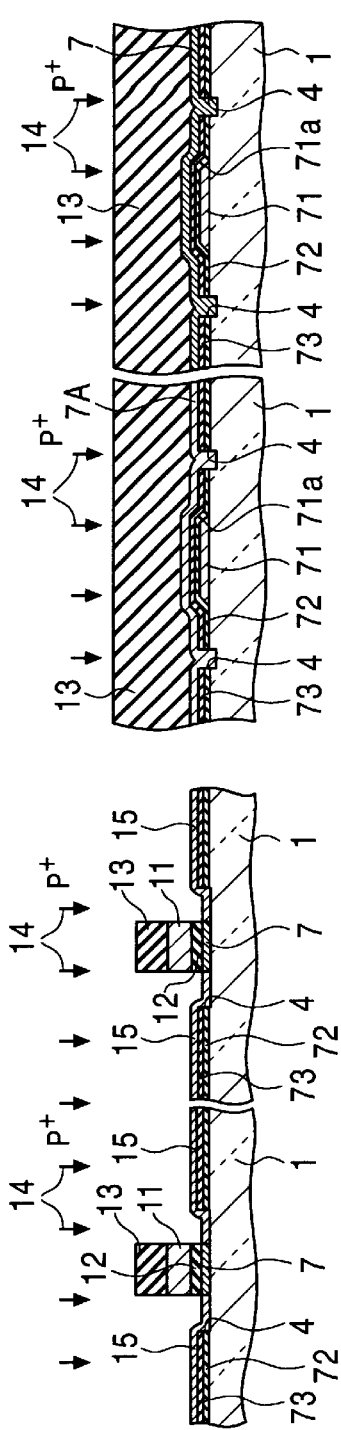

With reference to FIG. 63C, all of the nMOSTFTs and pMOSTFTs in the peripheral driving region, as well as the gate sections of the nMOSTFTs in the display region, are covered with a photoresist 13, and the exposed source and drain regions of the nMOSTFTs are doped with, for example, phosphorus ions 14 by ion implantation at 20 kV and at a dosage of $5\times10^{13}$ atoms/cm$^2$ to form LDD sections 15 of an N$^-$-type layer by self-alignment.

Figure 64A:
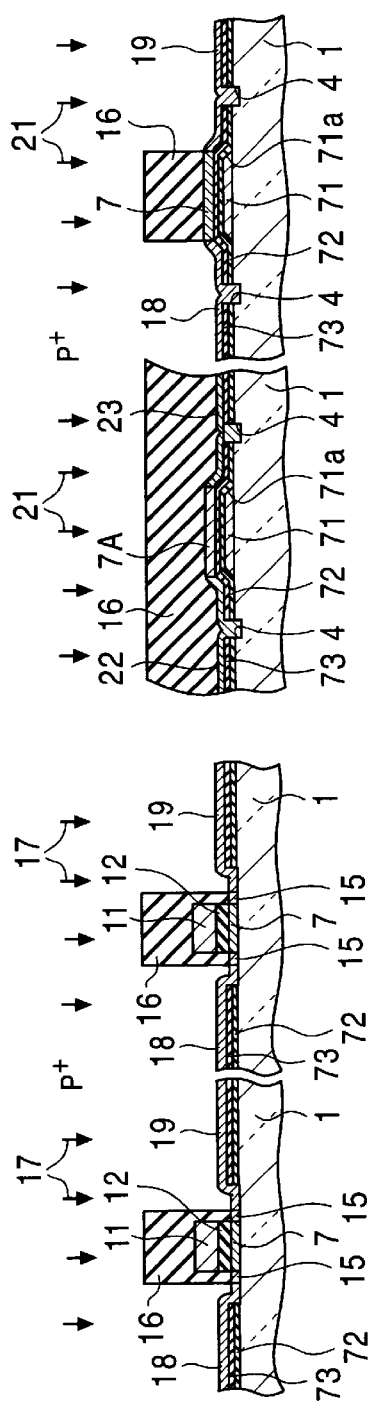
FIGS. 64A to 64C are sectional views showing subsequent steps of the process for producing LCD in accordance with the first embodiment of the third aspect of the present invention.

With reference to FIG. 64A, all of the pMOSTFTs in the peripheral driving region, the gate sections of the nMOSTFTs in the peripheral driving region, and the gate sections and the LDD sections of the nMOSTFTs in the display region are covered with a photoresist 16, and the exposed regions are doped with phosphorus or arsenic ions 17 by ion implantation at 20 kV and at a dosage of $5\times10^{15}$ atoms/cm$^2$ to form source sections 18, drain sections 19 and the LDD sections 15 of an N$^+$-type layer of the nMOSTFTs.

Figure 64B:
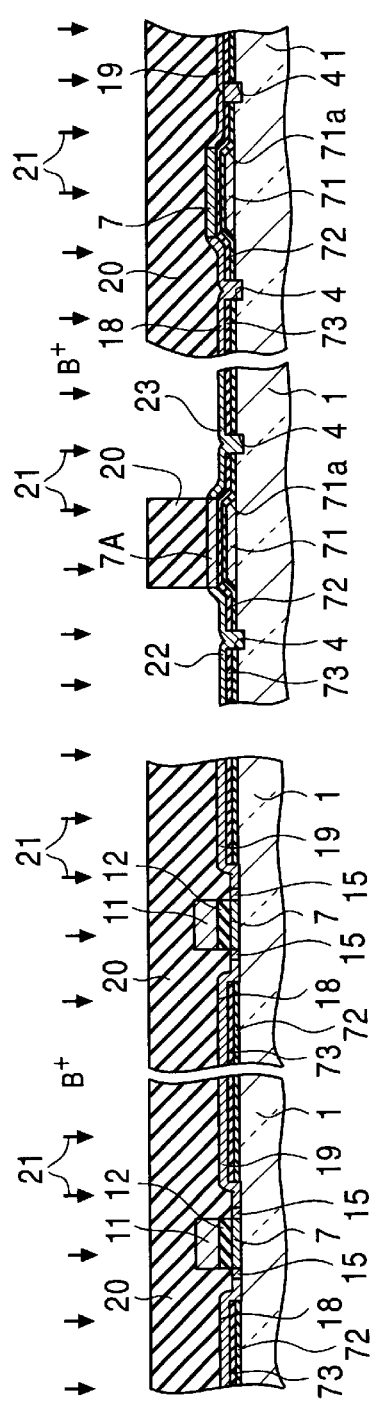

With reference to FIG. 64B, all of the nMOSTFTs in the peripheral driving region and the display region and the gate sections of the pMOSTFTs in the peripheral driving region are covered with a photoresist 20, and the exposed regions are doped with boron ions 21 by ion implantation at 10 kV and at a dosage of $5\times10^{15}$ atoms/cm$^2$ to form source sections 22 and drain sections 23 of an P$^+$-type layer of the pMOSTFTs. In the case of an nMOS peripheral driving circuit, this step is not necessary since the circuit does not have a pMOSTFT.

Figure 64C:
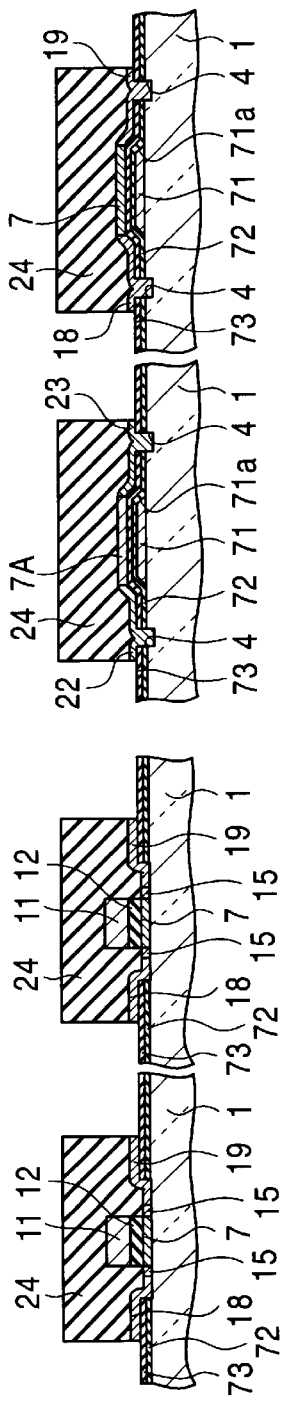

With reference to FIG. 64C, in order to island the active device sections including TFTs and diodes and the passive device sections including resistors and inductors, photoresist layers 24 are provided on all of the active device sections and the passive device sections in the peripheral driving region and the display section, and the single-crystal silicon layer 7 in other sections is removed by a conventional photolithographic process or an etching process using a hydrofluoric acid solution.

Figure 65A:
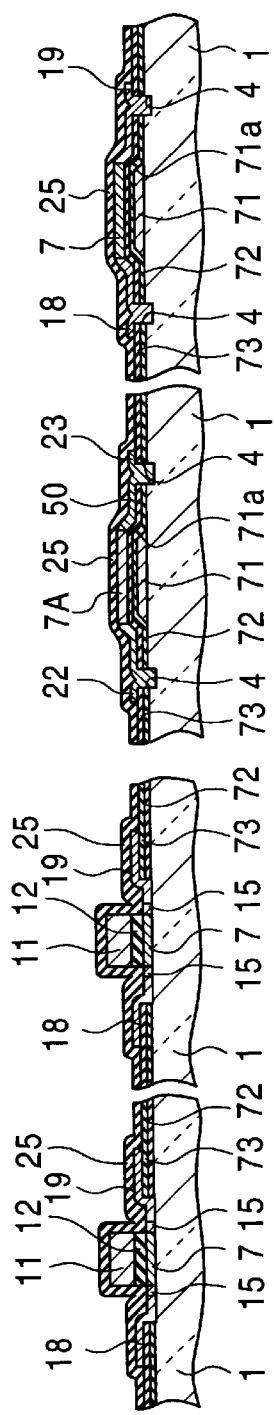
FIGS. 65A to 65C are sectional views showing subsequent steps of the process for producing LCD in accordance with the first embodiment of the third aspect of the present invention.

With reference to FIG. 65A, a $SiO_2$ film having a thickness of approximately 200 nm and then a phosphosilicate glass (PSG) film having a thickness of approximately 300 nm are continuously deposited to form a protective film 25 on the entire surface by a plasma-enhanced CVD process, a high-density plasma-enhanced CVD process or a catalytic CVD process.

In such a state, the single-crystal silicon layer is activated. Activation treatment is performed at approximately 1,000° C. for approximately 10 seconds using, for example, a halogen lamp, and the gate electrode composed of the Mo—Ta alloy having a high melting point is durable during the annealing for activation. The Mo—Ta alloy can be used not only for the gate section but also as lead lines over a wide range. In the activation, excimer laser annealing requiring high process costs is generally not used. If excimer laser annealing is used, overlapping scanning of 90% or more is preferably performed on the entire surface or selectively the active device section and the passive device section using XeCl (wavelength: 308 nm).

Figure 65B:
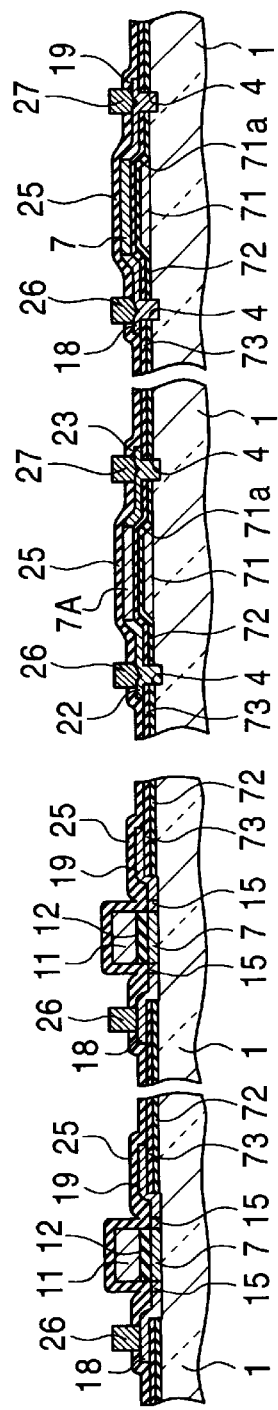

With reference to FIG. 65B, contact holes are formed for all of the source-drain sections of the TFTs in the peripheral driving circuit and the source sections of the TFTs in the display region, by a conventional photolithographic process and an etching process.

A film having a thickness of 500 to 600 nm is formed on the entire surface, from aluminum or an aluminum alloy, e.g., an aluminum alloy containing 1 wt % Si or 1 to 2 wt % copper and, by a conventional photolithographic process and an etching process, source electrodes 26 of all TFTs both in the peripheral driving circuit section and the display section, as well as the drain electrodes 27 in the peripheral driving circuit section, are formed, simultaneously with the formation of data lines and gate lines. The substrate is then subjected to sintering treatment in a forming gas ($N_2+H_2$) at approximately 400° C. for 1 hour.

Figure 65C:
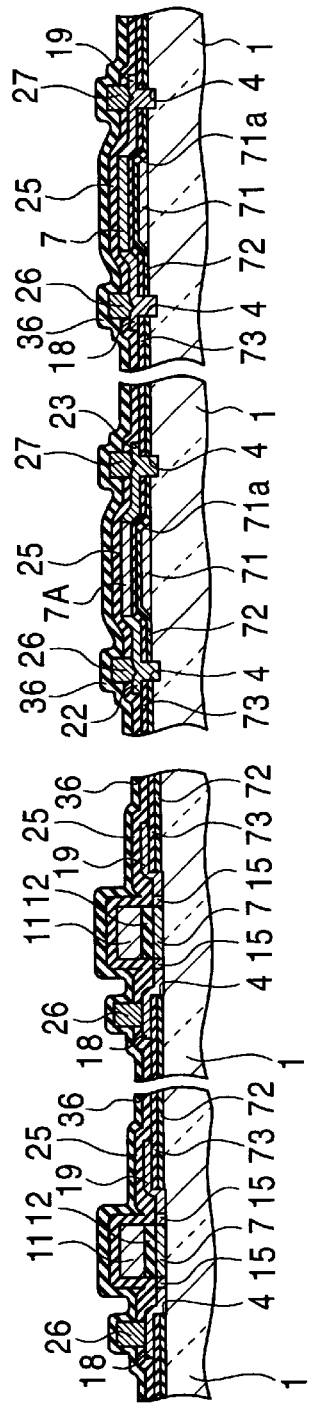

With reference to FIG. 65C, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed for the drain sections of TFTS in the display region. It is not necessary to remove the $SiO_2$, PSG and SiN films in the pixel sections.

Basic requirements of a reflective liquid crystal display are to reflect the light incident on the display towards the interior of the liquid crystal panel and, at the same time, to scatter the light. This is because the direction of the incident light is uncertain whereas the position of the observer with respect to the display is substantially fixed. Thus, the reflector must be designed on an assumption that point light sources are present at arbitrary positions. As shown in FIG. 66A, a photosensitive resin film 28 having a thickness of 2 to 3 $\mu$m is formed on the entire surface by spin coating and, as shown in FIG. 66B, an uneven pattern is formed in at least the pixel region by a conventional photolithographic process and an etching process so that the pixel section has optimized reflective characteristics and viewing-angle characteristics, followed by a reflow to form a lower portion of the reflective face of an uneven surface 28A. At the same time, contact holes are formed in the resin for allowing contact of the drain sections of the display TFTs.

With reference to 66C, a sputtering film having a thickness of 400 to 500 nm is deposited from aluminum or an aluminum alloy, e.g., an alloy containing 1 wt % Si, on the entire surface, and the sputtering film at the region other than the pixel sections is removed by a general photolithographic process and an etching process, thereby to form an uneven aluminum reflective sections 29 which are connected to the drain sections 19. The reflective sections 29 are used as pixel electrodes for displaying. Next, these are subjected to sintering at approximately 300° C. for 1 hour in a forming gas to enhance the contact. Silver or a silver alloy may be used instead of aluminum to increase the reflectance.

As described above, a single-crystal silicon layer 7 is formed by high-temperature graphoepitaxy using the step differences as the seeds, and an active-matrix substrate 30 integrating a display section and a peripheral-driving-circuit section is produced by forming, both in the display section and in the peripheral-driving circuit section which employ the single-crystal silicon layer 7, top-gate nMOSLDD-TFTs and CMOS circuits which are composed of bottom-gate pMOSTFTs and bottom-gate nMOSTFTs.

With reference to FIG. 8, a method of producing a reflective liquid crystal display using the active-matrix substrate (driving substrate) 30 will now be described. Hereinafter, the active-matrix substrate is referred to as a TFT substrate.

When a liquid crystal cell in this LCD is produced by double-side assembly (suitable for medium to large liquid crystal panels of 2 inches or greater), polyimide alignment films 33 and 34 are formed one surface of the TFT substrate 30 and on a device-mounting surface of a counter electrode 32 having a solid indium tin oxide (ITO) electrode, respectively. The polyimide alignment films are formed by roll coating or spin coating so that thicknesses are in a range of 50 to 100 nm and are cured at 180° C. for 2 hours.

Subsequent steps of the process, such as alignment by, for example, rubbing, washing, spacing the substrate 1 and the counter substrate, filling the liquid crystal, and so forth are basically the same as those of the first embodiment of the first aspect of the present invention as described before. Advantages brought about by this embodiment are the same as those of the first embodiment of the first aspect except for the advantages peculiar to the use of the dual-gate structure of the first aspect, and are not described to avoid redundancy.

FIGS. 15A to 15C show a second embodiment of the third aspect of the present invention.

This embodiment also is an active-matrix reflective LCD as is the case of the first embodiment, but is different from the first embodiment in that, after the processing shown in FIG. 2A, for example, an indium film 6 having a thickness of 10 to 20 μm is formed on the entire surface including the step differences 4 by a sputtering process or a vacuum evaporation process, as shown in FIG. 15A. Although an indium-gallium film or a gallium film can be used in place of the indium film 6, the following description proceeds assuming the use of the indium film 6 by way of example.

With reference to FIG. 15B, an amorphous silicon film 5 having a thickness of several μm to 0.005 μm (for example, 0.1 μm) is formed on the indium film 6 by a known plasma-enhanced CVD process.

Since the temperature for forming the single-crystal silicon film must not significantly exceed the melting point of the low-melting-point metal 6 (156° C. for indium or 29.77° C. for gallium), it is difficult to form a polycrystalline silicon film which is optimally formed at 600° C. to 650° C. Therefore, the amorphous silicon film 5 is formed on the indium film 6 by a plasma-enhanced CVD process.

The substrate 1 is maintained in a hydrogen atmosphere at 1,000° C. or less (particularly 900 to 930° C.) for approximately 5 minutes so that the amorphous silicon film 5 is dissolved in the indium melt.

With reference to FIG. 15C, the substrate 1 is gradually cooled so that the silicon dissolved in the indium melt is deposited by graphoepitaxy on the substrate 1 using the step differences 4 as the seeds, whereby a single-crystal silicon layer 7 having a thickness of, for example, approximately 0.1 μm is formed.

Thus, the features of the second embodiment are the same as those of the first embodiment, except for the process step shown in Figs. FIGS. 15A to 15C, and advantages are also the same as those of the second embodiment of the first aspect.

FIGS. 16A and 16B show a third embodiment of the third aspect of the present invention.

This embodiment also is an active-matrix reflective LCD as is the case of the first embodiment, but is different from the first embodiment in that, after the processing shown in FIG. 2A, an indium film 6A having a thickness of 10 to 20 μm and containing a given amount (for example approximately 1 percent by weight) of silicon is formed on the entire surface including the step differences 4 by a sputtering process or a vacuum evaporation process, as shown in FIG. 16A.

The substrate 1 is maintained in a hydrogen atmosphere at 1,000° C. or less (particularly 900 to 930° C.) for approximately 5 minutes, so that the silicon is dissolved in the indium melt.

The substrate 1 is gradually cooled so that the silicon dissolved in the indium melt is deposited by graphoepitaxy on the substrate 1 using the step differences 4 as a seed, whereby a single-crystal silicon layer 7 having a thickness of approximately 0.1 μm is formed, as shown in FIG. 16B.

The (100) plane of the single-crystal silicon layer 7 is deposited on the substrate by epitaxy as described before, and the orientation of the crystal layer can be controlled by changing the shape of the step differences as shown in FIGS. 9A to 9F.

After the deposition of the single-crystal silicon layer 7 by graphoepitaxy, indium at the surface is removed by hydrochloric acid as in the first embodiment, and each TFT in the display section and the peripheral-driving-circuit section is produced after effecting a predetermined treatment on the single-crystal silicon layer 7.

In this embodiment, heat-melting and cooling treatments are performed after forming the amorphous silicon layer 5 on the low-melt-point metal layer 6 which is formed to cover the step differences 4, but the graphoepitaxial growth of the single-crystal silicon from the melt of the low-melt-point metal takes place as in the case of the preceding embodiment.

A fourth embodiment of the third aspect will now be described with reference to FIGS. 17A to 19D.

This embodiment has, as in the case of the first embodiment, top-gate MOSTFTs in the display section and bottom-gate MOSTFTs in the peripheral driving circuit section, but pertains to a transmissive LCD, unlike the first embodiment. More specifically, in this embodiment, the transmissive LCD is produced by following the procedure as Steps shown in FIGS. 1A to 3C and FIGS. 63A to 65C as in the first embodiment, but in the subsequent process, contact holes 19 for the drain sections of TFTs in the display section are formed in insulating films 25 and 36, as shown in FIG. 17A, and the unnecessary SiO$_2$ film, PSG film and Si film in the pixel-opening section are removed to improve the transmittance.

With reference to FIG. 17B, a planarization film 28B, which is composed of an acrylic photosensitive transparent resin and has a thickness of 2 to 3 μm, is formed on the entire surface by spin coating etc., and then contact holes for drains of TFTs in the displaying section (display TFTs) are formed in the transparent resin 28B, followed by curing of the transparent resin 28B executed under a given condition.

With reference to FIG. 17C, an ITO film having a thickness of 130 to 150 nm is formed on the entire surface by sputtering, and then an ITO transparent electrodes 41 in contact with the drain section 19 in the display region are formed by photolithography and etching. Next, a heat-treatment in a forming gas at 200 to 250° C. for 1 hour is performed to reduce the contact resistance between the drain of each TFT in the display section and the ITO and to improve the transparency of the ITO.

Then, a transmissive LCD is assembled combining this TFT substrate 1 with a counter substrate 32 as in the first embodiment, as shown in FIG. 18. In this embodiment, however, a polarizer is provided also on the TFT substrate. Although transmission light runs in this transmissive LCD as shown by a solid line in the drawing, the arrangement may be such that transmission light is available from the counter substrate 32.

An on-chip color-filter (OCCF) structure and an on-chip black (OCB) structure can be made from this transmissive LCD, as follows.

Thus, after performing Steps shown in FIGS. 1A to 3C and FIGS. 63A to 65B which are executed as described before, contact holes are also formed at the drain sections of the PSG-SiO$_2$ insulating film 25 as shown in FIG. 19A, and an aluminum embedded layer 41A for a drain electrode is formed, followed by deposition of the SiN-PSG insulating film 36.

With reference to FIG. 19B, a photoresist 61 containing a red, green or blue pigment having a thickness of 1 to 1.5 μm is formed on the corresponding color segments and, as shown in FIG. 19C, color filter layers 61(R), 61(G) and 61(B) are formed by a general photolithographic process in such a pattern as to leave the colors only at predetermined locations corresponding to the pixels. (OCCF structure). Contact holes are also formed at the drain sections. This embodiment excludes the use of opaque ceramics substrates and substrates made of low-transmissivity glass or heat-resistant resin.

With reference to FIG. 19C, a metal shading layer 43 servable as a black mask layer is formed over the contact holes communicating with the drains of the display TFTs and over the color filter layer, by a patterning process using a metal. For example, a molybdenum film having a thickness of 200 to 250 nm is formed by a sputtering process and is then patterned to form a given shape for shading the display TFTs (OCB structure).

With reference to FIG. 19D, a planarization film 28B composed of a transparent resin is formed, and then ITO transparent electrodes 41 are formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

A fifth embodiment of the third aspect of the present invention will now be described.

This embodiment relates to an active-matrix reflective liquid crystal display (LCD) including top-gate MOSTFTs formed of a single-crystal silicon layer which is deposited by low-temperature graphoepitaxy from an indium-gallium-silicon or gallium-silicon melt, using as seeds step differences (indents) on a glass substrate having a low distortion point.

In contrast to the first embodiment, the substrate 1 used in this embodiment is a glass substrate having a low distortion point or maximum usable temperature as low as 600° C. or so, such as borosilicate glass or aluminosilicate glass, as the substrate employed in Step shown in FIG. 1A. Such a glass is inexpensive and can easily be produced in large sizes, e.g., 500 mm×600 mm×0.1 to 1.1 mm can be formed using long rolled glass. Obviously, quartz and crystallized glass may be used as well.

After forming the step differences 4 as in the preceding embodiments and subsequent deposition of the polycrystalline silicon layer 5, an indium-gallium (or gallium) film is formed in Step shown in FIG. 2C on the polycrystalline silicon film 5 by a MOCVD, sputtering or vacuum evaporation process using trimethyl indium gallium or trimethyl gallium so that the thickness thereof becomes several ten to several hundred times the thickness of the polycrystalline silicon film 5, for example, the thickness becomes 10 to 20 μm.

The substrate 1 is maintained in a hydrogen atmosphere at 300 to 600° C. (or 420 to 600° C.) for 5 minutes. As a result, the polycrystalline silicon 6 (or amorphous silicon) is dissolved into the indium-gallium or gallium melt. Silicon in this melt can be precipitated at a temperature which is significantly lower than the original precipitation temperature.

When the substrate 1 is gradually cooled, as shown in FIG. 3A, silicon dissolved in indium-gallium (or indium) is deposited by graphoepitaxy on the bottom corners of the step differences 4 serving as seeds to form a single-crystal silicon layer 7 having a thickness of, for example, 0.1 μm.

In this case also, the (100) plane of the single-crystal silicon layer 7 is deposited on the substrate by epitaxy and the orientation of the crystal layer can be controlled by changing the shape of the step differences 4, as shown in FIGS. 9A to 9F.

After the deposition of the single-crystal silicon layer 7 by graphoepitaxy on the substrate 1, indium and gallium at the surface are removed by hydrochloric acid or sulfuric acid, as shown in FIG. 2C.

Using the single-crystal silicon layer 7, top-gate MOSTFTs are formed in the display section and bottom-gate MOSTFTs are formed in the peripheral-driving-circuit section, as in the first embodiment. The structure shown in FIG. 8 may also be employed in this embodiment.

This embodiment offers advantages which are the same as those of the fifth embodiment of the first aspect of the present invention.

A sixth embodiment of the third aspect of the present invention will now be described.

In contrast to the preceding fifth embodiment, this embodiment relates to a transmissive LCD in which a single-crystal silicon layer is formed by low-temperature graphoepitaxy using an indium-gallium film, as in the fourth embodiment.

Using the single-crystal silicon layer, the transmissive LCD is produced by the process shown in FIGS. 17A to FIG.

19D, as in the fourth embodiment. Opaque ceramic substrates and opaque or translucent organic substrates are not suitable for the transmissive LCD. Opaque ceramic substrates and opaque or translucent organic substrates are not suitable for the transmissive LCD.

Accordingly, this embodiment has the advantages of both the fourth and fifth embodiments. Thus, this embodiment offers the following advantages in addition to those produced by the first embodiment: borosilicate glass and heat-resistant organic materials which are inexpensive and facilitate the formation of long thin rolled substrates can be used as the substrate 1; the conductive type and Vth of the single-crystal silicon layer can be readily adjusted by the ratio of indium to gallium; and the color filter 42 and the black mask 43 provided on the display array section improve the aperture ratio of the liquid crystal display panel and decreases electrical power consumption of the display module including a back light.

FIGS. 67A to 67C and FIGS. 21A to 28C show a seventh embodiment of the third aspect of the present invention.

In this embodiment, the peripheral-driving-circuit section includes a CMOS driving circuit including bottom-gate-type pMOSTFTs and nMOSTFTs as in the first embodiment. The display section is of a reflective type and includes TFTs having various gate configurations arranged in a variety o combinations.

The display section shown in FIG. 67A includes top-gate nMOSLDD-TFTs as in the first embodiment, while the display section shown in FIG. 67B includes bottom-gate nMOSLDD-TFTs, whereas the display section shown in FIG. 67C includes dual-gate nMOSLDD-TFTs. These bottom-gate and dual-gate MOSTFTs can be produced by the same process for the bottom-gate MOSTFTs of the peripheral-driving-circuit section, as will be described later, the dual-gate MOSTFT having higher driving ability and being suitable for high-speed switching by virtue of the presence of upper and lower gates and, furthermore, the upper or lower gate may be selectively used to implement a top- or bottom-gate type during operation.

In the bottom-gate MOSTFT shown in FIG. 67B, a gate electrode 71 is composed of, for example, molybdenum-tantalum, and a gate insulting film is composed of a SiN film 72 and a SiO$_2$ film 73. A channel region and so forth using the single-crystal silicon layer are formed on the gate insulating film as in the case of the bottom-gate MOSTFT of the peripheral-driving-circuit section. The dual-gate MOSTFT shown in FIG. 67C has the lower-gate section substantially the same as that in the bottom-gate MOSTFT, whereas the upper-gate section includes an upper-gate electrode 83 formed on a gate insulating film 82 composed of a SiO$_2$ film and a SiN film. In all the cases, each gate section is formed in the exterior of the step difference 4 which serves as a seed for graphoepitaxy.

A method of producing the above-mentioned bottom-gate MOSTFT will be described with reference to FIGS. 21A to 25C, and a method of producing the dual-gate MOSTFT will be described with reference to FIGS. 26A to 28C. The method of producing the dual-gate MOSTFT in the peripheral-driving-circuit section is the same as that described before with reference to FIGS. 1A to 3C and FIGS. 63A to 65C and is therefore not illustrated.

With reference to FIG. 21A, in the production of the bottom-gate MOSTFT in the display section, a molybdenum-tantalum alloy film 71 having a thickness of 500 to 600 nm is formed on a substrate 1 by sputtering.

With reference to FIG. 21B, a photoresist 70 having a given pattern is formed by a processing which is the same as that described with reference to FIG. 1B, and the molybdenum-tantalum alloy film 71 is subjected to taper etching using the photoresist 70 as a mask to form a gate electrode 71 having a trapezoidal side base 71a with an angle of 20 to 45 degrees.

With reference to FIG. 21C, the processing which is the same as that shown in FIG. 1C is conducted in which, after the photoresist 70 is removed, a SiN film 72 having a thickness of approximately 100 nm and then a SiO$_2$ film 73 having a thickness of approximately 200 nm are deposited on the substrate 1 including the molybdenum-tantalum alloy film 71, by a plasma-enhanced CVD process, thereby to form a gate insulating film.

With reference to FIG. 21D, the same process as that described before in connection with FIG. 2A is executed in which a photoresist 2 having a given pattern is formed in at least the TFT-forming region, and a plurality of step differences 4 having a proper shape and size are formed in the gate insulating film and further in the substrate 1 through a mask constituted by the photoresist 2, as described above. The step differences 4 function as seeds during graphoepitaxy of the single-crystal silicon layer as will be described later, and have a depth d of 0.3 to 0.4 μm, a width of 2 to 3 μm, a length of 10 to 20 μm perpendicular to the drawing sheet, and an basilar angle (between the bottom and the side wall) which is a right angle.

Then, after removal of the photoresist 2, the same processing as FIG. 2B is conducted to form a polysilicon film 5, as in FIG. 22A.

The same processing as that shown in FIG. 2C is conducted so as to deposit a film 6 of indium, or of indium-gallium, as shown in FIG. 22B.

Then, the same process as FIG. 3A is executed to cause graphoepitaxial growth of a single-crystal silicon, whereby a single-crystal silicon layer of a thickness of, for example, 0.1 μm or so is deposited. In this process, the side faces 71a of the underlying gate electrode 71 are gently tapered, so that these side faces do not cause impediment to the epitaxial growth on the seeds constituted by the step differences, whereby the single-crystal silicon layer 7 can grow on these side faces without discontinuity.

Then, the film 6A of indium is removed as shown in FIG. 22D and, after execution of Steps shown in FIGS. 3C, 63A and 63B, the processing which is the same as that of FIG. 63C is executed in which the gate section of the nMOSTFTs in the display section are covered by the photoresist 13, and source and drain regions of the nMOSTFTs left exposed are doped by ion implantation with phosphor ions 14, whereby an LDD section 15 composed of an N-type layer is formed by self-alignment. In this process, the bottom-gate electrode 71 permits easy recognition of the height differences or pattern, thus facilitating positioning of the photoresist 13, i.e., mask alignment, thereby suppressing misalignment.

With reference to FIG. 23A, the gate section and the LDD section of the nMOSTFT are covered with a photoresist 16 and the exposed region is doped with phosphorus or arsenic ions 17 by ion implantation to form a source section 18 and a drain section 19 composed of an N$^+$-type layer of the nMOSTFT, as in Step shown in FIG. 64A.

With reference to FIG. 23B, the entire nMOSTFT is covered with a photoresist 20 and then doped with boron ions 21 by ion implantation to form a source section and a drain section of the p+ layer of the pMOSTFTs in the peripheral-driving-circuit section, as in Step shown in FIG. 64B.

With reference to FIG. 23C, a photoresist 24 is provided and then the single-crystal silicon layer is selectively removed by conventional photolithography and etching to island the active device section and the passive device section, as in Step shown in FIG. 64C.

With reference to FIG. 23D, a SiO$_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in Step shown in FIG. 65A. The SiO$_2$ film 53 and the PSG film 54 correspond to the aforementioned protective film 25. The single-crystal silicon layer is then subjected to an activation treatment as described before.

With reference to FIG. 24A, contact holes are formed for the source sections by conventional photolithography and etching, as in Steps shown in FIG. 65B. An aluminum sputtering film having a thickness of 400 to 500 nm is formed on the entire surface, and source electrodes 26 of the TFTS, data lines and gate lines are simultaneously formed by conventional photolithography and etching. The substrate is then sintered in a forming gas at approximately 400° C. for 1 hour.

With reference to FIG. 24B, an insulating film 36 composed of a PSG film having a thickness of approximately 300 nm and a SiN film having a thickness of approximately 300 nm is formed on the entire surface by a high-density plasma-enhanced CVD process or a catalytic CVD process, and contact holes are formed at the drain sections of display TFTs, as in FIG. 65C.

With reference to FIG. 24C, a photosensitive resin film 28 having a thickness of 2 to 3 μm is formed by spin coating, as in the step shown in FIG. 66A, followed by a Step shown in FIG. 24D in which an uneven pattern is formed and then subjected to reflow to form a lower portion of a reflective layer having an uneven surface 28A so that the pixel section has optimized reflective and viewing-angle characteristics. At the same time, contact holes are formed in the resin for allowing contact of the drain sections of the display TFTS. At the same time, contact holes are formed in the resin for allowing contact of the drain sections of the display TFTS.

With reference to FIG. 24D, an aluminum sputtering film having a thickness of 400 to 500 nm is formed on the entire surface, as in the step shown in FIG. 66C, and then an uneven aluminum reflective section 29 connecting to the drain sections 19 of the display TFTs is formed by conventional photolithography and etching.

As described above, the resulting active-matrix substrate 30 integrates a display section and a peripheral-driving-circuit section, in which the display section includes bottom-gate nMOSLDD-TFTs using the single-crystal silicon layer 7 formed by high-temperature graphoepitaxy on the step differences 4 as a seed, while the peripheral-driving-circuit section includes a CMOS driving circuit having bottom-gate pMOSTFTs and bottom-gate nMOSTFTs.

FIGS. 24A to 24D show the formation of the gate insulating film of the above-mentioned bottom-gate MOSTFT in the display section by anodic oxidation of molybdenum-tantalum.

After the step of FIG. 21B, the molybdenum-tantalum alloy film 71 is subjected to conventional anodic oxidation treatment, as shown in FIG. 25A, to form on the surface a gate insulating film 74 composed of Ta$_2$O$_5$ and having a thickness of 100 to 200 nm.

Next, with reference to FIG. 25B, the step differences 4 are formed and a single-crystal layer 7 is deposited thereon graphoepitaxy, as in the steps shown in FIGS. 21D to 22D, followed by execution of processing similar to those of FIGS. 22E to 24D to form an active matrix substrate 30 as shown in FIG. 25C.

When the dual-gate MOSTFTs are produced in the display section, the processes are executed in the same way as those shown in FIGS. 21A to 22D.

More specifically, with reference to FIG. 26A, step differences 4 are formed in the substrate 1 through the insulating films 72 and 73, and then a single-crystal silicon layer 7 is deposited by graphoepitaxy on the step differences 4 as a seed. Next, a step which is the same as that shown in FIG. 63A is executed so that a SiO$_2$ film having a thickness of approximately 200 nm and then a SiN film having a thickness of approximately 100 nm are successively formed on the entire surface of the single-crystal silicon layer 7 by a plasma-enhanced CVD process or a catalytic CVD process, thereby to form an insulating film 80 corresponding to the insulating film 8. Then, a molybdenum-tantalum alloy film 81 having a thickness of 500 to 600 nm, corresponding to the sputtering film 9, is formed by sputtering.

With reference to FIG. 26B, processing which is the same as that shown in FIG. 63B is executed: namely, a photoresist pattern 10 is formed and is subjected to continuous etching to form a top-gate electrode 82 (corresponding to the gate electrode 12) composed of the molybdenum-tantalum alloy and a gate insulating film (corresponding to the gate insulating film 11), thereby exposing the single-crystal silicon layer 7.

With reference to FIG. 26C, the same processing as that shown in FIG. 63C is executed: namely, the top-gate section of the nMOSTFT is covered with a photoresist 13, and the exposed source and drain regions of the nMOSTFT for display are doped with phosphorus ions 14 by ion implantation to form an N$^-$-type LDD section 15.

With reference to FIG. 26D, the same processing as that shown in FIG. 64A is executed: namely, the gate section and the LDD section of the nMOSTFT are covered with a photoresist 16, and the exposed region is doped with phosphorus or arsenic ions 17 by ion implantation, thereby to form a source section 18 and a drain section 19 of nMOSTFT composed of an N$^+$-type layer.

With reference to FIG. 27A, the same processing as that shown in FIG. 64B is performed: namely, the gate section of the pMOSTFT is covered with a photoresist 20 and the exposed region is doped with boron ions 21 by ion implantation to form a source section and a drain section of the pMOSTFT composed of a P$^+$-layer in the peripheral-driving-circuit section.

With reference to FIG. 27B, the same processing as that shown in FIG. 64C is executed: namely, a photoresist layer 24 is provided and the single-crystal silicon layer is selectively removed at portions other than the active and passive device sections by conventional photolithography and etching, thereby to island the active device section and the passive device section.

With reference to FIG. 27C, the same process as that shown in FIG. 65A is performed: namely, a SiO$_2$ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process. These films 53 and 54 correspond to the aforesaid protective film 25. Then, an activation treatment is effected on the single-crystal silicon layer 7.

With reference to FIG. 27D, the same processing as that shown in FIG. 65B is executed: namely, contact holes are formed for the source sections. An aluminum sputtering film having a thickness of 400 to 500 nm is formed on the entire surface, and then source electrodes 26, data lines and gate lines are simultaneously formed by conventional photolithography and etching.

With reference to FIG. 28A, the same processing as that shown in FIG. 65C is executed: namely, an insulating film 36 including a PSG film having a thickness of approximately 300 nm and a SiN film having a thickness of approximately 300 nm is formed on the entire surface, and contact holes are formed for the drain sections of the display TFTS.

With reference to FIG. 28B, a photosensitive resin film 28 having a thickness of 2 to 3 $\mu$m is formed on the entire surface by, for example, spin coating. With reference to FIG. 28C, Steps which are the same as those of FIGS. 66B and 66C are performed: namely, a lower portion of a reflective face comprising an uneven surface 28A is formed in at least the pixel section, contact holes are formed for the drain sections of the display TFTs, and an uneven aluminum reflective section 29 connecting to the drain sections 19 of the display TFTs are formed so that optimum reflective and viewing-angle characteristics are achieved.

The resulting active-matrix substrate 30 integrates a display section and a peripheral-driving-circuit section, in which the display section includes dual-gate nMOSLDD-TFTs and the peripheral-driving-circuit section includes a CMOS driving circuit having bottom-gate nMOSTFTs and bottom-gate pMOSTFTs, wherein these TFTs are formed by using the single-crystal silicon layer 7 deposited by high-temperature graphoepitaxy on the step differences 4 as seeds.

An eighth embodiment of the third aspect of the present invention will be described with specific reference to FIGS. 29A to 30C, FIGS. 32A to 33C and FIGS. 35A to 36B, as well as to FIGS. 68A and 68B and FIGS. 69A to 69C.

In this embodiment, the gate electrode at the top gate section is composed of a material having relatively low thermal resistance, such as aluminum, an aluminum alloy, e.g., aluminum alloy containing 1 wt % of silicon or 1 to 2 wt % of copper, or copper, unlike the preceding embodiments.

The process of this embodiment is similar to the eighth embodiment of the first aspect, except that bottom-gate MOSTFTs are formed in the peripheral-driving circuit section, in contrast to the first aspect in which dual-gate MOSTFTs are used in the peripheral-driving circuit section. Thus, steps are followed from that of FIG. 1A down to that shown in FIG. 3C, whereby an N-type well 7A is formed in the pMOSTFT region of the peripheral-driving circuit section, as shown in FIG. 29A. The process then proceeds from the step shown in FIG. 29B down to the step shown in FIG. 30C, in the same way as that described before in conjunction with the eighth embodiment of the first aspect with reference to these Figures.

After a patterning of the respective gate sections, the active device section and the passive device section are isolated, in the same way as that described before and, as shown in FIG. 68A, a $SiO_2$ film having a thickness of approximately 200 nm and then a phosphosilicate glass (PSG) film having a thickness of approximately 300 nm are deposited on the entire surface, thereby to form a protective film 25.

With reference to FIG. 68B, contact holes are formed for the source and drain sections of all TFTs in the peripheral-driving-circuit section and the source sections of the display TFTs, by conventional photolithography and etching.

A film having a thickness of 500 to 600 nm is formed on the entire surface by sputtering, with aluminum or an aluminum alloy containing 1 weight percent of Si and, thereafter, the source electrodes 26 of all TFTs in the peripheral-driving-circuit section and the display section, drain electrodes 27 in the peripheral-driving-circuit section, data lines and gate lines are simultaneously formed by conventional photolithography and etching. The substrate is then subjected to sintering treatment in a forming gas ($N_2+H_2$) at approximately 400° C. for 1 hour.

Then, Steps which are the same as those shown in FIG. 65C to FIG. 66C are executed, whereby an active-matrix substrate 30 is obtained integrating a display section and a peripheral-driving-circuit section by using the single-crystal silicon layer 7, in which the display section includes top-gate nMOSLDD-TFTs having gate electrodes of aluminum or aluminum alloy containing 1 weight percent of Si, while the peripheral-driving-circuit section has a CMOS driving circuit having bottom-gate pMOSTFTs and bottom-gate nMOSTFTs.

Since the aluminum or aluminum-alloy gate electrodes 11 are formed after the activation treatment of the single-crystal silicon layer 7, the gate electrode material is not subject to the heat during the activation treatment, so that inexpensive material having relatively low heat resistance, such as aluminum or 1 wt % Si aluminum alloy, can be used as the gate electrode, offering a wider selection of the electrode materials. This applies also to the case where the display section includes bottom-gate MOSTFTs.

For implementing a configuration in which dual-gate MOSTFTs are formed in the display section while bottom-gate MOSTFTs are used in the peripheral-driving-circuit section, respectively, the processes shown in FIG. 21A to 22D are performed, and then an N-type well 7A is formed at the PMOSTFT section in the peripheral-driving-circuit section, as shown in FIG. 32A.

With reference to FIG. 32B, the TFT s in the display section are doped with phosphorus ions 14 to form LDD sections 15, as in the step shown in FIG. 29B.

With reference to FIG. 33A, the same processing as that shown in FIG. 30A is executed: namely, the nMOSTFT sections in the display section and the peripheral-driving-circuit section are doped with phosphorus ions 17 to form $N^+$-type source regions 18 and drain regions 19.

With reference to FIG. 33B, the same process as that shown in FIG. 30B is executed: namely, the pMOSTFT section in the peripheral-driving-circuit section is doped with boron ions 21 to form a $P^+$-type source region 22 and a drain region 23.

Figure 69A:
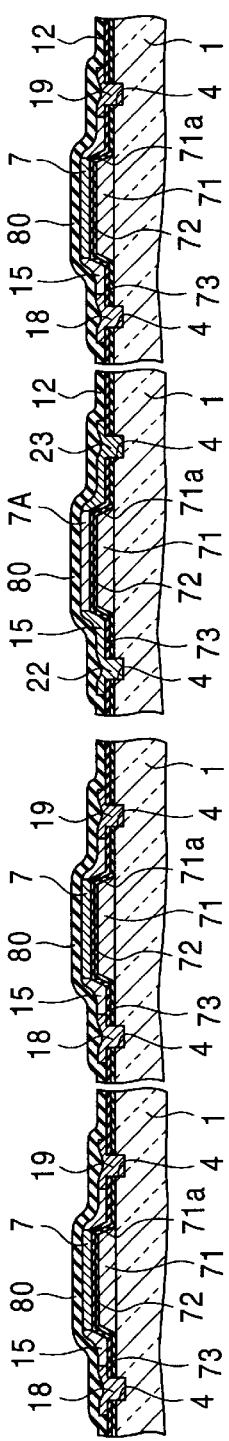
FIGS. 69A to 69C are sectional views showing steps of the process for producing an LCD in accordance with the eighth embodiment of the third aspect of the present invention.

With reference to FIG. 33C, after the removal of the resist 20, the single-crystal silicon layer 7 is patterned to island the active device section and the passive device section and, thereafter, as shown in FIG. 69A, the single-crystal silicon layers 7 and 7A are activated in the same way as that described before, followed by formation of a gate insulating film 80 in the display section.

Figure 69B:
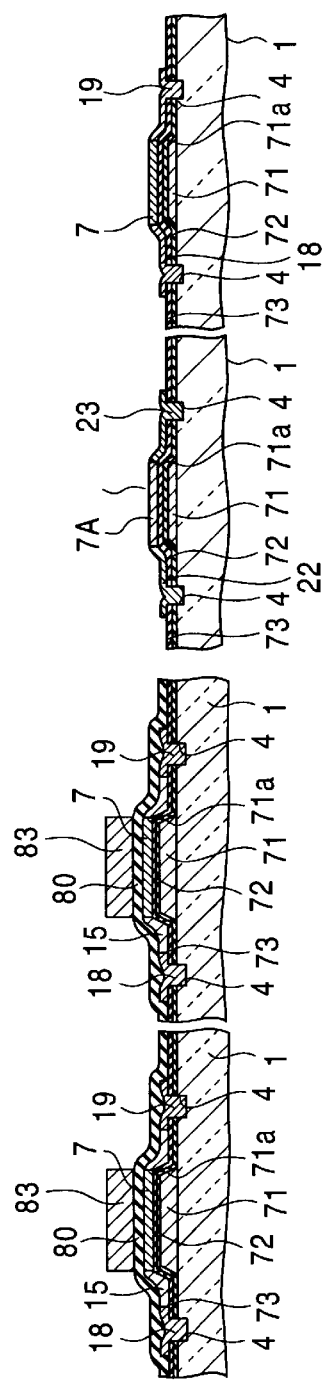

With reference to FIG. 69B, an aluminum film sputtered on the entire surface is patterned to form upper-gate electrodes 83 in the display section.

Figure 69C:
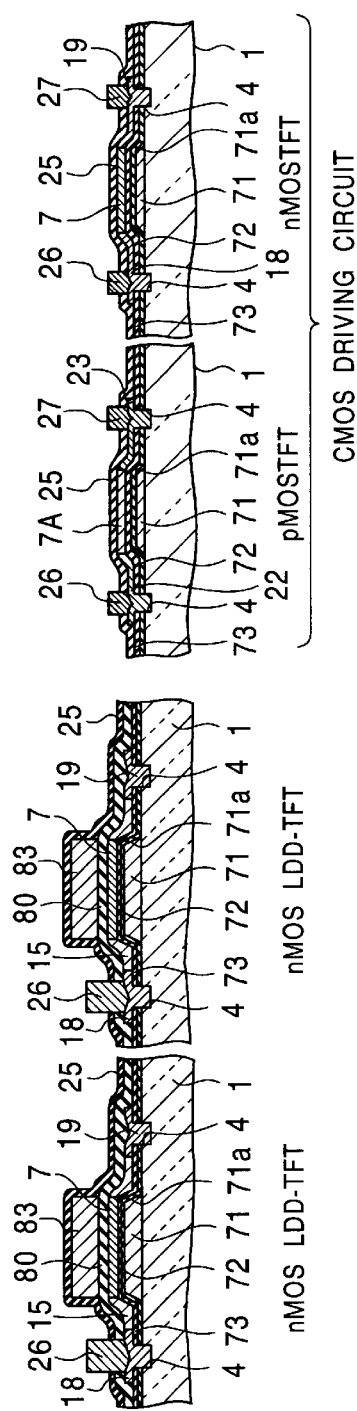

With reference to FIG. 69C, a $SiO_2$ film having a thickness of approximately 200 nm and then a PSG film having a thickness of approximately 300 nm are deposited to form a protective film 25.

Source electrodes 26 of all TFTs in the peripheral-driving-circuit section and the display section and drain electrodes 27 in the peripheral-driving-circuit section are formed by the same process as that described before, whereby an active-matrix substrate 30 is obtained integrating the display section and the peripheral-driving-circuit section using the single-crystal silicon layer 7, wherein the display section includes dual-gate nMOSLDD-TFTs having aluminum top gate electrodes, while the peripheral-driving-circuit section includes a CMOS driving circuit having bottom-gate pMOSLDD-TFTs and bottom-gate nMOSTFTs.

Since the gate electrodes 83 are formed after the activation treatment of the single-crystal silicon layer 7 in this embodiment, the gate electrode material does not undergo the heat applied during the activation treatment, so that any inexpensive material having relatively low heat resistance, such as aluminum, aluminum alloy or copper may be used for the gate electrode, thus widening the selection of the electrode materials. The source electrodes 26 (and the drain electrodes also) may be simultaneously formed in Step shown in FIG. 69B, thus offering advantages in the production process.

When the bottom-gate or top-gate or dual-gate MOSTFTs are formed in any of above-described embodiments, the single-crystal silicon layer 7 deposited on the step difference 4 may have discontinuity or thinned portions, as schematically shown in FIG. 35A, leading to connection failure or increase in the resistance and, therefore, the source electrode 26 (or the drain electrode 27) is preferably provided in a region including the step difference 4 in order to ensure the connection to the single-crystal silicon layer 7, as shown in FIGS. 35B and 35C.

As an alternative to Step shown in FIG. 2B or Step shown in FIG. 32B, after the formation of the top-gate insulating film on the single-crystal silicon layer 7, ion implantation and activation treatment may be performed and then the top-gate electrodes and source and drain electrodes may be simultaneously formed.

The step differences 4 are formed in the substrate 1 (and in the overlying SiN film) in the described embodiment as shown in FIG. 36A, this is only illustrative and the step differences 4 may be formed on-a SiN film 51 on the substrate 1 so that the SiN film 51 inhibits diffusion of ions from the glass substrate 1.

FIGS. 37A to FIGS. 39 show a ninth embodiment of the third aspect of the present invention.

In this embodiment, TFTs are formed at the exterior of the step differences 4, that is, in regions other than the step differences 4. In these drawings, the single-crystal silicon layer 7 and the gate electrodes 11, source electrodes 26 and drain electrodes 27 are shown only schematically.

Referring first to FIG. 37A, the indented section formed by the step difference 4 is located along and on one side of the source region, and the gate insulating film 12 and the gate electrodes 11 are formed on the areas of the single-crystal silicon layer 7 where there is no indented section. FIG. 37B shows an arrangement in which the indented section has an L-like shape, with one leg extending along the side of the source region and the other leg extending in the direction of length of the channel down to the end of the drain region. FIG. 37C shows an arrangement in which the indented section has a rectangular form with four sides surrounding the TFT active region. FIG. 37D shows an arrangement in which the indented section has three sides. In FIG. 37E, an indented section has an L-shape with two sides. In all these cases, adjacent indented sections 4 are discrete and isolated from each other.

Thus, the indented sections or step differences 4 may have any suitable shape, and the TFTs are formed on the areas other than these step differences 4, so that the TFTS can be fabricated without difficulty.

FIGS. 38A to 38C show bottom-gate MOSTFTs. Any type of step difference 4 shown in FIGS. 36A to 36E may be employed also in this type of MOSTFTS. In FIG. 38A corresponding to FIG. 37A, the bottom-gate MOSTFT is formed on the flat portion other than the step difference 4. Likewise, FIGS. 38B corresponds to FIG. 37B, and FIG. 38C corresponds to FIG. 37C or 37D.

FIG. 39 shows a dual-gate MOSTFT. Any type of step difference 4 shown in FIGS. 37A to 37E may also be employed in this type. For example, the dual-gate MOSTFT may be formed on the flat portion in the interior of the step difference 4 shown in FIG. 37C or 37D.

FIGS. 40A to 42 show a tenth embodiment of the third aspect of the present invention. The tenth embodiment is basically the same as the tenth embodiment of the first aspect, except for the use of bottom-gate MOSTFTs graphoepitaxially grown from the single-crystal silicon layer in place of the dual-gate MOSTFTs used in the first embodiment, and offers the same advantages as those obtained with the tenth embodiment of the first aspect. Further description of the tenth embodiment, therefore, is omitted to avoid redundancy.

FIGS. 43A and 43B show an eleventh embodiment of the third aspect of the present invention, wherein one of the upper and lower-gate sections of a dual-gate type nMOSTFT is used in a transistor operation, whereas the other operates as follows.

In an nMOSTFT shown in FIG. 43A, an appropriate negative voltage is constantly applied to the gate electrode at the top gate side to reduce the leakage current in the back channel. When the top gate electrode is opened, this is used as a bottom-gate type. In FIG. 43B, an appropriate negative voltage is constantly applied to the gate electrode at the bottom gate side to reduce the leakage current in the back channel. When the bottom gate electrode is opened, this is used as a top-gate type. In case of a PMOSTFT, leakage current in the back channel can be reduced by constantly applying an appropriate positive voltage to the gate electrode.

The interface between the single-crystal silicon layer 7 and the insulating film has low crystallinity and readily causes a leakage current, but the above-mentioned negative voltage applied to the gate electrode can effectively reduce the leakage current. This advantage is added to that offered by the LDD structure. Furthermore, the bottom gate electrode shades the light incident on the substrate 1, so that the leakage current caused by the incident light can be reduced.

A twelfth embodiment of the third aspect of the present invention will now be described with reference to FIGS. 51 and 52 and also to FIGS. 70 to 76.

As described above, the top-gate, bottom-gate and dual gate TFTs have different structures, functions and characteristics. A variety of combinations of these TFTs may be employed in the display section and the peripheral-driving-circuit section to obtain various advantageous effects.

For example, as shown in FIG. 70, when any one of the top-gate MOSTFT, the bottom-gate MOSTFT and the dual-gate MOSTFT is used in the display section, at least the bottom-gate type is used alone or in a combination with at least one of the other types, in the peripheral-driving-circuit section. In this case, there are 12 types of combination identified by Nos. 1 to 12. When a dual-gate structure is employed in the MOSTFT in the peripheral-driving-circuit section, this dual-gate structure functions as a top-gate type or a bottom-gate type by selecting the upper or lower gate, and the dual-gate type structure also is preferred when a local portion of the peripheral driving circuit requires TFTs having large driving power. For example, electrooptical devices using organic EL or FED will require such TFTs having large driving power.

A variety of combinations (Nos. 1 to 216) of channel conduction types are available for the MOSTFTs to be used in the peripheral-driving-circuit section and the display section, specifically: FIGS. 71 and 72 show combinations possible when the MOSTFTs in the display section do not have a LDD structure; FIGS. 73 and 74 show combinations possible when the MOSTFTs in the display section have a LDD structure; FIGS. 75 and 76 show combinations possible when the peripheral-driving-circuit section includes TFTs having a LDD structure; and FIGS. 77 and 78 show combinations possible when both the peripheral-driving-circuit section and the display section include TFTs having a LDD structure.

Thus, the details of the combinations shown in FIG. 70 are shown in FIGS. 71 to 78. These combinations are also available when the peripheral-driving-circuit section includes the top-gate MOSTFT and the other-type MOSTFT (s). These combinations are applicable not only when the channel regions of the TFTs are formed of a single-crystal silicon but also when the channel region of the TFT is formed of polycrystalline silicon or amorphous silicon (only in the display section).

FIGS. 53A to FIG. 54 show a thirteenth embodiment of the present invention.

This embodiment is an active-matrix LCD which includes TFTs having high driving power and using the above-mentioned single-crystal silicon layer in the peripheral-driving-circuit section, in order to attain a greater driving power. This, however, is not exclusive and the TFTs may employ not only bottom-gate MOSTFTs but also other gate types together with the dual-gate type, as well as a variety of channel conduction types, and may further include MOSTFTs using polycrystalline silicon layer. In contrast, the MOSTFTs of the display section preferably use a single-crystal silicon layer, although they may use a polycrystalline or amorphous silicon layer or at least two out of the three types of silicon layers in combination. It is to be noted, however, when the display section is constituted by nMOSTFTs, a single-crystal or polycrystalline silicon layer is preferably used because such types of silicon layer enables a reduction in the areas of TFTs and is preferred to amorphous silicon also from the viewpoint of reduction in pixel defects, although a practically acceptable switching speed is still attainable also with the amorphous silicon layer. Polysilicon, in addition to single-crystal silicon, may be formed during graphoepitaxy, thereby forming a continuous grain silicon (CGS) structure which can be advantageously used for the formation of the active device and the passive device in some cases. Other features are the same as those of the thirteenth embodiment of the first aspect described before, and are not described any more to avoid redundancy.

FIG. 55 shows a fourteenth embodiment of the present invention.

This embodiment implements a passive-matrix drive, in contrast to the preceding embodiments that are focused on active-matrix drive configurations. This embodiment is basically the same as the fourteenth embodiment of the first aspect of the present invention, except that the MOSTFTs formed from the graphoepitaxially-grown single-crystal silicon layer are of bottom-gate type unlike the first aspect in which dual-gate MOSTFTs are used. This embodiment therefore produces the same advantages as those offered by the fourteenth embodiment of the first aspect of the present invention.

FIGS. 56A and 56B show a fifteenth embodiment of the present invention.

This embodiment is directed to an electrooptical device other than an LCD, such as an organic or inorganic EL device (electroluminescent device), FED (field emission display device), LEPD (light-emitting polymer display device), and LED (light-emitting diode). This embodiment is basically the same as the fifteenth embodiment of the first aspect of the present invention, except that the MOSTFTs formed from the graphoepitaxially-grown single-crystal silicon layer are of bottom-gate type unlike the first aspect in which dual-gate MOSTFTs are used. This embodiment therefore produces the same advantages as those offered by the fifteenth embodiment of the first aspect of the present invention.

A description will now be given of first to thirteenth embodiments of a fourth aspect of the present invention which employs a melt layer of a low-melting-point metal and which has the step of forming a bottom-gate first thin-film transistor.

The first embodiment of the fourth aspect of the present invention will be described with reference to FIGS. 1A to 3C, FIGS. 63A to 66C, and FIGS. 8 to 14.

The present invention will now be described in more detail with reference to the following preferred embodiments.

The first embodiment of the fourth aspect of the present invention will be described with reference to FIGS. 1A to 3C, FIGS. 63A to 66C, and FIGS. 8 to 14.

The first embodiment relates to an active-matrix reflective liquid crystal display (LCD) having a peripheral driving circuit incorporating bottom-gate MOSTFTs formed by a single-crystal silicon layer which are formed by graphoepitaxy from a melt of indium-silicon at high temperature using as a seed an indented section defined by a step difference provided on a substrate as a seed. FIGS. 12 to 14 show an overall layout of the reflective LCD.

FIGS. 12 to 14 show an overall layout of the reflective LCD.

The basic structure of the LCD is substantially the same as those of the first aspect described before, so that description is omitted with such basic structure for the purpose of simplification of the specification.

With reference to FIGS. 1A to 3C, FIGS. 66A to 66C and FIGS. 8 to FIG. 10F, the active-matrix reflective LCD in this embodiment will be described in accordance with the production steps. In FIGS. 1A to 6C, the left side of each drawing shows the production steps for the display section and the right side shows the production steps for the peripheral-driving-circuit section.

Referring first to FIG. 1A, a film 71 of about 500 to 600 nm thick is formed from a molybdenum/tantalum (Mo—Ta) alloy by sputtering on a major surface of an insulating substrate 1 made of, for example, a quartz glass or a transparent crystalline glass.

Then, as shown in FIG. 1B, a photoresist 70 is formed in a given pattern and the Mo—Ta film 71 is taper-etched through a mask constituted by the photoresist 70, whereby a gate electrode 71 is formed to have side faces that are gently slanted at an angle of 20 to 45 degrees to provide a substantially trapezoidal cross-section.

Then, as shown in FIG. 1C, a gate insulating film composed of an SiN film 72 (about 100 nm thick) and an $SiO_2$ film 73 (about 200 nm thick) laminated in this order is deposited by, for example, a plasma CVD process on the substrate 1 having the molybdenum-tantalum alloy film 71, after removal of the photoresist 70.

Subsequently, as shown in FIG. 57A, a photoresist 2 having a given pattern is formed in at least a TFT-forming region, and the surface is irradiated with, for example, F+ ions 3 of CF$_4$ plasma through the mask constituted by the photoresist 2, and a plurality of step differences 4 having a given shape and a given size are formed in the gate insulating film (and further in the substrate 1) by typical photolithography, such as reactive ion etching (RIE), and then by etching (photoetching).

The insulating substrate 1 may be composed of a highly-heat-resistant substrate having a diameter of 8 to 12 inches and a thickness of 700 to 800 am, such as quartz glass, crystallized glass, or ceramic, although in a transmissive LCD described below an opaque ceramic substrate cannot be used. The step differences 4 function as seeds for graphoepitaxy of single-crystal silicon. Each step difference 4 has, for example, a depth d of 0.3 to 0.4 $\mu$m, a width w of 2 to 10 $\mu$m, and a length 1 of 10 to 20 $\mu$m (in the direction perpendicular to the drawing sheet). The basilar angle defined by the bottom face and the side face is a right angle. In order to prevent diffusion of ions such as Na ions from the glass substrate, an SiN film of, for example, 50 to 200 nm thick and, as desired, a silicon oxide film (referred to as SiO$_2$ film, hereinafter) of, for example, 100 nm thick may be formed on the glass substrate, in advance of the steps described heretofore.

Subsequently, a silicon-indium melt 6 containing about 1 weight percent of silicon is applied to the substrate 1 which has been heated to a temperature of from 900 to 930° C., after removal of the photoresist 2, as shown in FIG. 57B. Alternatively, the surface of the substrate 1 is coated with the silicon-indium melt by a dipping in which the substrate 1 is dipped in the melt, a floating in which the substrate 1 is moved in or on the melt, or through a contact under by aplication of a jet of the melt or under the influence of supersonic waves.

The substrate 1 is held in this state for a period of several minutes to several tens of minutes, followed by a slow cooling. In case of dipping, the slow cooling is effected by slowly pulling the substrrate out of the melt. Consequently, the silicon that has been dissolved in the indium grows by graphoepitaxy, using the bottom corners of the step differences 4 as the seeds for the growth, whereby a P-type single-crystal silicon layer 7 of, for example, 0.1 $\mu$m, as shown in FIG. 3A. In this process, the side faces 71a of the underlying gate electrode 71 are gently tapered, so that these side faces do not cause impediment to the epitaxial growth on the seeds constituted by the step differences, whereby the single-crystal silicon layer 7 can grow on these side faces without discontinuity. Dipping or floating method permits easy administration of factors such as the composition of the melt, temperature of the melt, and pulling rate, thus facilitating the control of the thickness and carrier impurity concentration of the epitaxial growth layer.

In the single-crystal silicon layer 7 as deposited, a (100) plane is epitaxially grown on the substrate, and this is known as graphoepitaxy. With reference to FIGS. 9A and 9B, a vertical wall, such as the above-mentioned step difference 4, is formed on the amorphous substrate 1, such as a glass substrate and an epitaxial layer is formed thereon, so that the (100) plane of a single-crystal is grown along the side face of the step difference 4 as shown in FIG. 9B, whereas a crystal having random plane orientation is grown on a flat amorphous substrate 1, as shown in FIG. 9A. The size of the single-crystal grain increases in proportion to the temperature and the time: when the temperature is lowered or when the time is shortened, the distance between the step differences should be decreased. The orientation of the grown crystal can be controlled by changing the shape of the step differences, as shown in FIGS. 10A to 10F. When MOS transistors are formed, the (100) plane is most frequently used. Accordingly, the step difference 4 can have any cross-sectional shape which facilitates crystal growth, for example, the angle at the bottom corner (basilar angle) may be a right angle or, alternatively, the side wall may be inclined inwardly or outwardly towards the lower end. The basilar angle of the step difference 4 is preferably a right angle or smaller, and the bottom corners are preferably rounded slightly.

Subsequent to the deposition of the single-crystal silicon layer 7 on the substrate 1 through the graphoepitaxy, the indium film 6A precipitating on the surface is removed b, for example, hydrochloric acid or sulfuric aci, as shown in FIG. 3. The removing treatment is conducted so as not to allow formation of a lower silicon-oxide film, whereby a bottom-gate MOSTFT having a channel region constituted by the single-crystal silicon layer 7 is formed in the peripheral-driving-circuit section, while a top-gate MOSTFT is formed in the display section.

The single-crystal silicon layer 7 deposited by graphoepitaxy contains is a p-type layer due to its indium content, and the concentration of the P-type impurity fluctuates, so that adjustment of the specific resistance is performed by doping with p-type impurity ions such as B+ at 10 kV and at a dosage of $2.7 \times 10^{11}$ atoms/cm$^2$, with the p-channel MOSTFT section masked by a photoresist (not shown in the drawing). With reference to FIG. 3C, in order to control the concentration of the impurity in the pMOSTFT-forming region, the nMOSTFT section is masked with a photoresist 60 and is doped with n-type impurity ions 65 such as P+ at 10 kV and at a dosage of $1 \times 10^{11}$ atoms/cm$^2$ to form an n-type well 7A.

With reference to FIG. 63A, a SiO$_2$ film having a thickness of approximately 200 nm and then a SiN film having a thickness of approximately 100 nm are continuously deposited on the entire single-crystal silicon layer 7 by a plasma-enhanced CVD process, a high-density plasma-enhanced CVD process or a catalytic CVD process to form a gate insulating film 8, followed by a sputtering to deposit a molybdenum-tantalum (Mo—Ta) alloy film 9 of 500 to 600 nm thereon.

With reference to FIG. 63B, photoresist patterns 10 are formed in the step difference regions (indented sections) of the TFT sections in the display region of the TFT sections of the peripheral driving region by any conventional photolithographic process, and a continuous etching is executed, whereby gate electrodes 11 of the Mo—Ta alloy film and gate insulating films 12 of SiN—SiO$_2$ are formed and the single-crystal silicon layer 7 is exposed. The Mo—Ta alloy film 9 is etched using an acidic etchant, SiN is etched by plasma etching using CF$_4$ gas, and SiO$_2$ is etched using a hydrofluoric acidic etchant.

With reference to FIG. 63C, all of the nMOSTFTs and pMOSTFTs in the peripheral driving region, as well as the gate sections of the nMOSTFTs in the display region, are covered with a photoresist 13, and the exposed source and drain regions of the nMOSTFTs are doped with, for example, phosphorus ions 14 by ion implantation at 20 kV and at a dosage of $5 \times 10^{13}$ atoms/cm$^2$ to form LDD sections 15 of an N−-type layer by self-alignment.

With reference to FIG. 64A, all of the pMOSTFTs in the peripheral driving region, the gate sections of the nMOSTFTs in the peripheral driving region, and the gate sections and the LDD sections of the nMOSTFTs in the display region are covered with a photoresist 16, and the exposed regions are doped with phosphorus or arsenic ions 17 by ion implantation at 20 kV and at a dosage of $5 \times 10^{15}$ atoms/cm² to form source sections 18, drain sections 19 and the LDD sections 15 of an N⁺-type layer of the nMOSTFTs.

With reference to FIG. 64B, all of the nMOSTFTs in the peripheral driving region and the display region and the gate sections of the pMOSTFTs in the peripheral driving region are covered with a photoresist 20, and the exposed regions are doped with boron ions 21 by ion implantation at 10 kV and at a dosage of $5 \times 10^{15}$ atoms/cm² to form source sections 22 and drain sections 23 of an P⁺-type layer of the pMOST-FTs. In the case of an nMOS peripheral driving circuit, this step is not necessary since the circuit does not have a MOSTFT.

With reference to FIG. 64C, in order to island the active device sections including TFTs and diodes and the passive device sections including resistors and inductors, photoresist layers 24 are provided on all of the active device sections and the passive device sections in the peripheral driving region and the display section, and the single-crystal silicon layer 7 in other sections is removed by a conventional photolithographic process or an etching process using a hydrofluoric acid solution.

With reference to FIG. 65A, a SiO₂ film having a thickness of approximately 200 nm and then a phosphosilicate glass (PSG) film having a thickness of approximately 300 nm are continuously deposited to form a protective film 25 on the entire surface by a plasma-enhanced CVD process, a high-density plasma-enhanced CVD process or a catalytic CVD process.

In such a state, the single-crystal silicon layer is activated. Activation treatment is performed at approximately 1,000° C. for approximately 10 seconds using, for example, a halogen lamp, and the gate electrode composed of the Mo—Ta alloy having a high melting point is durable during the annealing for activation. The Mo—Ta alloy can be used not only for the gate section but also as lead lines over a wide range. In the activation, excimer laser annealing requiring high process costs is generally not used. If excimer laser annealing is used, overlapping scanning of 90% or more is preferably performed on the entire surface or selectively the active device section and the passive device section using XeCl (wavelength:308 nm).

With reference to FIG. 65B, contact holes are formed for all of the source-drain sections of the TFTs in the peripheral driving circuit and the source sections of the TFTs in the display region, by a conventional photolithographic process and an etching process.

A film having a thickness of 500 to 600 nm is formed on the entire surface, from aluminum or an aluminum alloy, e.g., an aluminum alloy containing 1 wt % Si or 1 to 2 wt % copper and, by a conventional photolithographic process and an etching process, source electrodes 26 of all TFTs both in the peripheral driving circuit section and the display section, as well as the drain electrodes 27 in the peripheral driving circuit section, are formed, simultaneously with the formation of data lines and gate lines. The substrate is then subjected to sintering treatment in a forming gas (N₂+H₂) at approximately 400° C. for 1 hour.

With reference to FIG. 65C, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed for the drain sections of TFTS in the display region. It is not necessary to remove the SiO₂, PSG and SiN films in the pixel sections.

Basic requirements of a reflective liquid crystal display are to reflect the light incident on the display towards the interior of the liquid crystal panel and, at the same time, to scatter the light. This is because the direction of the incident light is uncertain whereas the position of the observer with respect to the display is substantially fixed. Thus, the reflector must be designed on an assumption that point light sources are present at arbitrary positions. As shown in FIG. 66A, a photosensitive resin film 28 having a thickness of 2 to 3 μm is formed on the entire surface by spin coating and, as shown in FIG. 66B, an uneven pattern is formed in at least the pixel region by a conventional photolithographic process and an etching process so that the pixel section has optimized reflective characteristics and viewing-angle characteristics, followed by a reflow to form a lower portion of the reflective face of an uneven surface 28A. At the same time, contact holes are formed in the resin for allowing contact of the drain sections of the display TFTs.

With reference to 66C, a sputtering film having a thickness of 400 to 500 nm is deposited from aluminum or an aluminum alloy, e.g., an alloy containing 1 wt % Si, on the entire surface, and the sputtering film at the region other than the pixel sections is removed by a general photolithographic process and an etching process, thereby to form an uneven aluminum reflective sections 29 which are connected to the drain sections 19. The reflective sections 29 are used as pixel electrodes for displaying. Next, these are subjected to sintering at approximately 300° C. for 1 hour in a forming gas to enhance the contact. Silver or a silver alloy may be used instead of aluminum to increase the reflectance.

As described above, a single-crystal silicon layer 7 is formed by high-temperature graphoepitaxy using the step differences as the seeds, and an active-matrix substrate 30 integrating a display section and a peripheral-driving-circuit section is produced by forming, both in the display section and in the peripheral-driving circuit section which employ the single-crystal silicon layer 7, top-gate nMOSLDD-TFTs and CMOS circuits which are composed of bottom-gate pMOSTFTs and bottom-gate nMOSTFTs.

With reference to FIG. 8, a method of producing a reflective liquid crystal display using the active-matrix substrate (driving substrate) 30 will now be described. Hereinafter, the active-matrix substrate is referred to as a TFT substrate.

When a liquid crystal cell in this LCD is produced by double-side assembly (suitable for medium to large liquid crystal panels of 2 inches or greater), polyimide alignment films 33 and 34 are formed one surface of the TFT substrate 30 and on a device-mounting surface of a counter electrode 32 having a solid indium tin oxide (ITO) electrode, respectively. The polyimide alignment films are formed by roll coating or spin coating so that thicknesses are in a range of 50 to 100 nm and are cured at 180° C. for 2 hours.

This embodiment offers advantages substantially the same as those offered by the first embodiment of the first aspect of the present invention.

In addition, this embodiment produces the following advantageous effects.

The single-crystal silicon layer has higher electron or hole mobility, comparable with that of a single-crystal silicon substrate and is higher than that of conventional amorphous or polycrystalline silicon thin-films, so that single-crystal silicon bottom-gate MOSTFTs using this single-crystal silicon layer can implement an integral structure composed of a display section and a peripheral-driving-circuit section, wherein the display section has nMOSTFTs, pMOSTFTs or cMOSTFTs with LDD structures that offer high switching performance and low-leak current characteristics, while the peripheral-driving-circuit section includes cMOSTFTs, nMOSTFTs and/or pMOSTFTs which exhibit high driving performance, thus implementing a display panel having high image quality, high definition, a narrow frame, a large screen and a high luminescent efficiency. Since the single-crystal silicon layer 7 has sufficiently high hole mobility, the peripheral driving circuit can drive by using only electrons or holes, or by a combination thereof, and can be combined with the display TFTs having pMOSTFT or CMOSTFTS with LDD structures, thus realizing an integrated panel structure. In compact to medium-sized panels, one of a pair of vertical peripheral driving circuits may be omitted.

In compact to medium-sized panels, one of a pair of vertical peripheral driving circuits may be omitted.

In the high-temperature heteroepitaxy, a single-crystal silicon layer having a variety of p-type impurity concentrations and a high mobility can be readily produced by controlling the factors such as ratio of indium to silicon, shape of the step difference, substrate heating temperature, melt temperature, cooling rate, and N- or P-type carrier impurities added, allowing the threshold voltage (Vth) to be readily controlled to reduce the resistance to facilitate high-speed operations.

A second embodiment of the fourth aspect of the present invention will be described with reference to FIGS. 58A to 58C, 59, 60A to 60D, and 79A to 79C.

This embodiment has, as in the case of the first embodiment, top-gate MOSTFTs in the display section and bottom-gate MOSTFTs in the peripheral driving circuit section, but pertains to a transmissive LCD, unlike the first embodiment. More specifically, in this embodiment, the transmissive LCD is produced by following the foregoing procedure starting from the step shown in FIGS. 1A and ending at the step shown in FIG. 65B as in the first embodiment, but in the subsequent process, contact holes 19 for the drain sections of TFTs in the display section are formed in insulating films 25 and 36, as shown in FIG. 58A, and the unnecessary $SiO_2$ film, PSG film and Si film in the pixel-opening section are removed to improve the transmittance.

With reference to FIG. 58B, a planarization film 28B, which is composed of an acrylic photosensitive transparent resin and has a thickness of 2 to 3 μm, is formed on the entire surface by spin coating etc., and then contact holes for drains of TFTs in the displaying section (display TFTs) are formed in the transparent resin 28B, followed by curing of the transparent resin 28B executed under a given condition.

With reference to FIG. 58C, an ITO film having a thickness of 130 to 150 nm is formed on the entire surface by sputtering, and then an ITO transparent electrodes 41 in contact with the drain section 19 in the display region are formed by photolithography and etching. Next, a heat-treatment in a forming gas at 200 to 250° C. for 1 hour is performed to reduce the contact resistance between the drain of each TFT in the display section and the ITO and to improve the transparency of the ITO.

Next, a heat-treatment in a forming gas at 200 to 250° C. for 1 hour is performed to reduce the contact resistance between the drain of each TFT in the display section and the ITO and to improve the transparency of the ITO.

Then, a transmissive LCD is assembled combining this TFT substrate 1 with a counter substrate 32 as in the first embodiment, as shown in FIG. 18. In this embodiment, however, a polarizer is provided also on the TFT substrate. Although transmission light runs in this transmissive LCD as shown by a solid line in the drawing, the arrangement may be such that transmission light is available from the counter substrate 32. Although transmission light runs in this transmissive LCD as shown by a solid line in the drawing, the arrangement may be such that transmission light is available from the counter substrate 32.

An on-chip color-filter (OCCF) structure and an on-chip black (OCB) structure can be made from this transmissive LCD, as follows.

Thus, after performing the procedure starting from the step of FIG. 1A to 3C and terminating in the step shown in FIG. 65B, contact holes are also formed at the drain sections of the PSG-$SiO_2$ insulating film 25 as shown in FIG. 19A, and an aluminum embedded layer 41A for a drain electrode is formed, followed by deposition of the SIN-PSG insulating film 36.

With reference to FIG. 19B, a photoresist 61 containing a red, green or blue pigment having a thickness of 1 to 1.5 μm is formed on the corresponding color segments and, as shown in FIG. 19C, color filter layers 61(R), 61(G) and 61(B) are formed by a general photolithographic process in such a pattern as to leave the colors only at predetermined locations corresponding to the pixels. (OCCF structure). Contact holes are also formed at the drain sections. This embodiment excludes the use of an opaque ceramics substrates and substrates made of low-transmissivity glass or heat-resistant resin.

With reference to FIG. 19C, a metal shading layer 43 servable as a black mask layer is formed over the contact holes communicating with the drains of the display TFTs and over the color filter layer, by a patterning process using a metal. For example, a molybdenum film having a thickness of 200 to 250 nm is formed by a sputtering process and is then patterned to form a given shape for shading the display TFTS (OCB structure).

With reference to FIG. 19D, a planarization film 28B composed of a transparent resin is formed, and then ITO transparent electrodes 41 are formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

A description will now be given of a third embodiment of the fourth aspect of the present invention.

This embodiment relates to an active-matrix reflective liquid crystal display (LCD) including top-gate MOSTFTs formed of a single-crystal silicon layer which is deposited by low-temperature graphoepitaxy from an indium-gallium-silicon or gallium-silicon melt, using as seeds step differences (indents) on a glass substrate having a low distortion point.

In contrast to the first embodiment, the substrate 1 used in this embodiment is a glass substrate having a low distortion point or maximum usable temperature as low as 600° C. or so, such as borosilicate glass or aluminosilicate glass, as the substrate employed in Step shown in FIG. 1A. Such a glass is inexpensive and can easily be produced in large sizes, e.g., 500 mm×600 mm×0.1 to 1.1 mm can be formed using long rolled glass. Obviously, quartz and crystallized glass may be used as well.

After forming the step differences 4 as in the preceding embdiments, a melt of indium-galliu (or of gallium) containing silicon is aplied to the substrate 1 in the step shownin FIG. 57B.

The substrate 1 is gradually cooled so that the silicon dissolved in the indium melt is deposited by graphoepitaxy on the substrate 1 using the step differences 4 as the seeds, whereby a single-crystal silicon layer 7 having a thickness of, for example, approximately 0.1 μm is formed, as shown in FIG. 3A.

In this case also, the (100) plane of the single-crystal silicon layer 7 is deposited on the substrate by epitaxy and the orientation of the crystal layer can be controlled by changing the shape of the step differences 4, as shown in FIGS. 9A to 9F.

After the deposition of the single-crystal silicon layer 7 by graphoepitaxy on the substrate 1, indium-gallium (or gallium) at the surface is removed by hydrochloric acid or sulfuric acid.

Then, top-gate MOSTFTs and bottom-gate MOSTFTs are formed in the display section and in the peripheral-driving-circuit section, respectively, by using the single-crystal silicon layer in the same way as the first embodiment. The structure shown in FIG. 8 may also be employed in this embodiment.

This embodiment has the following noticeable advantages, in addition to the advantages of the first embodiment.

This embodiment makes it possible to deposite a uniform single-crystal silicon layer on the glass substrate 1, through a graphoepitaxy performed at a further lowered temperature of about 300 to 600 C or about 420 to 600 C.

This process enables the formation of the single-crystal silicon layer on an insulating substrate such as an organic substrate, other than the glass substrate, allowing the use of any inexpensive material having a low distortion point and improved physical properties as the substrate, thus facilitating production of large-size substrates. Accordingly, a thin, long and rolled glass or organic substrate provided with a single-crystal silicon layer can be produced using such a material at a reduced cost and with high productivity. When the constituents in the glass substrate are diffused into the upper layer and affect the transistor characteristics, a thin barrier layer, for example, a silicon nitride layer having a thickness of 50 to 200 nm, is preferably provided, in order to suppress such a diffusion.

The low-temperature graphoepitaxyenables easy formation of a single-crystal silicon thin film having a wide variety of P-type impurity concentration and high electron mobility, through the control of the factors such as the indium/gallium composition ratio of the indium-gallium film, heating temperature and cooling rate, thus offering an easy control of the threshold value Vth to allow high-speed operation of the product device.

A description will now be given of a fourth embodiment of the fourth aspect of the present invention.

In contrast to the preceding third embodiment, this embodiment relates to a transmissive LCD in which a single-crystal silicon layer is formed by low-temperature graphoepitaxy using an indium-gallium melt, as in the second embodiment.

Using the single-crystal silicon layer, the transmissive LCD is produced by the process shown in FIGS. 17A to FIG. 19D, as in the second embodiment. Opaque ceramic substrates and opaque or translucent organic substrates are not suitable for the transmissive LCD.

Accordingly, this embodiment has the advantages of both the second and third embodiments. Thus, this embodiment offers the following advantages in addition to those produced by the first embodiment: borosilicate glass and heat-resistant organic materials which are inexpensive and facilitate the formation of long thin rolled substrates can be used as the substrate 1; the conductive type and Vth of the single-crystal silicon layer can be readily adjusted by the ratio of indium to gallium; and the color filter 42 and the black mask 43 provided on the display array section improve the aperture ratio of the liquid crystal display panel and decreases electrical power consumption of the display module including a back light.

A fifth embodiment of the fourth aspect of the present invention will now be described.

In this embodiment, the peripheral-driving-circuit section includes a CMOS driving circuit including bottom-gate-type pMOSTFTs and nMOSTFTs as in the first embodiment. The display section is of a reflective type and includes TFTs having various gate configurations arranged in a variety o combinations.

Figure 79A:
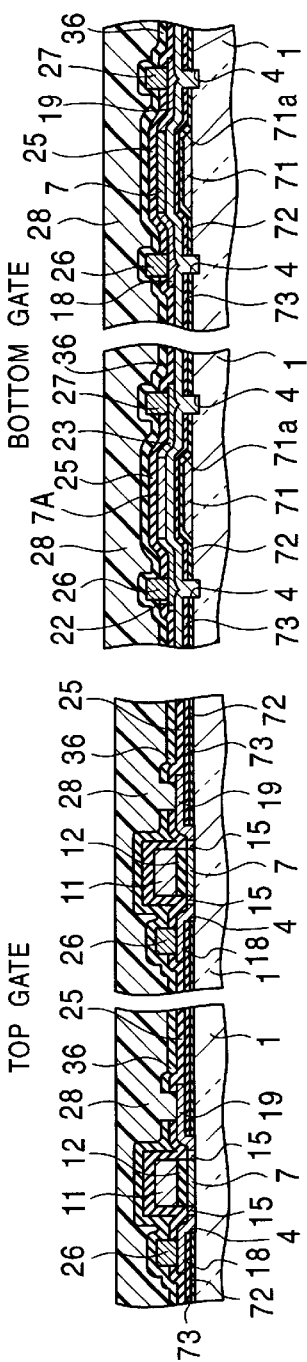
FIGS. 79A to 79C are sectional views showing critical portions of an LCD in accordance with a fifth embodiment of a fourth aspect of the present invention.
Figure 79B:
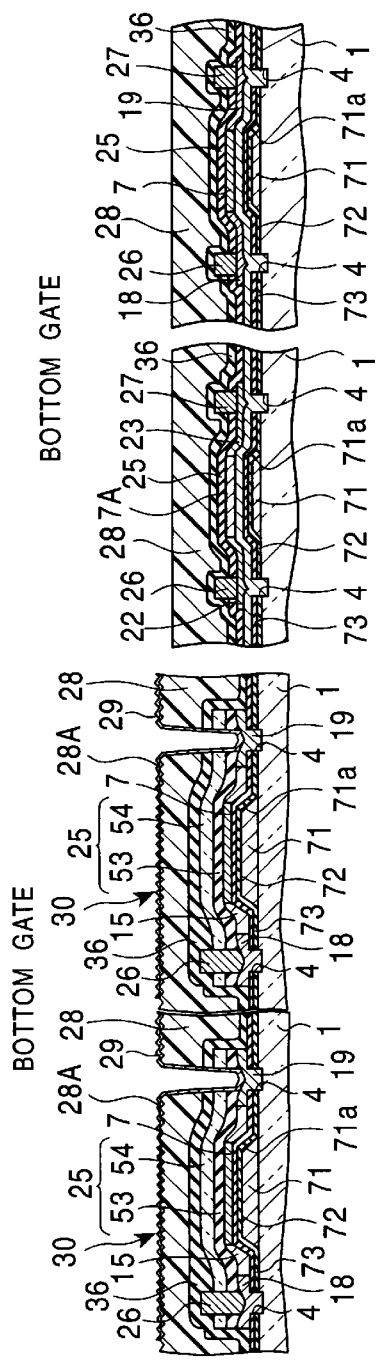
Figure 79C:
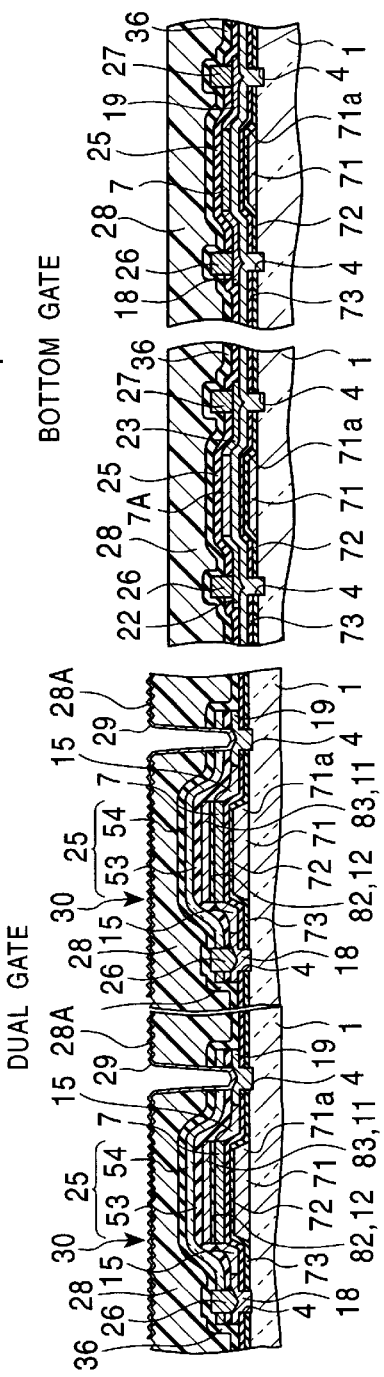

The display section shown in FIG. 79A includes top-gate nMOSLDD-TFTs as in the first embodiment, while the display section shown in FIG. 79B includes bottom-gate nMOSLDD-TFTs, whereas the display section shown in FIG. 79C includes dual-gate nMOSLDD-TFTs. These bottom-gate and dual-gate MOSTFTs can be produced by the same process for the dual-gate MOSTFTs of the peripheral-driving-circuit section, as will be described later, the dual-gate MOSTFT having higher driving ability and being suitable for high-speed switching by virtue of the presence of upper and lower gates and, furthermore, the upper or lower gate may be selectively used to implement a top- or bottom-gate type during operation.

In the bottom-gate MOSTFT shown in FIG. 79B, a gate electrode 71 is composed of, for example, molybdenum-tantalum, and a gate insulting film is composed of a SiN film 72 and a $SiO_2$ film 73. A channel region and so forth using the single-crystal silicon layer are formed on the gate insulating film as in the case of the dual-gate MOSTFT of the peripheral-driving-circuit section. The dual-gate MOSTFT shown in FIG. 79C has the lower-gate section substantially the same as that in the bottom-gate MOSTFT, whereas the upper-gate section includes an upper-gate electrode 83 formed on a gate insulating film 82 composed of a $SiO_2$ film and a SiN film. In all the cases, each gate section is formed in the exterior of the step difference 4 which serves as a seed for graphoepitaxy.

A description will now be given of a method of producing the above-mentioned bottom-gate MOSTFT and a method of producing the dual-gate MOSTFT. The method of producing the dual-gate MOSTFT in the peripheral-driving-circuit section is the same as that described before with reference to FIGS. 1A to 3C and FIGS. 63A to 65C and is therefore not illustrated.

Figure 80A:
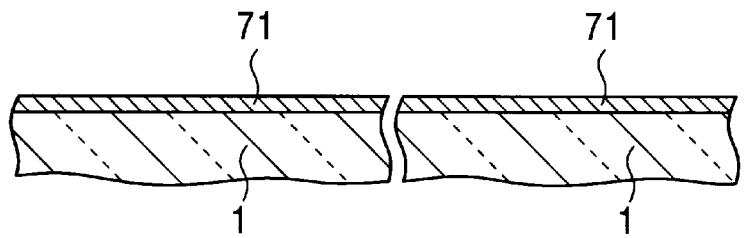
FIGS. 80A to 80D are sectional views showing steps of a process for producing the LCD of the fifth embodiment of the fourth aspect of the present invention.

With reference to FIG. 80A, in the production of the bottom-gate MOSTFT in the display section, a molybdenum-tantalum alloy film 71 having a thickness of 500 to 600 nm is formed on a substrate 1 by sputtering as in the step shown in FIG. 1A.

Figure 80B:
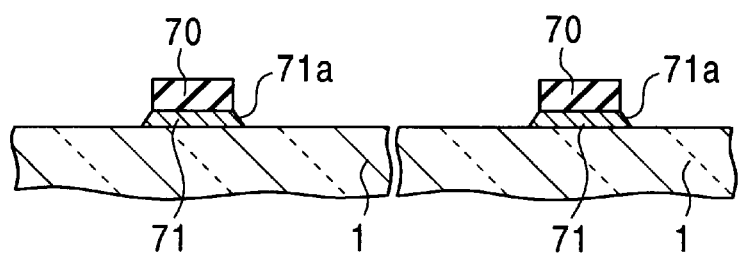

With reference to FIG. 80B, a photoresist 70 having a given pattern is formed by a processing which is the same as that described with reference to FIG. 1B, and the molybdenum-tantalum alloy film 71 is subjected to taper etching using the photoresist 70 as a mask to form a gate electrode 71 having a trapezoidal side base 71a with an angle of 20 to 45 degrees.

Figure 80C:
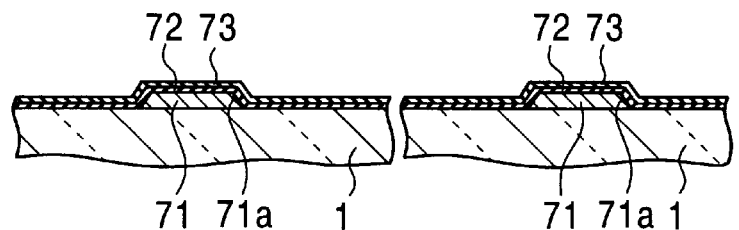

With reference to FIG. 80C, the processing which is the same as that shown in FIG. 1C is conducted in which, after the photoresist 70 is removed, a SiN film 72 having a thickness of approximately 100 nm and then a $SiO_2$ film 73 having a thickness of approximately 200 nm are deposited on the substrate 1 including the molybdenum-tantalum alloy film 71, by a plasma-enhanced CVD process, thereby to form a gate insulating film.

Figure 80D:
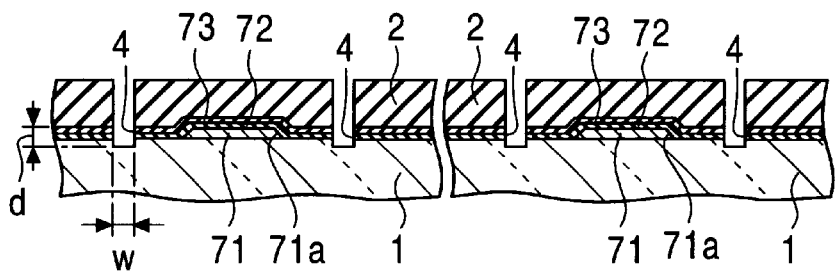

With reference to FIG. 80D, the same process as that described before in connection with FIG. 2A is executed in which a photoresist 2 having a given pattern is formed in at least the TFT-forming region, and a plurality of step differences 4 having a proper shape and size are formed in the gate insulating film and further in the substrate 1 through a mask constituted by the photoresist 2, as described above. The step differences 4 function as seeds during graphoepitaxy of the single-crystal silicon layer as will be described later, and have a depth d of 0.3 to 0.4 µm, a width of 2 to 3 µm, a length of 10 to 20 µm perpendicular to the drawing sheet, and an basilar angle (between the bottom and the side wall) which is a right angle.

Then, as shown in FIG. 61A, a melt 6 of indium (or indium-gallium or gallium) containing silicon is applied as in the step shown in FIG. 2B.

Then, the same process as FIG. 3B is executed to cause graphoepitaxial growth of a single-crystal silicon, whereby a single-crystal silicon layer of a thickness of, for example, 0.1 µm or so is deposited, as shown in FIG. 61B. In this process, the side faces 71a of the underlying gate electrode 71 are gently tapered, so that these side faces do not cause impediment to the epitaxial growth on the seeds constituted by the step differences, whereby the single-crystal silicon layer 7 can grow on these side faces without discontinuity.

Then, the film 6A of indium is removed as shown in FIG. 61C and the processing which is the same as that of FIG. 63C is executed in which the gate section of the nMOSTFTs in the display section are covered by the photoresist 13, and source and drain regions of the nMOSTFTs left exposed are doped by ion implantation with phosphor ions 14, whereby an LDD section 15 composed of an N-type layer is formed by self-alignment, as shown in FIG. 61D. In this process, the bottom-gate electrode 71 permits easy recognition of the height differences or pattern, thus facilitating positioning of the photoresist 13, i.e., mask alignment, thereby suppressing misalignment. In this process, the bottom-gate electrode 71 permits easy recognition of the height differences or pattern, thus facilitating positioning of the photoresist 13, i.e., mask alignment, thereby suppressing misalignment.

With reference to FIG. 62A, the gate section and the LDD section of the nMOSTFT are covered with a photoresist 16 and the exposed region is doped with phosphorus or arsenic ions 17 by ion implantation to form a source section 18 and a drain section 19 composed of an N$^+$-type layer of the nMOSTFT, as in Step shown in FIG. 64A.

With reference to FIG. 62B, the entire nMOSTFT is covered with a photoresist 20 and then doped with boron ions 21 by ion implantation to form a source section and a drain section of the p+ layer of the pMOSTFTs in the peripheral-driving-circuit section, as in Step shown in FIG. 64B.

With reference to FIG. 62C, a photoresist 24 is provided and then the single-crystal silicon layer is selectively removed by conventional photolithography and etching to island the active device section and the passive device section, as in Step shown in FIG. 64C.

With reference to FIG. 62D, a SiO$_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in Step shown in FIG. 65A. The SiO$_2$ film 53 and the PSG film 54 correspond to the aforementioned protective film 25. The single-crystal silicon layer is then subjected to an activation treatment as described before.

With reference to FIG. 24A, contact holes are formed for the source sections by conventional photolithography and etching, as in Steps shown in FIG. 65B. An aluminum sputtering film having a thickness of 400 to 500 nm is formed on the entire surface, and source electrodes 26 of the TFTs, data lines and gate lines are simultaneously formed by conventional photolithography and etching. The substrate is then sintered in a forming gas at approximately 400° C. for 1 hour.

With reference to FIG. 24B, an insulating film 36 composed of a PSG film having a thickness of approximately 300 nm and a SiN film having a thickness of approximately 300 nm is formed on the entire surface by a high-density plasma-enhanced CVD process or a catalytic CVD process, and contact holes are formed at the drain sections of display TFTs, as in FIG. 65B.

With reference to FIG. 24C, a photosensitive resin film 28 having a thickness of 2 to 3 µm is formed by spin coating, as in the step shown in FIG. 66A, followed by a Step shown in FIG. 24D in which an uneven pattern is formed and then subjected to reflow to form a lower portion of a reflective layer having an uneven surface 28A so that the pixel section has optimized reflective and viewing-angle characteristics. At the same time, contact holes are formed in the resin for allowing contact of the drain sections of the display TFTs.

With reference to FIG. 24D, an aluminum sputtering film having a thickness of 400 to 500 nm is formed on the entire surface, as in the step shown in FIG. 66C, and then an uneven aluminum reflective section 29 connecting to the drain sections 19 of the display TFTs is formed by conventional photolithography and etching.

As described above, the resulting active-matrix substrate 30 integrates a display section and a peripheral-driving-circuit section, in which the display section includes bottom-gate nMOSLDD-TFTs using the single-crystal silicon layer 7 formed by high-temperature graphoepitaxy on the step differences 4 as a seed, while the peripheral-driving-circuit section includes a CMOS driving circuit having bottom-gate pMOSTFTs and bottom-gate nMOSTFTs.

Figure 81A:
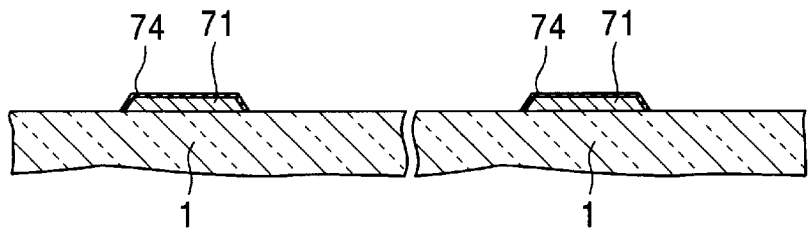
FIGS. 81A to 81C are sectional views showing steps of a process for producing the LCD of the fifth embodiment of the fourth aspect of the present invention.
Figure 81B:
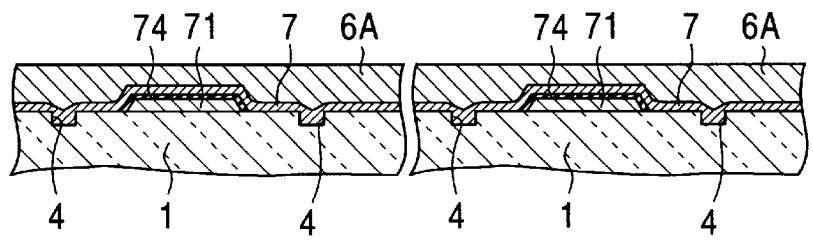
Figure 81C:
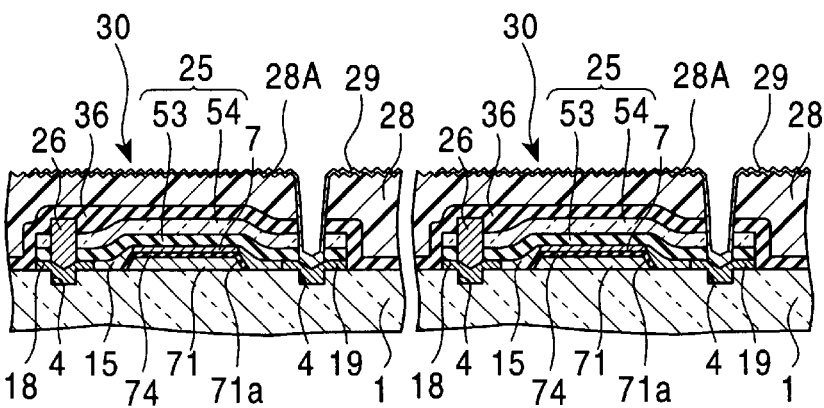

FIGS. 81A to 81C show the formation of the gate insulating film of the above-mentioned bottom-gate MOSTFT in the display section by anodic oxidation of molybdenum-tantalum.

After the step of FIG. 80B, the molybdenum-tantalum alloy film 71 is subjected to conventional anodic oxidation treatment, as shown in FIG. 81A, to form on the surface a gate insulating film 74 composed of Ta$_2$O$_5$ and having a thickness of 100 to 200 nm.

Next, with reference to FIG. 81B, the step differences 4 are formed and a single-crystal layer 7 is deposited thereon graphoepitaxy, as described before, followed by execution of processing similar to those of FIGS. 22E to 24C to form an active matrix substrate 30 as shown in FIG. 25C.

When the dual-gate MOSTFTs are produced in the display section, the processes are executed in the same way as that described before.

More specifically, with reference to FIG. 26A, step differences 4 are formed in the substrate 1 through the insulating films 72 and 73, and then a single-crystal silicon layer 7 is deposited by graphoepitaxy on the step differences 4 as a seed. Next, a step which is the same as that shown in FIG. 63A is executed so that a SiO$_2$ film having a thickness of approximately 200 nm and then a SiN film having a thickness of approximately 100 nm are successively formed on the entire surface of the single-crystal silicon layer 7 by a plasma-enhanced CVD process or a catalytic CVD process, thereby to form an insulating film 80 corresponding to the insulating film 8. Then, a molybdenum-tantalum alloy film 81 having a thickness of 500 to 600 nm, corresponding to the sputtering film 9, is formed by sputtering.

With reference to FIG. 26B, processing which is the same as that shown in FIG. 63B is executed: namely, a photoresist pattern 10 is formed and is subjected to continuous etching to form a top-gate electrode 82 (corresponding to the gate electrode 12) composed of the molybdenum-tantalum alloy and a gate insulating film (corresponding to the gate insulating film 11), thereby exposing the single-crystal silicon layer 7.

With reference to FIG. 26C, the same processing as that shown in FIG. 63C is executed: namely, the top-gate section of the nMOSTFT is covered with a photoresist 13, and the exposed source and drain regions of the nMOSTFT for display are doped with phosphorus ions 14 by ion implantation to form an $N^-$-type LDD section 15.

With reference to FIG. 26D, the same processing as that shown in FIG. 64A is executed: namely, the gate section and the LDD section of the nMOSTFT are covered with a photoresist 16, and the exposed region is doped with phosphorus or arsenic ions 17 by ion implantation, thereby to form a source section 18 and a drain section 19 of nMOSTFT composed of an $N^+$-type layer.

With reference to FIG. 27A, the same processing as that shown in FIG. 64B is performed: namely, the gate section of the pMOSTFT is covered with a photoresist 20 and the exposed region is doped with boron ions 21 by ion implantation to form a source section and a drain section of the pMOSTFT composed of a $P^+$-layer in the peripheral-driving-circuit section.

With reference to FIG. 27B, the same processing as that shown in FIG. 64C is executed: namely, a photoresist layer 24 is provided and the single-crystal silicon layer is selectively removed at portions other than the active and passive device sections by conventional photolithography and etching, thereby to island the active device section and the passive device section.

With reference to FIG. 27C, the same process as that shown in FIG. 65A is performed: namely, a $SiO_2$ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process. These films 53 and 54 correspond to the aforesaid protective film 25. Then, an activation treatment is effected on the single-crystal silicon layer 7.

With reference to FIG. 27D, the same processing as that shown in FIG. 65B is executed: namely, contact holes are formed for the source sections. An aluminum sputtering film having a thickness of 400 to 500 nm is formed on the entire surface, and then source electrodes 26, data lines and gate lines are simultaneously formed by conventional photolithography and etching.

With reference to FIG. 28A, the same processing as that shown in FIG. 65C is executed: namely, an insulating film 36 including a PSG film having a thickness of approximately 300 nm and a SiN film having a thickness of approximately 300 nm is formed on the entire surface, and contact holes are formed for the drain sections of the display TFTs.

With reference to FIG. 28B, a photosensitive resin film 28 having a thickness of 2 to 3 μm is formed on the entire surface by, for example, spin coating. With reference to FIG. 28C, Steps which are the same as those of FIGS. 66B and 66C are performed: namely, a lower portion of a reflective face comprising an uneven surface 28A is formed in at least the pixel section, contact holes are formed for the drain sections of the display TFTs, and an uneven aluminum reflective section 29 connecting to the drain sections 19 of the display TFTs are formed so that optimum reflective and viewing-angle characteristics are achieved.

The resulting active-matrix substrate 30 integrates a display section and a peripheral-driving-circuit section, in which the display section includes dual-gate nMOSLDD-TFTs and the peripheral-driving-circuit section includes a CMOS driving circuit having bottom-gate nMOSTFTs and bottom-gate pMOSTFTs, wherein these TFTs are formed by using the single-crystal silicon layer 7 deposited by high-temperature graphoepitaxy on the step differences 4 as seeds.

The fourth aspects of the present invention can be carried out in various other forms.

For instance, an electrooptical device or a driving substrate can be implemented in accordance with the fourth aspect of the present invention, such that the gate electrode at the top gate section is composed of a material having relatively low thermal resistance, such as aluminum, an aluminum alloy, e.g., aluminum alloy containing 1 wt % of silicon or 1 to 2 wt % of copper, or copper. This embodiment can be carried out substantially in the same way as the eighth embodiment of the third aspect of the invention described before.

Further, the TFTs may be formed at the exterior of the step differences, rather than in the step differences, as in the ninth embodiment of the third aspect of the present invention.

Likewise, as in the tenth embodiment of the first aspect of the present invention, a self-alignment type LDD-TFT, for example, a double-gate MOSTFT including a plurality of top-gate MOSLDD-TFTs, can be implemented in accordance with the fourth aspect of the present invention.

It is also possible to implement an electrooptical device such that, as in the eleventh embodiment of the first aspect of the present invention, one of the upper and lower-gate sections of a dual-gate type nMOSTFT is used in a transistor operation, whereas the other operates in a specific manner.

Further, a variety of combinations of TFTS may be employed in the display section and the peripheral-driving-circuit section, as in the case of the twelfth embodiment of the third aspect which was described before with reference to FIGS. 70 to 78.

Although the invention has been described through its preferred forms, it is to be understood that the described embodiments are not exclusive and various changes and modifications may be imparted thereto within the scope of the present invention which is limited solely by the appended claims.

What is claimed is:

1. A method of producing an electrooptical device having a first substrate carrying a display section provided with pixel electrodes and a peripheral-driving-circuit section provided on a periphery of the display section, a second substrate, and an optical material disposed between the first substrate and the second substrate; the method comprising the steps of:

a gate-forming step for forming a gate portion including a gate electrode and a gate insulating film on one face of said first substrate;

a step-forming step for forming a step difference on said one face of the first substrate;

a layer-forming step for forming a polycrystalline or amorphous silicon layer having a predetermined thickness on the first substrate having the gate portion and the step difference and then forming a low-meltingpoint metal layer on or under the polycrystalline or amorphous silicon layer, or of forming a low-melting-point metal layer containing silicon on the first substrate having the step difference;

a heating step for dissolving silicon of the polycrystalline or amorphous layer or of the low-melting-point metal layer into said low-melting-point metal layer by heating;

a deposition step for depositing on said first substrate a single-crystal silicon layer by allowing the silicon of said polycrystalline or amorphous silicon layer or of the low-melting-point metal layer to grow by graphoepitaxy by a cooling treatment using as a seed the step difference on the substrate;

a step for effecting a predetermined treatment on said single-crystal silicon layer, thereby forming a channel region, a source region and a drain region; and a step for forming a first thin-film transistor of dual-gate type having the gate portions on the above and below said channel region and constituting at least part of said peripheral-driving-circuit section.

2. A method of producing an electrooptical device according to claim 1, wherein the step difference is formed as an indented section so that a cross-sectional side face is perpendicular to the bottom face or slanted to the bottom face, and the step difference is used as a seed for graphoepitaxy of the single-crystal silicon layer.

3. A method of producing an electrooptical device according to claim 1, wherein the polycrystalline or amorphous silicon layer is formed by a low-temperature deposition process and the low-melting-point metal layer is deposited thereon or thereunder, or the low-melting-point metal layer containing the silicon is deposited, followed by the heating and cooling steps.

4. A method of producing an electrooptical device according to claim 1, wherein the first substrate comprises one of a glass substrate and a heat-resistant organic substrate, and the low-melting-point metal layer comprises at least one metal selected from the group consisting of indium, gallium, tin, bismuth, lead, zinc, antimony, and aluminum.

5. A method of producing an electrooptical device according to claim 4, wherein, when the low-melting-point metal layer comprises indium, the heating step is performed in a hydrogen atmosphere at a temperature of 850 to 1,100° C. and, when the low-melting-point metal layer comprises an indium-gallium alloy, at a temperature of 300 to 1,100° C., whereas, when the low-melting-point metal layer comprises gallium, at a temperature of 400 to 1,100° C.

6. A method of producing an electrooptical device according to claim 1, wherein a diffusion-barrier layer is formed on the first substrate, and the polycrystalline or amorphous silicon layer or the low-melting-point metal layer containing the silicon is formed on said diffusion barrier layer.

7. A method of producing an electrooptical device according to claim 1, wherein a Group III or V element is introduced into the polycrystalline or amorphous silicon layer or the low-melting-point metal layer containing the silicon material in the layer-forming step so as to control the type and the concentration of the impurity in the single-crystal silicon layer.

8. A method of producing an electrooptical device according to claim 1, wherein an upper gate portion having a gate insulating film and a gate electrode is formed on the deposited single-crystal silicon layer, and introducing the Group III or V element while using said upper gate portion as a mask, thereby forming said channel region, said source region and said drain region.

9. A method of producing an electrooptical device according to claim 1, wherein the step difference is formed in said first substrate and/or a film formed on the first substrate, and the first thin-film transistor is formed on at least one of the interior and the exterior of the indented section formed by the step difference.

10. A method of producing an electrooptical device according to claim 1, wherein the step difference is formed along at least one side of a device region including the channel region, the source region and the drain region of the first thin-film transistor.

11. A method of producing an electrooptical device according to claim 1, wherein said gate electrode underlying said single-crystal silicon layer is tapered at its side edges so as to form a trapezoidal shape.

12. A method of producing an electrooptical device according to claim 1, wherein the single-crystal silicon layer deposited in the depositing step is doped with a Group III or V impurity to form the channel region, the source region, and the drain region.

13. A method of producing an electrooptical device according to claim 1, wherein the peripheral-driving-circuit section further comprises at least one of a top-gate thin-film transistor, a bottom-gate thin-film transistor and a dual-gate thin-film transistor, each having a channel region of a polycrystalline or amorphous silicon layer and a gate region formed above or below the channel region, or comprises at least one of a diode, a resistor, a capacitor and an inductor, each comprising the single-crystal, polycrystalline or amorphous silicon layer.

14. A method of producing an electrooptical device according to claim 1, further comprising a switching device provided on said first substrate for switching the pixel electrodes of said display section.

15. A method of producing an electrooptical device according to claim 14, wherein the first thin-film transistor comprises at least the dual-gate type among a top-gate type having a gate section above the channel region, a bottom-gate type having a gate section below the channel region, and a dual-gate type having one gate section above and one below the channel region, and the switching device comprises one of a top-gate second thin-film transistor, a bottom-gate second thin-film transistor and a dual-gate second thin-film transistor.

16. A method of producing an electrooptical device according to claim 15, wherein when the second thin-film transistor is a bottom-gate or dual-gate type, a lower electrode of a heat-resistant material is provided below the channel region, and a gate insulating film is formed on the gate electrode to form a lower gate section, and the second thin-film transistor is formed by the same process including the step-forming step as that for the first thin-film transistor.

17. A method of producing an electrooptical device according to claim 15, wherein after the single-crystal silicon layer is formed on the lower gate section, the single-crystal silicon layer is doped with a Group III or V impurity to form the source region and the drain region, followed by an activation treatment.

18. A method of producing an electrooptical device according to claim 15, wherein source and drain regions of the first and second thin-film transistors are formed by ion implantation of the impurity through a resist mask after forming the single-crystal silicon layer, the activation treatment is performed, a gate insulating film is formed, and then a gate electrode of the first thin-film transistor and optionally an upper gate electrode of the second thin-film transistor are formed.

19. A method of producing an electrooptical device according to claim 15, wherein, when the second thin-film transistor is a top-gate type, the source region and the drain region of each of the first thin-film transistor and the second thin-film transistor are formed by ion implantation of an impurity element through a resist mask after the formation of the single-crystal silicon layer, an activation treatment is performed, and then gate sections including gate insulating films and gate electrodes of the first thin-film transistor and the second thin-film transistor are formed.

20. A method of producing an electrooptical device according to claim 15, wherein, when the thin-film transistor is the top-gate type, gate sections including gate insulating films and gate electrodes of the first thin-film transistor and the second thin-film transistor are formed after the formation of the single-crystal silicon layer, the source regions and the drain regions of the first thin-film transistor and the second thin-film transistor are formed by ion implantation of an impurity element through the gate sections and resists as masks, and then an activation treatment is performed.

21. A method of producing an electrooptical device according to claim 15, wherein thin-film transistors in the peripheral-driving-circuit section and the display section comprise n-channel, p-channel or complementary insulating-gate field-effect transistors.

22. A method of producing an electrooptical device according to claim 21, wherein the thin-film transistors in the peripheral-driving-circuit section are formed by a combination of a complementary type and an n-channel type, a combination of a complementary type and a p-channel type, or a combination of a complementary type, an n-channel type and a p-channel type thin-film.

23. A method of producing an electrooptical device according to claim 15, wherein at least a part of the thin-film transistors in the peripheral-driving-circuit section and the display section has a lightly-doped drain (LDD) structure of a single type having a LDD section between the gate and the source or drain or of a double type having LDD sections between the gate and source and between the gate and the drain.

24. A method of producing an electrooptical device according to claim 23, wherein the resist mask used when the LDD structure is formed is left unremoved and the ion implantation for forming the source region and the drain region is performed through a resist mask that covers the remaining resist mask.

25. A method of producing an electrooptical device according to claim 15, wherein the step difference is formed on one surface of the first substrate, a single-crystal, polycrystalline, or amorphous silicon layer is formed on the surface having the step difference, and the second thin-film transistor is formed to have a channel region, a source region, and a drain region constituted by the single-crystal, polycrystalline, or the amorphous silicon layer, with at least one gate section provided above and/or below the single-crystal, polycrystalline, or the amorphous silicon layer.

26. A method of producing an electrooptical device according to claim 25, wherein the thin-film transistor of said peripheral-drive-circuit section is constituted by said first thin-film transistor of the n-channel type, p-channel type or complementary type, while said thin-film transistor of said display section is of the n-channel type, p-channel type or the complementary type when said single-crystal silicon layer is used as the channel region, n-channel type, p-channel type or the complementary type when said polycrystalline silicon layer is used as the channel region, and n-channel type, p-channel type or the complementary type when said amorphous silicon layer is used as the channel region.

27. A method of producing an electrooptical device according to claim 25, wherein the step difference forms an indented section having a cross-section in which a side face is perpendicular to or slanted to the bottom face, and the step difference functions as a seed for graphoepitaxy of the single-crystal silicon layer.

28. A method of producing an electrooptical device according to claim 24, wherein source or drain electrodes of the first and/or second thin-film transistors are formed in a region including the step difference.

29. A method of producing an electrooptical device according to claim 25, wherein the step difference is formed on at least one of the first substrate and a film formed on the first substrate, and the second thin-film transistor is formed on at least one of the interior and the exterior of the indented section formed by the step difference.

30. A method of producing an electrooptical device according to claim 25, wherein at least one of the type and the concentration of a Group III or V impurity in the single-crystal, polycrystalline or amorphous silicon layer is controlled.

31. A method of producing an electrooptical device according to claim 25, wherein the step difference is formed along at least one side of a device region including the channel region, the source region and the drain region of the second thin-film transistor.

32. A method of producing an electrooptical device according to claim 25, wherein a gate electrode below the single-crystal, polycrystalline or amorphous silicon layer is tapered at its side edges to have a trapezoidal form.

33. A method of producing an electrooptical device according to claim 25, wherein a diffusion-barrier layer is provided between the first substrate and the single-crystal, polycrystalline or amorphous silicon layer.

34. A method of producing an electrooptical device according to claim 1, wherein the first substrate is one of a glass substrate and a heat-resistant organic substrate.

35. A method of producing an electrooptical device according to claim 1, wherein the first substrate is optically opaque or transparent.

36. A method of producing an electrooptical device according to claim 1, wherein the pixel electrodes are provided for a reflective or transmissive display.

37. A method of producing an electrooptical device according to claim 1, wherein the display section comprises a laminated configuration having the pixel electrodes and a color filter layer.

38. A method of producing an electrooptical device according to claim 1, wherein, when the pixel electrodes are reflective electrodes, unevenness is formed on a resin film and said pixel electrodes are provided on said resin having the unevenness and, when the pixel electrodes are transparent electrodes, the surface is planarized by a transparent planarization film and the pixel electrodes are formed on the planarized plane.

39. A method of producing an electrooptical device according to claim 14, wherein the display section is illuminated or dimmed by driving the switching device.

40. A method of producing an electrooptical device according to claim 14, wherein a plurality of the pixel electrodes are arranged in a matrix in the display section and a switching device is connected to each of the plurality of pixel electrodes.

41. A method of producing an electrooptical device according to claim 1, wherein the display section comprises one of a liquid crystal display, an electroluminescent display, a field emission display, a light-emitting polymer display, and a light-emitting diode display.

* * * * *